United States Patent [19]

Kobayashi et al.

[11] Patent Number: 5,659,505
[45] Date of Patent: Aug. 19, 1997

[54] ELECTRICALLY PROGRAMMABLE AND ERASABLE NONVOLATILE SEMICONDUCTOR MEMORY DEVICE AND OPERATING METHOD THEREFOR

[75] Inventors: Shinichi Kobayashi; Yasushi Terada; Yoshikazu Miyawaki; Takeshi Nakayama; Tomoshi Futatsuya; Natsuo Ajika; Yuichi Kunori; Hiroshi Onoda, all of Hyogo-ken, Japan

[73] Assignee: Mitsubishi Denki Kabushiki Kaisha, Tokyo, Japan

[21] Appl. No.: 509,250

[22] Filed: Jul. 31, 1995

Related U.S. Application Data

[62] Division of Ser. No. 43,889, Apr. 7, 1993, abandoned.

[30] Foreign Application Priority Data

| Apr. 7, 1992 | [JP] | Japan | 4-85281 |
| Jun. 30, 1992 | [JP] | Japan | 4-172812 |
| Jul. 6, 1992 | [JP] | Japan | 4-178116 |
| Sep. 7, 1992 | [JP] | Japan | 4-238546 |
| Dec. 24, 1992 | [JP] | Japan | 4-344807 |

[51] Int. Cl.$^6$ .............................. G11C 11/40
[52] U.S. Cl. ..................... 365/185.29; 365/185.13; 365/185.33
[58] Field of Search .............. 365/185.13, 185.18, 365/185.28, 185.33, 230.03, 185.29, 218, 189

[56] References Cited

U.S. PATENT DOCUMENTS

| 4,377,857 | 3/1983 | Tickle . | |
| 4,460,982 | 7/1984 | Gee et al. | 365/189 |
| 4,868,619 | 9/1989 | Mukherjee et al. . | |
| 4,878,199 | 10/1989 | Mizutani et al. | 365/185 |
| 4,887,238 | 12/1989 | Terasawa et al. | 365/185 |
| 4,959,812 | 9/1990 | Monodomi et al. | 365/185 |
| 5,022,000 | 6/1991 | Terasawa et al. | 365/189.09 |
| 5,077,691 | 12/1991 | Haddad et al. | 365/218 |
| 5,088,060 | 2/1992 | Endoh et al. . | |
| 5,126,808 | 6/1992 | Montalvo et al. . | |
| 5,245,570 | 9/1993 | Fazio et al. | 365/185.13 |
| 5,278,439 | 1/1994 | Ma et al. . | |
| 5,341,342 | 8/1994 | Brahmbhatt | 365/900 |
| 5,365,484 | 11/1994 | Cleveland et al. | 365/218 |

FOREIGN PATENT DOCUMENTS

| 3831538A1 | 3/1989 | Germany . |
| 1-282873 | 11/1989 | Japan . |
| 2-3182 | 1/1990 | Japan . |
| 3-295097 | 12/1991 | Japan . |
| 4-14871 | 1/1992 | Japan . |
| 5-6680 | 1/1993 | Japan . |

OTHER PUBLICATIONS

"A 4-Mbit NAND-EEPROM with Tight Programmed Vt Distribution", Tomoharu Tanaka et al., 1990 Symposium on VLSI Circuits Digest of Technical Papers, pp. 105-106.

"An Experimental 4-Mbit CMOS EEPROM with a NAND-Structured Cell", Masaki Momodomi, et al., IEEE Journal of Solid-State Circuits, vol. 24, No. 5, Oct. 1989, pp. 1238-1241.

"A New Erasing and Row Decoding Scheme for Low Supply Voltage Operation 16-Mb/64-Mb Flash Memories", Yoshikazu Miyawaki et al., IEEE Journal of Solid-State Circuits, vol. 27, No. 4, Apr. 1992, pp. 583-587.

"An Experimental 4-Mb Flash EEPROM with Sector Erase", Mike McConnell et al., IEEE Journal of Solid-State Circuits, vol. 26, No. 4, Apr. 1991, pp. 484-489.

(List continued on next page.)

*Primary Examiner*—David C. Nelms
*Assistant Examiner*—Vu A. Le
*Attorney, Agent, or Firm*—Lowe, Price, LeBlanc & Becker

[57] ABSTRACT

In erasing, electrons are simultaneously injected into floating gates from sources of a plurality of memory cells. Thus, the threshold voltages of the plurality of memory cells are increased. In programming, electrons are emitted from a floating gate of a selected memory cell to a drain. Thus, the threshold voltage of the selected memory cell is reduced.

34 Claims, 124 Drawing Sheets

OTHER PUBLICATIONS

"An In–System Reprogrammable 32KX8 CMOS Flash Memory", Virgil Niles Kynett et al., IEEE Journal of Solid–State Circuits, vol. 23, No. 5, Oct. 1988, pp. 1157–1163.

"A 5V Only 16Mbit Flash EEPROM Cell Using Highly Reliable Write/Erase Technologies", N. Kodama, et al., 1991 Symposium on VLSI Technology, pp. 75–76.

"A 4–Mb NAND EEPROM with Tight Programmed Vt Distribution", Masaki Momodomi et al., IEEE Journal of Solid–State Circuits, vol. 26, No. 4, Apr. 1991, pp. 492–495.

"A 3.42 μm2Flash Memory Cell Technology Conformable to a Sector Erase", Hitoshi Kume et al., 1991 Symposium on VLSI Technology, pp. 77–78.

Nikkei Electronics, Feb. 17, 1992 (No. 547), pp. 180–181.

Jacob Millman, Ph.D. et al, Microelectronics Second Edition, McGraw Hill Book Company, 1987, pp. 191–193.

"A High–Density NAND EEPROM with Block–Page Programming for Microcomputer Applications", IEEE Journal of Solid–State Circuits, Yoshihisa Iwata, et al., vol. 25, No. 2, Apr. 1990, pp. 417–424.

FIG. 2 (a)

| STORED DATA | FLOATING GATE | THRESHOLD VOLTAGE |
|---|---|---|
| ERASED STATE | "1" | INJECTION | HIGH |
| PROGRAMMED STATE | "0" | EMISSION | LOW |

FIG. 2 (b) (PRIOR ART)

| STORED DATA | FLOATING GATE | THRESHOLD VOLTAGE |
|---|---|---|
| ERASED STATE | "1" | EMISSION | LOW |
| PROGRAMMED STATE | "0" | INJECTION | HIGH |

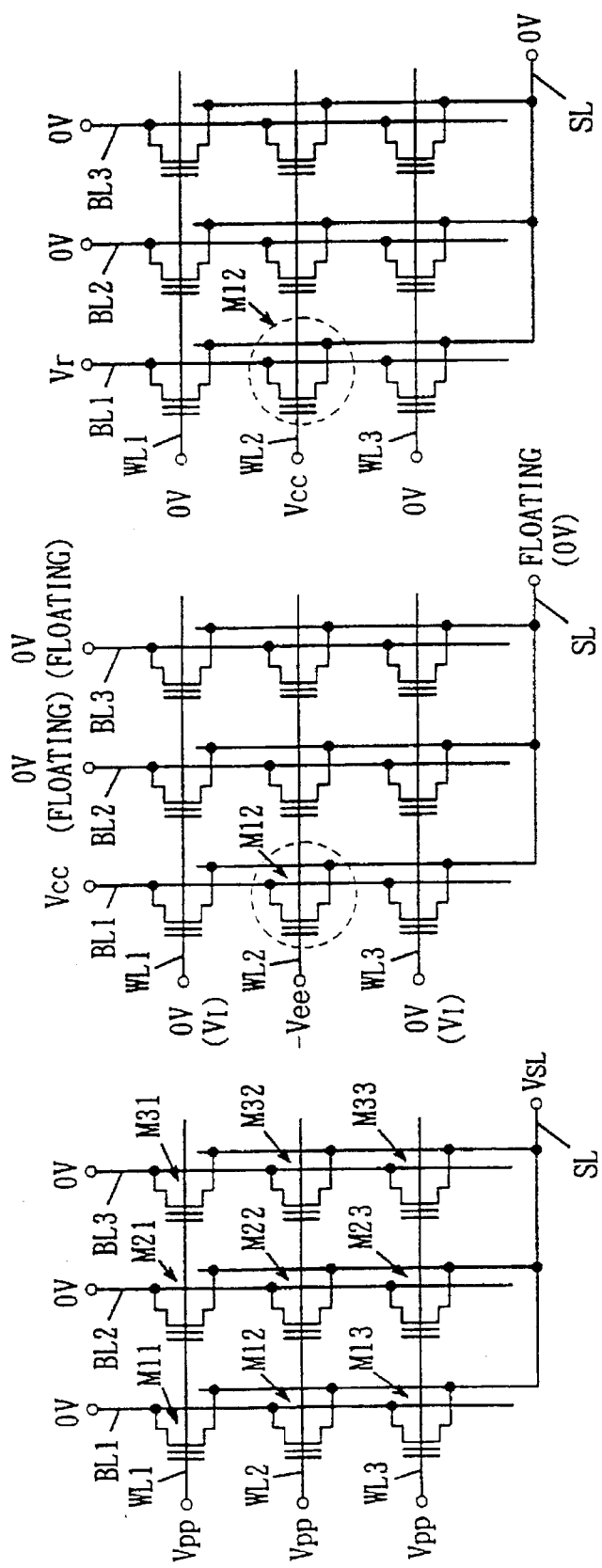

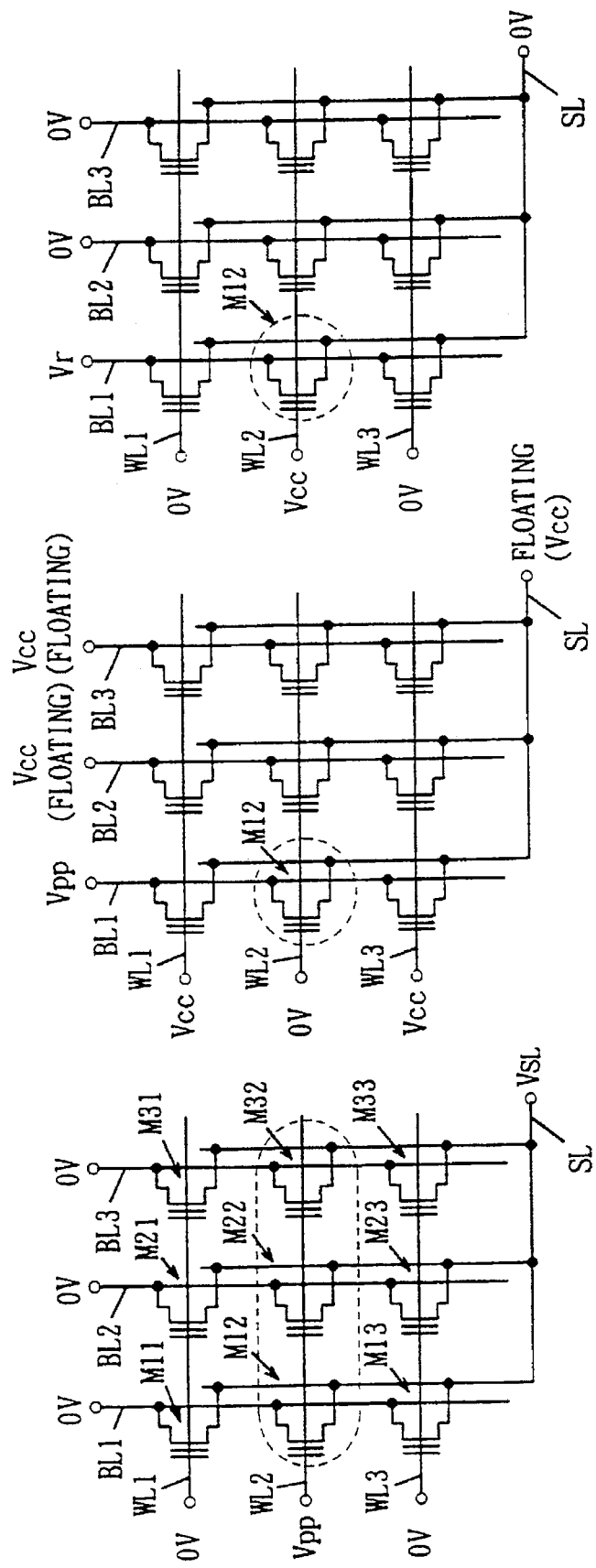

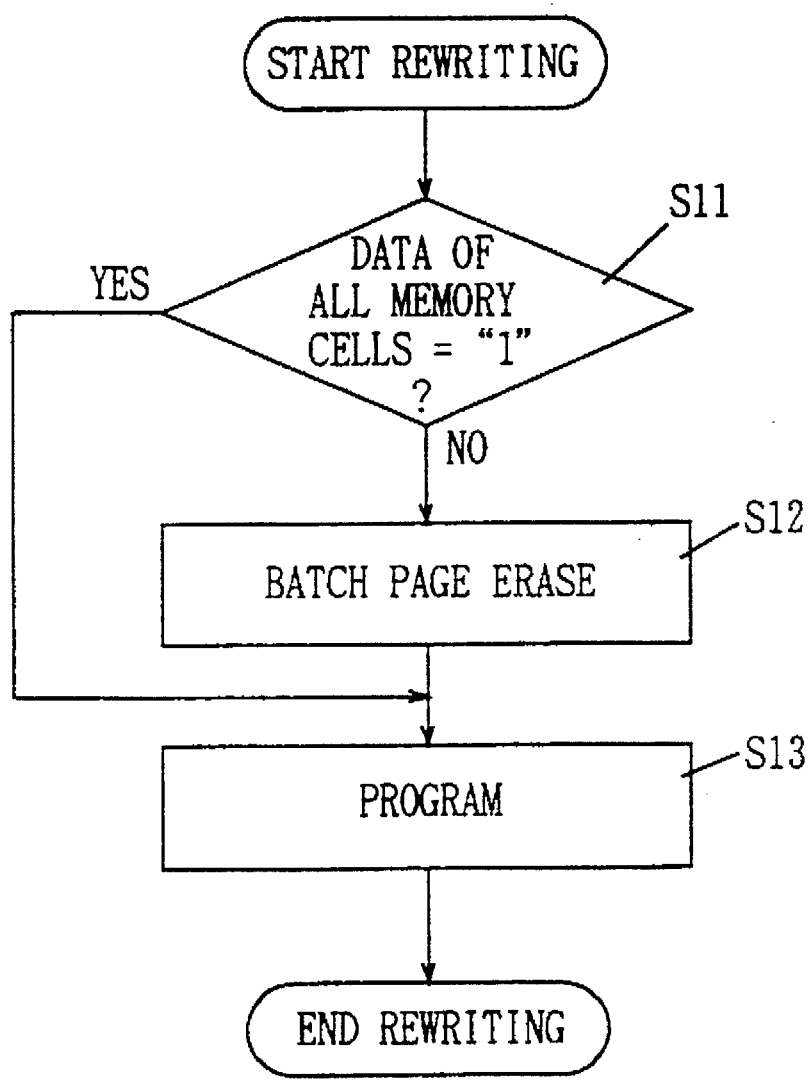

FIG. 26 (a)
FIG. 26 (b)
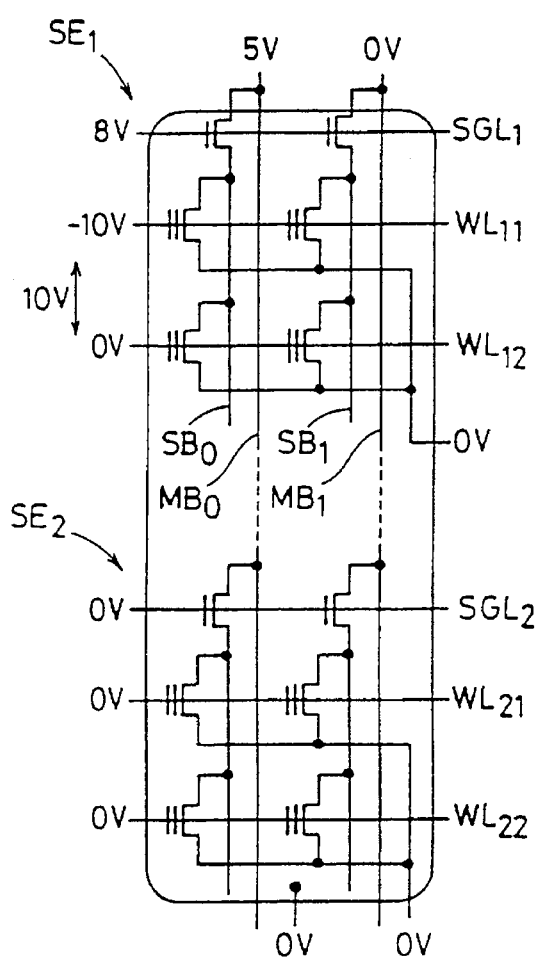
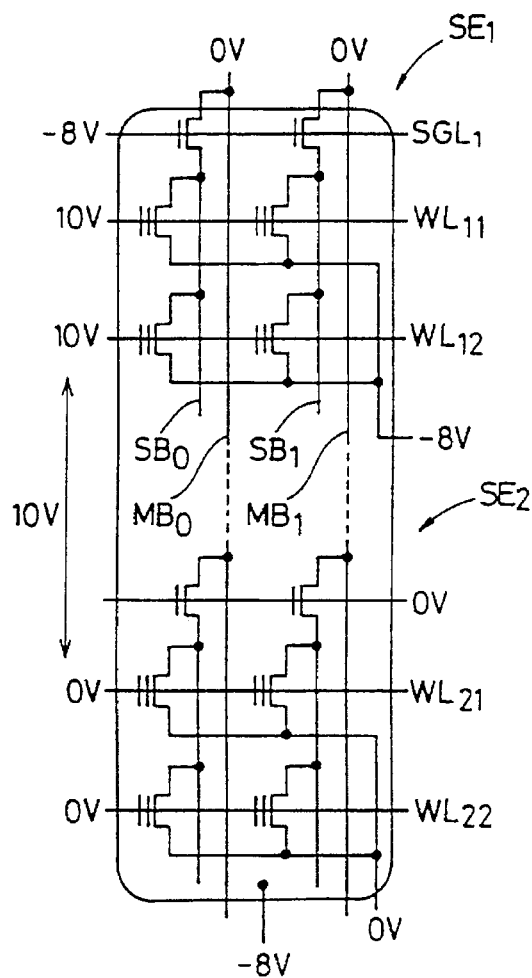

FIG. 86
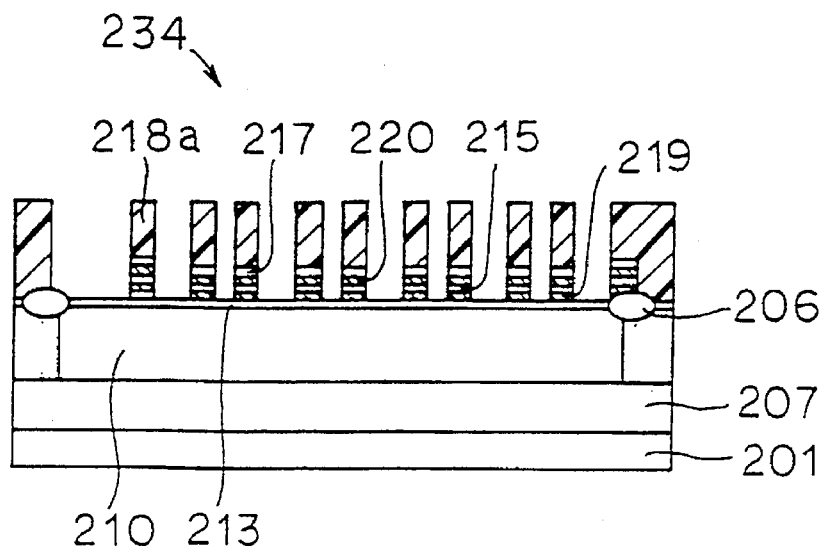
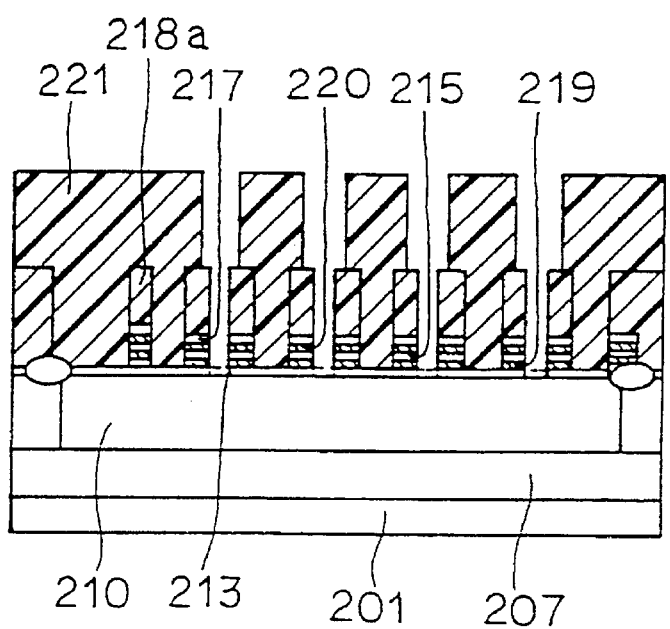
FIG. 87 (a)
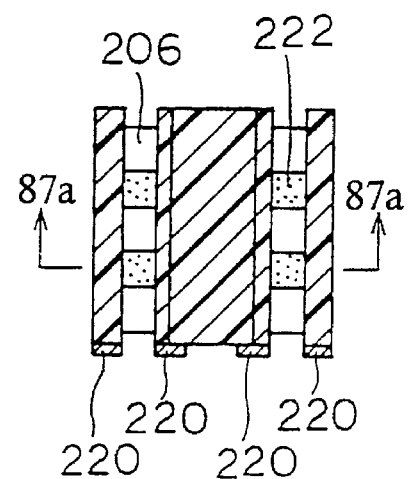
FIG. 87 (b)

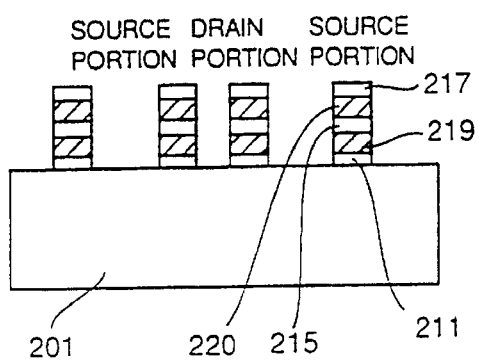
FIG. 102 (I)
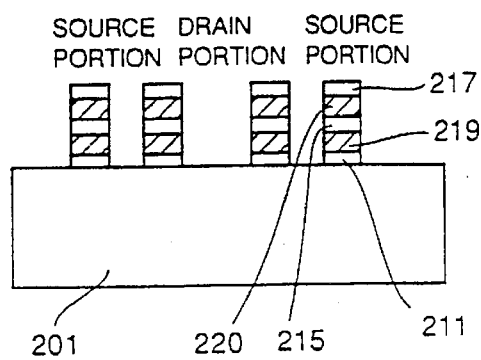
FIG. 102 (II)
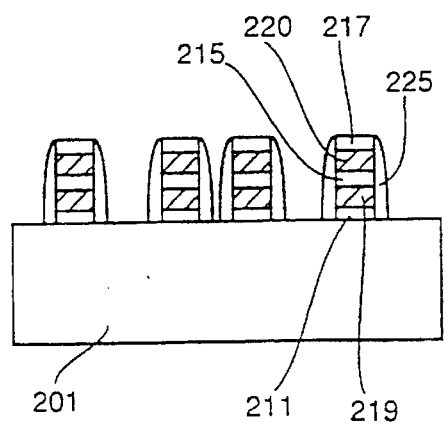
FIG. 103 (I)
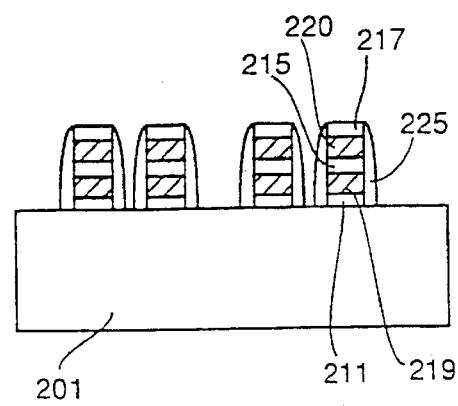
FIG. 103 (II)

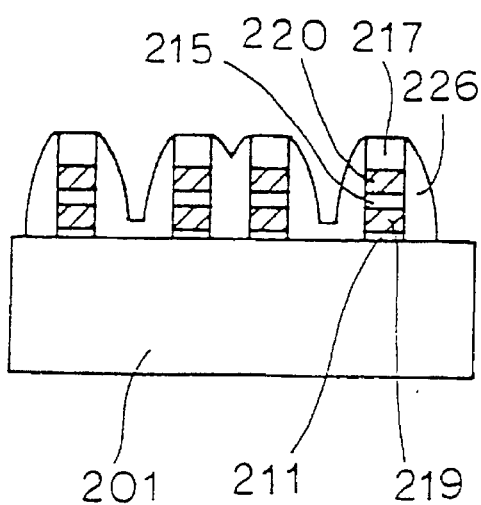
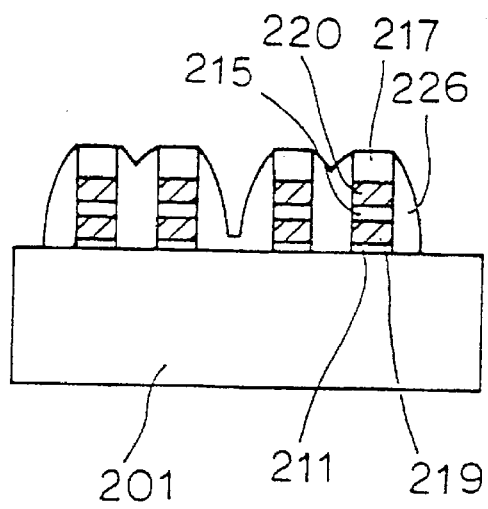
FIG. 104 ( I )  
FIG. 104 ( II )

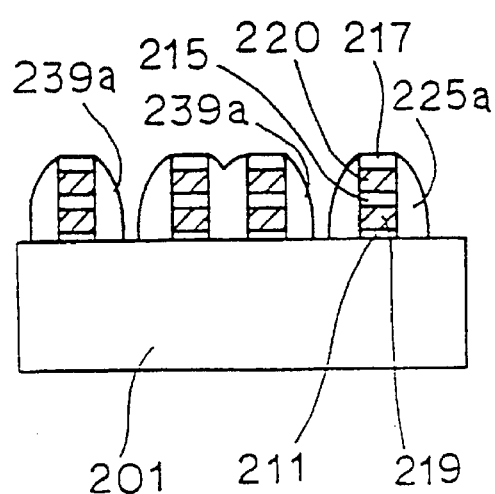
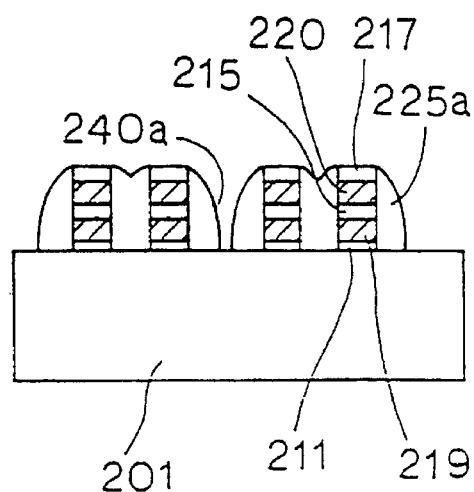
FIG. 105 (I)  FIG. 105 (II)
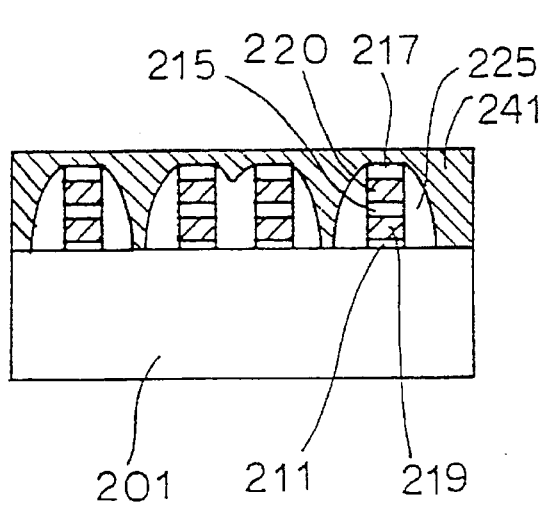
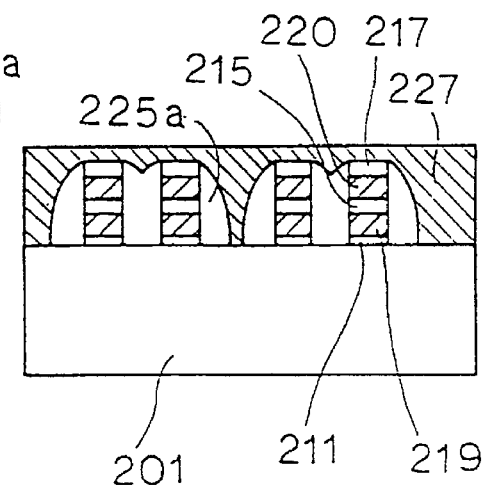
FIG. 106 (I)  FIG. 106 (II)

FIG. 130 (a)    PRIOR ART
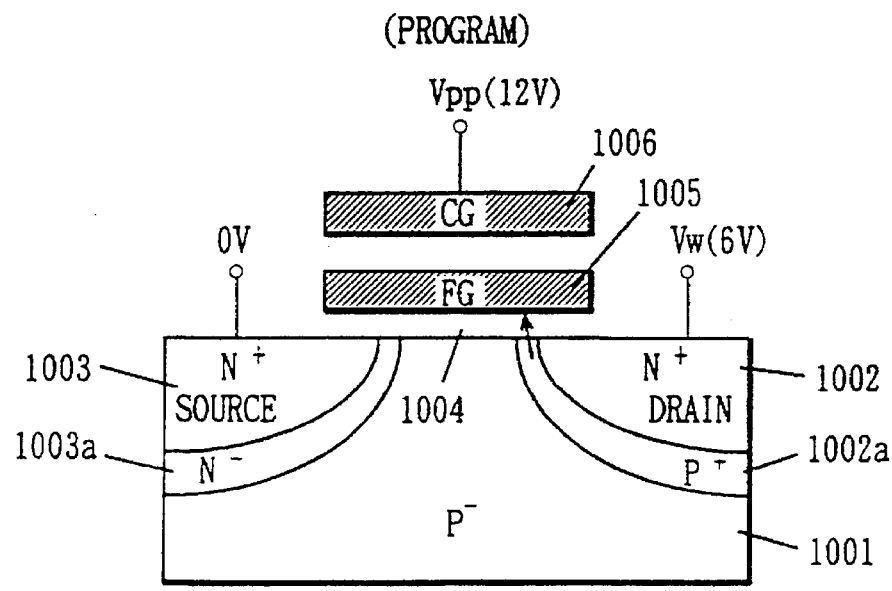
FIG. 130 (b)   PRIOR ART
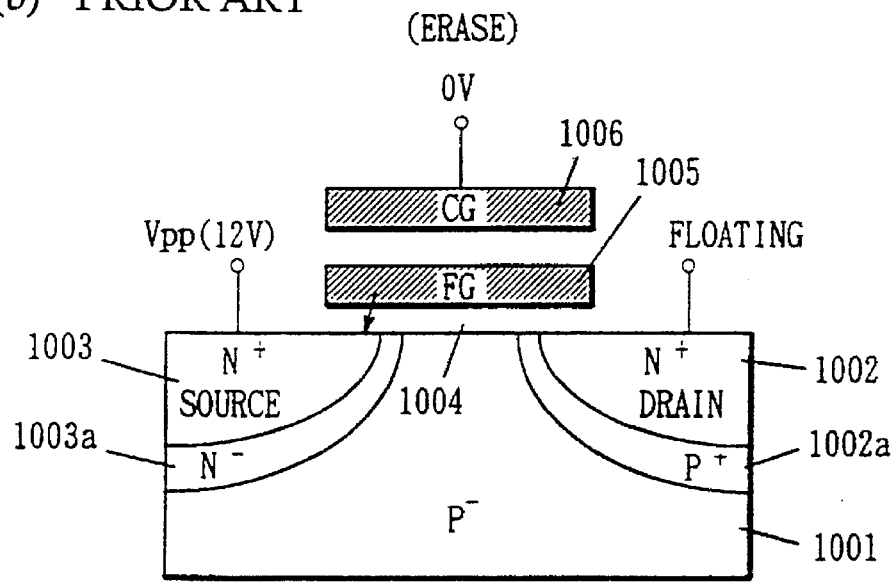

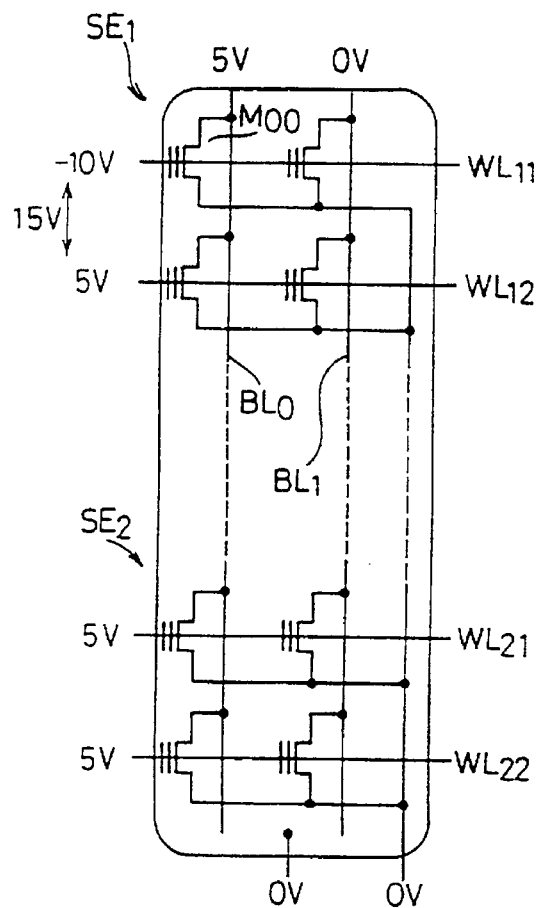 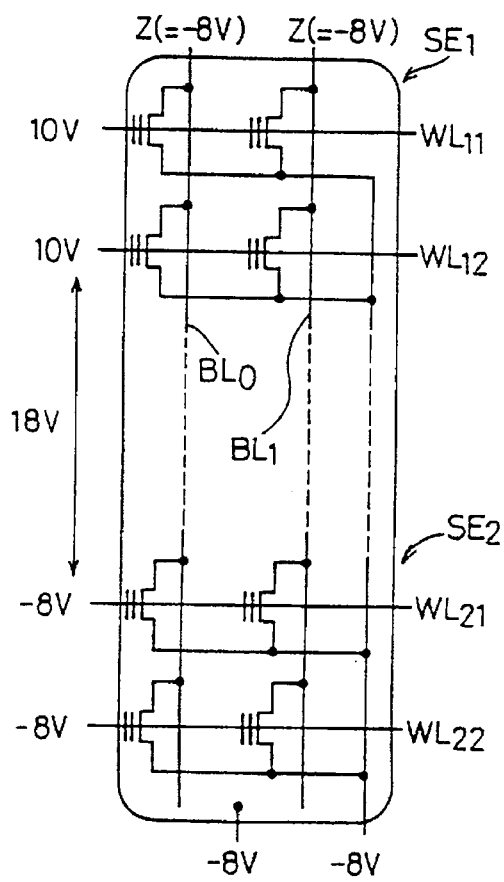
FIG. 147 (a)                FIG. 147 (b)

FIG. 156 (a)   PRIOR ART
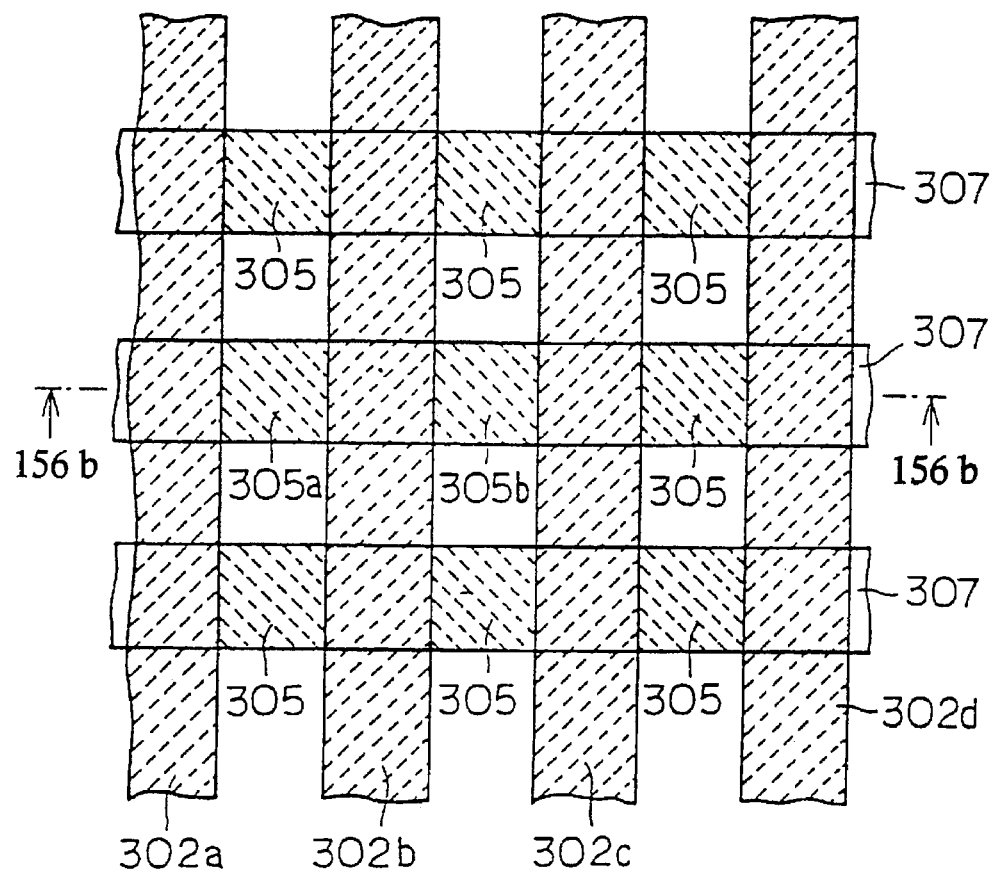
FIG. 156 (b)   PRIOR ART
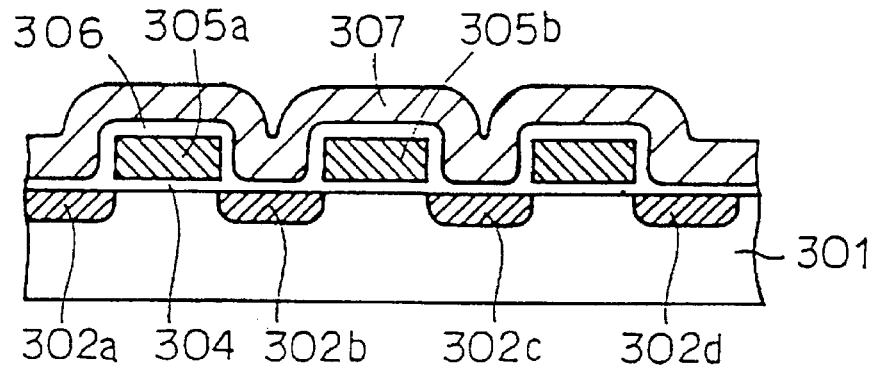

ELECTRICALLY PROGRAMMABLE AND ERASABLE NONVOLATILE SEMICONDUCTOR MEMORY DEVICE AND OPERATING METHOD THEREFOR

This application is a division of application Ser. No. 08/043,889, filed Apr. 7, 1993, now abandoned

CROSS-REFERENCE TO RELATED COPENDING APPLICATION

Related, copending application of particular interest to the instant application is U.S. Ser. No. 07/794,708, entitled "NON-VOLATILE SEMICONDUCTOR MEMORY DEVICE", filed Nov. 20, 1991, which is a continuation application of U.S. Ser. No. 07/536,876, filed Jun. 12, 1990 (now abandoned) and assigned to the same assignee of the instant application.

BACKGROUND OF THE INVENTION

1. Field of the Invention

The present invention relates to a nonvolatile semiconductor memory device, and more particularly, it relates to an electrically programmable and erasable nonvolatile semiconductor memory device (hereinafter referred to as a flash memory) including stack gate type memory cells and an operating method thereof.

2. Description of the Background Art

First, general definitions of erasing and programming are described. Erasing means an operation of batch-changing the threshold voltages of a plurality of memory cells to prescribed states. Programming means an operation of changing the threshold voltage of selected memory cells to another prescribed state. Data "1" corresponds to an erased memory cell, and data "0" corresponds to a programmed memory cell.

(1) Sectional Structure of Memory Cell (FIGS. 128 and 129)

FIG. 128 shows a sectional structure of a general stack gate type memory cell (memory transistor) which is employed in a conventional flash memory. A P$^-$-type semiconductor substrate 1001 is provided on its major surface with two N$^+$-type impurity regions, which form a drain 1002 and a source 1003 respectively, at a prescribed interval. An extremely thin insulating film 1004 (about 100 Å in thickness) of an oxide film or the like is formed on a region of the semiconductor substrate 1001 between the drain 1002 and the source 1003. A floating gate 1005 is formed on the insulating film 4, while a control gate 1006 is formed thereon with another insulating film interposed therebetween. Thus, the memory cell has a double gate structure. The P$^-$-type semiconductor substrate 1001 may be replaced by a P$^-$ well.

In the flash memory, information (data) is stored in the memory cell depending on whether electrons are injected into or emitted from the floating gate 1005.

When electrons are injected into the floating gate 1005, the threshold voltage of the memory cell as viewed from the control gate 1006 is so high that no current flows across the drain 1002 and the source 1003 unless the control gate voltage exceeds Vg0, as shown in FIG. 129. This is because negative charges of the electrons stored in the floating gate 1005 cancel a positive voltage. This state is called a programmed state. In this case, the memory cell stores the data "0". The electrons stored in the floating gate 1005 semipermanently remains unerased, whereby the stored data is also semipermanently held.

When electrons are emitted from the floating gate 1005, on the other hand, the threshold voltage of the memory cell as viewed from the control gate 1006 is so low that a current flows across the drain 1002 and the source 1003 when the control gate voltage exceeds Vg1, as shown in FIG. 129. This state is called an erased state. In this case, the memory cell stores data "1".

It is possible to read the data stored in the memory cell by detecting the aforementioned two states.

(2) Programming and Erasing of Memory Cell (FIG. 130)

FIG. 130 shows conditions of voltage application for programming and erasing the memory cell at (a) and (b) respectively.

In programming, a write voltage Vw (about 6 V in general) is applied to the drain 1002 and a high voltage Vpp (about 12 V in general) is applied to the control gate 1006, while the source 1003 is grounded. Thus, hot electrons are generated in the vicinity of the drain 1002 by avalanche breakdown, or channel hot electrons having high energy are generated in a channel formed in the region between the drain 1002 and the source 1003. The hot electrons accelerated by the high voltage of the control gate 1006 jump over an energy barrier formed by the insulating film 1004, to be injected into the floating gate 1005 from a portion close to the drain 1002. As the result, the threshold voltage of the memory cell is increased.

In erasing, on the other hand, the drain 1002 is brought into a floating state and a high voltage Vpp is applied to the source 1003, while the control gate 1006 is grounded. Thus, a high voltage is generated in the thin insulating film 1002, so that the electrons are emitted from the floating gate 1005 to the source 1003 by a tunnel effect. As the result, the threshold voltage of the memory cell is reduced.

Thus, electrons are injected into the floating gate 1005 by hot electrons in programming. As shown in FIG. 130, therefore, a P$^+$-type impurity region 1002a is provided along the drain 1002 so that a higher electric field is generated in the channel or substrate direction.

In erasing, on the other hand, electrons are emitted from the floating gate 1005 to the source 1003 by a tunnel effect. Thus, only an electric field generated across the floating gate 1005 and the source 1003 is required for such erasing. The electric field in the channel or substrate direction is preferably minimized to cause no leakage current. Therefore, an N$^-$-type impurity region 1003a is provided along the source 1003, in order to weaken the electric field in the channel or source direction.

(3) Overall Structure of Flash Memory (FIGS. 131 and 132)

FIG. 131 is a block diagram showing the overall structure of the conventional flash memory.

A memory array 1010 includes a plurality of bit lines, a plurality of word lines crossing with the plurality of bit lines, and a plurality of memory cells which are provided on the crossings.

FIG. 131 shows only four memory cells M00, M01, M10 and M11 which are arranged in two rows and two columns, for simplifying the illustration. Drains of the memory cells M00 and M01 are connected to a bit line BL0, while those of the memory cells M10 and M11 are connected to another bit line BL1. Control gates of the memory cells M00 and M10 are connected to a word line WL0, while those of the memory cells M01 and M11 are connected to another word line WL1. Sources of the memory cells M00, M01, M10 and M11 are connected to a source line SL.

An address buffer 1020 receives externally supplied address signals AD, to supply X and Y address signals to X and Y decoders 1030 and 1040 respectively. The X decoder 1030 selects one of the plurality of word lines WL0 and WL1 in response to the X address signal. On the other hand, the Y decoder 1040 generates a selection signal Y0 or Y1 for selecting one of the plurality of bit lines BL0 and BL1 in response to the Y address signal.

A Y gate 1050 includes Y gate transistors YG0 and YG1 in correspondence to the bit lines BL0 and BL1. The Y gate transistors YG0 and YG1 connect the bit lines BL0 and BL1 to a sense amplifier 1060 and a write circuit 1080 in response to the selection signals Y0 and Y1 respectively.

In reading, the sense amplifier 1060 detects data read on the bit line BL0 or BL1, and outputs the same to the exterior through a data input/output buffer 1070. In programming, on the other hand, externally supplied data DA is supplied to the write circuit 1080 through the data input/output buffer 1070, so that the write circuit 1080 supplies a write voltage to the bit lines BL0 and BL1 in accordance with the data DA.

A Vpp/Vcc switching circuit 1090 receives an externally supplied high voltage (12 V in general) and an externally supplied power supply voltage Vcc (5 V in general), and supplies the X decoder 1030, the Y decoder 1040 and the write circuit 1080 with the high voltage Vpp or the power supply voltage Vcc. A verify voltage generating circuit 1100 receives the externally supplied power supply voltage Vcc, and supplies a prescribed verify voltage to a selected word line in verification as described later. A source control circuit 1110 supplies the source line SL with the high voltage Vpp in erasing.

A control signal buffer 1012 supplies an externally supplied control signal CT to a control circuit 1130, which controls operations of the respective circuits.

As shown in FIG. 132, the X decoder 1030 includes a decoder circuit 1301, and a plurality of high voltage switches 1302 corresponding to the plurality of word lines WL. The decoder circuit 1301 decodes an X address signal XA, to generate a selection signal for selecting one of the plurality of word lines WL. Each high voltage switch 1302 supplies the selected word line WL with the high voltage Vpp or the power supply voltage Vcc in response to a control signal SW received from the control circuit 1130.

This flash memory is formed on a chip CH.

(4) Operation of Flash Memory (FIGS. 133 to 140)

(a) Program Operation (FIG. 133)

FIG. 133 illustrates conditions of voltage application in a program operation. It is assumed here that the memory cell M00 is programmed, for example. The control circuit 1130 is supplied with a control signal specifying a program operation through the control signal buffer 1120. The Vpp/Vcc switching circuit 1090 is supplied with a high voltage Vpp from the exterior, and supplies the same to the X and Y decoders 1030 and 1040.

The X decoder 1030 selects the word line WL0 in response to an X address signal received from the address buffer 1020, to supply the high voltage Vpp to the same.

The Y decoder 1040 supplies a high voltage selection signal Y0 to the Y gate transistor YG0 in response to a Y address signal received from the address buffer 1020. Thus, the Y gate transistor YG0 is turned on.

The source control circuit 1110 supplies 0 V to the source line SL. The write circuit 1080 is activated. Thus, the write voltage Vw is supplied to the bit line BL0.

As the result, voltages are applied to the memory cell M00 as shown at (a) in FIG. 130, to program the memory cell M00.

(b) Erase Operation (FIGS. 134 to 136)

An erase operation includes a pre-erase write operation and a batch erase operation.

(i) Pre-Erase Write Operation (FIG. 134)

Before batch erasing of memory cells, all memory cells are programmed by the aforementioned method. Thus, the threshold voltages of all memory cells are increased. This is called a pre-erase write operation.

With reference to a flow chart shown in FIG. 134, the pre-erase write operation is now described. First, a determination is made as to whether or not data stored in all memory cells are "0" (step S51). If data of all memory cells are not "0", an address specified by an address signal is set at zero (step S52). The memory cell specified by the address signal is programmed by the aforementioned program operation (step S53).

Then, a determination is made as to whether or not the address specified by the address signal is the final one (step S54). If the address is not the final one, the addresses are incremented one by one (step S55), to carry out a program operation (step S53). This operation is continued until the final address is reached (steps S53, S54 and S55). When the final address is reached, the pre-erase write operation is terminated.

(ii) Batch Erase Operation (FIGS. 135 and 136)

A batch erase operation is now described with reference to a flow chart shown in FIG. 135. FIG. 136 shows conditions of voltage application for the batch erase operation.

First, a control signal specifying batch erasing is supplied to the control circuit 1130 through the control signal buffer 1120. In batch erasing, the Vpp/Vcc switching circuit 90 supplies the high voltage vpp to the source control circuit 1110, which in turn supplies the high voltage Vpp to the source line SL (step S61).

The X decoder 1030 grounds the word lines WL0 and WL1. On the other hand, the Y decoder 1040 supplies selection signals Y0 and Y1 of 0 V to the Y gate transistors YG0 and YG1 respectively. Thus, the bit lines BL0 and BL1 enter floating states.

As the result, voltages are applied to all memory cells as shown at (b) in FIG. 130, whereby the threshold voltages of all memory cells are reduced.

It is difficult to reduce the threshold voltages of all memory cells below a prescribed value only by one time application of the high voltage (erasing voltage) to the source line SL. In general, therefore, high voltage pulses are applied to the source line SL a plurality of times, and erase verification is performed after every pulse application.

First, a high voltage pulse is applied to the source line SL (step S61), and thereafter the source line SL is set at 0 V (step S62), to select an address zero (step S63). Then, a prescribed verify voltage which is lower than the power supply voltage Vcc is supplied to the selected word line by the verify voltage generating circuit 1100 (step S64). Thus, data is read from the selected memory cell on a corresponding bit line, to be detected by the sense amplifier 1060. Then, a determination is made as to whether or not the data detected by the sense amplifier 1060 is "1" (step S65).

If the data detected by the sense amplifier 1060 is "0", the steps S61 to S64 are repeated.

If the data detected by the sense amplifier 1060 is "1", on the other hand, a determination is made as to whether or not an address specified by an address signal is the final one (step S66). If the address is not the final one, this address is incremented by 1 (step S67). Thus, data are read out from all memory cells while the addresses are incremented one by one. If a read data is "0", a high voltage pulse is applied to the source line SL, to erase the memory cell.

Thus, the threshold voltages of the memory cells are monitored so that all memory cells are gradually erased.

(c) Read Operation (FIG. 137)

FIG. 137 shows conditions of voltage application for a read operation. It is assumed here that data is read out from the memory cell M00.

First, a control signal specifying a read operation is supplied to the control circuit 1130 through the control signal buffer 1120. The X decoder 1030 selects the word line WL0 in response to an X address signal received from the address buffer 1020, and applies the power supply voltage Vcc to the same. At this time, the potential of the nonselected word line WL1 is maintained at 0 V.

The Y decoder 1040 turns on the Y gate transistor YG0 in response to a Y address signal received from the address buffer 1020. Thus, the bit line BL0 is connected to the sense amplifier 1060. At this time, the source control circuit 1100 supplies 0 V to the source line SL.

As the result, the memory cell M00 enters an ON state when its threshold voltage is low. Thus, a current I flows in a resistor R provided in the sense amplifier 1060, to reduce a read voltage Vr on the bit line BL0. The read voltage Vr on the bit line BL0 is outputted as data "1" through an inverter INV2.

When the threshold voltage of the memory cell M00 is high, on the other hand, the memory cell m00 enters an OFF state. Thus, the read voltage Vr on the bit line BL0 is high. The read voltage Vr on the bit line BL0 is outputted as data "0" through the inverter INV2.

When the voltage of a bit line approaches the power supply voltage Vcc in reading, hot electrons may be generated to program the memory cell. This is called a soft write phenomenon. In order to prevent the soft write phenomenon, the read voltage Vr on the bit line is set at about 1 V by an N-channel transistor TR and an inverter INV1.

(d) Potentials on Respective Lines in Respective Operations (FIG. 138)

FIG. 138 shows potentials on word, bit and source lines in program, erase and read operations. In program and pre-erase write operations, the high voltage Vpp is applied to the word line and the write voltage Vw is applied to the bit line while 0 V is applied to the source line. In batch erasing, the high voltage Vpp is applied to only the source line and 0 V is applied to the word line, while the bit line is in a floating state. In reading, the source voltage Vcc is applied to the word line and the source line is at 0 V, while the read voltage Vr appears on the bit line.

(3) Reason for Requirement for Pre-Erase Write Operation (FIGS. 139 and 140)

The reason why the pre-erase write operation is required in erasing is now described with reference to FIGS. 139 and 140. FIG. 139 shows changes in the threshold voltage of the memory cell caused by program and batch erase operations. FIG. 140 shows changes in the threshold voltage of the memory cell caused by program, pre-erase write and batch erase operations.

In the batch erase operation, the control gate 1006 reaches 0 V and the drain 1002 enters a floating state while the source 1003 is supplied with the high voltage Vpp in the memory cell, as shown at (b) in FIG. 130. In such conditions of voltage application, a high voltage is developed across the source 1003 and the floating gate 1005, whereby the electrons stored in the floating gate 1005 are extracted to the source 1003. As the result, the threshold voltage of the memory cell is reduced.

If this erase operation is carried out in a low threshold voltage state (data "1"), however, the threshold voltage of the memory cell reaches a negative value, as shown in FIG. 139. This is called depression of the memory cell, which causes the following problem in reading:

It is assumed here that the memory cell M00 is selected in the read operation shown in FIG. 137 while the memory cell M01 is depressed by batch erasing. Namely, the threshold voltage of the memory cell m01 is at a negative value.

In this case, the source voltage Vcc is applied to the word line WL0, while the potential of the word line WL1 remains at 0 V. If the memory cell M00 stores data "0", this memory cell M00 is not turned on even if the potential of the word line WL0 reaches the power supply voltage Vcc. Thus, no current is generated in the bit line BL0.

When the threshold voltage of the memory cell M01 is at a negative value, however, this memory cell M01 is turned on even if the potential of the word line WL1 is at 0 V. As the result, a current is generated on the bit line BL0. In this case, the sense amplifier 1060 determines that the memory cell M00 stores data "1".

When at least one of memory cells which are connected to a bit line has a negative threshold voltage, as hereinabove described, a current inevitably flows in the bit line even if the memory cell is in a nonselected state. Thus, the data stored in the selected memory cell cannot be correctly read.

In order to solve such a problem, the pre-erase write operation is carried out before the batch erase operation, as shown in FIG. 140. Thus, the threshold voltages of all memory cells are temporarily brought into high states, so that the batch erase operation is thereafter carried out. As the result, the voltages of the erased memory cells are unified at positive values which are lower than the power supply voltage Vcc. Thus, reliability of the memory is improved by the pre-erase write operation.

However, the conventional flash memory has the following problems:

(1) Rewrite Operation (FIG. 141)

In order to rewrite data stored in the memory cells in the aforementioned conventional flash memory, as shown in FIG. 141, a pre-erase write operation is carried out (step S71) and then a batch erase operation is carried out (step S72), so that a program operation is thereafter carried out (step S73).

When the capacity of the flash memory is increased, a time required for the pre-erase write operation is extremely increased. For example, a flash memory of 1001 megabit requires 1001 to 1002 seconds for programming memory cells of all addresses.

When the pre-erase write operation requires such a long time, it means that a long time is required for rewriting the data. This is extremely inconvenient for the user.

(2) Depression by Over-Erasing (FIGS. 142 and 143)

In erasing, the pre-erase write operation is carried out in advance of the batch erase operation in order to unify the threshold voltages of the memory cells substantially at the same values, as hereinabove described. In practice, however, a plurality of memory cells provided in an erase unit are necessarily dispersed in erasability.

If such dispersion is extremely large as shown in FIG. 142, parts of the memory cells are over-erased and depressed.

In such depressed memory cells, currents inevitably flow even if the control gates thereof are grounded. As the result, data read from memory cell which is connected to the same bit line as the depressed memory cell is so disturbed by the depressed memory cell that the data thereof is regularly determined as "1".

FIG. 143 shows the structure of a memory cell having no such problem.

Referring to FIG. 143, a P$^-$-type semiconductor substrate 301 is provided on its major surface with N$^+$-type impurity regions 1302, 1303 and 1310 at prescribed intervals. A gate electrode 1304 is formed on a region between the impurity regions 1302 and 1303 with an insulating film formed by an oxide film interposed therebetween. Thus, a selection transistor 1305 is constituted.

A floating gate 1307 is formed on the impurity region 1303 with an extremely thin oxide film 1306 of about 100 Å interposed therebetween, and a control gate 1308 is formed thereon with another insulating film interposed therebetween. Thus, a memory transistor 1309 having a two-layer gate structure is constituted.

The selection transistor 1305 and the memory transistor 1309 form a one-bit memory cell. The impurity region 1302 is connected to a bit terminal B, while the gate electrode 1304 is connected to a word terminal W. The impurity region 1310 is connected to a source terminal S. The control gate 1308 is connected to a control gate terminal CG.

The memory cell shown in FIG. 143 is provided with the selection transistor 1305, whereby no problem is caused even if the memory transistor 1309 is depressed, dissimilarly to the above.

However, the memory cell shown in FIG. 143 is complicated in structure as compared with the stack gate type memory cell shown in FIG. 128, and requires a wide area.

(3) Disturbance between Sectors (FIG. 144)

In a conventional flash memory, it is possible to subdivide a data rewrite unit by sectoring a memory array. In this case, however, a memory cell provided in a selected sector disadvantageously influences that provided in a nonselected sector. This phenomenon is called disturbance.

Consider that a plurality of memory cells which are connected to a word line WL0 are divided into selectors SE1 and SE2 as shown in FIG. 144, for example. In this case, a high voltage is applied also to a control gate of a memory cell provided in the nonselected sector SE2 when a memory cell provided in the sector SE1 is programmed.

On the other hand, consider that a plurality of memory cells which are connected to a bit line BL0 are divided into sectors SE1 and SE3. In this case, a high voltage is applied also to a drain of a memory cell provided in the nonselected sector SE3 when the memory cell provided in the sector SE1 is programmed.

In each case, it is possible to sufficiently guarantee data even if the disturbance is repeated thousands of times. Assuming that data in a memory cell provided in a single sector is rewritten by 10000 times, however, disturbance is caused in another sector by the following number of times, since a plurality of sectors are provided on the same word line and the same bit line:

Disturbance=(10000 times)×(number of sectors−1)

Thus, disturbance is caused in a sector by an enormous number of times when a plurality of sectors are present. In recent years, however, such a sector must guarantee a great number of rewrite times. Thus, the disturbance between different sectors is extremely problematic.

(4) Power Consumption

When a memory cell is programmed in a conventional flash memory, electrons are injected into its floating gate by channel hot electrons. Thus, a large channel current is required for programming, leading to increase in power consumption.

(5) Integration Density

A conventional flash memory is disclosed having a main bit line and a subbit line in U.S. Pat. No. 5,126,808. In such a flash memory, electrons are drawn by channel hot electrons for programming to result in a great channel current. This will generate a problem set forth in the following.

FIG. 145 is a layout of a conventional flash memory having a main bit line and a subbit line on a semiconductor substrate. Referring to FIG. 145, a main bit line MB and subbit lines SB0 and SB1 are formed in parallel on a semiconductor substrate. Word lines WL0, WL1, . . . and select gate lines SGL0, SGL1 are formed in a direction perpendicular to the bit lines. A memory cell is formed at each crossing of a word line and a subbit line. For example, memory cells M11, M12, . . . are formed at the crossings of each of the word lines WL0, WL1, . . . and the subbit line SB1. A select gate transistor SG' for sector selection is formed at the crossing of the main bit line MB and the select gate line SGL0. An N$^+$ diffusion layer 1405 is formed in the semiconductor substrate.

In memory cells M11, M12, . . . shown in FIG. 145, programming using channel hot electrons is carried out as described above to result in a great channel current flowing via the subbit line SB1. Because this great current flows via the select gate transistor SG' for sector selection, it is necessary to select a great value of a channel width for select gate transistor SG'. This means that a select gate transistor SG' occupies a large area on a semiconductor substrate, resulting in reduction of the integration density in a semiconductor substrate.

Furthermore, the flash memory shown in FIG. 145 has first and second aluminum interconnection layers formed as the subbit lines SB0, SB1 and the main bit line MB in order to reduce the resistance of the main bit line MB and the subbit lines SB0 and SB1. This means that an aluminum interconnection layer can not be used to reduce the resistance of word lines WL0, WL1, . . . formed by a polysilicon layer. As a result, there will be a delay in the transfer of a signal in a word line, so that a high operation speed can not be obtained.

FIG. 146 is a structure of a memory cell of a conventional flash memory. Referring to FIG. 146, two memory cells M00 and M10 are isolated by an isolation oxide film 1402 formed on a P well 1008. For example, when programing is to be carried out for memory cell M10, a high voltage of 10 V is applied to a second aluminum interconnection layer 1006 forming a control gate and a voltage of 5 V is applied to a drain 1002' of transistor M10. A width Wb of isolation oxide film 1402 too narrow is equivalent to the presence of a MOS transistor 1403 using this isolation oxide film 1402 as a gate oxide film. The presence of an equivalent MOS transistor 1003 will prevent a desired operation in memory cells M00 and M10. Therefore, the width Wb of isolation oxide film 1402 can not be set to a low value in order to prevent generation of this equivalent MOS transistor 1403. This means that the integration density in the memory cell array is reduced.

FIG. 147 is a circuit diagram showing the voltage applied to the memory cell array of a conventional flash memory. FIG. 147(a) shows the voltage applied for programming, and FIG. 147(b) shows the voltage applied for erasure.

Referring to FIG. 147(a), a voltage of 5 V is applied to the bit line BL0 and a negative voltage of −10 V is applied to the word line WL11 to introduce electrons into the floating gate of memory cell M00. The non-selected word line WL12 is applied with a voltage of 5 V. In other words, the X decoder not shown must provide voltages of −10 V and 5 V.

Referring to FIG. 147(b), a positive voltage of 10 V is applied to word lines WL11 and WL12, and bit lines BL0 and BL1 are brought to a high impedance state in order to erase the data stored in the selected sector SE1. A negative voltage of −8 V is applied to word lines WL21 and WL22 in the non-selected sector SE2. In other words, the X decoder not shown must provide a positive voltage of 10 V and a negative voltage of −8 V.

Therefore, the X decoder not shown must provide an output voltage having a voltage difference of 15 V in a programming operation, and a voltage difference of 18 V in an erase operation. Because the voltage difference of the output voltage is great, it is difficult to form the X decoder on a smaller area on a semiconductor substrate.

(6) External Power Supply

In programming, it is necessary to apply a voltage of 1005 to 1006 V to the drain of each memory cell. Since programming by the channel hot electrons requires a large channel current as described above, it is extremely difficult to produce such a drain voltage by internal voltage boost through a single external power supply of 1003 or 5 V. Even if the drain voltage can be produced, it is impossible to simultaneously program a number of bits. Thus, the program time is extremely increased.

(7) Structure of Conventional Flash Memory

The structure of a conventional flash memory will be described in detail.

A flash memory is known as a memory device in which data can be freely written and can be electrically erased. An EEPROM including one transistor and allowing collective erasure of charges representing written information electrically, that is, a so called flash memory has been proposed in U.S. Pat. No. 4,868,619 and in "An In-System Reprogrammable 32 K×8 CMOS Flash Memory" by Virgil Niles Kynett et al., IEEE Journal of Solid-State Circuits, Vol. 23, No. 5, October 1988.

FIG. 148 is a block diagram showing a general structure of a flash memory. Referring to the figure, the flash memory includes a memory cell matrix 1 arranged in rows and columns, an X address decoder 2, a Y gate 3, a Y address decoder 4, an address buffer 5, a write circuit 6, a sense amplifier 7, an input/output buffer 8 and a control logic 9.

Memory cell matrix 1 has a plurality of memory transistors arranged in rows and coles formed therein. X address decoder 2 and Y gate 3 are connected to select a row and a column of memory cell matrix 1. Y address decoder 4 for applying information to select the column is connected to Y gate 3. X address decoder 2 and Y address decoder 4 are connected to address buffer 5 in which address information is temporarily stored.

Y gate 3 is connected to write circuit 6 for effecting writing operation at the time of data input and to sense amplifier 7 for determining "0" and "1" from the current value flowing at the time of data output. Write circuit 6 and sense amplifier 7 are connected to input/output buffer 8 for temporarily storing the input/output data. Address buffer 5 and input/output buffer 8 are connected to control logic 9 for controlling operation of the flash memory. Control logic 9 controls in accordance with a chip enable signal, an output enable signal and a program signal.

FIG. 149 is an equivalent circuit diagram showing the schematic structure of the memory cell matrix 1 shown in FIG. 148. The flash memory having this memory cell matrix is referred to as an NOR type one. Referring to the figure, a plurality of word lines $WL_1$, $WL_2$, ..., $WL_L$ extending in the row direction and a plurality of bit lines $BL_1$, $BL_2$, ..., $BL_j$ extending in the column direction are arranged to cross orthogonally with each other, thus forming a matrix. Memory transistors $Q_{11}$, $Q_{12}$, ..., $Q_{ij}$ each having a floating gate are arranged at crossings between the word lines and the bit lines. Each memory transistor has its drain connected to the bit line. Each memory transistor has its control gate connected to the word line. The memory transistors have their sources connected to respective source lines S1, S2, ... The sources of the memory transistors belonging to the same row are connected to each other as shown in the figure.

FIG. 150 is a partial cross section showing a cross sectional structure of one memory transistor forming the above-described NOR type flash memory. FIG. 151 is schematic plan view showing the planar layout of the NOR type flash memory. FIG. 152 is a partial cross section taken along the line A—A of FIG. 151. The structure of the NOR type flash memory will be described with reference to the figures.

Referring to FIGS. 150 and 152, in a p type impurity region 10 formed in a silicon substrate, n type impurity regions, for example a drain region 11 and a source region 12 are formed spaced apart from each other. A control gate 13 and a floating gate 14 are formed at the region sandwiched by the drain region 11 and source region 12 so that a channel is formed. Floating gate 14 is formed on p type impurity region 10 with a thin gate oxide film 15 having the thickness of about 100 Å posed therebetween. Control gate 13 is formed on floating gate 14 with an interlayer insulating film 16 posed therebetween so that it is electrically separated from the floating gate 14. Floating gate 14 is formed of polycrystalline silicon. Control gate 13 is formed of polycrystalline silicon layer or a stacked layer including polycrystalline layer and a layer of a metal having high melting point. Oxide film 17 is formed by deposition by the CVD method on the surface of the polycrystalline silicon layer forming floating gate 14 or control gate 13. A smooth coat film 21 (see. FIG. 91) is formed to cover floating gate 14 and control gate 13.

As shown in FIG. 151, control gates 13 are formed to be connected with each other to extend in the lateral direction (row direction), serving as a word line. The bit line 18 is arranged to orthogonally cross word line 13, and is electrically connected to each drain region 11 through a drain contact 20. As shown in FIG. 152, bit line 18 is formed on smooth coat film 21. As shown in FIG. 151, source region 12 extends in the direction along the word line 13 and is formed at a region surrounded by word line 13 and a field oxide film 19. Drain region 11 is also formed in a region surrounded by word line 13 and field oxide film 19.

The operation of the NOR type flash memory having the above described structure will be described with reference to FIG. 150.

In writing operation, a voltage of 5 V is applied to drain region 11 and a voltage of about 10 V is applied to control gate 13. Source region 12 and p type impurity region 10 are kept at the ground potential (0 V). At this time, a current of several 100 μA flows through the channel of the memory transistor. Among the electrons flowing from the source through the drain, electrons accelerated near the drain turn to be electrons having high energy in the vicinity, that is, so called channel hot electrons. These electrons are introduced to floating gate 14 as denoted by the arrow ① because of the electric field generated by the voltage applied to control gate 13. In this manner, electrons are stored in floating gate 14 and the threshold voltage Vth of memory transistor attains, for example, 8 V. This state is called the written state, that is, "0".

In the erasing operation, a voltage of about 5 V is applied to source region 12, a voltage of about −10V is applied to control gate 13 and p type impurity region 10 is held at the ground potential. Drain region 11 is released. Because of the electric field caused by the voltage applied to source region 12, electrons in floating gate 14 pass through thin gate oxide film 15 by tunnelling phenomenon, as shown by the arrow ②. As electrons in the floating gate 14 are drawn out in this manner, the threshold voltage Vth of the memory transistor attains, for example, to 2 V. This state is referred to as erased state "1". Since the source of each memory transistor is connected as shown in FIG. 149, all memories can be erased at one time by this erasing operation.

In reading operation, a voltage of about 5 V is applied to control gate 13 and a voltage of about 1 V is applied to drain region 11. Source region 12 and p type impurity region 10 are kept at the ground potential. At this time, determination of "1" or "0" is carried out dependent on whether a current flows through the channel region of the memory transistor.

More specifically, in the written state, there is no channel formed as Vth is 8 V, and therefore current does not flow. In the erased state, a channel is formed and current flows, as Vth is 2 V. In the NOR type device, electrons are introduced to the floating gate 14 utilizing channel hot electrons so as to realize the written state "0". Since introduction of electrons using channel hot electrons is not very efficient, power consumption of the NOR type device is large.

Referring to FIG. 152, when memory transistor 22a is selected and writing is to be done in this transistor, for example, a voltage of about 5 V is applied to drain region 11, and a voltage of about 10 V is applied to control gate 13 as described above, and writing is done in the floating gate 14 of the memory transistor 22a.

When memory transistor 22b is selected for writing, similar voltages are applied to drain region 11 and control gate 13 of memory transistor 22b. Since memory transistors 22a and 22b share the drain region 11, there is a possibility that electrons which have been introduced to floating gate 14 of memory transistor 22a are drawn out to drain region 11 by tunneling phenomenon, because of the voltage applied to drain region 11 at the time of writing to memory transistor 22b. This phenomenon is called drain disturb phenomenon. Since electrons are drawn out from the floating gate of the memory transistor to which electrons are introduced because of the drain disturb phenomenon, the memory transistor which must have been the written state turns to be to the erased state, which causes erroneous operation of the flash memory.

A NAND type device has been proposed to solve the problems in the NOR type. The NAND type flash memory is disclosed, for example, in Nikei Electronics 1992. 2. 17 (No. 547), pp. 180 to 181. FIG. 153 is an equivalent circuit diagram of a portion of the NAND type flash memory. Select gate transistors 39a, 39b and 39c have one impurity region connected to the bit line and the other impurity region connected to memory transistors 38a, 38b and 38c, respectively.

By select gate transistors 39a, 8 memory transistors 38a arranged in the lengthwise direction are selected; by select gate transistors 39b, 8 memory transistors 38b arranged in the lengthwise direction are selected; and by select gate transistors 39c, 8 memory transistors 38c arranged in the lengthwise direction are selected. These memory transistors 38a, 38b and 38c are grounded through select gate transistors 23a, 23b and 23c, respectively.

FIG. 154 is a cross section of a part of the memory cell matrix of the NAND type flash memory. At a P type impurity region 30 formed in the silicon substrate 26, impurity regions 27 are formed spaced apart from each other. Between the impurity regions 27, a memory transistor 38a having a floating gate 29 and a control gate 28 is formed.

FIG. 155 is a cross section of memory transistors 38a. At a p type impurity region 30 formed in silicon substrate, impurity regions 27 are formed spaced apart from each other. At the p type impurity region 30 between the impurity region 27, a gate oxide film 35, a floating gate 29, an interlayer insulating film 36 and a control gate 28 are stacked. Control gate 28 and floating gate 29 are covered by an oxide film 37.

The operation of the NAND type flash memory will be described with reference to FIGS. 153 to 155. First, writing operation will be described. When writing is to be done in the memory transistor 38a having the word line $W_S$, for example, selecting gate $S_2$ of select gate transistor, bit line B1, source line and p type impurity regions 30 are kept at the ground potential, a voltage of about 10 V is applied to $S_1$, B2 and B3, a voltage of about 20 V is applied to word line $W_8$, and other word lines $W_1$ to $W_7$ are kept at the ground potential. Consequently, as shown by ① in FIG. 155, in the memory transistor 38a having the word line $W_8$ (control gate 28), electrons in the channel region are introduced to floating gate 29 by channel FN. This corresponds to the written state "0", and $V_{th}$ at this time is 3 V.

The erasing operation will be described. For erasure, a voltage of 20 V is applied to the bit line $S_1$, $S_2$ and p type impurity region 30, and word lines $W_1$ to $W_8$ are kept at the ground potential. At this time, electrons are drawn out from the floating gate 29 of memory transistor 38a which is at the written state "0" to the channel region by channel FN, and it is set to the erased state "1". $V_{th}$ at the erased state "1" comes to be −2 V.

The reading operation will be described. When reading of memory transistor 38a having the word lines $W_8$ is to be carried out, a voltage of about 1 V is applied to bit line B1, and the source line and the substrate are kept at the ground potential. Word line $W_8$ is kept at the ground potential and a voltage of about 5 V is applied to word lines $W_1$ to $W_7$. A prescribed voltage is applied to selecting gates $S_1$ and $S_2$ to turn ON the select gate transistor.

Since word line $W_8$ is kept at the ground potential (0 V), when the memory transistor 38a having the word line $W_8$ is at the erased state "1", memory transistor 38a is turned ON, while if it is at the written state "0", memory transistor 38a is turned OFF. Memory transistors 38a having word lines $W_1$ to $W_7$ are turned ON regardless of the written state "0" or erased state "1", as a voltage of 5 V has been applied to word lines $W_1$ to $W_7$.

Therefore, referring to FIG. 154, when the memory transistor 38a having the word line $W_8$ is at the erased state "1", the current flows through a channel formed by respective word lines $W_1$ to $W_8$, through the bit line to the sense amplifier. When memory transistor 38a having word line $W_8$ is at the written state "0", since there is no channel form by word line $W_8$, current does not flow to the sense amplifier. Therefore, when sense amplifier senses a current, it is determined to be the erased state "1", while if the current is not sensed, it is determined to be the written state "0".

When electrons are introduced to the floating gate utilizing channel FN, efficiency is higher as compared with the case when electrons are introduced by using channel hot electrons. Therefore, compared with the NOR type device, power consumption in the NAND type device can be reduced.

Further, since a high voltage is not applied to the drain region of the memory transistor as channel FN is used in writing in the NAND type device, the drain disturb phenomenon can be prevented.

However, in the NAND type device, since reading is carried out by a current flowing through 8 memory transistors arranged in series, the time necessary for reading operation is long.

In addition, since a relatively high voltage of 20 V is used in writing and erasing, higher degree of integration is difficult.

SUMMARY OF THE INVENTION

An object of the present invention is to reduce a time required for an erase operation in a flash memory, thereby reducing a time required for a rewrite operation.

Another object of the present invention is to implement a stable erase operation by preventing a stack gate type memory cell from depression caused by over-erasing.

Still another object of the present invention is to prevent a sectored memory array from disturbance.

A further object of the present invention is to reduce power consumption in programming.

A further object of the present invention is to provide a flash memory which is operable by a single external power supply.

A still further object is to provide a nonvolatile semiconductor memory device which can operate with low power consumption, and in which drain disturb phenomenon can be suppressed, reading operation can be carried out at high speed and maximum voltage can be lowered.

A nonvolatile semiconductor memory device according to the present invention comprises a plurality of memory cells which are arranged in a plurality of rows and a plurality of columns, a plurality of word lines which are provided in correspondence to the plurality of rows, a plurality of bit lines which are provided in correspondence to the plurality of columns, a source line which is provided in common for the plurality of memory cells, an electron injecting circuit and an electron extracting circuit.

Each of the plurality of memory cells includes a control gate which is connected to a corresponding word line, a drain which is connected to a corresponding bit line, a source which is connected to the source line, and a floating gate. The electron injecting circuit simultaneously injects electrons into the floating gates of a plurality of memory cells in erasing. The electron extracting circuit extracts the electrons from the floating gate of a selected memory cell in programming.

In the aforementioned nonvolatile semiconductor memory device, electrons are injected into the floating gates of the plurality of memory cells in erasing. Thus, the threshold voltages of the plurality of memory cells are increased.

In programming, on the other hand, electrons are extracted from the floating gate of a selected memory cell. Thus, the threshold voltage of the selected memory cell is reduced.

Therefore, it is possible to batch-erase the plurality of memory cells with no pre-erase write operation. Further, the memory cells are prevented from depression caused by over-erasing. As the result, the time required for batch erasing is reduced and a data rewrite time is also reduced.

The electron injecting circuit may include a voltage applying circuit which applies prescribed positive voltages to one or more selected word lines and the source line respectively for injecting hot electrons into the floating gates of the plurality of memory cells.

In this case, erasing is performed by injection of the hot electrons.

The electron injecting circuit may include a voltage applying circuit which applies a prescribed positive voltage to one or more selected word lines for injecting electrons into the floating gates of the plurality of memory cells by a tunnel effect.

The sources and the drains of the plurality of memory cells may be formed in a well. The electron injecting circuit may include a voltage applying circuit which applies a prescribed positive voltage to the plurality of word lines or one or more selected word lines while applying a prescribed negative voltage to the well for injecting electrons into the floating gates of the plurality of memory cells by a tunnel effect.

In this case, erasing is performed by the tunnel effect. Thus, power consumption is reduced in erasing.

The electron extracting circuit may include a voltage applying circuit which applies a prescribed positive voltage to a selected bit line for extracting electrons from the floating gate of a selected memory cell by a tunnel effect.

The electron extracting circuit may include a voltage applying circuit which applies a prescribed positive voltage to a selected bit line while applying a prescribed negative voltage to a selected word line for extracting electrons from the floating gate of a selected memory cell by a tunnel effect.

In this case, programming is performed by the tunnel effect. Thus, power consumption is reduced in programming.

The electron extracting circuit may include a voltage applying circuit which precharges a selected bit line at a prescribed potential in accordance with data while applying a prescribed voltage to a selected word line, then temporarily grounds the source line, and thereafter applies a negative voltage to the selected word line.

In this case, the selected bit line is precharged at the prescribed potential and the prescribed potential is applied to the selected word line, whereafter the source line is temporarily grounded. Thus, a current flows in a memory cell whose threshold voltage is reduced below a prescribed value to be programmed. Thus, the voltage of the bit line is reduced.

On the other hand, no current flows in a memory cell whose threshold voltage is not reduced below the prescribed value. Thus, the voltage of the bit line is maintained. When a negative voltage is subsequently applied to the word line, therefore, only the memory cell having a high threshold voltage is programmed. As the result, no verify operation is required in programming.

A nonvolatile semiconductor memory device according to another aspect of the present invention comprises a plurality of memory cells which are arranged in a plurality of rows and a plurality of columns, a plurality of word lines which are provided in correspondence to the plurality of rows, a plurality of main bit lines which are provided in correspondence to the plurality of columns, and a source line which is provided in common for the plurality of memory cells. The plurality of memory cells are divided into a plurality of sectors, each of which includes a plurality of memory cells arranged in a plurality of rows and a plurality of coles.

This nonvolatile semiconductor memory device further comprises a plurality of subbit line groups which are provided in correspondence to the plurality of sectors, and a first connection circuit which selectively connects one of the plurality of subbit line groups to the plurality of main bit lines. Each of the plurality of subbit line groups includes a plurality of subbit lines which correspond to a plurality of columns in a corresponding sector.

Each of the plurality of memory cells includes a control gate which is connected to a corresponding word line, a drain which is connected to a corresponding subbit line, a source which is connected to the source line, and a floating gate.

This nonvolatile semiconductor memory device further comprises an electron injecting circuit and an electron extracting circuit. The electron injecting circuit simultaneously injects electrons into the floating gates of a plurality of memory cells which are provided in a selected sector in erasing. The electron extracting circuit extracts electrons from the floating gate of a selected memory cell in programming.

In this nonvolatile semiconductor memory device, it is possible to subdivide an erase unit by the main- and subbit line structure. Further, disturbance between the sectors is avoided in programming. In addition, bitwise program control is enabled on a bit basis.

The plurality of memory cells may be formed in a well. The nonvolatile semiconductor memory device may further comprise a positive voltage generating circuit and a negative voltage generating circuit. The positive voltage generating circuit receives a power supply voltage from the exterior, to generate a prescribed positive voltage. The negative voltage generating circuit receives a power supply voltage from the exterior, to generate a prescribed negative voltage.

The electron injecting circuit includes a first voltage applying circuit which receives the positive and negative voltages from the positive and negative voltage generating circuits and applies a prescribed positive voltage to word lines corresponding to a selected sector while applying a prescribed negative voltage to the well thereby injecting electrons into the floating gates of a plurality of memory cells provided in the selected sector by a tunnel effect in erasing.

The electron extracting circuit includes a second voltage applying circuit which receives the positive and negative voltages from the positive and negative voltage generating circuits and applies a prescribed negative voltage to a selected word line while applying a prescribed positive voltage to a selected main bit line thereby extracting electrons from the floating gate of a selected memory cell by a tunnel effect in programming.

In the nonvolatile semiconductor memory device, erasing and programming are performed by a tunnel effect. Thus, power consumption is reduced in erasing and programming, whereby positive and negative voltages can be generated in the chip from an external power supply voltage which is supplied from a single power supply. As the result, a flash memory operating by a single power supply is obtained.

The nonvolatile semiconductor memory device may further comprise a plurality of capacitance elements which are provided in correspondence to the plurality of main bit lines, and a second connection circuit. The second connection circuit connects the plurality of capacitance elements to the plurality of main bit lines respectively in programming.

In programming of the nonvolatile semiconductor memory device, charges are stored in the capacitance elements by voltages of the main bit lines. When the plurality of main bit lines are switched at a high speed, therefore, reduction of the voltages of the main bit lines is suppressed. Thus, the programming is stably performed in a short time.

The source line may be separated into a plurality of parts in correspondence to the plurality of sectors. The nonvolatile semiconductor memory device may further include a potential setting circuit, which sets parts of the source line corresponding to selected and nonselected sectors at different potentials in erasing.

In the nonvolatile semiconductor memory device, source potentials of memory cells provided in selected and nonselected sectors are made different from each other in erasing, whereby the memory cells provided in the selected sector can be stably erased while data stored in the memory cells provided in the nonselected sector can be reliably protected.

The nonvolatile semiconductor memory device may further comprise a capacitance element and a third connection circuit, which connects the capacitance element to the source line in erasing.

In this nonvolatile semiconductor memory device, it is possible to increase leakage times of source potentials of the memory cells by connecting the capacitance element to the source line in erasing. Thus, the memory cells can be stably erased.

The electron extracting circuit may include a voltage applying circuit. This voltage applying circuit precharges a selected main bit line at a prescribed potential in accordance with data while applying a prescribed voltage to a selected word line, then temporarily grounds the source line and thereafter applies a negative voltage to the selected word line.

In this case, the selected main bit line is precharged at the prescribed potential and the prescribed voltage is applied to the selected word line, whereafter the source line is temporarily grounded. Thus, a current flows in a memory cell whose threshold voltage is reduced below a prescribed value to be programmed. Thus, the voltage of the main bit line is reduced.

On the other hand, no current flows in a memory cell whose threshold voltage is not reduced below the prescribed value. Thus, the voltage of the main bit line is held. When a negative voltage is subsequently applied to the word line, therefore, only a memory cell having a high threshold voltage is programmed. As the result, no verify operation is required in programming.

In accordance with another aspect of the present invention, a nonvolatile semiconductor memory device includes a memory cell array having a plurality of memory cells arranged in rows and columns. Each memory cell includes a control gate, a floating gate, a drain and a source. The nonvolatile semiconductor memory device further includes a plurality of main bit lines each provided in one corresponding column of the memory cell array, a plurality of subbit lines, each connected to the drain of memory cells in a corresponding one column of the memory cell array, a plurality of switching transistors, each responsive to an externally applied address signal for connecting a corresponding one of the plurality of main bit lines to a corresponding one of the plurality of subbit lines, a plurality of word lines, each connected to the control gate of the memory cells in a corresponding one row of the memory cell array, a source line connected to the sources of the plurality of memory cells, a row decoder responsive to an externally applied address signal for selectively applying a negative voltage to the plurality of word lines, and a positive voltage applying circuit responsive to an externally applied operation mode control signal for supplying a positive voltage to a source line.

In operation, the row decoder selectively supplies a negative voltage to a plurality of word lines, and the positive voltage applying circuit applies a positive voltage to a source line. Therefore, the difference of the voltages applied to a word line selected by the row decoder and a non-selected word line is reduced. As a result, the row decoder can be formed on a smaller occupying area.

In accordance with a further aspect of the present invention, a nonvolatile semiconductor memory device includes a main bit line formed on a semiconductor substrate, first and second subbit lines provided in series, each being formed parallel to the main bit line, first and second switching transistors, each responsive to a sector select signal for connecting the main bit line to a corresponding first or second subbit line, a first memory cell group including a plurality of memory cells each connected to the first subbit line, and a second memory cell group including a plurality of memory cells each connected to the second subbit line. Each memory cell includes a control gate and a floating gate formed on a semiconductor substrate, and a drain and a source formed in the substrate. Each memory cell is connected to a corresponding first or second subbit line via the drain. The nonvolatile semiconductor memory device further includes an insulating layer insulating a memory cell in the first memory cell group located closest to the second memory cell from a memory cell in the second memory cell group located closest to the first memory cell group.

In operation, the memory cells located closest to the first and the second memory cell groups are insulated by the insulating layer formed in the substrate. Therefore, a higher integration density can be achieved in comparison with the case where a transistor for isolation is used.

In accordance with still another aspect of the present invention, a nonvolatile semiconductor memory device includes a main bit line, first and second subbit lines provided in series, and each parallel to the main bit line, first and second switching transistors, each responsive to a sector select signal for connecting the main bit line to a corresponding first or second subbit line, a first memory cell group including n memory cells (n≧2) each connected to the first subbit line, and a second memory cell group including n memory cells, each connected to the second subbit line. Each memory cell includes a control gate, a floating gate, a drain, and a source. Each memory cell is connected to a corresponding first or second subbit line via the drain. The nonvolatile semiconductor memory device further includes n connection lines, connecting the control gate of the j-th (j=1, 2, . . . , n) memory cell in the first memory cell group located in a direction away from the second memory cell group to the control gate of the j-th memory cell of the second memory cell group located in a direction away from the first memory cell group, and a row decoder responsive to an externally applied address signal for selecting one of the n connection lines.

In operation, n connection lines are connected to respective memory cells in the above-described manner, wherein the row decoder selects one of the n connection lines in response to an externally applied address signal. Because the connection manner of the n connection lines to the row decoder is simplified, a higher integration density is obtained.

In accordance with a still further aspect of the present invention, a nonvolatile semiconductor memory device includes a memory cell array having a plurality of memory cells arranged in rows and coles. Each memory cell includes a control gate, a floating gate, a drain and a source. The nonvolatile semiconductor memory device further includes a plurality of main bit lines each provided in one corresponding column in the memory cell array, a plurality of subbit lines each connected to the drain electrode of the memory cells of one corresponding column in the memory cell array, a plurality of switching transistors each responsive to an externally applied address signal for connecting a corresponding one of the plurality of main bit lines to a corresponding one of the plurality of subbit lines, a plurality of word lines each connected to the control gate of the memory cells of a corresponding one row in the memory cell array, a circuit generating a predetermined positive voltage, a circuit generating a predetermined negative voltage, a row decoder responsive to an externally applied address signal for selecting one of the plurality of word lines, and a switching circuit connected to receive a positive voltage, a negative voltage, and an externally applied word line voltage, and responsive to an externally applied test mode signal for applying an externally applied word line voltage to the row decoder. The row decoder includes a first complementary type circuit including P type and N type field effect transistors. The switching circuit includes a second complementary type circuit including P type and N type field effect transistors. An externally applied word line voltage is provided to a word line selected by the row decoder via the first and second complementary type circuits.

In a test mode operation, an externally applied word line voltage is provided to the word line via the first and second complementary type circuits, whereby the voltage level is not reduced in the voltage path. Therefore, a desired voltage can be applied to a selected word line. As a result, testing of a word line can be carried out under a predetermined condition of word line voltage.

A voltage generating circuit in accordance with yet a further aspect of the present invention includes a semiconductor substrate of a first conductivity type, and a plurality of capacitors each having first and second electrodes. The plurality of capacitors have the first electrodes connected to receive alternately first and second complementary clock signals. The voltage generating circuit further includes a plurality of diodes each formed in the substrate. Each diode includes a second conductivity type well formed in the substrate, a first conductivity well formed in the second conductivity type well, regions supplying the potential of a preceding stage to the first and second conductivity type wells, and a second conductivity type impurity region formed in the first conductivity type well. The second conductivity type impurity region is connected to a corresponding second electrode of the plurality of capacitors.

In operation, parasitic bipolar transistor is not induced because a triple well structure is established in the substrate. Therefore, erroneous operation in the voltage generating circuit is prevented.

In accordance with a still further aspect of the present invention, the nonvolatile semiconductor memory device includes a semiconductor substrate having a main surface including first and second element forming regions; a plurality of memory transistors formed in the first element forming region allowing electrical writing and erasure by a control gate and a floating gate; a sub bit line electrically connected to the drain region of each of the plurality of memory transistors; and a select gate transistor formed in the first element forming region. The sub bit line is electrically connected to one of the source/drain regions of the select gate transistor. The nonvolatile semiconductor memory device of this aspect further includes a main bit line electrically connected to the other one of the source/drain regions of the select gate transistor; a first well region formed in the semiconductor substrate to surround the first element forming region; and a second well region of a conductivity type different from that of the first well region, formed in the semiconductor substrate to surround the first well region. When a voltage is applied to the first well region, the junction between the first and second well regions is set to the reverse-bias state. By the second well region, the first element forming region and the second element forming region are insulated.

In the nonvolatile semiconductor memory device described above, when a voltage is applied to the first well region, junction between the first and second well regions is set to the reverse-bias state. Therefore, even when a voltage is applied to the first well region, current does not flow to the second element forming region.

Therefore, in the nonvolatile semiconductor memory device described above, a voltage can be applied to the first well region. When a voltage, the sign of which is different from that of the voltage applied to the first well region, is applied to the control gate, the potential difference between the first well region and the control gate can be enlarged relatively, while the maximum voltage in the semiconductor substrate can be lowered, whereby channel FN can be generated. Therefore, carriers can be introduced to the floating gate by the channel FN. In a still further aspect, this is utilized for erasing operation of the nonvolatile semiconductor memory device.

In the nonvolatile semiconductor memory device described above, the sub bit line is connected to the drain region of each of the plurality of memory transistors. Therefore, it is not necessary to operate other memory transistors when reading of a memory transistor is to be carried out, and therefore the speed of operation in reading can be increased as compared with the NAND type device.

Further, in the nonvolatile semiconductor memory device described above, the bit line is divided into a main bit line and a sub bit line. The main bit line and the sub bit line are rendered conductive by the select gate transistor. Therefore, one sub bit line can be electrically isolated from the other sub bit line while sharing the same main bit line. Therefore, when writing operation is done using one sub bit line, the other bit line can be electrically separated from the said one sub bit line. Therefore, in memory transistors connected to the other sub bit line, drain disturb does not occur in this writing operation.

In the nonvolatile semiconductor memory device described above, data writing operation can be realized by drain FN. Therefore, writing operation can be carried out at high efficiency, and the current flowing through the bit line can be reduced. Since the current flowing through the bit line can be reduced, a material having large resistance value can be used as a material of the bit line, and therefore the bit line can be formed of a material other than aluminum. Therefore, the bit line can be formed to have the two-layered structure of the main and sub bit lines.

Further, in the nonvolatile semiconductor memory device described above, the memory transistor can be set to the written state by the drain FN. Therefor, as compared with the NOR type device in which writing operation is carried out by channel hot electrons, efficiency in writing can be improved, and therefore power consumption can be reduced.

According a still further aspect, in the nonvolatile semiconductor memory device of the present invention, a voltage is applied to the first well region, a voltage having a sign different from that of the voltage applied to the first well region is applied to the control gate, and by FN (Fowler Nordheim) tunnelling (channel FN) at the entire surface of the channel region, carriers are introduced to the floating gate, thus setting the memory transistor to the erased state; and a voltage is applied to the main bit line, a voltage having a sign different from that of the voltage applied to the main bit line is applied to the control gate, and by the FN (Fowler Nordheim) tunnelling (drain FN) at a portion of overlap between the drain region and the floating gate, carriers are drawn out from the floating gate, thus setting the memory transistor to the written state.

In accordance with a still further aspect of the present invention, the nonvolatile semiconductor memory device is assumed to be the device including a substrate of a first conductivity type having a main surface, an impurity region of the second conductivity type serving as a bit line formed on the main surface of the semiconductor substrate, first and second floating gates formed on the main surface of the semiconductor substrate with insulating films interposed therebetween to sandwich the impurity region of the second conductivity type, and a control gate formed to extend over the first and second floating gates with an insulating film interposed therebetween. The first floating gate is formed at a position partially overlapping with one end of the impurity region, and the second floating gate is formed at a position not overlapping but apart from the other end of the impurity region.

In the nonvolatile semiconductor memory device described above, the second floating gate is formed not to overlap with the impurity region. Therefore, when the transistor is erased by introducing electrons to all the floating gates and then information is to be written by drawing out electrons from the first floating gate, erroneous drawing out of the electrons from the second floating gate adjacent to the first floating gate can be prevented. Namely, erroneous operation can be prevented.

In accordance with a still further aspect of the present invention, in the nonvolatile semiconductor memory device, the aforementioned impurity region includes a first impurity region of a second conductivity type having relatively higher concentration and a second impurity region of the second conductivity type having relatively low concentration. The first floating gate is formed at a position partially overlapped with one end of the first and second impurity regions, and the second floating gate is formed at a position not overlapping but apart from the other end of the first impurity region and partially overlapping with the other end of the second impurity region.

In this nonvolatile semiconductor memory device also, since the second floating gate is not overlapped with the other end of the first impurity region, erroneous operation of the nonvolatile semiconductor memory device can be prevented similarly as described above.

In a method of programming information in the nonvolatile semiconductor memory device according to the present invention, first, electrons are introduced to all the floating gates from the entire surface of the channel region by FN (Fowler Nordheim) phenomenon. This state corresponds to the erased state. By the FN phenomenon at a region where the floating gate and the impurity region are overlapped with each other, electrons are drawn out from a desired floating gate, so that the information is written.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows erased and programmed states in the first to twelfth embodiments in comparison with the prior art;

FIG. 14 illustrates conditions of voltage application in batch erase, program and read operations in the third embodiment;

FIG. 15 illustrates conditions of voltage application in batch page erase, program and read operations in the fourth embodiment;

FIG. 16 is a flow chart for illustrating a rewrite operation in the fourth embodiment;

FIG. 26 is a circuit diagram showing the voltage applied in the memory cell array of the embodiment of the sixth embodiment.

FIGS. 77–95 are sectional views of the memory transistor region of the fourteenth embodiment of a nonvolatile semiconductor memory device in accordance with the present invention, respectively showing the first to nineteenth steps of the manufacturing method thereof.

FIGS. 102–106 are sectional views of the source line contact region and the drain contact region of the fourteenth embodiment of a nonvolatile semiconductor memory device in accordance with the present invention, respectively showing the first to fifth steps of the manufacturing method thereof.

FIG. 130 illustrates conditions of voltage application for a memory cell in program and erase operations in the conventional flash memory;

FIG. 147 is a circuit diagram showing the voltage applied to the memory cell array of a conventional flash memory.

FIG. 156 is a view showing a nonvolatile semiconductor memory device having a memory cell array of a conventional virtual ground structure, in which (a) is a plan view and (b) is a sectional view thereof taken along line 156b—156b of (a).

DESCRIPTION OF THE PREFERRED EMBODIMENTS

First, relations between program and erase operations and threshold voltages in first to twelveth embodiments of the present invention are described in comparison with those in the prior art.

Figure 1:
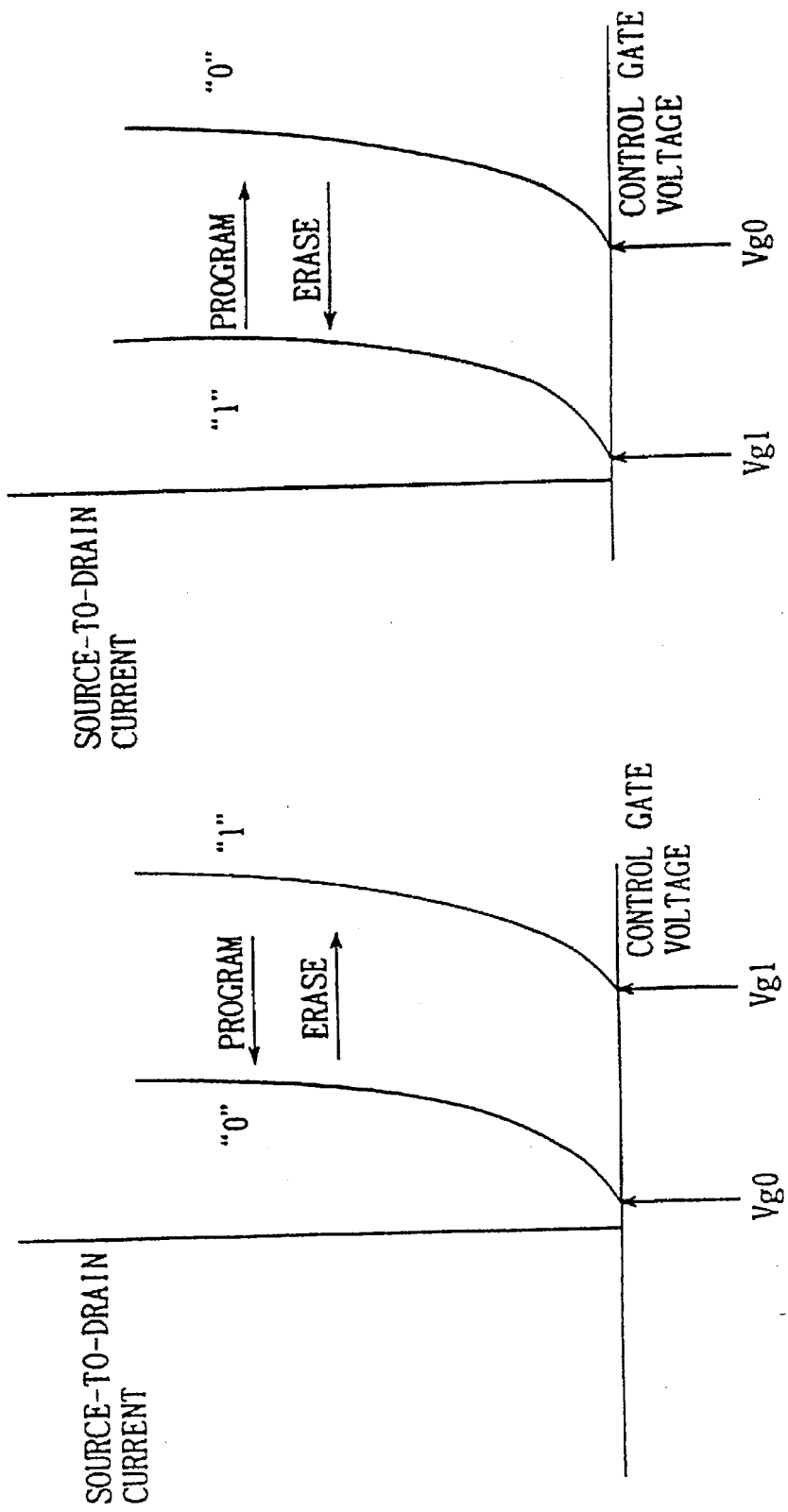
FIG. 1 shows relations between program and erase operations and threshold voltages in first to twelveth embodiments of the present invention in comparison with those in the prior art.

In the prior art, the threshold voltage of a memory cell is increased by a program operation while the same is reduced by an erase operation, as shown at (b) in FIG. 1. In each embodiment of the present invention, on the other hand, the threshold voltage of a memory cell is reduced by a program operation while the same is increased by an erase operation, as shown at (a) in FIG. 1.

In the prior art, electrons are emitted from the floating gate of a memory cell which is in an erased state so that its threshold voltage is reduced as shown at (b) in FIG. 2. In a memory cell which is in a programmed state, on the other hand, electrons are injected into the floating gate so that its threshold voltage is increased.

In each embodiment of the present invention, electrons are injected into the floating gate of a memory cell which is in an erased state so that its threshold voltage is increased as shown at (a) in FIG. 2. In a memory cell which is in a programmed state, on the other hand, electrons are emitted from the floating gate so that its threshold voltage is reduced.

In both of the embodiments and the prior art, the erased state corresponds to data "1" and the programmed state corresponds to data "0".

Figure 3:
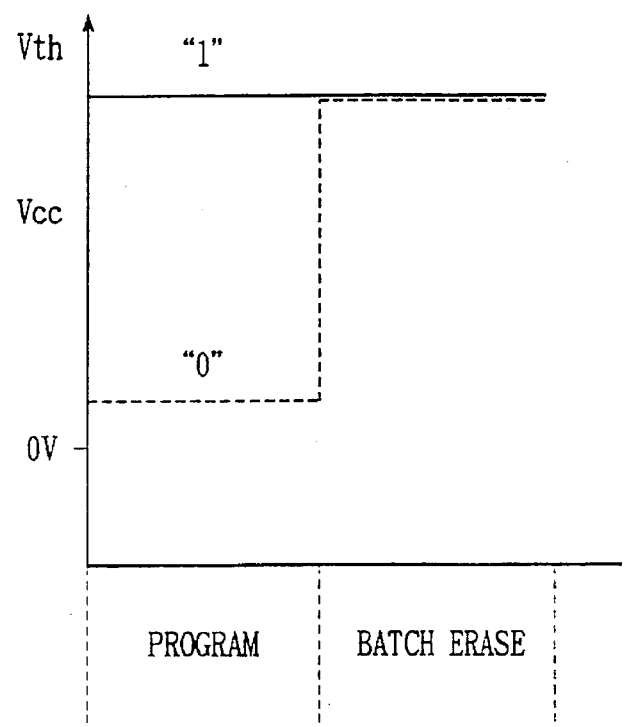
FIG. 3 illustrates threshold voltages in batch erasing in the first to twelfth embodiments.

Thus, according to the present invention, the threshold voltage of each memory cell is increased by an erase operation, whereby it is possible to increase the threshold voltages of all memory cells beyond a source voltage Vcc by a batch erase operation while performing no pre-erase write operation, as shown in FIG. 3.

Figure 4:
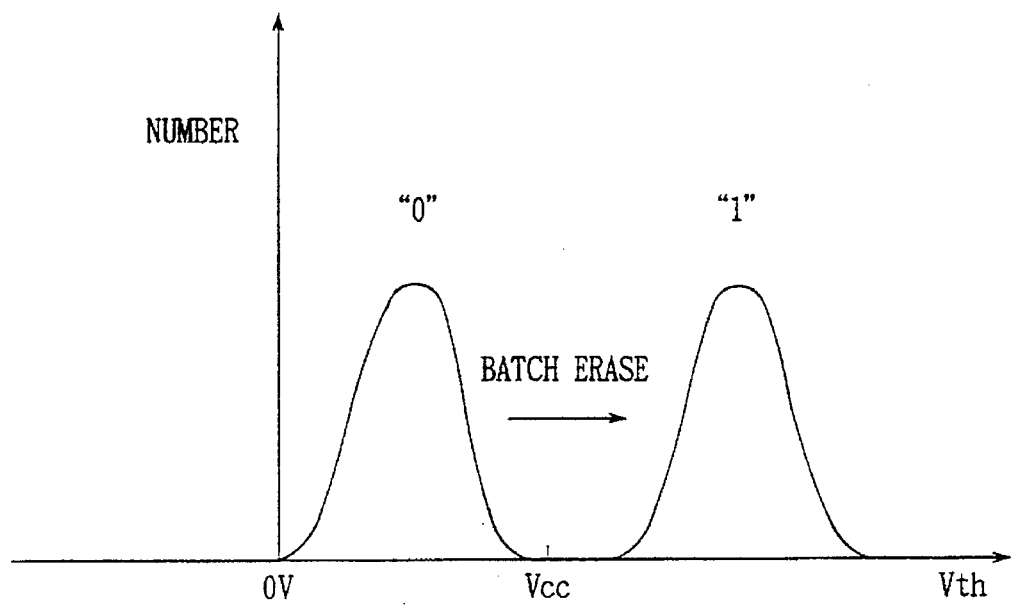
FIG. 4 illustrates changes of the threshold voltages caused by batch erasing in the first to twelfth embodiments.

Even if a plurality of memory cells are dispersed in threshold voltage, no memory cell is depressed by a batch erase operation, as shown in FIG. 4.

(1) First Embodiment (FIGS. 5 to 8)

Figure 5:
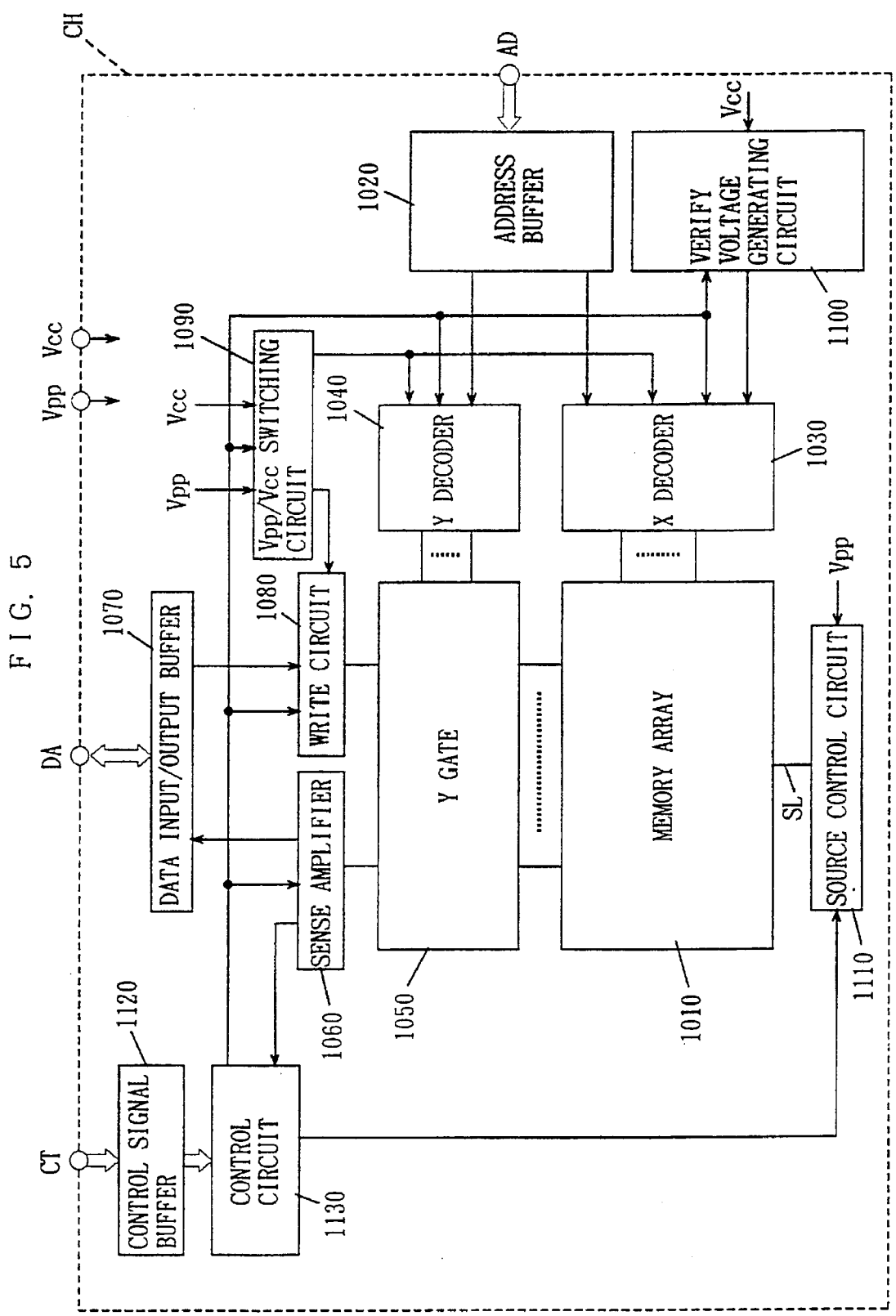
FIG. 5 is a block diagram showing the overall structure of a flash memory according to the first embodiment.

(a) Overall Structure of Flash Memory (FIG. 5)

Figure 131:
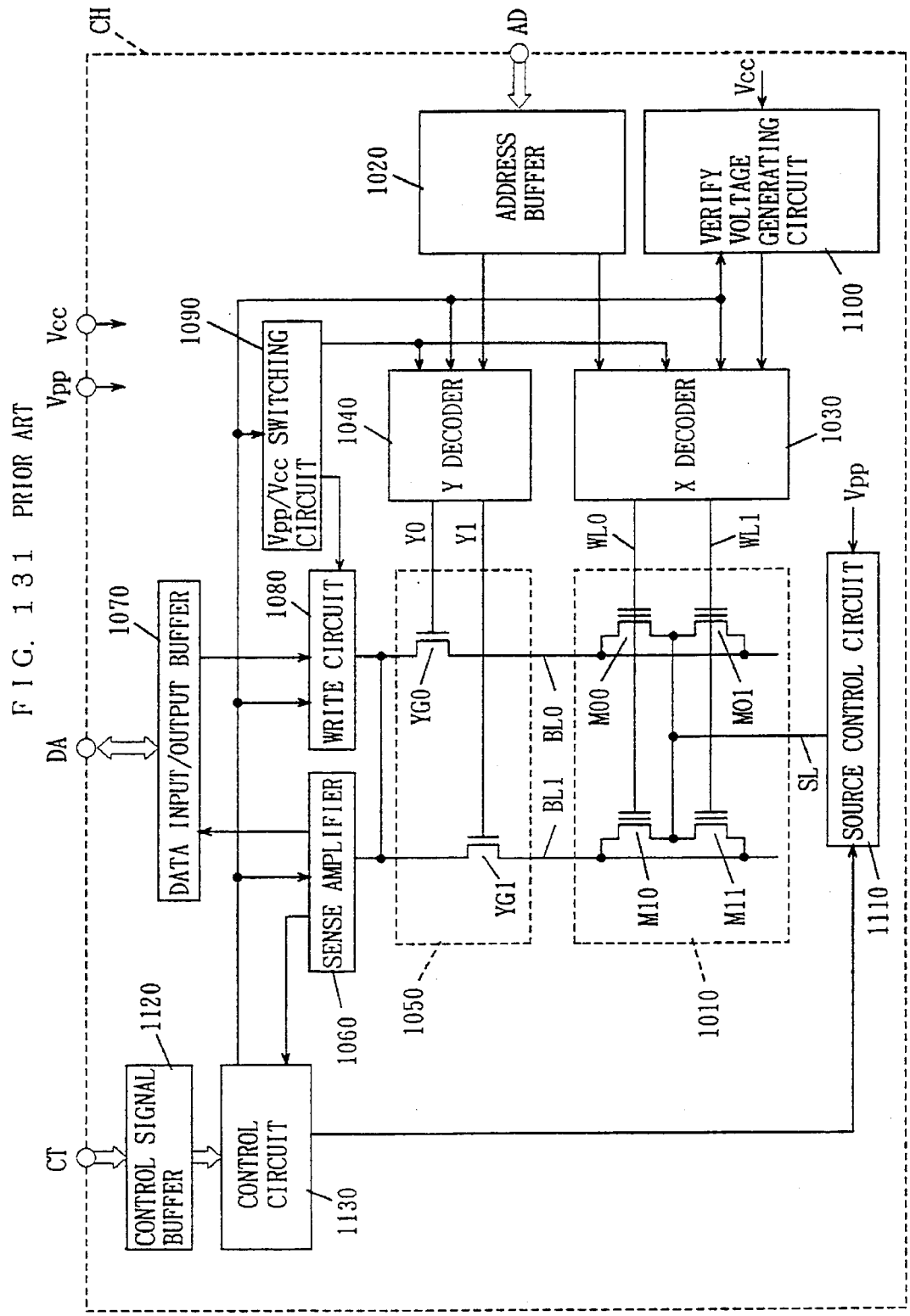
FIG. 131 is a block diagram showing the overall structure of a conventional flash memory.

FIG. 5 is a block diagram showing the overall structure of a flash memory according to the first embodiment. The overall structure of the flash memory shown in FIG. 5 is similar to that of the conventional flash memory shown in FIG. 131, except conditions of voltage application in respective operations. The flash memory shown in FIG. 5 is also formed on a chip CH.

Figure 6:
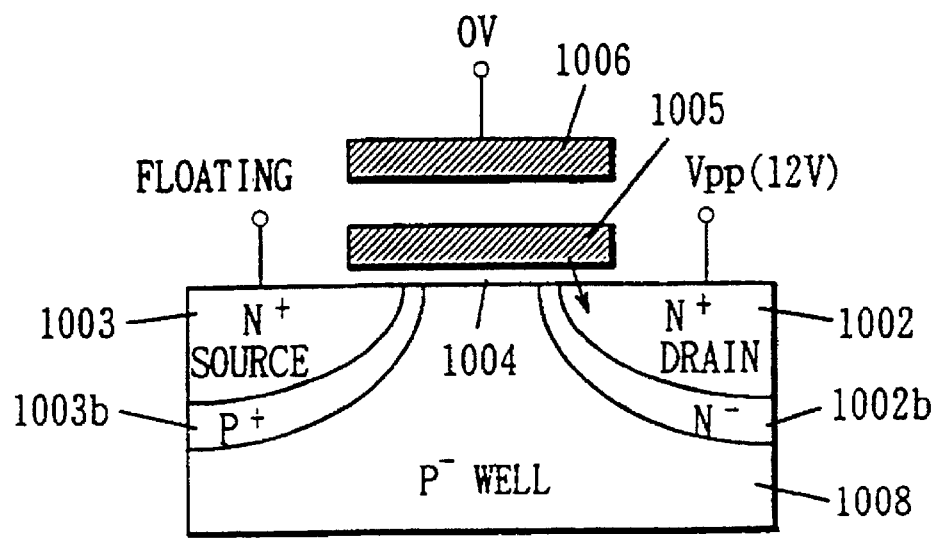
FIG. 6 illustrates conditions of voltage application for a memory cell in programming and erasing in the first embodiment.
Figure 6:
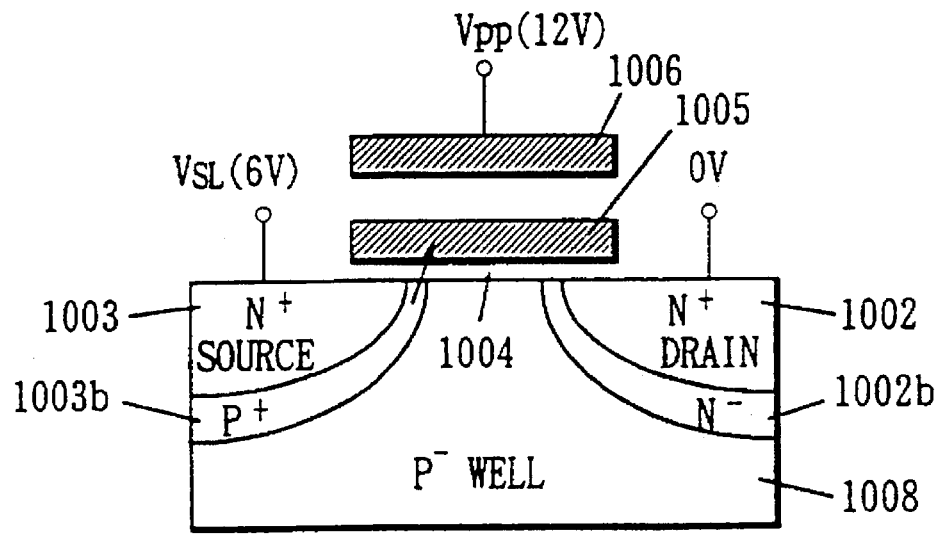

(b) Programming and Erasing of Memory Cell (FIG. 6)

FIG. 6 shows conditions of voltage application for a memory cell in programming and erasing at (a) and (b) respectively.

In programming, a high voltage Vpp (about 12 V in general) is applied to a drain 1002 and 0 V is applied to a control gate 1006, while a source 1003 is brought into a floating state, as shown at (a) in FIG. 6. Thus, a high electric field is generated across a floating gate 1005 and the drain 1002, so that electrons are emitted from the floating gate 1005 to the drain 1002 by a tunnel effect. As the result, the threshold voltage of the memory cell is reduced.

In erasing, 0 V is applied to the drain 1002, a high voltage Vpp (about 12 V in general) is applied to the control gate 1006 and a prescribed high voltage $V_{SL}$ (6 V) is applied to the source 1003, as shown at (b) in FIG. 6. Thus, hot electrons by avalanche breakdown or channel hot electrons are generated in the vicinity of the source 1003. The hot electrons are accelerated by the high voltage Vpp of the control gate 1006, and jump over an energy barrier defined by an insulating film 1004, to be injected into the floating gate 1005. As the result, the threshold voltage of the memory cell is increased.

Thus, electrons are emitted from the floating gate 1005 to the drain 1002 by a tunnel effect in programming. Therefore, an $N^-$-type impurity region 1002b is provided along the drain 1002, in order to weaken the electric filed in the channel or substrate direction.

In erasing, on the other hand, electrons are injected into the floating gate 1005 from a portion close to the source 1003 by hot electrons. Therefore, a $P^+$-type impurity region 1003b is provided along the source 1003 so that a higher electric field is generated in the channel or substrate direction.

A $P^-$ well 1008 may be replaced by a $P^-$-type semiconductor substrate.

Figures 7A, 7B, 7C:
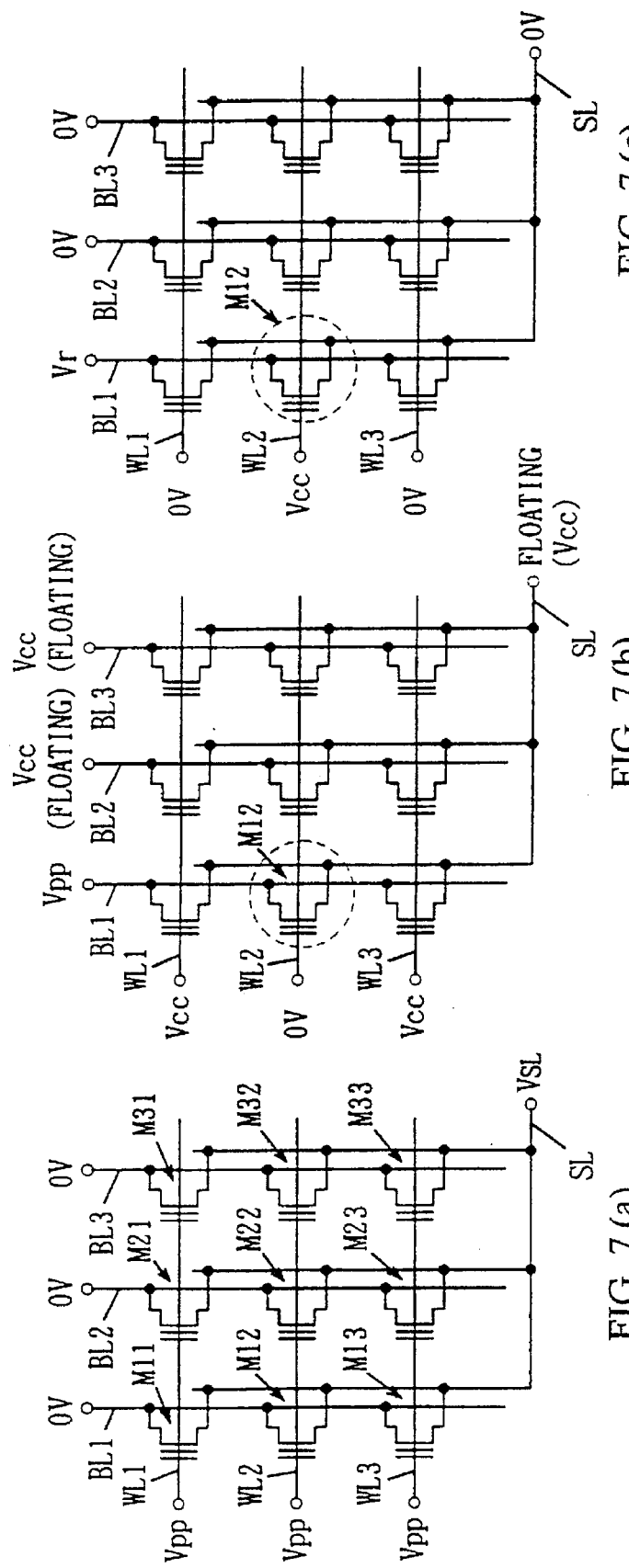
FIG. 7 illustrates conditions of voltage application in batch erase, program and read operations in the first embodiment.

(c) Operations of Flash Memory (FIG. 7)

Batch erase, program and read operations of the flash memory are now described with reference to FIG. 7. FIG. 7 shows memory cells M11 to M13, M21 to M23 and M31 to M33, which are parts of those included in a memory array 10.

(i) Batch Erase Operation ((a) in FIG. 7)

First, a control signal specifying a batch erase operation is supplied to a control circuit 1130 through a control signal buffer 1120. Further, a high voltage Vpp is externally supplied to a Vpp/Vcc switching circuit 1090.

The Vpp/Vcc switching circuit 1090 supplies the high voltage Vpp to an X decoder 1030. The X decoder 1030 selects all word lines WL1 to WL3, and applies the high voltage Vpp to the same. A Y decoder 1040 turns on all Y gate transistors which are included in a Y gate 1050. A write circuit 1080 applies 0 V to all bit lines BL1 to BL3 through the Y gate 1050. A source control circuit 1110 applies a prescribed high voltage $V_{SL}$ ($V_{SL}$<Vpp) to a source line SL.

Thus, voltages are applied to all memory cells M11 to M33, as shown at (b) in FIG. 6. As the result, all memory cells M11 to M33 are erased.

(ii) Program Operation ((b) in FIG. 7)

It is assumed here that the memory cell M12 is programmed. Namely, data "0" is written in the memory cell M12, while data "1" are written in the remaining memory cells.

First, a control signal specifying a program operation is supplied to the control circuit 1130 through the control signal buffer 1120. Further, a high voltage Vpp is externally supplied to the Vpp/Vcc switching circuit 1090.

The X decoder 1030 selects the word line WL2 in response to an x address signal received from an address buffer 1020, to apply 0 V to the selected word line WL2 while applying a source voltage Vcc to the nonselected word lines WL1 and WL3.

The Vpp/Vcc switching circuit 1090 supplies the high voltage Vpp to the write circuit 1080, to which data are sequentially supplied from the exterior through a data input/output buffer 1070. At this time, the Y decoder 1040 sequentially turns on the Y gate transistors provided in the Y gate 1050 in response to a Y address signal received from the address buffer 1020. The write circuit 1080 applies the high voltage Vpp to the bit line BL1 through the Y gate 1050, while applying the power supply voltage Vcc to the bit lines BL2 and BL3. The source control circuit 1110 brings the source line SL into a floating state.

Thus, voltages are applied to the memory cell M12, as shown at (a) in FIG. 6. At this time, each of the remaining memory cells is in one of the following states:

(A) The drain is impressed with the high voltage Vpp and the control gate is impressed with the power supply voltage Vcc, while the source is in a floating state.

(B) The drain is impressed with the source voltage Vcc and the control gate is impressed with 0 V, while the source is in a floating state.

(C) The drain and the control gate are impressed with the source voltage Vcc, while the source is in a floating state.

Consequently, a high electric field is generated only across the floating gate and the drain of the memory cell M12, so that only the memory cell M12 is programmed.

(iii) Read Operation ((c)in FIG. 7)

Figure 137:
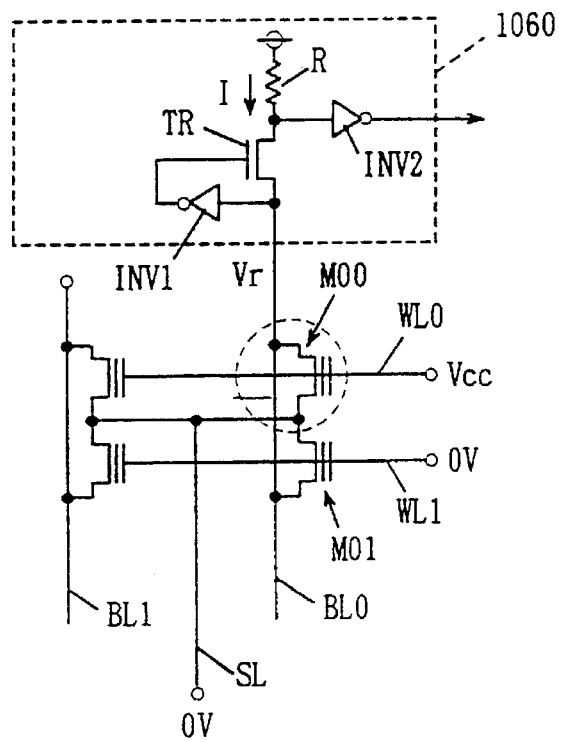
FIG. 137 illustrates conditions of voltage application in a read operation in the conventional flash memory.
Figure 138:
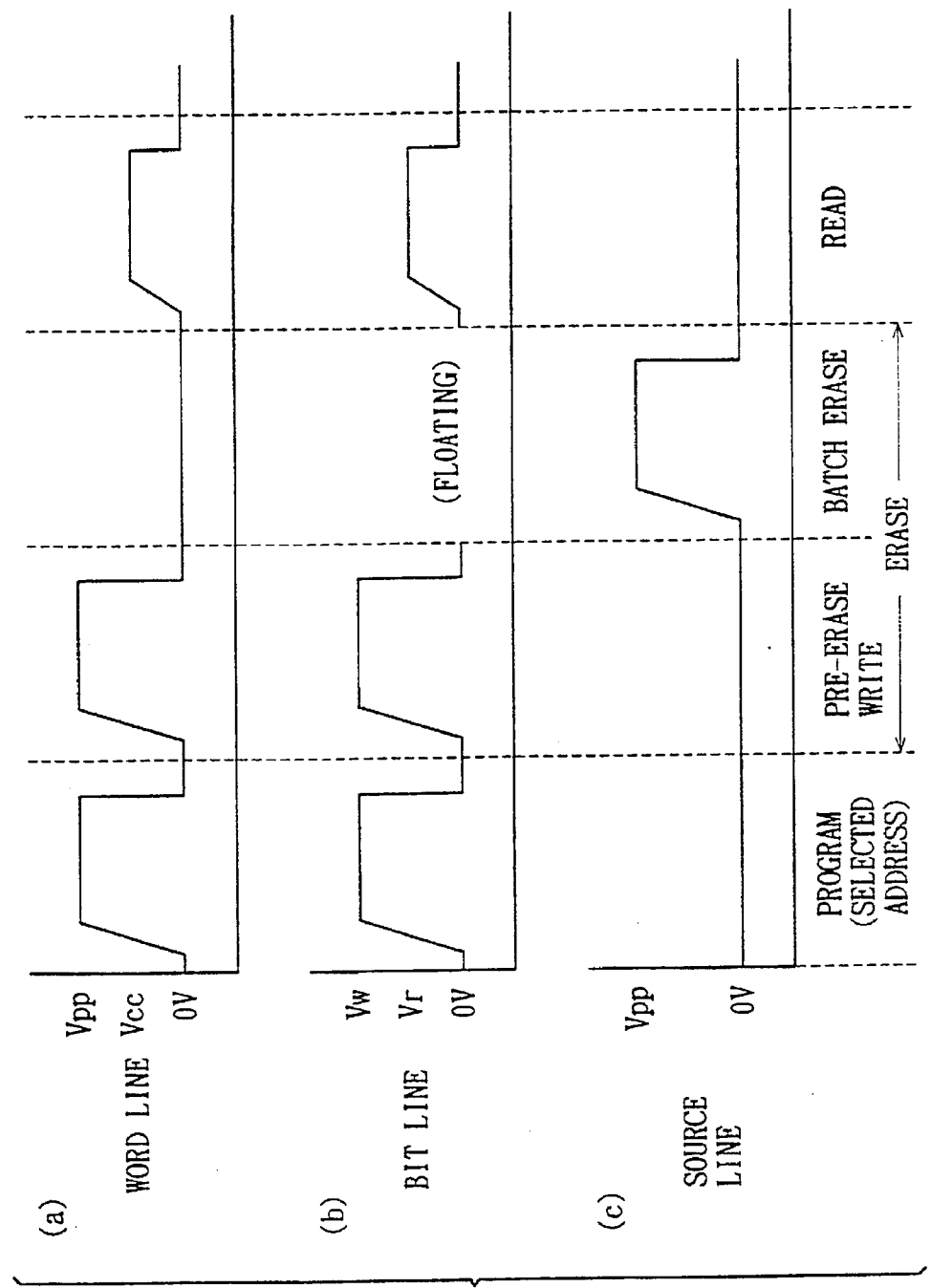
FIG. 138 illustrates voltages of respective lines in program, erase and read operations in the conventional flash memory.
Figure 139:
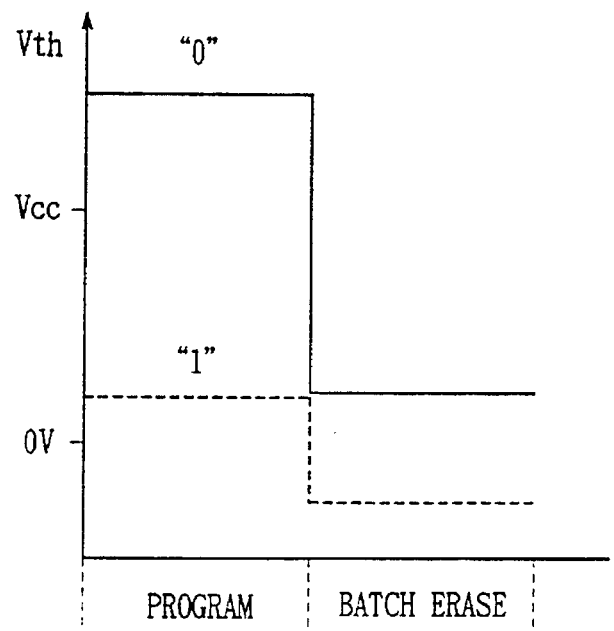
FIG. 139 illustrates threshold voltages in the case of performing a batch erase operation with no pre-erase write operation in the conventional flash memory.
Figure 140:
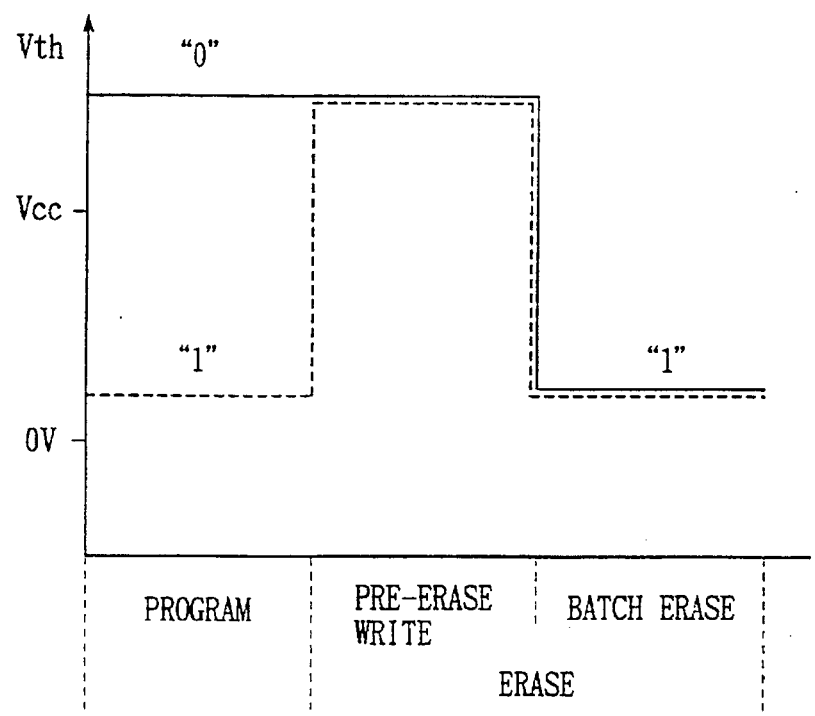
FIG. 140 illustrates threshold voltages in the case of performing a batch erase operation after a pre-erase write operation.
Figure 141:
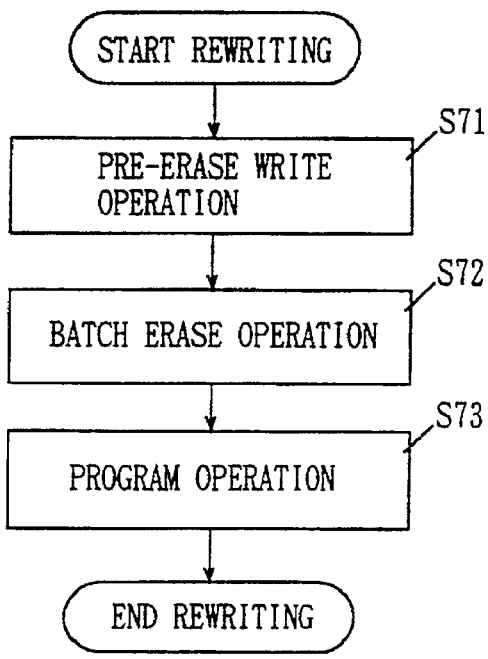
FIG. 141 is a flow chart for illustrating a rewrite operation in the conventional flash memory.
Figure 142:
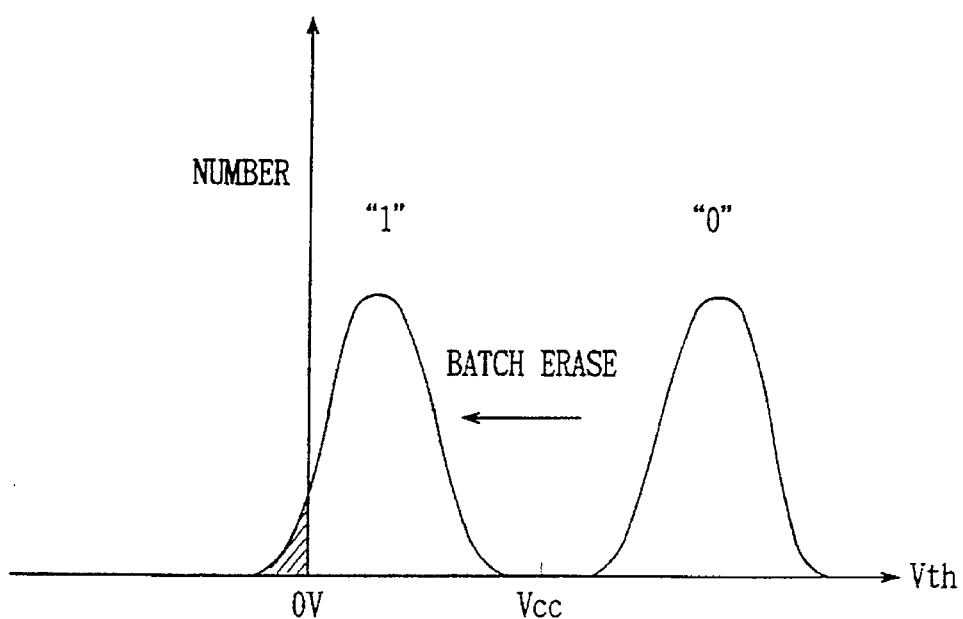
FIG. 142 illustrates changes of threshold voltages in the case of performing a batch erase operation in the conventional flash memory.
Figure 143:
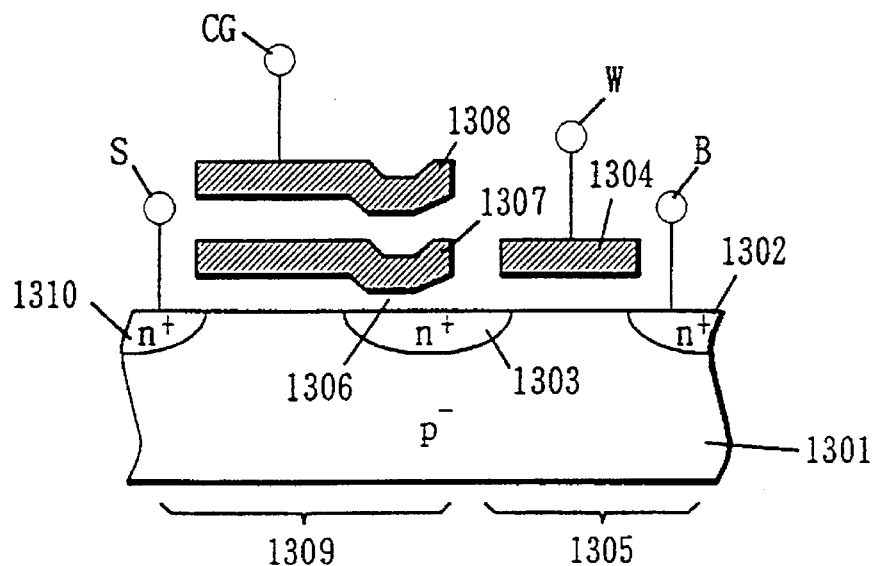
FIG. 143 is a sectional view showing the structure of a memory cell including a selection transistor.
Figure 144:
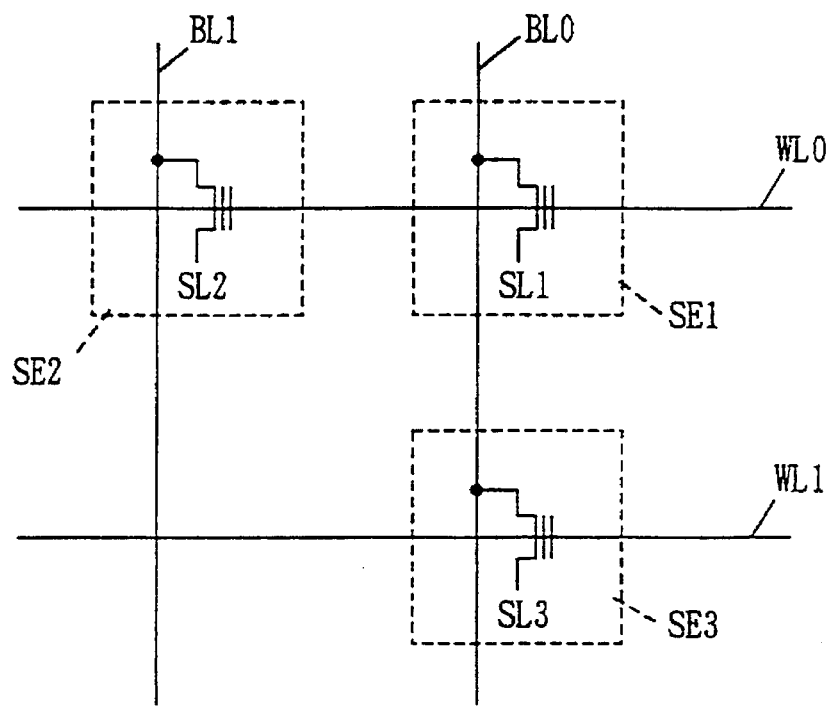
FIG. 144 is a diagram for illustrating disturbance in sectoring.

The read operation is substantially similar to that described above with reference to FIG. 137. It is assumed here that data is read from the memory cell M12. First, a control signal specifying a read operation is supplied to the control circuit 1130 through the control signal buffer 1120.

The X decoder 1030 selects the word line WL2 in response to an X address signal received from the address buffer 1020, to apply the power supply voltage Vcc to the same. At this time, the remaining word lines WL1 and WL3 are maintained at 0 V. The Y decoder 1040 turns on one Y gate transistor provided in the Y gate 1050 in response to a Y address signal received from the address buffer 1020. The source control circuit 1110 grounds the source line SL.

Thus, a read voltage Vr appears on the bit line BL1. This read voltage Vr is detected and amplified by a sense amplifier 1060, to be outputted to the exterior through the data input/output buffer 1070.

Figure 8:
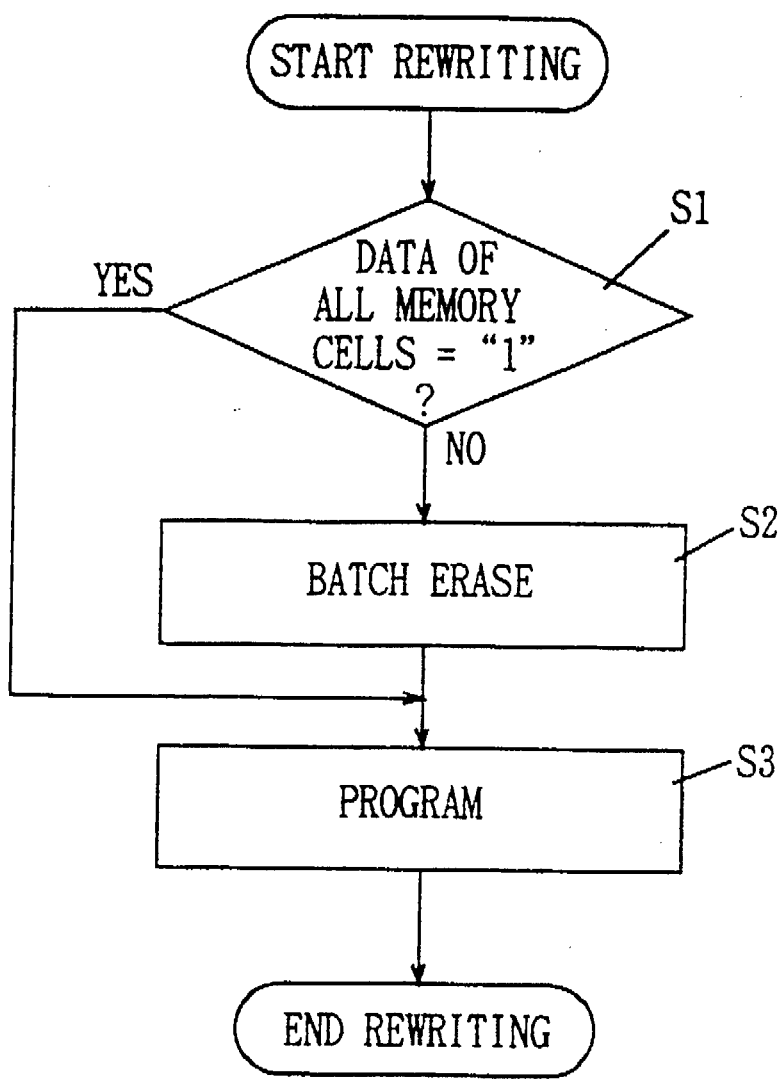
FIG. 8 is a flow chart for illustrating a rewrite operation in the first embodiment.

(d) Rewrite Operation (FIG. 8)

A data rewrite operation in this flash memory is now described with reference to a flow chart shown in FIG. 8.

First, a determination is made as to whether or not all memory cells store data "1" (step S1). If data "1" are not stored in all memory cells, a batch erase operation is performed (step S2). Thereafter a program operation is performed (step S3). Thus, it is possible to rewrite data with no pre-erase write operation, dissimilarly to the prior art.

(e) Modifications

The nonselected bit lines BL2 and BL3 may be brought into floating states in programming. At this time, each nonselected memory cell is in one of the following states:

(A) The drain is impressed with the high voltage Vpp and the control gate is impressed with the power supply voltage Vcc, while the source is in a floating state.

(B) The drain is in a floating state and the control gate is impressed with 0 V, while the source is in a floating state.

(C) The drain is in a floating state and the control gate is impressed with the power supply voltage Vcc, while the source is in a floating state.

Also in this case, a high electric field is generated only in a region between the floating gate and the drain of the memory cell M12, so that only the memory cell M12 is programmed by a tunnel effect.

In programming, the power supply voltage Vcc may be applied to the source line SL. At this time, the high voltage Vpp is applied to the drain of the memory cell M12, while 0 V is applied to the control gate and the power supply voltage Vcc is applied to the source. Each of the remaining memory cells is in one of the following states:

(A) The drain is impressed with the high voltage Vpp, while the control gate and the source are impressed with the power supply voltage Vcc.

(B) The drain is impressed with the power supply voltage Vcc and the control gate is impressed with 0 V, while the source is impressed with the power supply voltage Vcc.

(C) The drain, the control gate and the source are impressed with the power supply voltage Vcc.

Also in this case, a high electric field is generated only in a region between the floating gate and the drain of the memory cell M12, so that only the memory cell M12 is programmed by a tunnel effect.

In programming, the nonselected bit lines BL2 and BL3 may be brought into floating states and the power supply voltage Vcc may be applied to the source line SL. At this time, the high voltage Vpp is applied to the drain of the memory cell M12 and 0 V is applied to its control gate, while the power supply voltage Vcc is applied to its source. Each of the remaining memory cells is in one of the following states:

(A) The drain is impressed with the high voltage Vpp, while the control gate and the source are impressed with the power supply voltage Vcc.

(B) The drain is in a floating state and the control gate is impressed with 0 V, while the source is impressed with the power supply voltage Vcc.

(C) The drain is in a floating state, while the control gate and the source are impressed with the power supply voltage Vcc.

Also in this case, a high electric field is generated only in the region between the floating gate and the drain of the memory cell M12, so that only the memory cell M12 is programmed by a tunnel effect.

A verify operation may be performed after the batch erase operation. Further, electrons may be extracted from the control gates of all memory cells by application of 0 V and the high voltage Vpp to the control gates of all memory cells and the P⁻ well (or P⁻-type semiconductor substrate) respectively in advance of the batch erase operation, to thereafter perform the batch erase operation while carrying out a verify operation. Thus, it is possible to further reduce dispersion in threshold voltage of the batch-erased memory cells.

(f) Effect of First Embodiment

In the conventional flash memory, electrons are injected into the floating gate from the drain side. When the potential of a bit line is increased in a read operation, therefore, electrons may be injected into a selected memory cell from the drain, to cause a soft write phenomenon.

In the flash memory according to the first embodiment, on the other hand, electrons are injected into the floating gate from the source side. Thus, a soft write phenomenon is hard to occur in a read operation.

The verify operation may be performed simultaneously with the program operation, so that dispersion in threshold voltage of programmed memory cells can be reduced.

Figure 9:
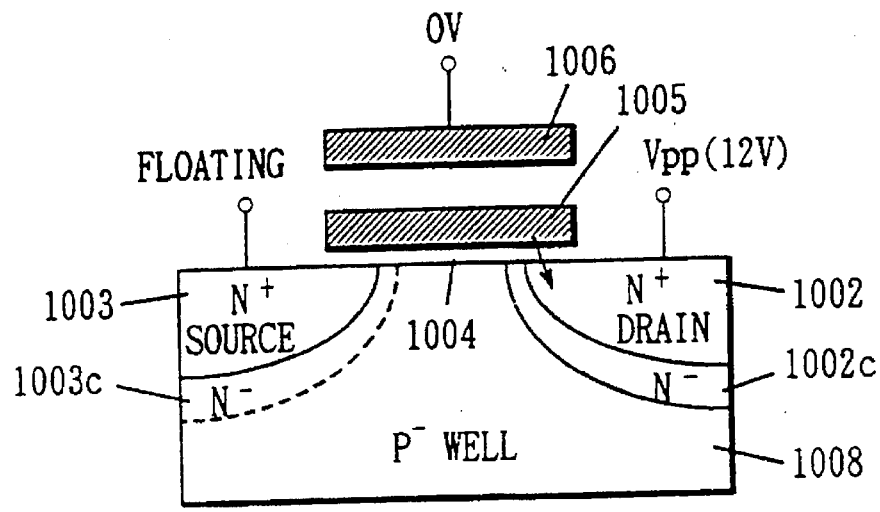
FIG. 9 illustrates conditions of voltage application for a memory cell in programming and erasing in the second embodiment.
Figure 9:
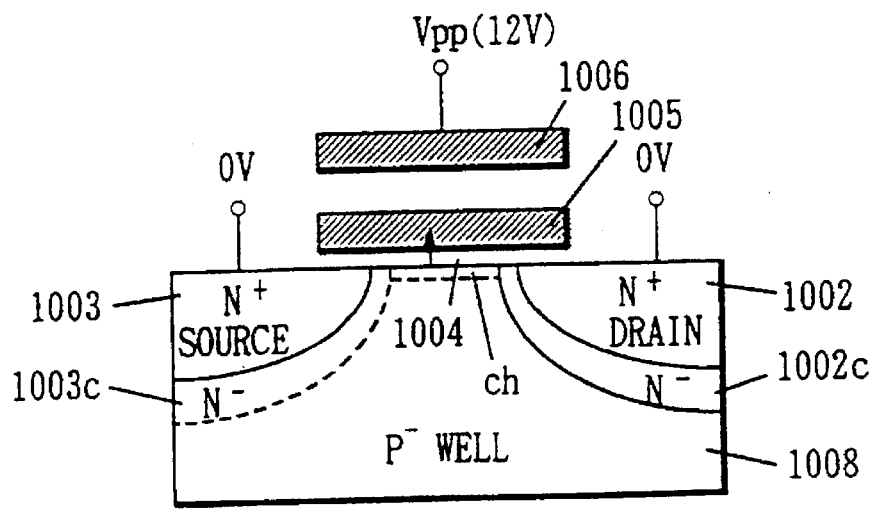
Figures 10A, 10B, 10C:
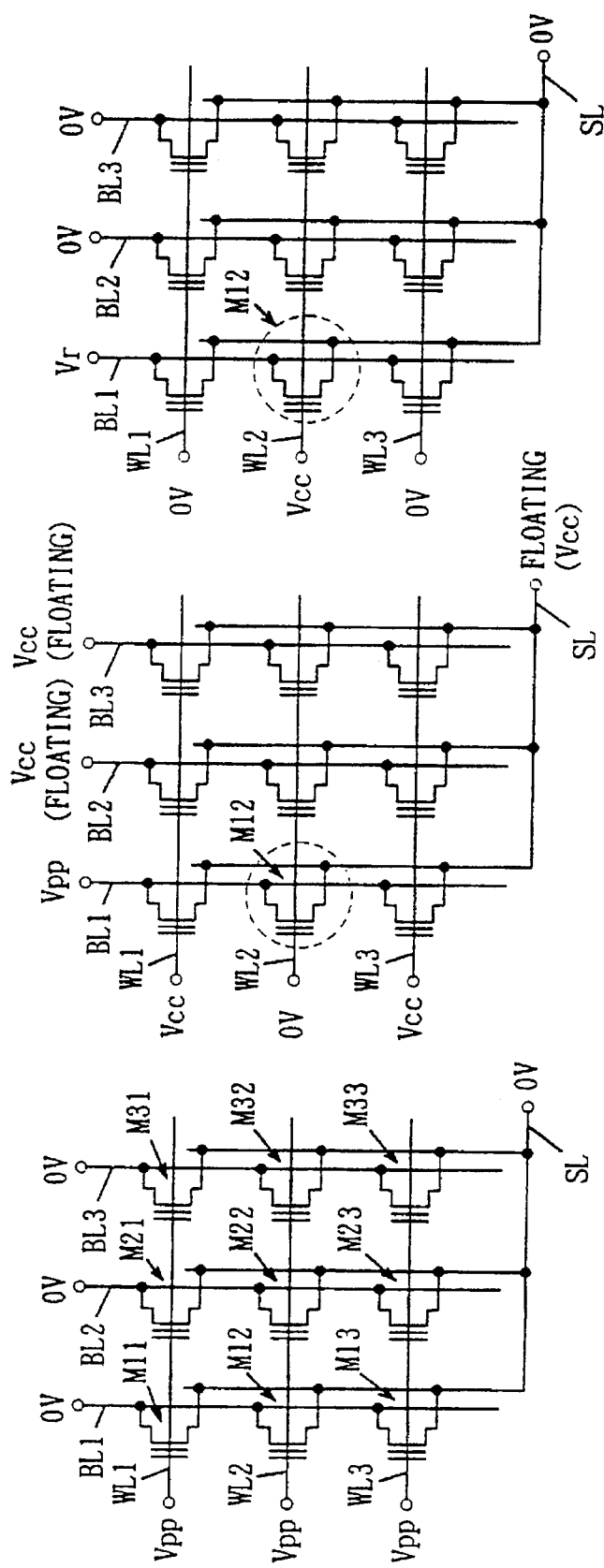
FIG. 10 illustrates conditions of voltage application in batch erase, program and read operations in the second embodiment.

(2) Second Embodiment (FIGS. 9 and 10)

The overall structure of a flash memory according to the second embodiment is similar to that shown in FIG. 5.

(a) Programming and Erasing of Memory Cell (FIG. 9)

Conditions of voltage application for a memory cell in programming and erasing are shown at (a) and (b) in FIG. 9 respectively. The conditions in programming are similar to those shown at (a) in FIG. 6.

In erasing, 0 V is applied to a drain 1002 and a high voltage Vpp (about 12 V in general) is applied to a control gate 1006 while 0 V is applied to a source 1003, as shown at (b) in FIG. 9. Thus, a channel ch is defined in a region between the source and the drain 1002, whereby a high electric field is generated across the channel ch and the floating gate 1005. Electrons are injected into the floating gate 1005 from the channel ch by a tunnel effect. As the result, the threshold voltage of the memory cell is increased.

According to this embodiment, electrons are emitted from the floating gate 1005 to the drain 1002 in programming by a tunnel effect. Therefore, an N⁻-type impurity region 1002c is provided along the drain 1002 in order to weaken the electric field in the channel or substrate direction.

Another N⁻-type impurity region 1003c may be provided along the source 1003. When such N⁻-type impurity regions 1002c and 1003c are provided on both drain and source sides, it is possible to reduce fabrication steps.

(b) Operation of Flash Memory (FIG. 10)

Batch erase, program and read operations of the flash memory are now described with reference to FIG. 10. The program and read operations are similar to those of the first embodiment. Therefore, only the batch erase operation is hereafter described.

First, a control signal specifying a batch erase operation is supplied to a control circuit 1130 through a control signal buffer 1120. Further, a high voltage Vpp is externally supplied to a Vpp/Vcc switching circuit 1090.

The Vpp/Vcc switching circuit 1090 supplies the high voltage Vpp to an X decoder 1030, which in turn selects all word lines WL1 to WL3 to apply the high voltage Vpp to the same. A Y decoder 1040 turns on all Y gate transistors which are included in a Y gate 1050. A write circuit 1080 applies 0 V to all bit lines BL1 to BL3 through the Y gate 1050. A source control circuit 1110 applies 0 V to a source line SL.

Thus, voltages are applied to all memory cells M11 to M33, as shown at (b) in FIG. 9. As the result, all memory cells M11 to M33 are erased.

A negative voltage may be positively applied to a P⁻ well (or a P⁻-type semiconductor substrate) in the batch erase operation.

The data are rewritten in the procedure shown in FIG. 8. Therefore, it is possible to rewrite the data with no pre-erase write operation, dissimilarly to the prior art.

(3) Third Embodiment (FIGS. 11 to 14)

Figure 11:
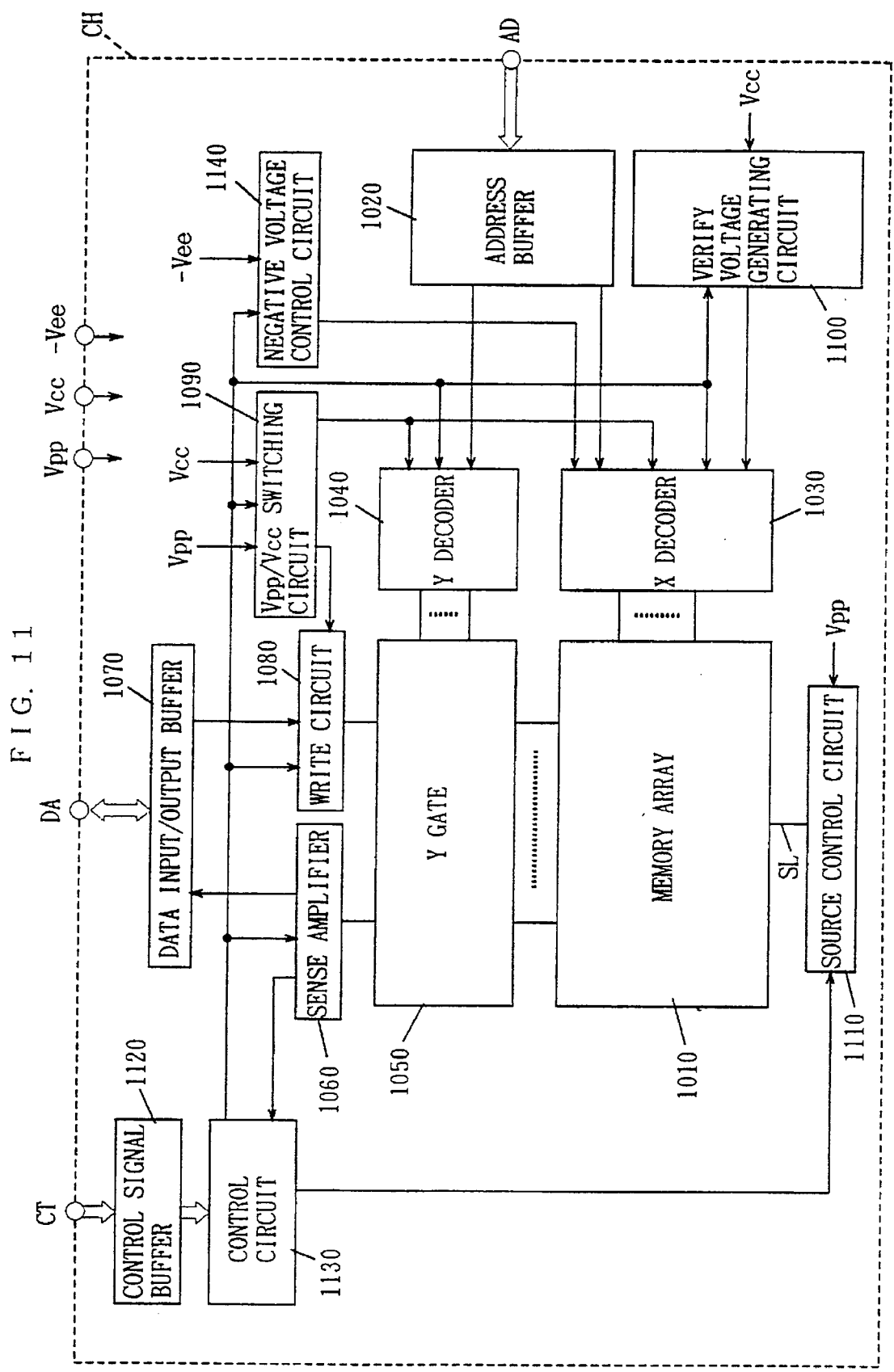
FIG. 11 is a block diagram showing the overall structure of a flash memory according to the third embodiment.
Figure 12:
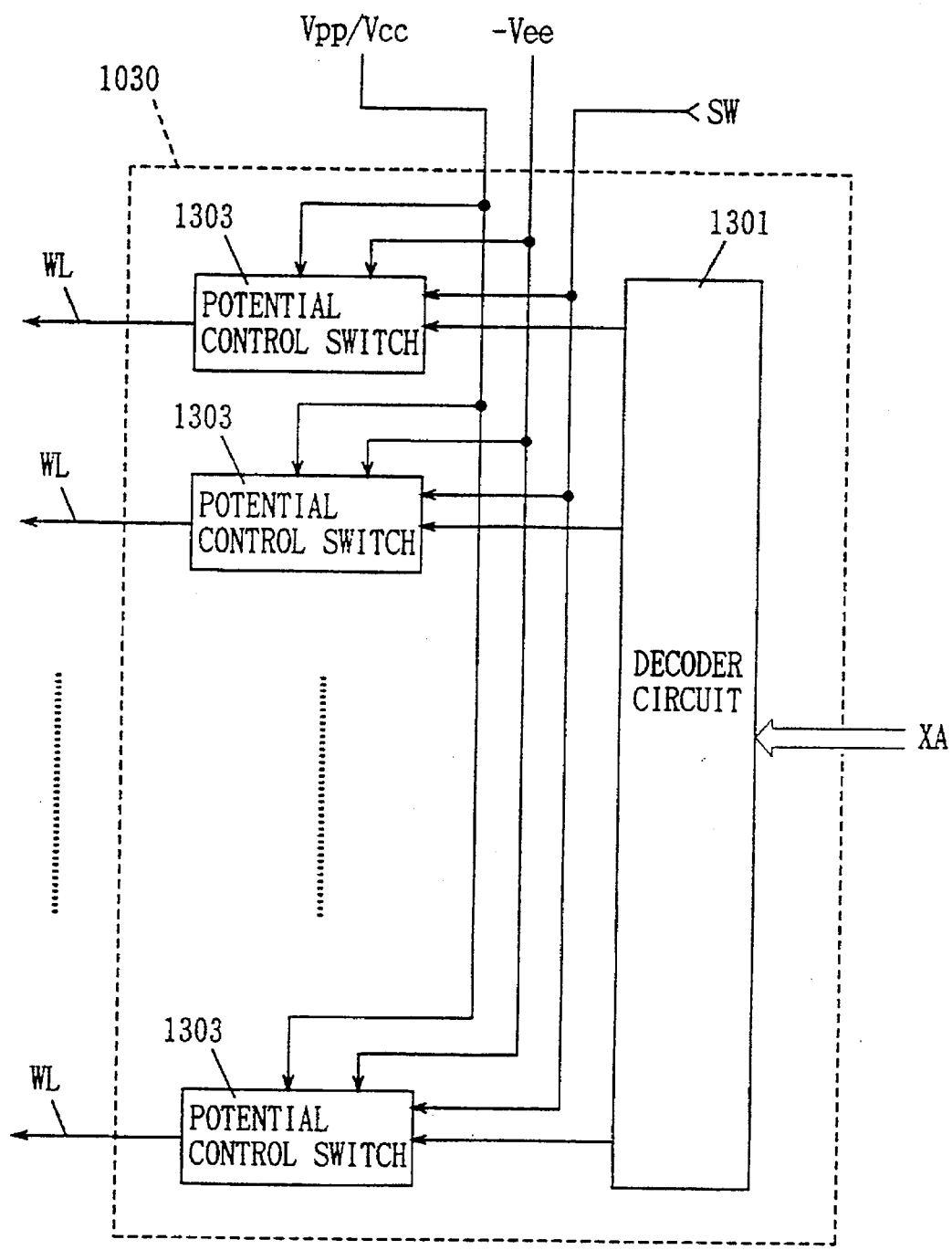
FIG. 12 is a block diagram showing the structure of an X decoder included in the flash memory shown in FIG. 11.
Figure 132:
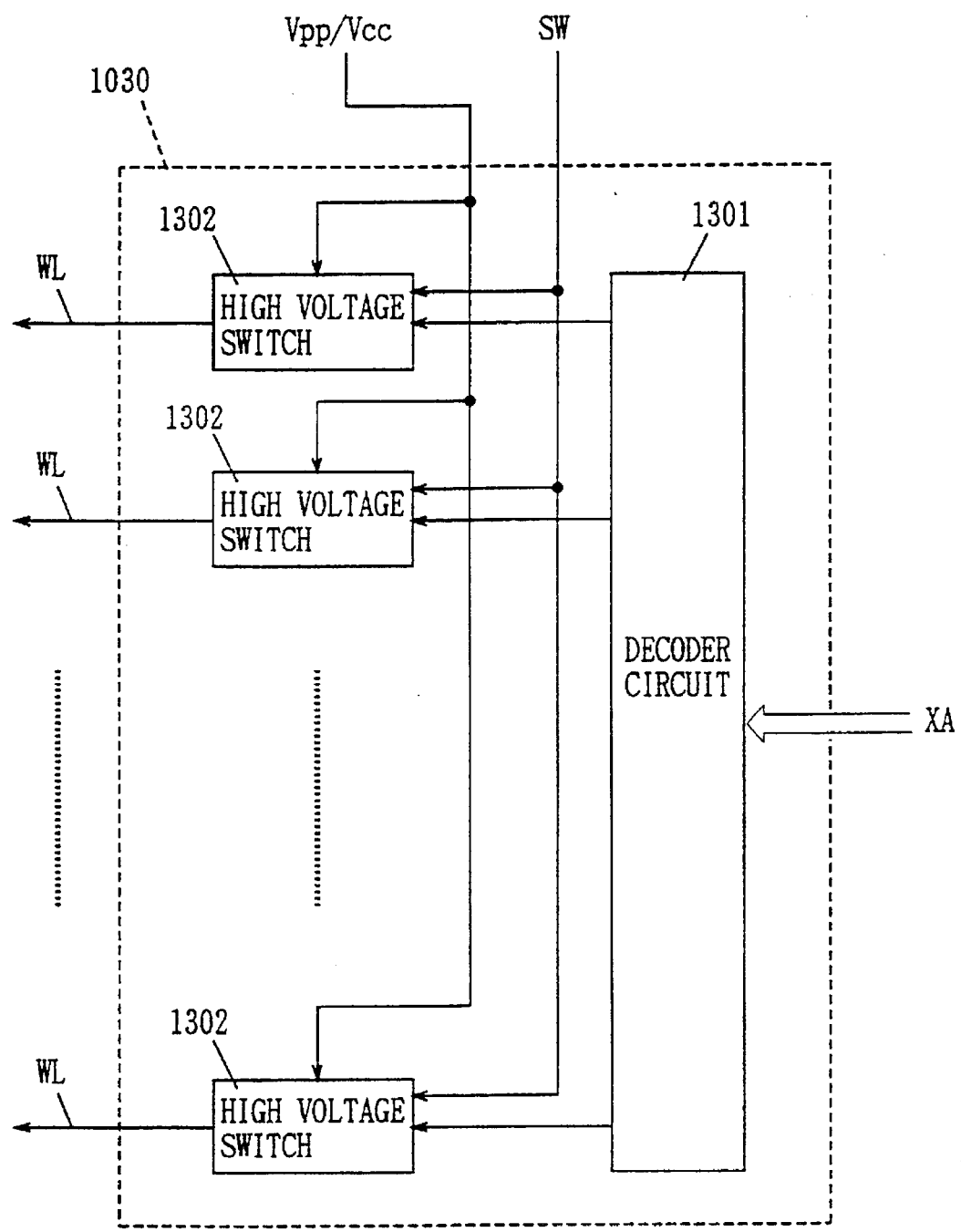
FIG. 132 is a block diagram showing the structure of an X decoder included in the flash memory shown in FIG. 56.
Figure 133:
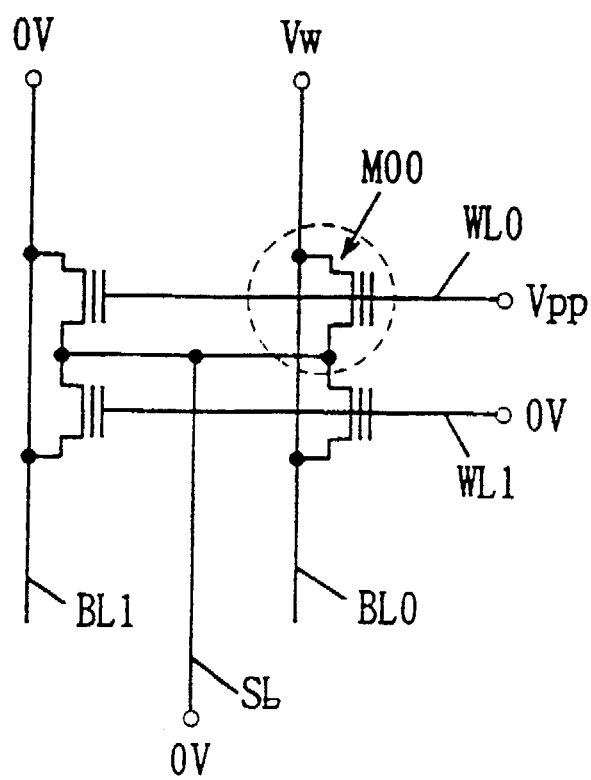
FIG. 133 illustrates conditions of voltage application in a program operation in the conventional flash memory.
Figure 134:
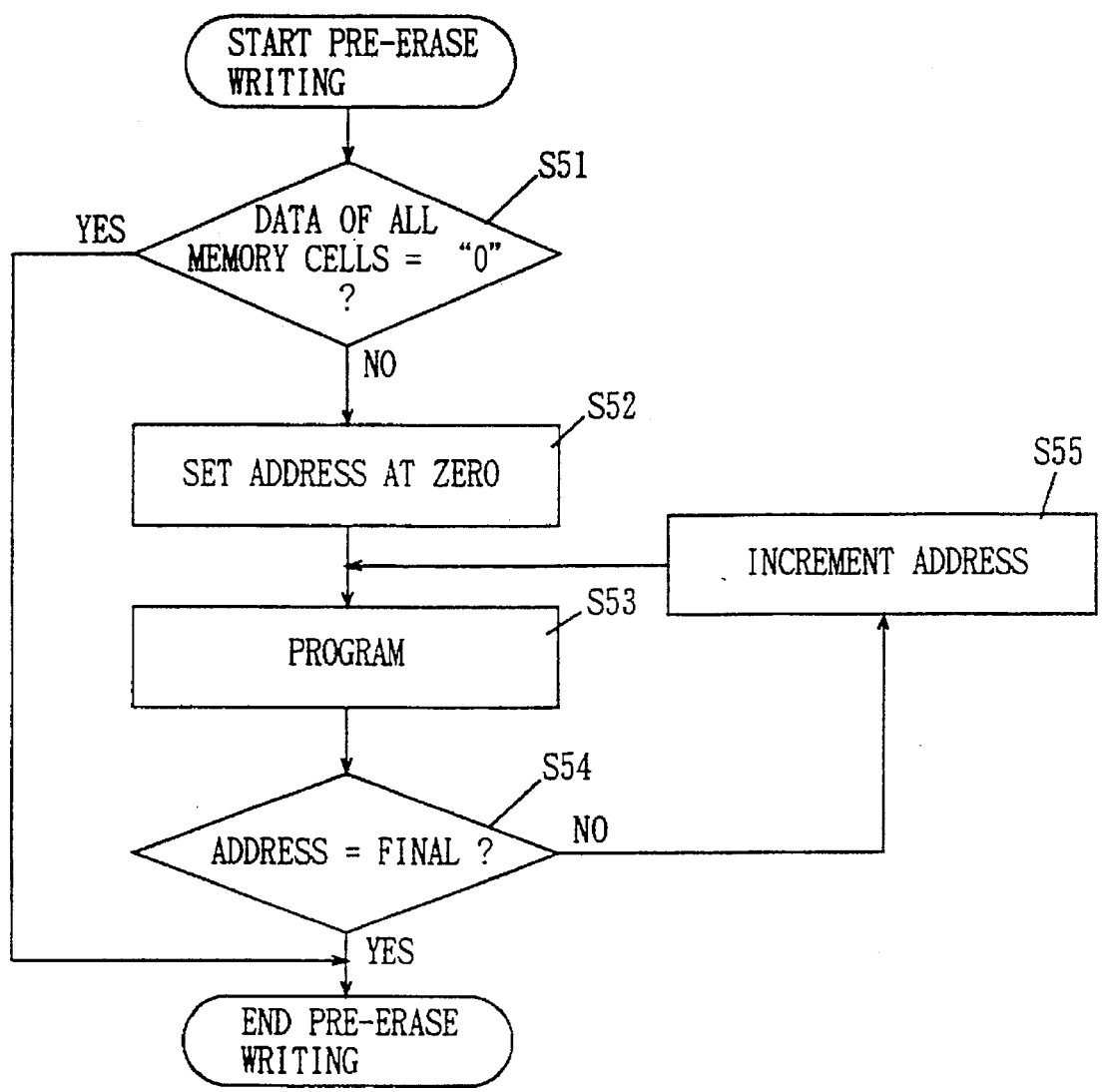
FIG. 134 is a flow chart for illustrating a pre-erase write operation in the conventional flash memory.

FIG. 11 is a block diagram showing the overall structure of a flash memory according to the third embodiment. This flash memory is different from that shown in FIG. 5 in the following point:

The flash memory is further provided with a negative voltage control circuit 1140 which receives an externally supplied negative voltage −Vee, to generate a prescribed negative voltage. Further, an X decoder 1030 includes a plurality of potential control switches 1303, which are connected to a plurality of word lines WL respectively, in place of a plurality of high voltage switches 1302 (see FIG. 132), as shown in FIG. 12. Each potential control switch 1303 applies a high voltage Vpp or a power supply voltage Vcc received from a Vpp/Vcc switching circuit 1090 or the negative voltage −Vee received from the negative voltage control circuit 1140 to a corresponding word line WL.

Figure 13:
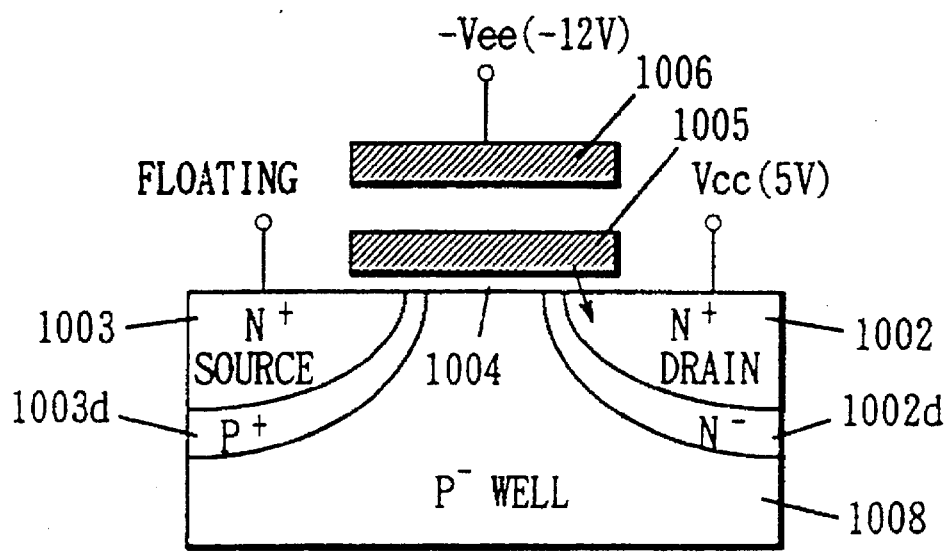
FIG. 13 illustrates conditions of voltage application for a memory cell in programming and erasing in the third embodiment.
Figure 13:
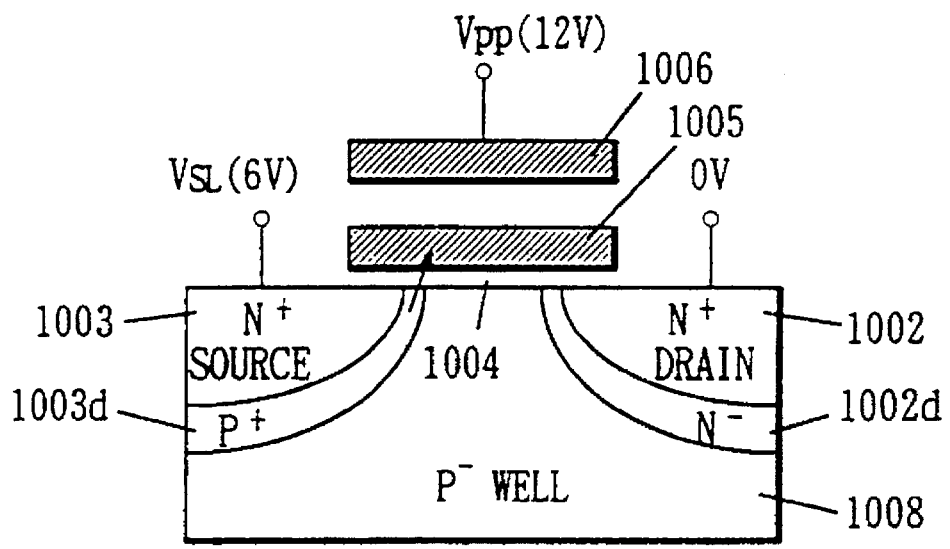

(b) Programming and Erasing of Memory Cell (FIG. 13)

Conditions of voltage application for a memory cell in programming and erasing are shown at (a) and (b) in FIG. 13 respectively.

In programming, the power supply voltage Vcc (about 5 V in general) is applied to a drain 1002 and the negative voltage −Vee (−12 V) is applied to a control gate 1006, while a source 1003 is brought into a floating state. Thus, a high electric field is generated across the floating gate 1005 and the drain 1002, whereby electrons are emitted from the floating gate 1005 to the drain 1002 by a tunnel effect. As the result, the threshold voltage of the memory cell is reduced.

The conditions in erasing are similar to those shown at (b) in FIG. 6.

Thus, electrons are emitted from the floating gate 1005 to the drain 1002 in programming by a tunnel effect. Therefore, an N⁻-type impurity region 1002d is provided along the drain 1002, in order to weaken the electric field in the channel or substrate direction.

In erasing, on the other hand, electrons are injected into the floating gate 1005 by hot electrons from a portion close to the source 1003. Therefore, a P⁺-type impurity region 1003d is provided along the source 1003 so that a higher electric field is generated in the channel or substrate direction.

(c) Operation of Flash Memory (FIG. 14)

Batch erase, program and read operations of the flash memory are now described with reference to FIG. 14. The batch erase and read operations are similar to those of the first embodiment. Therefore, the program operation is hereafter described.

It is assumed here that the memory cell M12 is programmed. Namely, data "0" is written in the memory cell M12, while data "1" are written in the remaining memory cells.

First, a control signal specifying the program operation is supplied to a control circuit 1130 through a control signal buffer 1120. Further, a negative voltage −Vee is externally supplied to a negative voltage control circuit 1140.

An X decoder 1030 selects the word line WL2 in response to an X address signal which is received from an address buffer 1020, to apply the negative voltage −Vee from the negative voltage control circuit 1140 to the selected word line WL2 while applying 0 V to the nonselected word lines WL1 and WL2.

The Vpp/Vcc switching circuit 1090 supplies the power supply voltage Vcc to a write circuit 1080. Data are sequentially supplied to the write circuit 1080 from the exterior through a data input/output buffer 1070. At this time, a Y decoder 1040 sequentially turns on Y gate transistors which are provided in a Y gate 1050 in response to a Y address signal received from the address buffer 1020. The write circuit 1080 applies the power supply voltage Vcc to a bit line BL1 through the Y gate 1050, while applying 0 V to bit lines BL2 and BL3. A source control circuit 110 brings a source line SL into a floating state.

Thus, voltages are applied to the memory cell M12 as shown at (a) in FIG. 13. At this time, each of the remaining memory cells is in one of the following states:

(A) The drain is impressed with the power supply voltage Vcc and the control gate is impressed with 0 V, while the source is in a floating state.

(B) The drain is impressed with 0 V and the control gate is impressed with the negative voltage −Vee, while the source is in a floating state.

(C) The drain and the control gate are impressed with 0 V, while the source is in a floating state.

(e) Modifications

In programming, the nonselected bit lines BL2 and BL3 may be brought into floating states. At this time, each of the nonselected memory cells is in one of the following states:

(A) The drain is impressed with the power supply voltage Vcc and the control gate is impressed with 0 V, while the source is in a floating state.

(B) The drain is in a floating state and the control gate is impressed with the negative voltage −Vee, while the source is in a floating state.

(C) The drain is in a floating state and the control gate is impressed with 0 V, while the source is in a floating state.

Also in this case, a high electric field is generated only in a region between the floating gate and the drain of the memory cell M12, so that only the memory cell M12 is programmed by a tunnel effect.

In programming, the nonselected bit lines may be brought into floating states and 0 V may be applied to the source line SL. In this case, the power supply voltage Vcc is applied to the drain and the negative voltage −Vee is applied to the control gate while 0 V is applied to the source in the memory cell M12. Each of the remaining memory cells is in one of the following states:

(A) The drain is impressed with the power supply voltage Vcc while the control gate and the source are impressed with 0 V.

(B) The drain is in a floating state and the control gate is impressed with the negative voltage −Vee, while the source is impressed with 0 V.

(C) The drain is in a floating state, while the control gate and the source are impressed with 0 V.

Also in this case, a high electric field is generated only in the region between the floating gate and the drain of the memory cell M12, so that only the memory cell M12 is programmed by a tunnel effect.

In the third embodiment, the batch erase operation may be performed in a similar manner to that in the second embodiment shown in FIG. 10. Voltages are applied to each memory as shown at (b) in FIG. 9.

In this case, electrons are injected into and emitted from the floating gate through tunnel effects, whereby power consumption is reduced. Thus, it is possible to generate high and negative voltages in the interior from the externally received source voltage.

(4) Fourth Embodiment (FIGS. 15 and 16)

The overall structure of a flash memory according to the fourth embodiment is similar to that shown in FIG. 5. Conditions of voltage application for each memory cell in programming and erasing are similar to those shown at (a) and (b) in FIG. 6. The fourth embodiment is different from the first embodiment only in a control method.

(a) Operation of Flash Memory (FIG. 15)

Batch page erase, program and read operations of the flash memory are now described with reference to FIG. 15. The program and read operations are similar to those of the first embodiment. Therefore, only the batch page erase operation is hereafter described.

The term "page" indicates all memory cells which are connected to a single word line. The batch page erase operation is performed on a page basis. A batch erase operation for a page corresponding to a word line WL2 is now described.

First, a control signal specifying a batch erase operation is supplied to a control circuit 1130 through a control signal buffer 1120. Further, a high voltage Vpp is externally supplied to a Vpp/Vcc switching circuit 1090.

The Vpp/Vcc switching circuit 1090 supplies the high voltage Vpp to an X decoder 1030. In response to an X address signal received from an address buffer 1020, the X decoder 1030 selects the word line WL2 to apply the high voltage Vpp to the selected word line WL2 while applying 0 v to nonselected word lines WL1 and WL3. A Y decoder 1040 turns on all Y gate transistors which are included in a Y gate 1050. A write circuit 1080 applies 0 V to all bit lines BL1 to BL3 through the Y gate 1050. A source control circuit 1110 applies a prescribed high voltage Vsn ($V_{SL}$<Vpp) to a source line SL.

Thus, voltages are applied to each of memory cells M12, M22 and M32 which are connected to the word line WL2, as shown at (b) in FIG. 6. As the result, the memory cells M12, M22 and M32 are erased.

In each of memory cells which are connected to the nonselected word lines WL1 and WL3, 0 V is applied to a drain 1002 and the high voltage Vsn is applied to a source 1003, while 0 V is applied to a control gate 1006. Thus, there is little possibility that hot electrons jump over an energy barrier defined by an insulating film to be injected into a floating gate 1005. Therefore, only the memory cells which are connected to the selected word line WL2 are batch-erased.

Thus, the batch erase operation is performed not on a memory array basis but on a page basis.

(b) Rewrite Operation (FIG. 16)

A data rewrite operation in the flash memory according to the fourth embodiment is now described with reference to a flow chart shown in FIG. 16.

First, a determination is made as to whether or not all memory cells store data "1" (step S11). If the data "1" are not stored in all memory cells, a batch page erase operation is performed for the page to be rewritten (step S12). Thereafter a program operation is performed (step S13).

Thus, it is possible to rewrite data on a page basis with no pre-erase write operation, dissimilarly to the prior art.

Figures 17A, 17B, 17C:
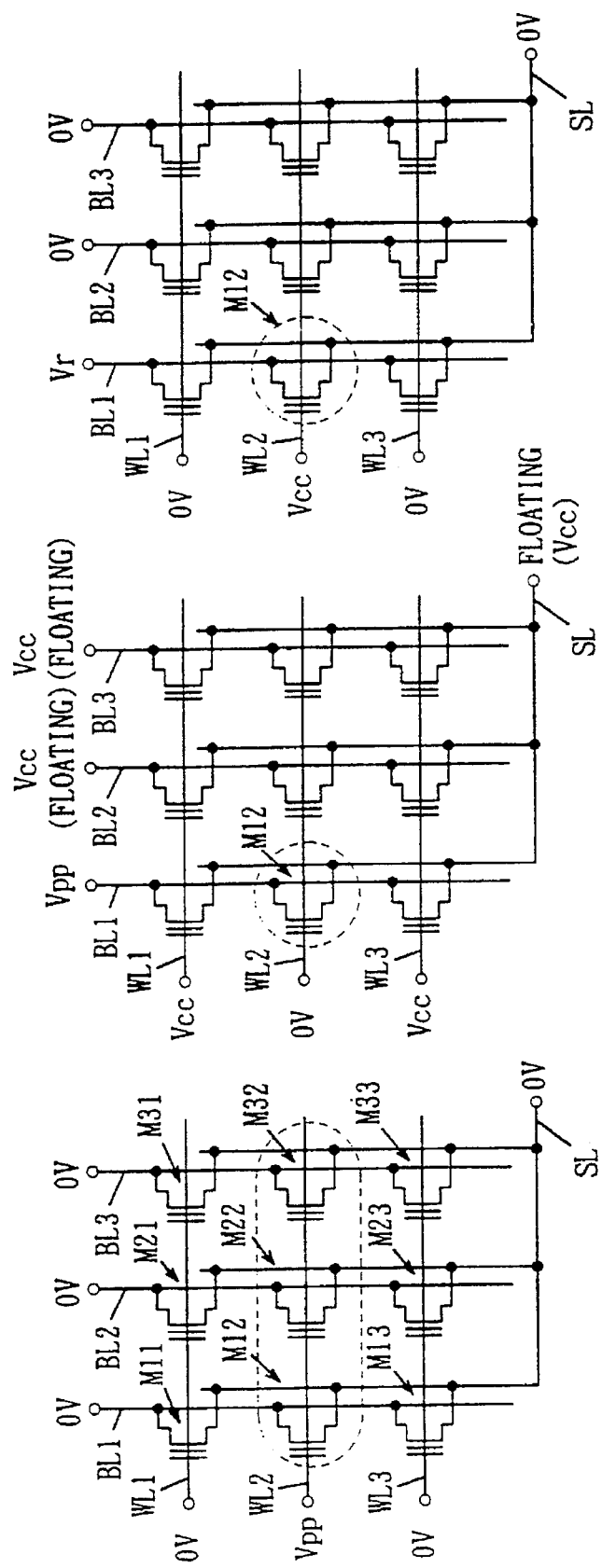
FIG. 17 illustrates conditions of voltage application in batch page erase, program and read operations in the fifth embodiment.

(5) Fifth Embodiment (FIG. 17)

The overall structure of a flash memory according to the fifth embodiment is similar to that shown in FIG. 5. Conditions of voltage application for each memory cell in program and erase operations are similar to those shown at (a) and (b) in FIG. 9 respectively. The fifth embodiment is different from the second embodiment only in a control method.

Batch page erase, program and read operations in the flash memory according to the fifth embodiment are now described with reference to FIG. 17. The program and read operations are similar to those of the second embodiment. Therefore, the batch page erase operation is hereafter described, with reference to a page corresponding to a word line WL2.

First, a control signal specifying a batch page erase operation is supplied to a control circuit 1130 through a control signal buffer 1120. Further, a high voltage Vpp is externally supplied to a Vpp/Vcc switching circuit 1090.

The Vpp/Vcc switching circuit 1090 supplies the high voltage Vpp to an X decoder 1030. In response to an X address signal received from an address buffer 1020, the X decoder 1030 selects the word line WL2 to apply the high voltage Vpp to the same while applying 0 V to nonselected word lines WL1 and WL3. A Y decoder 1040 turns on all Y gate transistors which are included in a Y gate 1050. A write circuit 80 applies 0 V to all bit lines BL1 to BL3 through a Y gate 1050. A source control circuit 1110 applies 0 V to a source line SL.

Thus, voltages are applied to each of memory cells M12, M22 and M33 which are connected to the word line WL2, as shown at (b) in FIG. 9. As the result, the memory cells M12, M22 and M32 are erased.

In each of memory cells which are connected to the nonselected word lines WL1 and WL3, 0 V is applied to a drain 1002, a source 1003 and a control gate 1006. Therefore, no high electric field is generated across the floating gate 1005 and the source 1003, whereby no electrons are injected into the floating gate 1005 by a tunnel effect. Thus, only the memory cells which are connected to the selected word line are batch-erased.

Thus, it is possible to perform a batch erase operation not on a memory array basis but on page basis also in the fifth embodiment.

The data are rewritten in the procedure shown in FIG. 16. Thus, it is possible to rewrite the data on a page basis with no pre-erase write operation, dissimilarly to the prior art.

(6) Sixth Embodiment (FIGS. 18 to 33)

Figure 18:
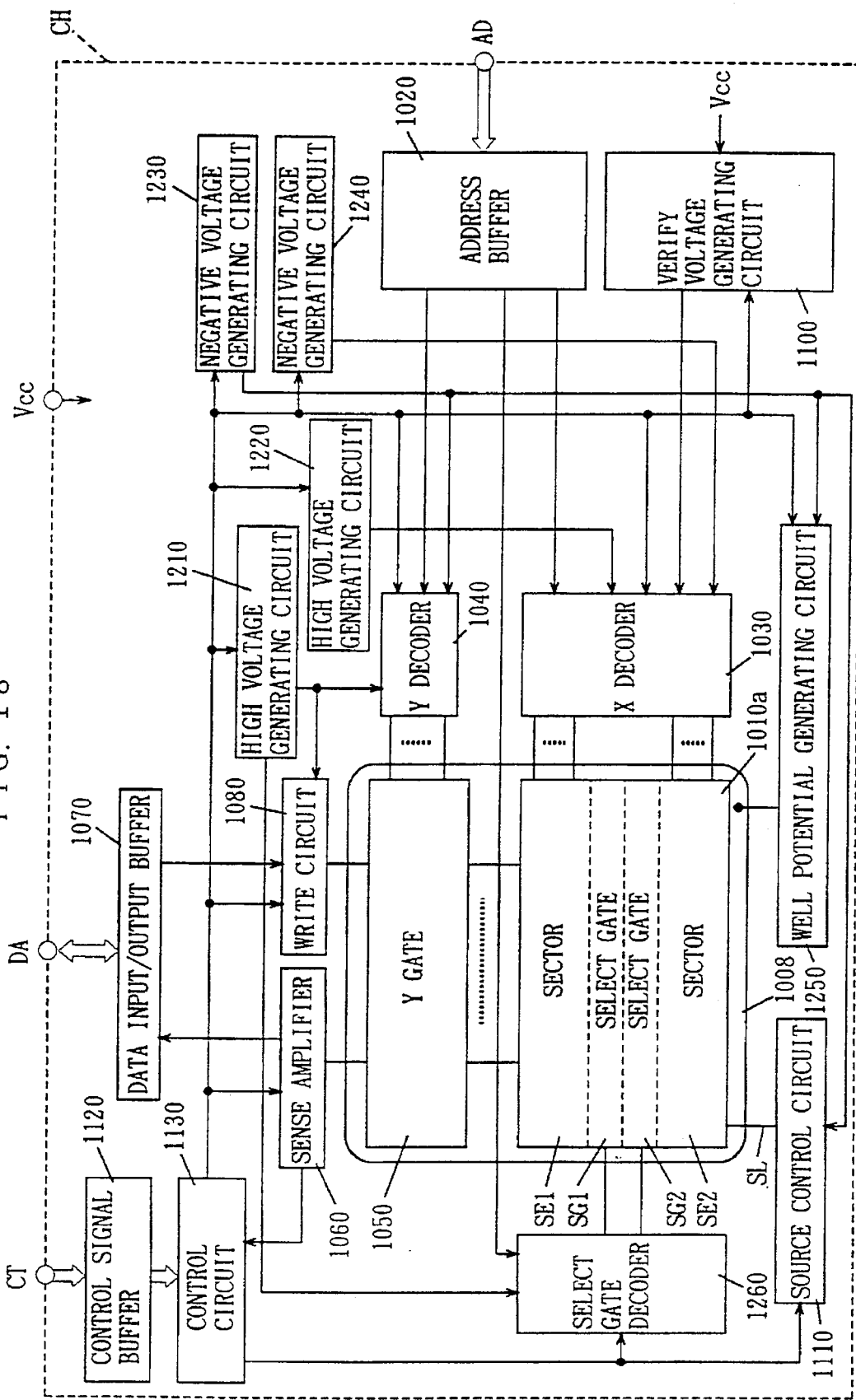
FIG. 18 is a block diagram showing the overall structure of a flash memory according to the sixth embodiment.
Figure 19:
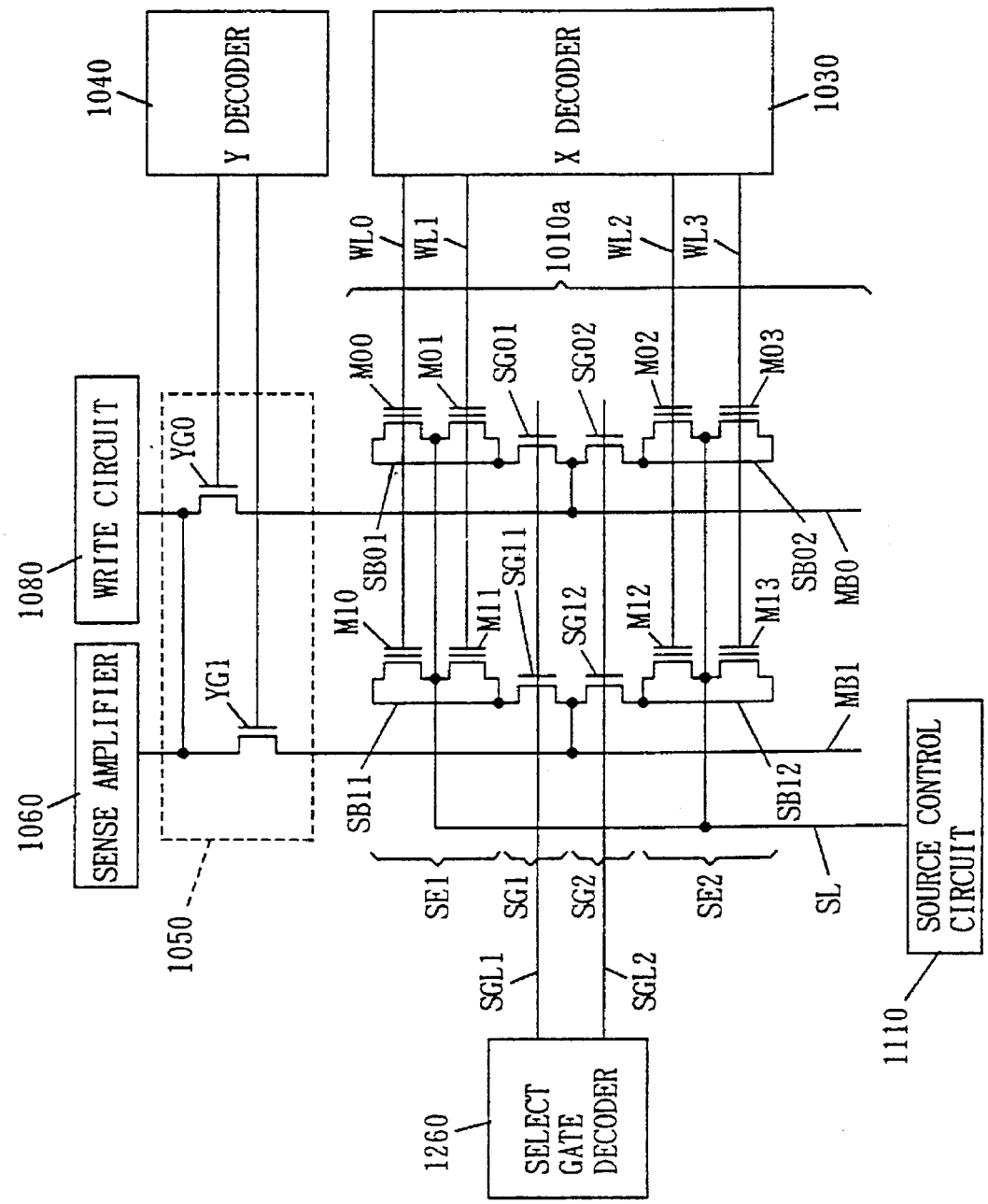
FIG. 19 is a circuit diagram showing the structures of a memory array included in the flash memory shown in FIG. 18 and parts related thereto in detail.

(a) Overall Structure of Flash Memory (FIGS. 18 and 19)

FIG. 18 is a block diagram showing the overall structure of a flash memory according to the sixth embodiment. FIG. 19 is a circuit diagram showing the structures of a memory array and parts related thereto.

Figure 56:
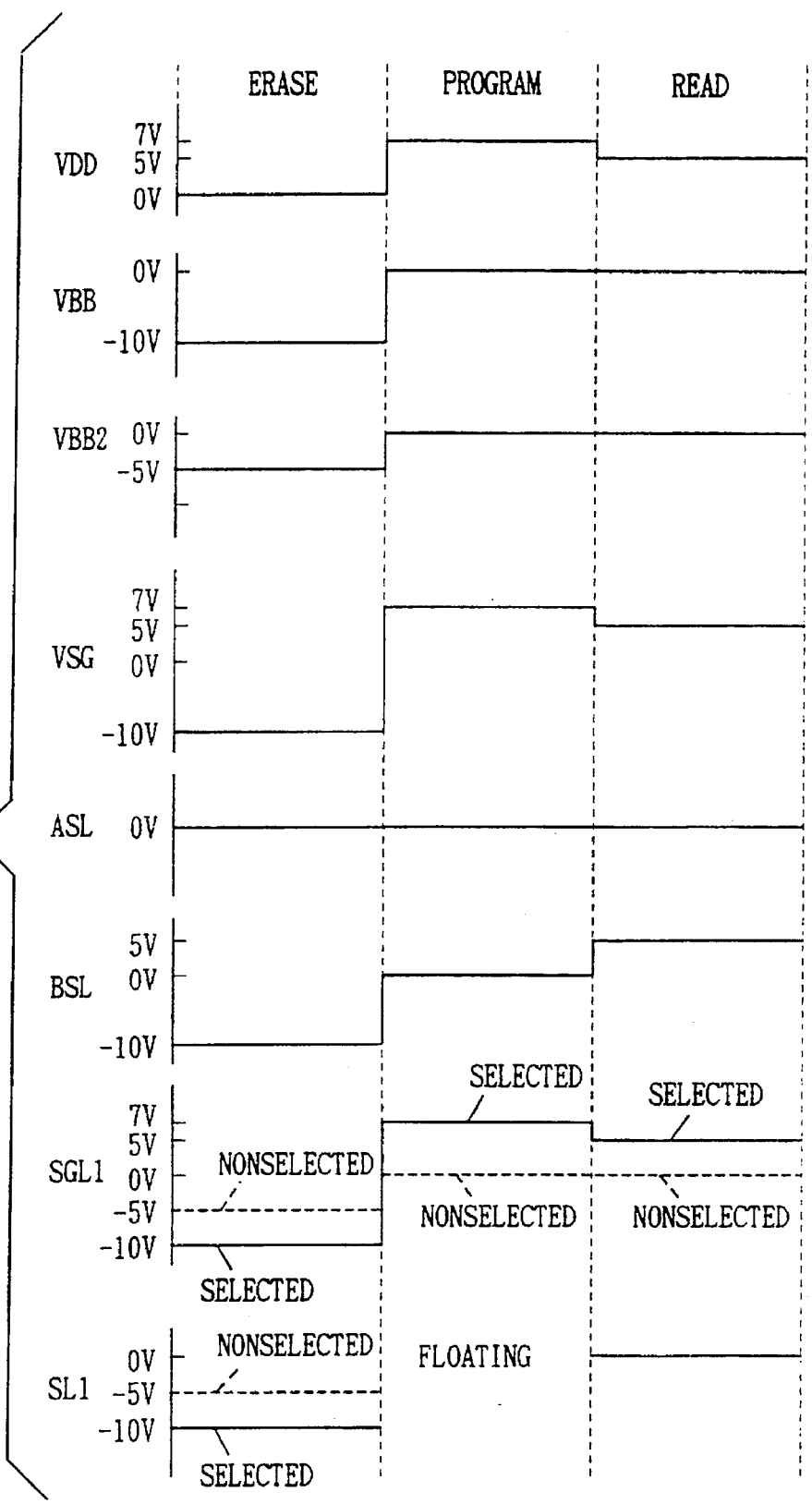
FIG. 56 illustrates voltages of respective parts in the select gate decoder and the source switch shown in FIG. 55.

The flash memory shown in FIG. 18 is different from the conventional flash memory shown in FIG. 56 in the following point: A memory array 1010a is divided into a plurality of sectors SE1 and SE2, as shown in FIG. 18. The memory array 10a includes select gates SG1 and SG2 which correspond to the sectors SE1 and SE2 respectively.

The memory array 1010a is formed in a P⁻ well 1008. This flash memory is provided with no Vpp/Vcc switching circuit 1090 shown in FIG. 131, but with high voltage generating circuits 1210 and 1220, negative voltage generating circuits 1230 and 1240, a well potential generating circuit 1250 and a select gate decoder 1260. The high voltage generating circuits 1210 and 1220 receive a power supply voltage Vcc (5 V, for example) from the exterior, to generate high voltages (10 V, for example). The negative voltage generating circuits 1230 and 1240 receive the power supply voltage Vcc from the exterior, to generate negative voltages (−10 V, for example). The well potential generating circuit 1250 applies a negative voltage (−5 V, for example) to the P⁻ well 1008 in erasing. The select gate decoder 1260 selectively activates the select gates SG1 and SG2 in response to a part of an address signal received from an address buffer 1020.

Referring to FIG. 19, a plurality of main bit lines are arranged in the memory array 1010a. FIG. 19 shows two main bit lines MB0 and MB1. The main bit lines MB0 and MB1 are connected to a sense amplifier 1060 and a write circuit 1080 through Y gate transistors YG0 and YG1 respectively.

A plurality of subbit lines are arranged in correspondence to each main bit line. In the example shown in FIG. 19, two subbit lines SB01 and SB02 are provided in correspondence to the main bit line MB0, while two subbit lines SB11 and SB12 are provided in correspondence to the main bit line MB1.

A plurality of word lines are arranged to cross the plurality of subbit lines. In the example shown in FIG. 19, word lines WL0 and WL1 are arranged to cross the subbit lines SB01 and SB11, while word lines WL2 and WL3 are arranged to cross the subbit lines SB02 and SB12.

Memory cells M00 to M03 and M10 to M13 are provided on crossings between the subbit lines SB01, SB02, SB11 and SB12 and the word lines WL0 to WL3. The memory cells M00, M01, M10 and M11 are included in the sector SE1, while the memory cells M02, M03, M12 and M13 are included in the sector SE2.

In each memory cell, a drain is connected to a corresponding subbit line and a control gate is connected to a corresponding word line, while a source is connected to a source line SL.

The select gate SG1 includes select gate transistors SG01 and SG11, while the select gate SG2 includes select gate transistors SG02 and SG12. The subbit lines SB01 and SB02 are connected to the main bit line MB0 through the select gate transistors SG01 and SG02 respectively, while the subbit lines SB11 and SB12 are connected to the main bit line MB1 through the select gate transistors SG11 and SG12 respectively. A select gate line SGL1 of the select gate decoder 1260 is connected to the select gate transistors SG01 and SG11, while another select gate line SGL2 thereof is connected to the select gate transistors SG02 and SG12.

Figure 20:
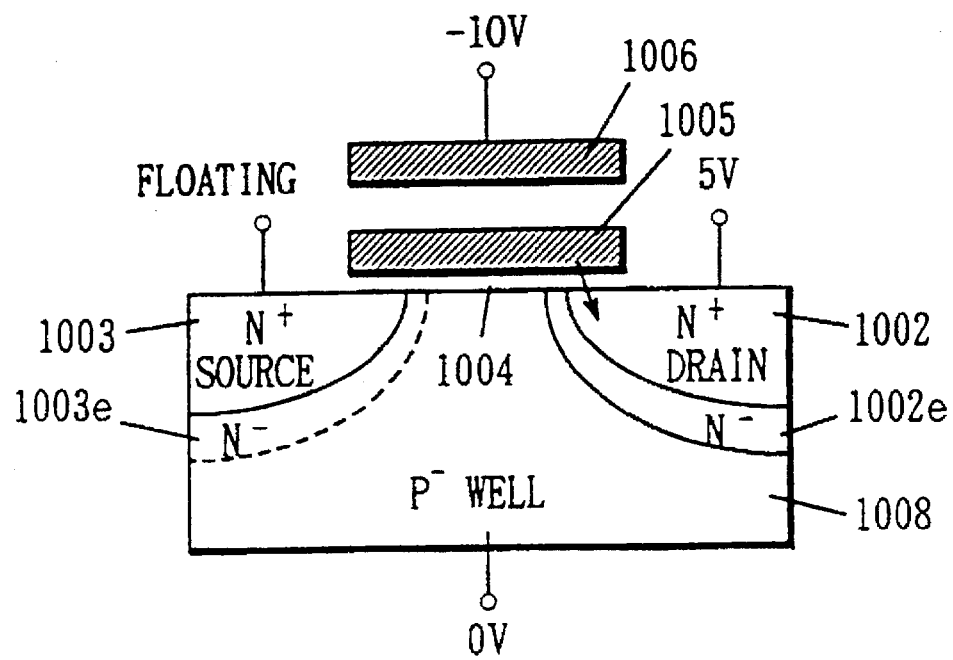
FIG. 20 illustrates conditions of voltage application for a memory cell in programming and erasing in the sixth embodiment.
Figure 20:
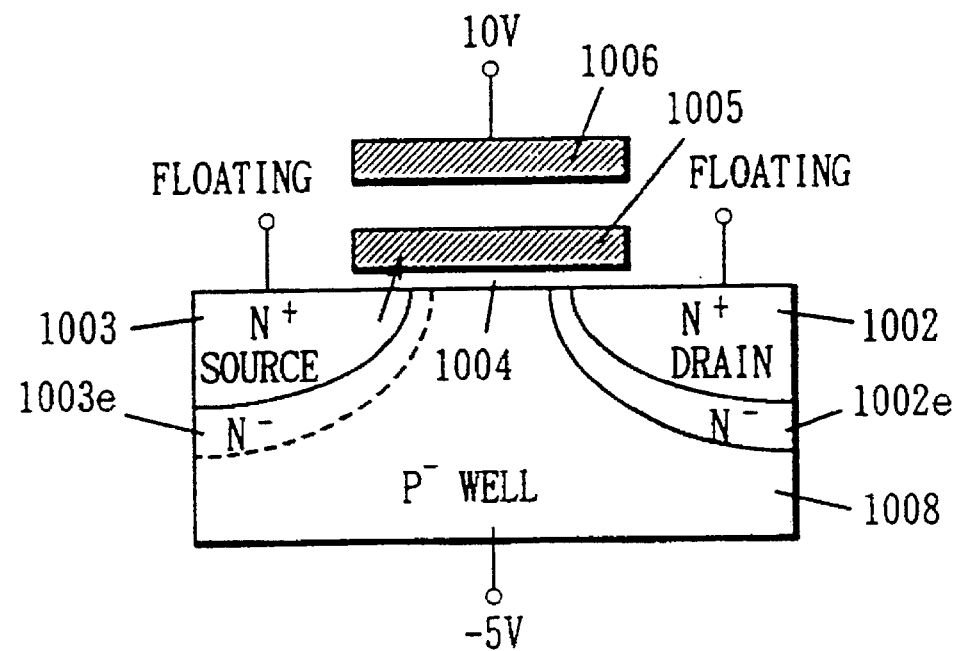

(b) Programming and Erasing of Memory Cell (FIG. 20)

Conditions of voltage application for a memory cell in programming and erasing are shown at (a) and (b) in FIG. 20 respectively.

In programming, a positive voltage 15 V, for example) is applied to the drain 1002 and a negative voltage. (−10 V, for example) is applied to the control gate 1006, while the source 1003 is brought into a floating state and 0 V is applied to the P− well 1008, as shown at (a) in FIG. 20. Thus, a high electric field is generated across the floating gate 1005 and the drain 1002, whereby electrons are emitted from the floating gate 1005 to the drain 1002 by a tunnel effect. As the result, the threshold voltage of the memory cell is reduced.

In erasing, on the other hand, the drain 1002 is brought into a floating state and a high voltage (10 V, for example) is applied to the control gate 1006, while the source 1003 is brought into a floating state and a negative voltage (5 V, for example) is applied to the P− well 1008, as shown at (b) in FIG. 20. Thus, a high voltage (15 V in this case) is applied across the control gate 1006 and the P− well 1008, and a high electric field is generated across the source 1003 and the floating gate 1005. As the result, electrons are injected into the floating gate 1005 from the source 1003 by a tunnel effect, whereby the threshold voltage of the memory cell is increased.

Thus, electrons are emitted from the floating gate 1005 to the drain 1002 in programming by a tunnel effect. Therefore, an N−-type impurity region 1002e is provided along the drain 1002, in order to weaken the electric field in the channel or substrate direction.

Another N−-type impurity region 1003e may be provided along the source 1003. When such N−-type impurity regions 1002e and 1003e are provided on both drain and source sides, it is possible to reduce the fabrication steps.

Figure 21:
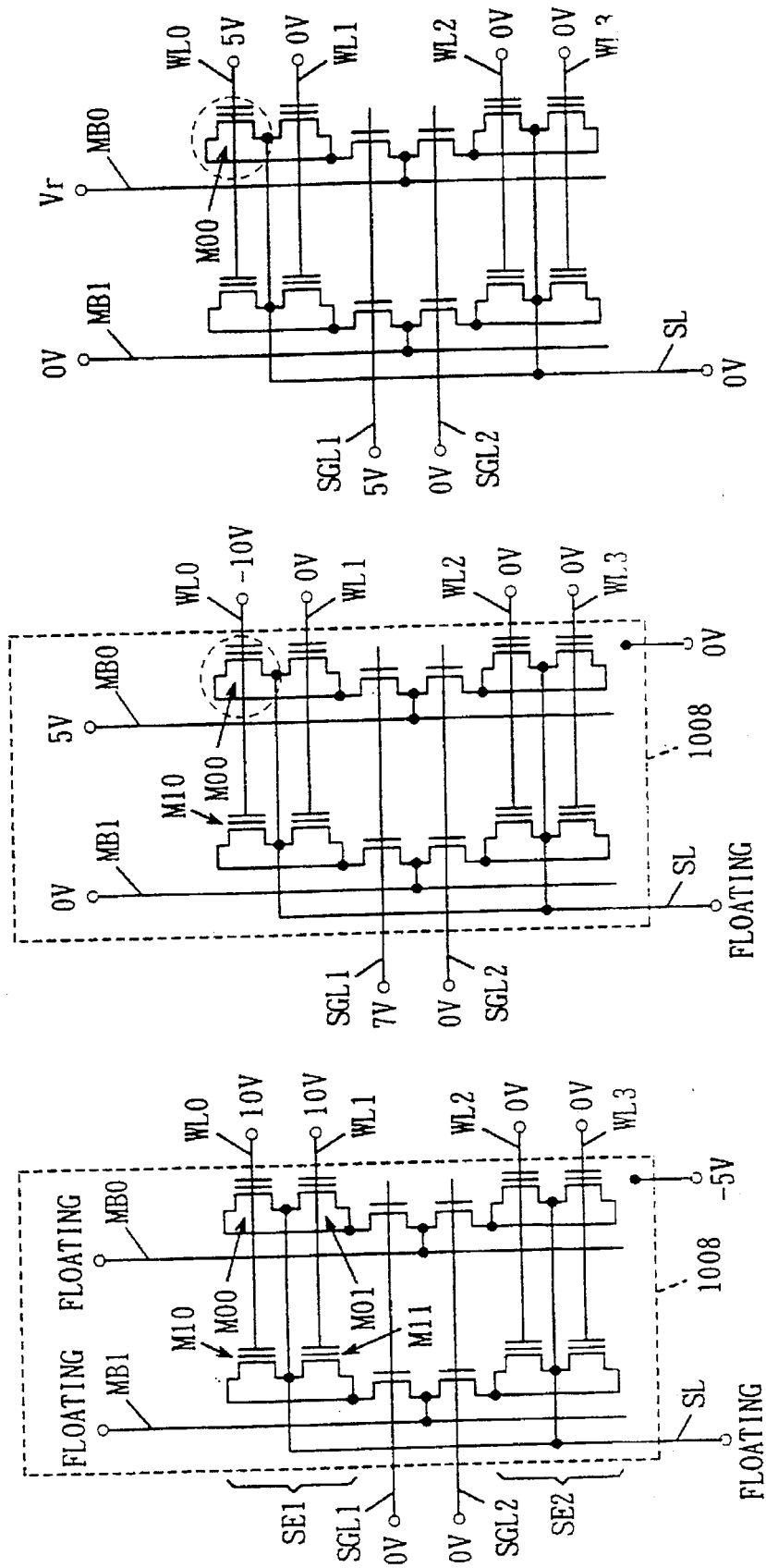
FIG. 21 illustrates conditions of voltage application in batch sector erase, program and read operations in the sixth embodiment.
Figure 22:
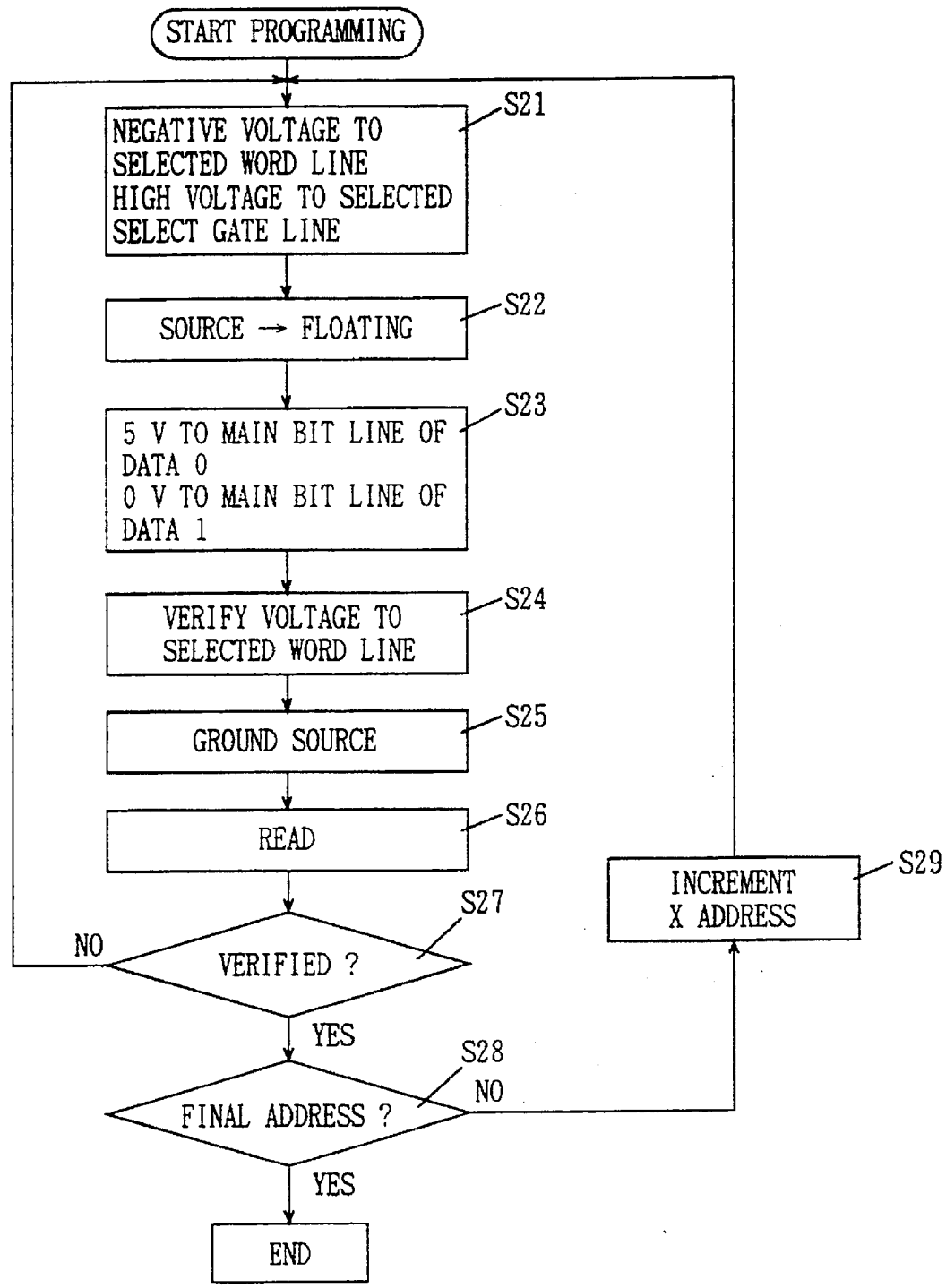
FIG. 22 is a flow chart for illustrating program and verify operations in the sixth embodiment.

(c) Operation of Flash Memory (FIG. 21)

Batch sector erase, program and read operations of the flash memory are now described with reference to FIG. 21.

(i) Batch Sector Erase Operation

It is assumed here that memory cells provided in the sector SE1 are batch-erased. First, a control signal specifying a batch sector erase operation is supplied to a control circuit 1130 through a control signal buffer 1120. Thus, the high voltage generating circuit 1220 and the negative voltage generating circuit 1230 are activated.

The high voltage generating circuit 1220 supplies a high voltage (10 V) to an X decoder 1030. The X decoder 1030 applies the high voltage (10 V) to the word lines WL0 and WL1 provided in the sector SE1, while applying 0 V to the word lines WL2 and WL3 provided in the sector SE2. The negative voltage generating circuit 1230 supplies negative voltages to a Y decoder 1040 and the well potential generating circuit 1250. The Y decoder 1040 applies the negative voltage (−5 V) to Y gate transistors YG0 and YG1 which are provided in a Y gate 1050. Thus, the main bit lines MB0 and MB1 enter floating states. A source control circuit 1010 brings the source line SL into a floating state. The well potential generating circuit 1250 applies the negative voltage (−5 V) to the P− well 1008. The select gate decoder 1260 applies 0 V to the select gate lines SGL1 and SGL2.

Thus, voltages are applied to each of the memory cells M00, M01, M10 and M11 provided in the sector SE1 as shown at (b) in FIG. 20. As the result, all memory cells provided in the sector SE1 are erased.

At this time, the voltage applied across the control gate and the P− well in each memory cell provided in the nonselected sector SE2 is 5 V, whereby no tunnel effect is caused. Further, substantially no disturbance is caused on the data since this potential condition is substantially identical to that in the read operation.

(ii) Program Operation ((b) in FIG. 21)

It is assumed here that the memory cell M00 is programmed. Namely, data "0" is written in the memory cell M00, while data "1" is written in the memory cell M10.

First, a control signal specifying a program operation is supplied to the control circuit 130 through the control signal buffer 1120. Thus, the high voltage generating circuit 1210 and the negative voltage generating circuit 1240 are activated.

The negative voltage generating circuit 1240 supplies a negative voltage to the X decoder 1030. In response to an X address signal received from the address buffer 1020, the X decoder 1030 selects the word line WL0 to apply a negative voltage (−10 V) to the same, while applying 0 V to the nonselected word lines WL1 to WL3.

The high voltage generating circuit 1210 supplies high voltages to the Y decoder 1040, the write circuit 1080 and the select gate decoder 1260. First, data "0" is externally supplied to the write circuit 1080 through a data input/output buffer 1070, and latched. In response to a Y address signal received from the address buffer 1020, the Y decoder 1040 applies a high voltage (7 V, for example) to the Y gate transistor YG0 provided in the Y gate 1050, while applying 0 V to the Y gate transistor YG1. Thus, the Y gate transistor YG0 is turned on.

The write circuit 1080 applies a program voltage (5 V) corresponding to the data "0" to the main bit line MB0 through the Y gate transistor YG0. Further, the select gate decoder 1260 applies a high voltage (7 V, for example) to the select gate line SGL1, while applying 0 V to the select gate line SGL2. Thus, the subbit lines SB01 and SB11 are connected to the main bit lines MB0 and MB1 respectively. The source control circuit 1110 brings the source line SL into a floating state. The well potential generating circuit 1250 applies 0 V to the P$^-$ well 1008.

Thus, voltages are applied to the memory cell M00 as shown at (a) in FIG. 20. As the result, the threshold voltage of the memory cell M00 is reduced.

After a lapse of a constant period (1 msec., for example), data "1" is externally supplied to the write circuit 1080 through the data input/output buffer 1070, and latched. In response to a Y address signal received from the address buffer 1020, the Y decoder 1040 applies a high voltage (7 V) to the Y gate transistor YG1 provided in the Y gate 1050, while applying 0 V to the Y gate transistor YG0. Thus, the Y gate transistor YG1 is turned on. The write circuit 1080 applies 0 V, corresponding to the data "1", to the main bit line MB1 through the Y gate transistor YG1. Therefore, the threshold voltage of the memory cell M10 is maintained at a high value.

A verify operation may be performed in the programming operation. This verify operation is described with reference to a flow chart shown in FIG. 22.

As described above, a negative voltage (−10 V) is applied to the selected word line WL0, while a high voltage (7 V) is applied to the select gate line SGL1 (step S21). The source line SL is brought into a floating state (step S22), while 5 V is applied to the main bit line MB0 of data "0" and 0 V is applied to the main bit line MB1 of data "1" (step S23). Thus, the threshold voltage of the memory cell M00 is reduced. At this time, the threshold voltage of the memory cell M10 is maintained at a high value.

After a lapse of a constant period (1 msec., for example), the control circuit 1130 starts a verify operation, whereby a verify voltage generating circuit 1100 is activated. The verify voltage generating circuit 1100 supplies the X decoder 1030 with a verify voltage which is lower than the normal power supply voltage Vcc. As the result, the verify voltage is applied to the selected word line WL0 (step S24). The source control circuit 1100 grounds the source line SL (step S25). Thus, a read operation is performed (step S26).

When the threshold voltage of the memory cell M00 is higher than the verify voltage, no current flows in the main bit line MB0. Therefore, the sense amplifier 1060 detects data "1". In this case, the control circuit 1130 determines that the program is insufficient, and again performs the program and verify operations (steps S27 and S21 to S26).

When the threshold voltage of the memory cell M00 is lower than the verify voltage, a current flows in the main bit line MB0. Therefore, the sense amplifier 1060 detects data "0". In this case, the control circuit 1130 determines that the program is sufficient, and terminates the program operation for the memory cell M00.

An X address signal supplied to the X decoder 1030 is sequentially incremented, to sequentially perform the program and verify operations for the word lines WL1, WL2 and WL3 (steps S28 and S29).

(iii) Read Operation ((c) in FIG. 21)

It is assumed here that data is read from the memory cell M00. First, a control signal specifying a read operation is supplied to the control circuit 1130 through the control signal buffer 1120.

In response to an X address signal received from the address buffer 1020, the X decoder 1030 selects the word line WL0 to apply the source voltage Vcc (5 V) to the same. At this time, the word lines WL1, WL2 and WL3 are maintained at 0 V. The select gate decoder 1260 applies 5 V to the select gate line SGL1, while applying 0 V to the select gate line SGL2. The Y decoder 1040 turns on the Y gate transistor YG0 provided in the Y gate 1050 in response to a Y address signal received from the address buffer 1020. The source control circuit 1110 grounds the source line SL.

Thus, a read voltage Vr appears on the main bit line MB0. The sense amplifier 1060 detects this read voltage Vr, to output the same to the exterior through the data input/output buffer 1070.

Figure 23:
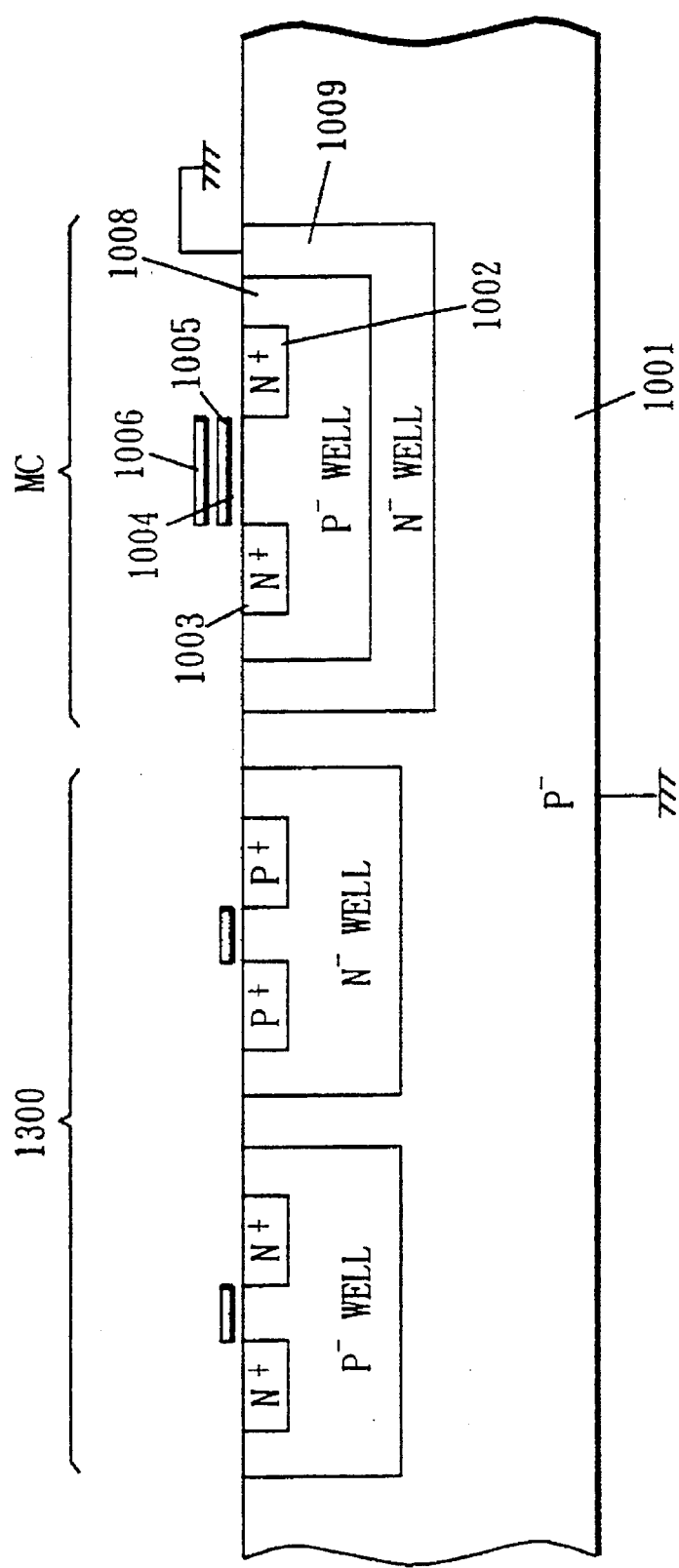
FIG. 23 is a sectional view showing the structure of a memory cell employed in the flash memory according to the sixth embodiment.

(d) Sectional Structure of Memory Cell (FIG. 23)

FIG. 23 illustrates the sectional structure of each memory cell employed for the flash memory according to this embodiment. The structure shown in FIG. 23 is called a triple well structure.

An N$^-$ well 1009 is formed in a prescribed region of a P$^-$-type semiconductor substrate 1, and a P$^-$ well 1008 is formed in the N$^-$ well 1009. Two N$^+$-type impurity regions are formed in prescribed regions of the P$^-$ well 1008 at a prescribed interval, to define a drain 1002 and a source 1003 respectively. A floating gate 1005 is formed above a region between the source 1002 and the drain 1003 with an extremely thin insulating film 1004 (about 100 Å) such as an oxide film interposed between the region and the gate, and a control gate 1006 is further formed above the floating gate 1005 with another insulating film interposed therebetween. Thus, a memory cell MC is formed.

A CMOS circuit region 1300 includes an N-channel transistor which is formed in a P$^-$ well and a P-channel transistor which is formed in an N$^-$ well.

(e) High Integration Density

Figure 24:
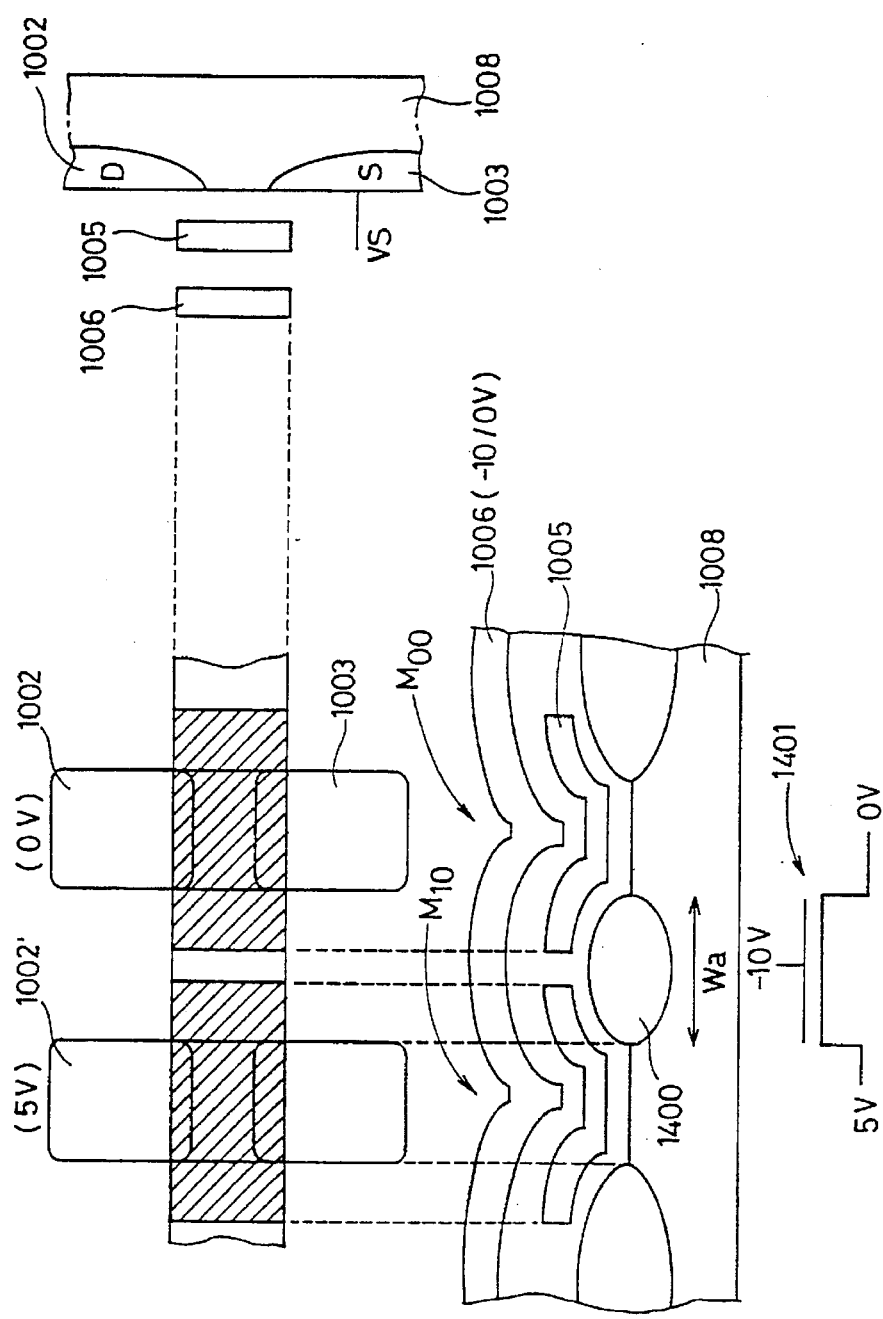
FIG. 24 is a structure of two adjacent memory cells in the sixth embodiment.

FIG. 24 shows the structure of two adjacent memory cells in accordance with the sixth embodiment. Referring to FIG. 24, the two memory cells M00 and M10 are isolated by an isolation oxide film 1400 formed on a P well 1008.

In a programming operation, a voltage of 5 V is applied to a drain 1002' of the selected memory cell M10, and a voltage of 0 V is applied to a drain 1002' of the non-selected memory cell M00. Additionally, a negative voltage of −10 V is applied to a second aluminum interconnection layer 1006 forming a control gate. Therefore, an MOS transistor 1401 equivalently exists with isolation oxide film 1400 as the gate oxide film.

Figure 146:
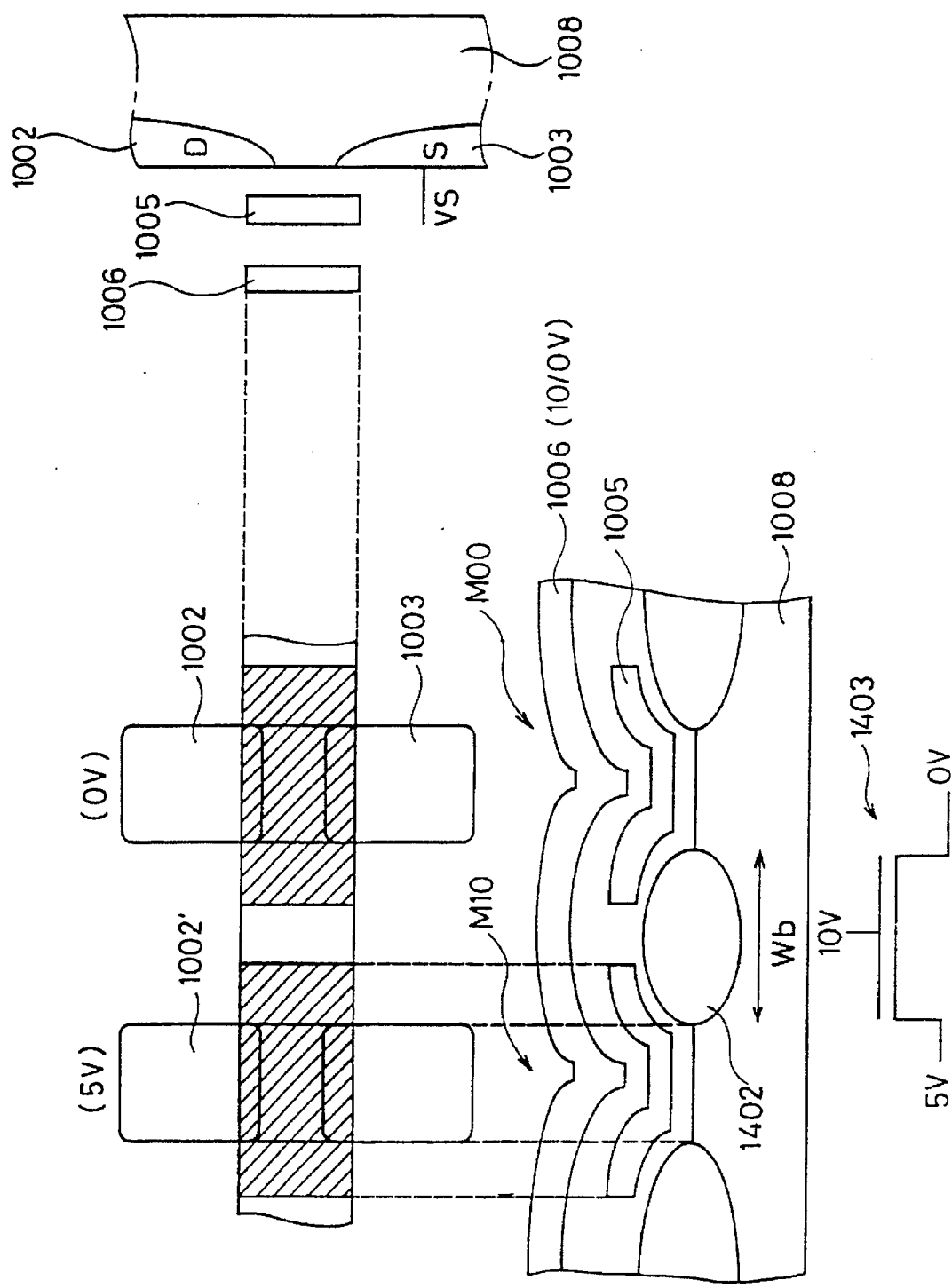
FIG. 146 is a structural view of a memory cell of a conventional flash memory.
Figure 148:
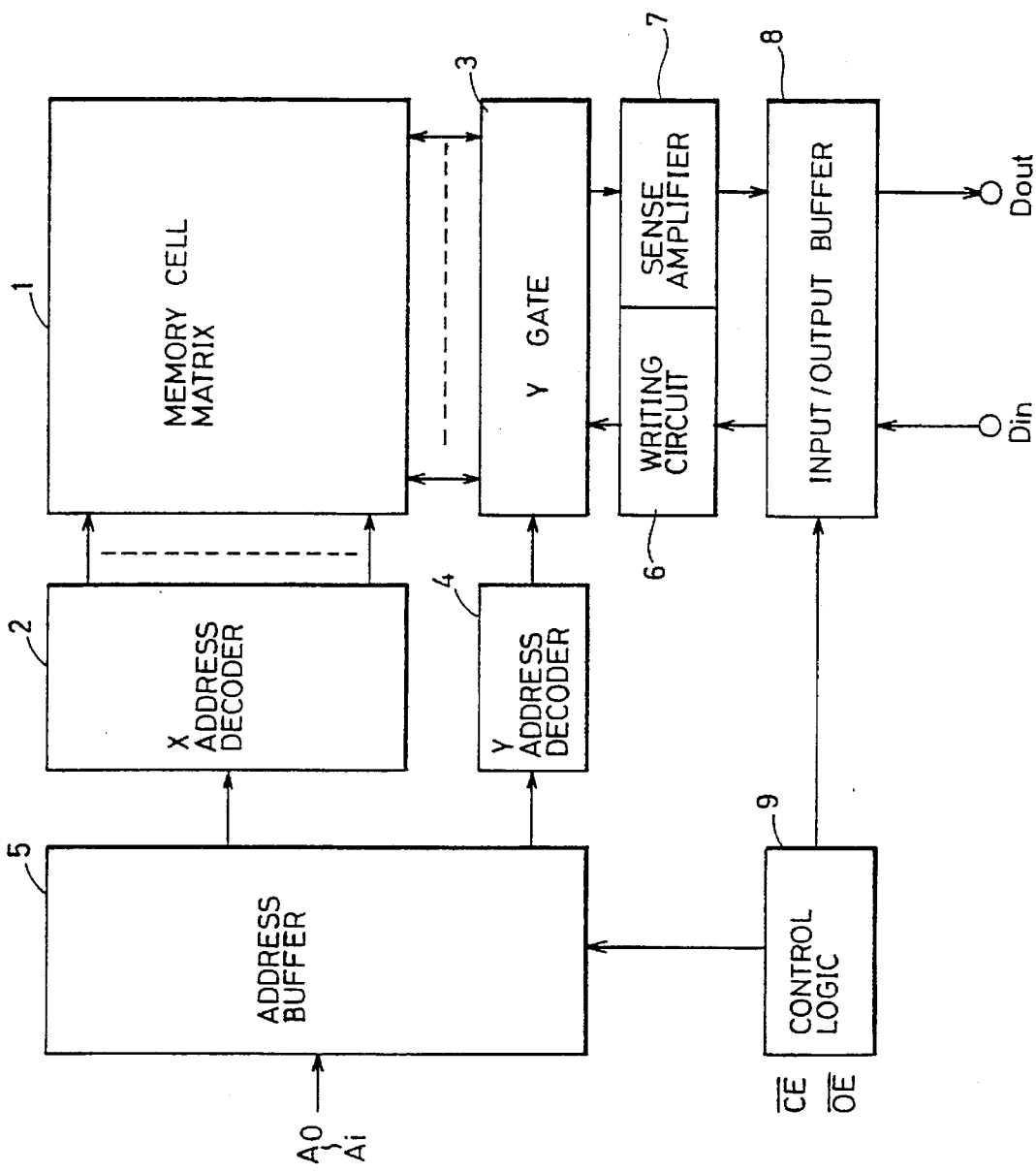
FIG. 148 is a block diagram of a flash memory showing a general structure.
Figure 149:
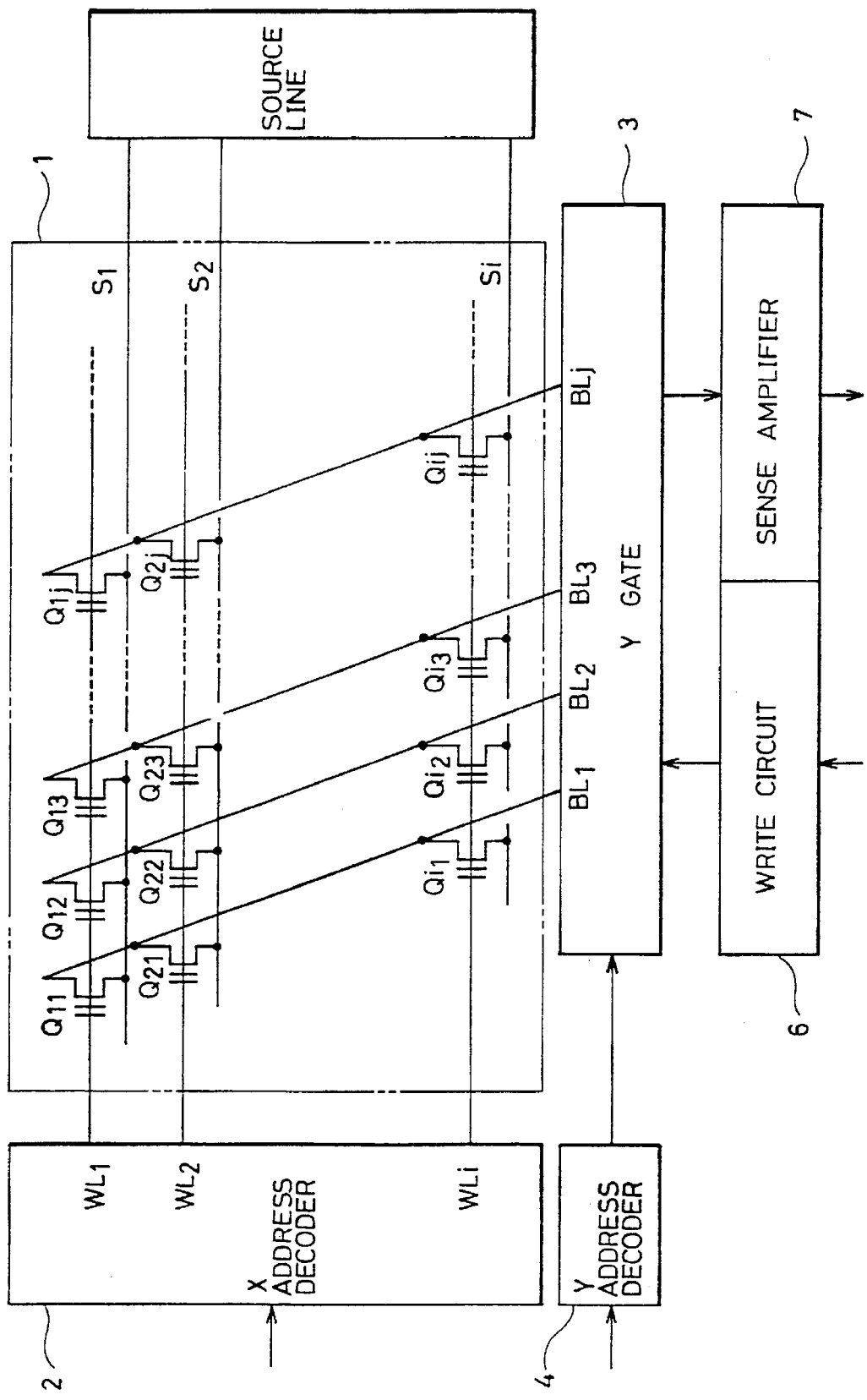
FIG. 149 is an equivalent circuit diagram schematically showing a structure of an NOR type memory cell matrix.
Figure 150:
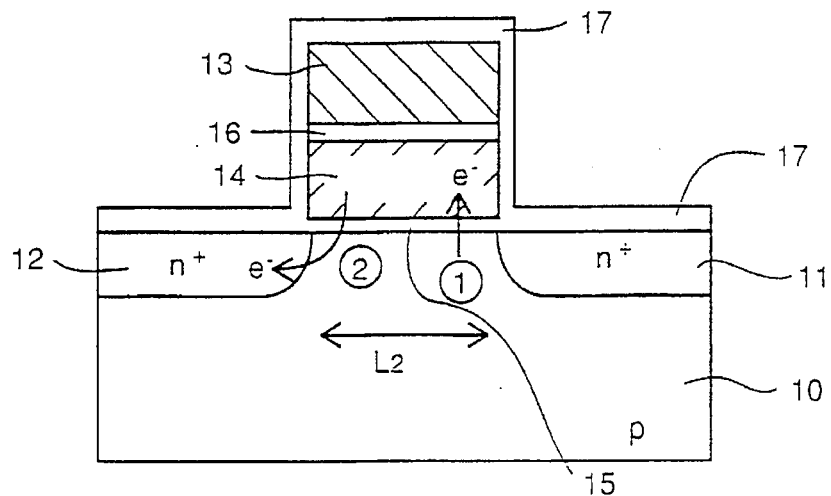
FIG. 150 is a sectional view of a structure of an NOR type memory transistor.
Figure 151:
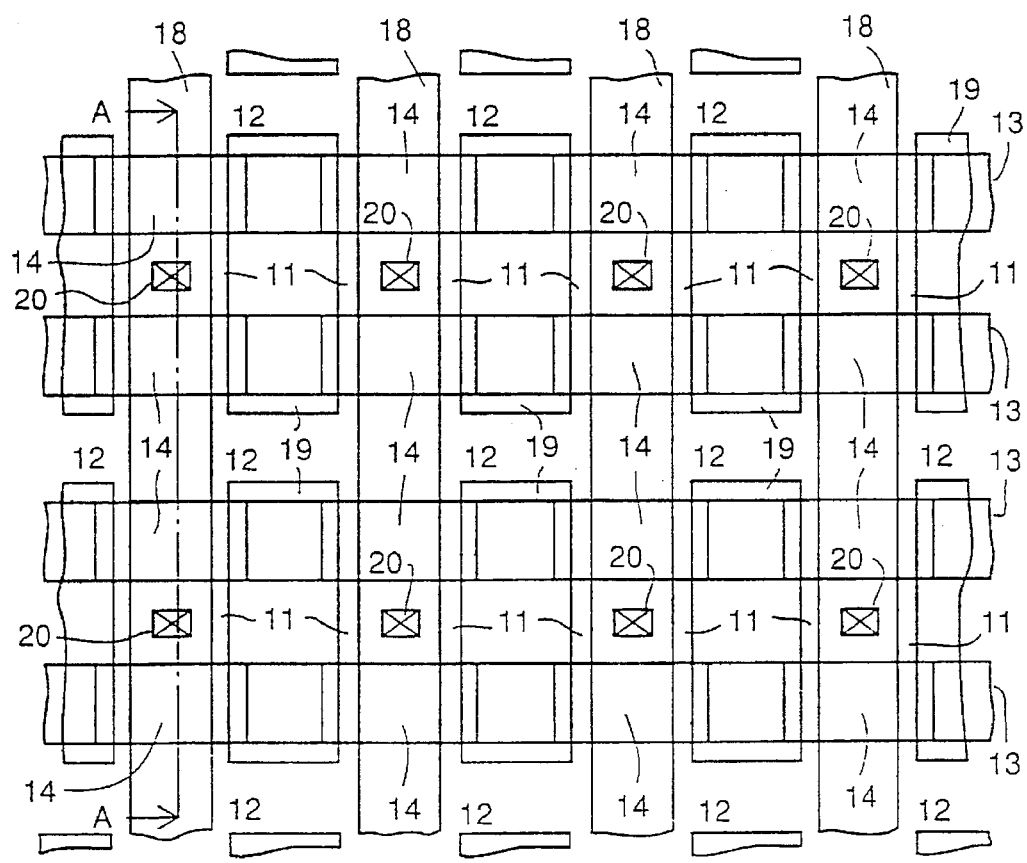
FIG. 151 is a plan view schematically showing an NOR type planner arrangement.
Figure 152:
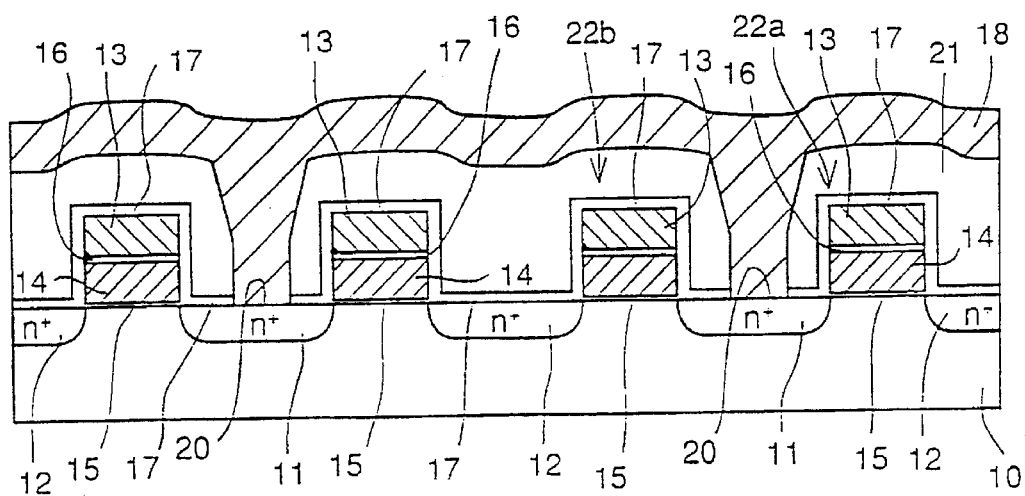
FIG. 152 is a sectional view taken along line A—A of FIG. 58.
Figure 153:
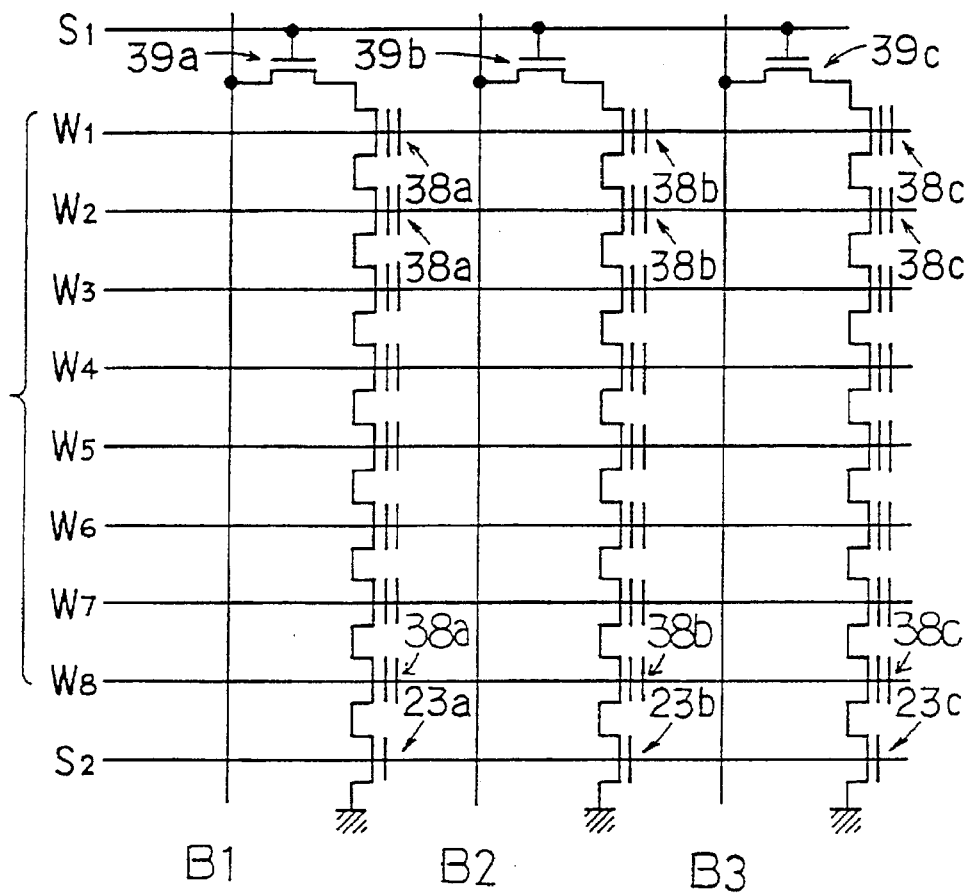
FIG. 153 is a partial equivalent circuit diagram of a memory cell matrix of an NAND type flash memory.
Figure 154:
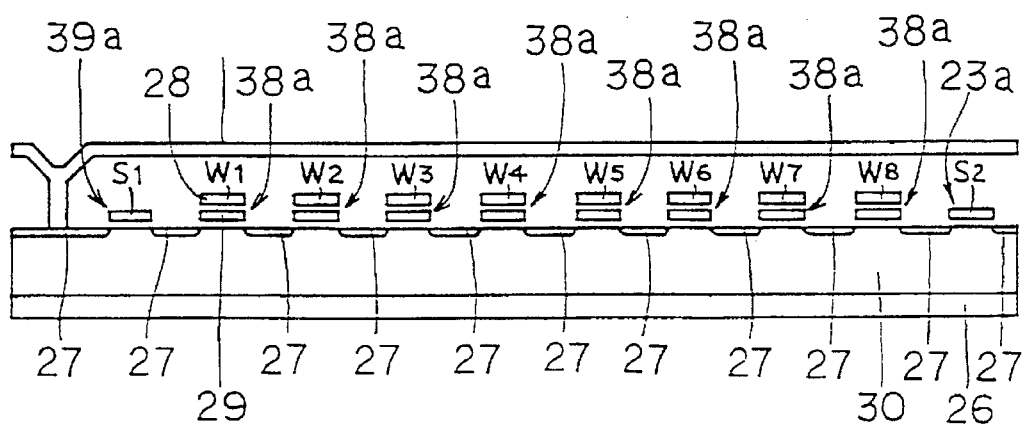
FIG. 154 is a partial sectional view of a memory cell matrix of an NAND type flash memory.
Figure 155:
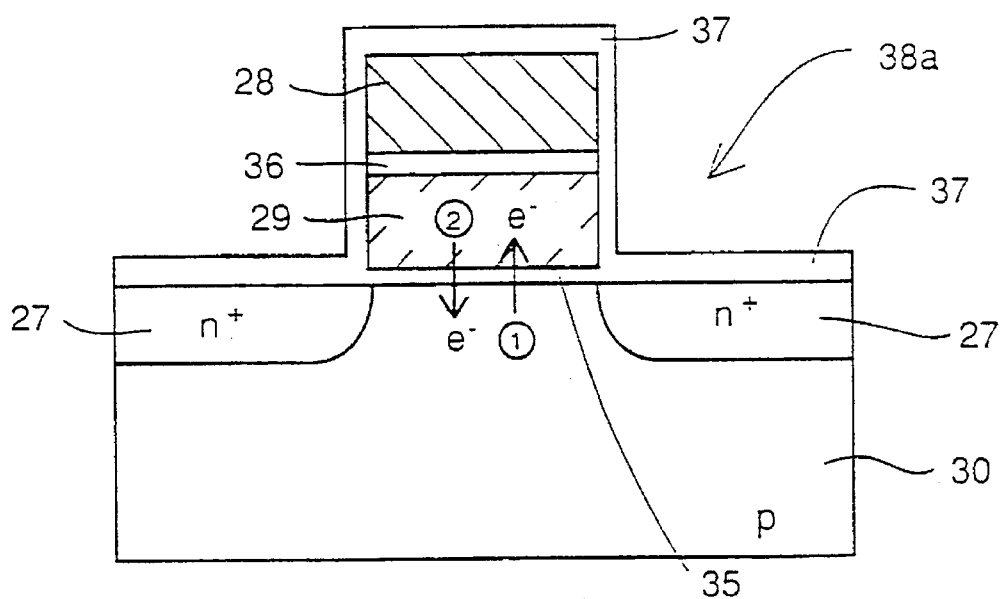
FIG. 155 is a sectional structural view of a memory transistor of an NAND type flash memory.

Equivalent NMOS transistor 1401 receives a negative voltage of −10 V via the gate electrode. This means that this equivalent transistor 1401 will not conduct in the above-described program operation. Therefore, a smaller value can be selected for the width Wa of isolation oxide film 1400 in comparison with the width Wb shown in FIG. 146. Thus, a higher integration density can be obtained.

Figure 25:
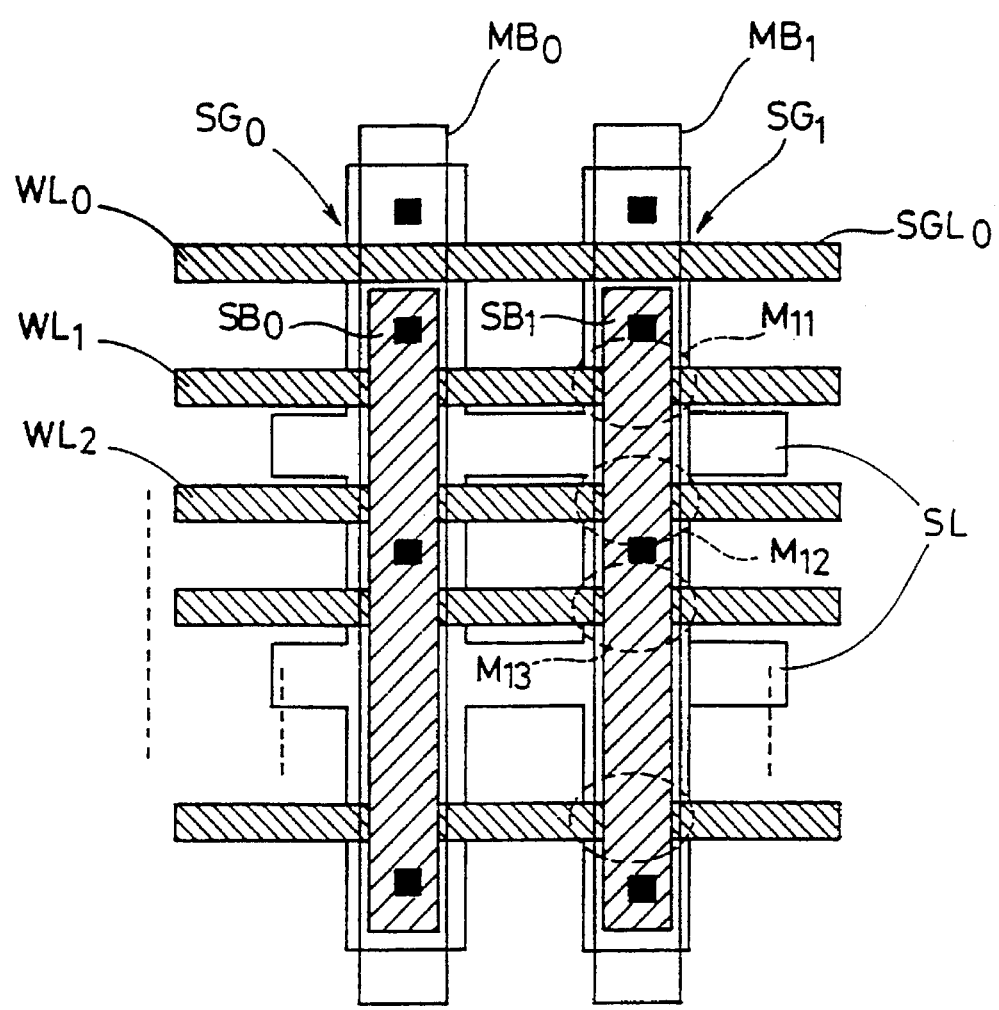
FIG. 25 is a layout diagram of the memory cell array in the sixth embodiment.
Figure 145:
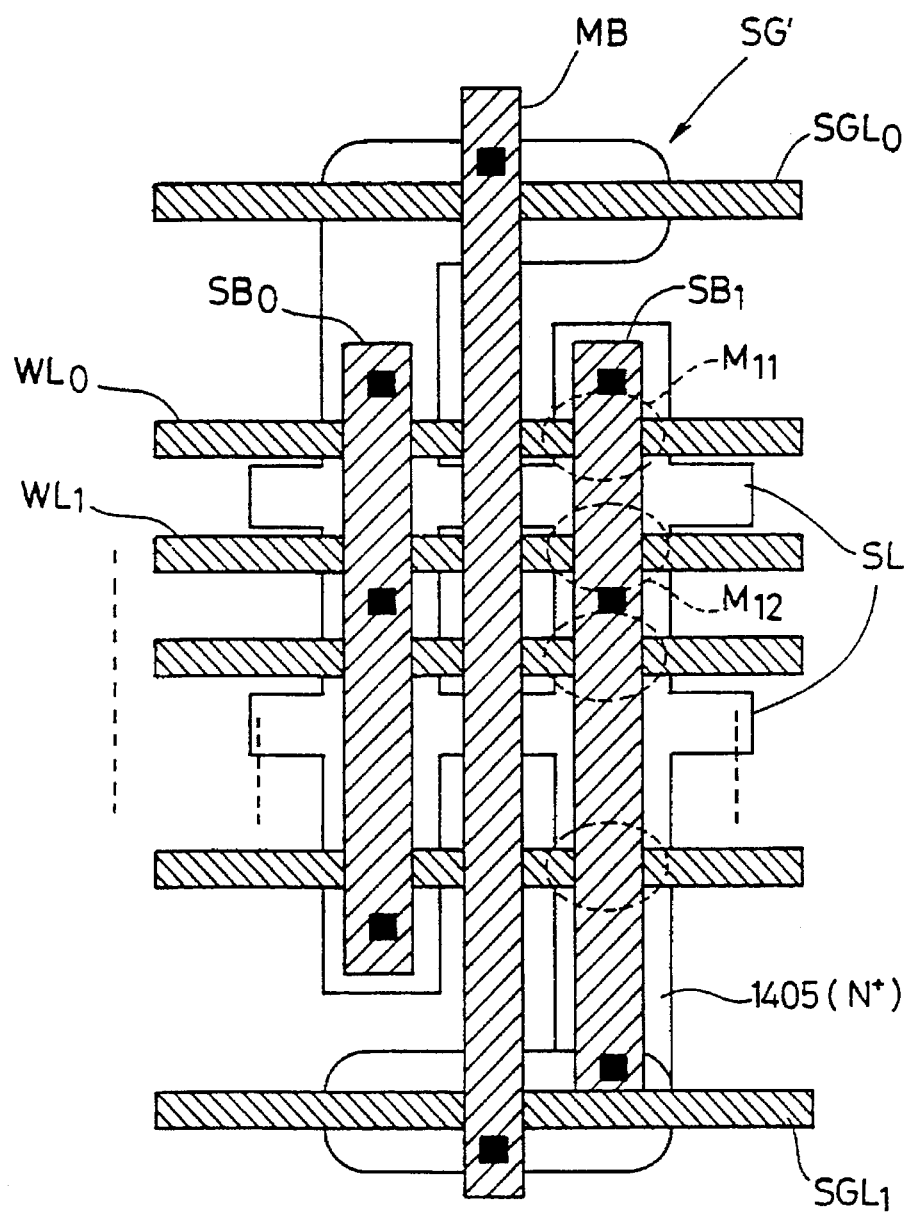
FIG. 145 is a layout diagram of a memory cell array of a conventional flash memory having a main bit line and a subbit line.

FIG. 25 is a layout of a memory cell array on a semiconductor substrate in accordance with the sixth embodiment. As described already, the current flowing through the subbit line is reduced significantly because the programming operation and erasure operation are carried out taking advantage of tunnel phenomenon in the sixth embodiment. Therefore, the channel width of select gate transistors SG0 and SG1 for sector selection can be selected to a smaller value in comparison with the case shown in FIG. 145. Therefore, a layout more applicable to high integration can be obtained.

FIG. 26 is a circuit diagram showing the voltage applied to the memory cell array of the sixth embodiment. FIG. 26(a) shows the voltage applied in a programming operation, and FIG. 26(b) shows the voltage applied in an erasure operation.

As shown in FIG. 26(a), the X decoder not shown provides the output voltages of −10V and 0 V in a programming operation. In other words, the X decoder provides output voltages having the voltage difference of 10 V.

Referring to FIG. 26(b), the X decoder requires the output voltages of 10 V and 0 V in an erasure operation. That is to say, the X decoder provides output voltages having a voltage difference of 10 V.

It can be appreciated by comparing the output voltage difference shown in FIG. 26 (i.e. 10 V) and that shown in FIG. 147 (i.e. 15 V and 18 V) that the output voltage difference of the X decoder is reduced in the sixth embodiment. This will contribute to improving the integration density of the X decoder. Because the output voltage difference of the X decoder is reduced in the sixth embodiment, the X decoder can be formed on a semiconductor substrate in a lower occupying area.

Figure 27:
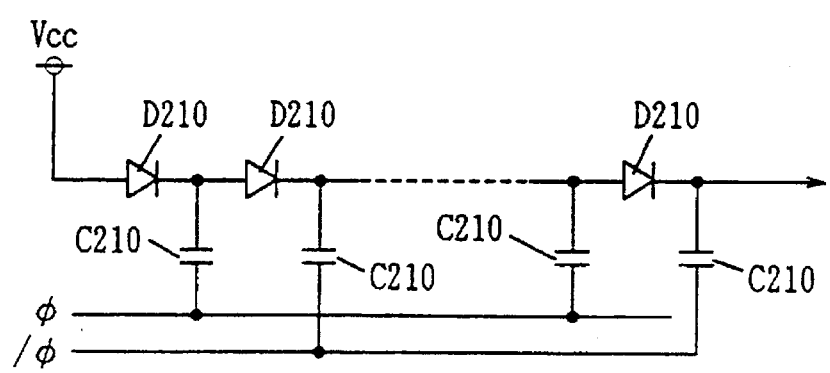
FIG. 27 is a circuit diagram showing an equivalent circuit of a high voltage generating circuit.
Figure 27:
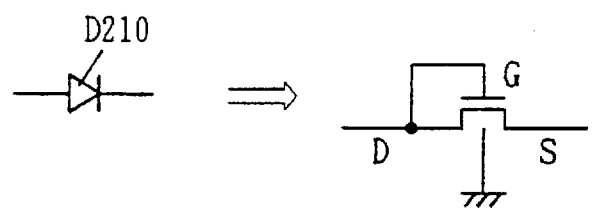
Figure 28:
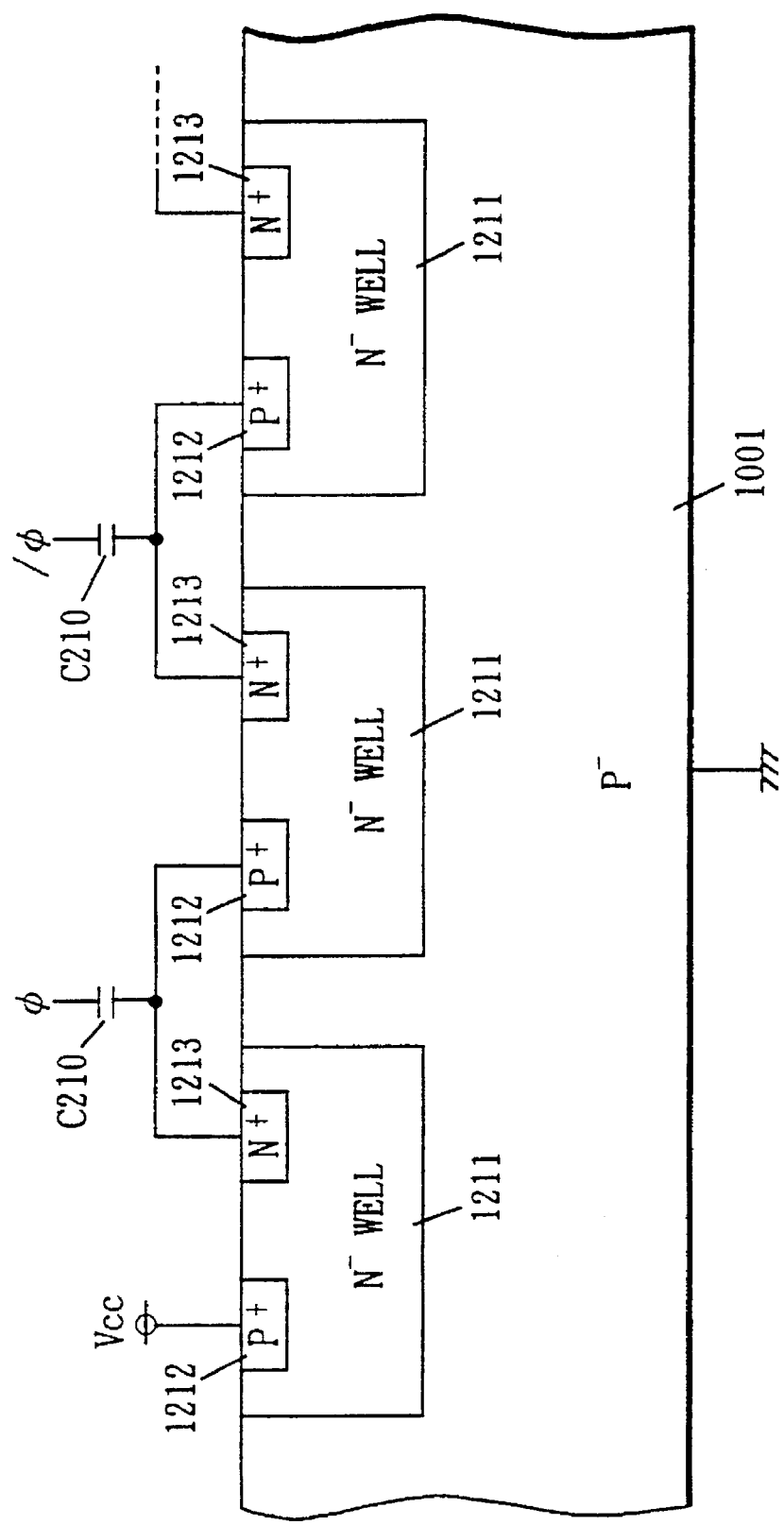
FIG. 28 is a sectional view showing a partial structure of the high voltage generating circuit employed for the flash memory according to the sixth embodiment.

(f) High Voltage Generating Circuit (FIGS. 27 and 28)

FIG. 27 shows an equivalent circuit of a high voltage generating circuit at (a). The high voltage generating circuit includes a plurality of diodes D210 and a plurality of capacitances C210. The capacitances C210 are supplied with two-phase clock signal $\phi$ and/$\bar{\phi}$, thereby forming charge pumps. As shown at (b) in FIG. 27, each diode D210 is generally formed by an N-channel transistor. The back gate of this N-channel transistor is grounded.

When a power supply voltage Vcc is at a low level (3 V, for example), however, it is difficult to obtain a high voltage due to a back gate effect. The back gate effect is such an effect that the threshold voltage is increased when a back gate voltage is reduced relatively with a source voltage.

FIG. 28 shows a structure employed in this embodiment. A plurality of N⁻ wells 211 are formed in a P⁻-type semiconductor substrate 1, while a P⁺-type impurity region 1212 and an N⁺-type impurity region 1213 are formed in each N⁻ well 1211. The P⁺-the impurity region 1212 and the N⁺-type impurity region 1213 form a diode.

According to this structure, no back gate effect is caused since each diode has no back gate.

Figure 29:
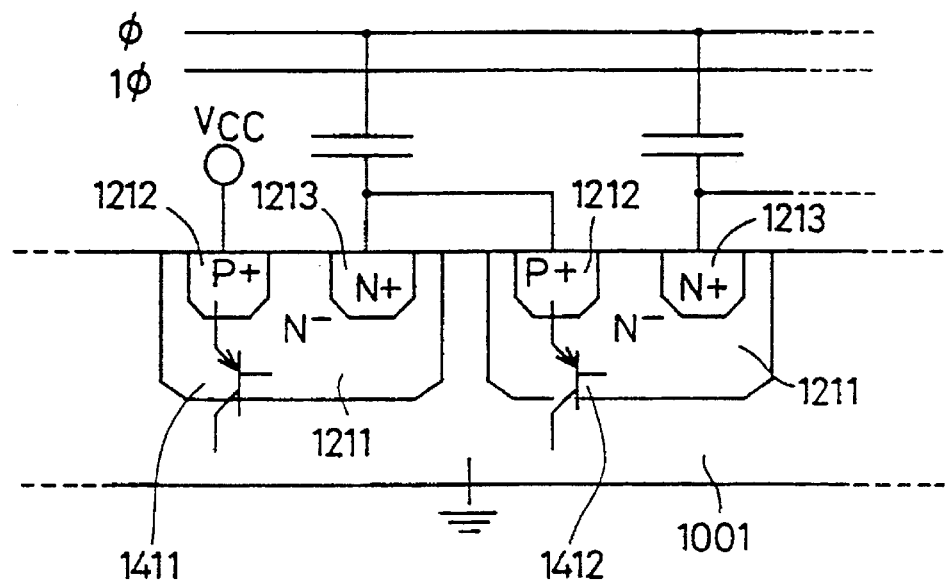
FIG. 29 is a sectional view for describing the presence of a parasitic transistor in the structure of FIG. 28.
Figure 30:
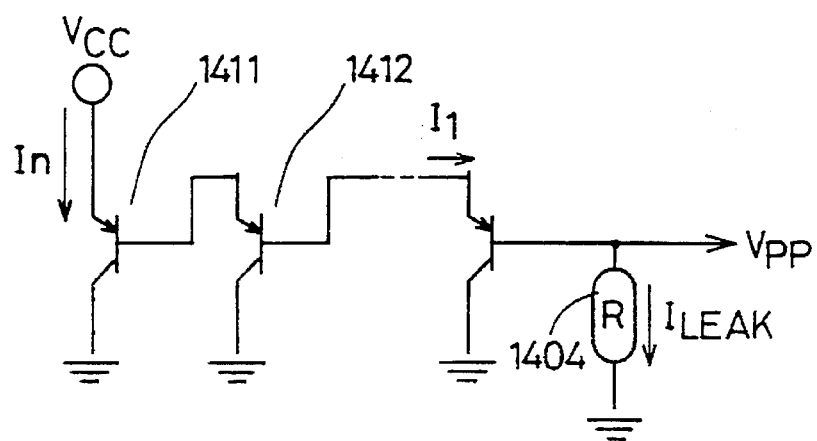
FIG. 30 is an equivalent circuit diagram of a circuit formed by the parasitic transistor shown in FIG. 29.

However, parasitic transistors (bipolar transistor) as shown in FIG. 29 may exist in the high voltage generating circuit having the structure shown in FIG. 28. Referring to FIG. 29, pnp type parasitic transistors 1411 and 1412 can be formed by a P⁺ type impurity region 1212, an N⁻ well 1211, and a P⁻ type. semiconductor substrate 1001. The circuit shown in FIG. 30 is equivalently formed by the presence of these parasitic transistors 1411, 1412, FIG. 30 is an equivalent circuit diagram of a circuit formed by the parasitic transistors 1411, 1412, . . . shown in FIG. 29. It can be appreciated from FIG. 30 that some leakage current $I_{LEAK}$ is slightly increased to induce an excessive amount of current In by the cascaded parasitic transistors 1411, 1412, . . . . . Assuming that the current amplified rate of each of parasitic transistors 1411, 1412, . . . is hfe, an excessive current In flows determined by the following equation.

$I_1 = (1+hfe) \cdot I_{LEAK}$ $In = (1+hfe)^n \cdot I_{LEAK}$

Figure 31:
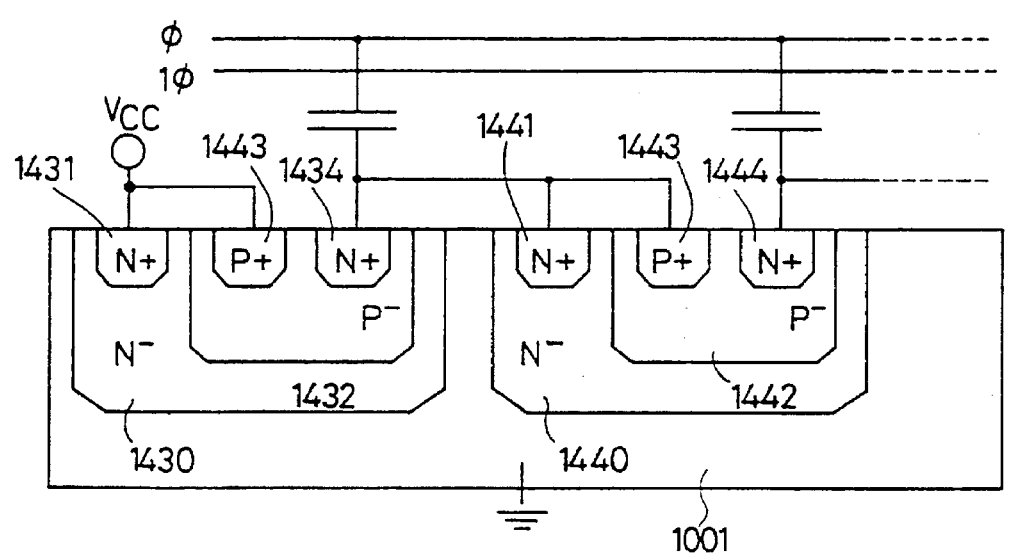
FIG. 31 is a sectional view of another structure of a high voltage generating circuit used in the flash memory of the sixth embodiment.

In order to prevent the flow of excessive current In in a high voltage generating circuit, the structure shown in FIG. 31 is proposed.

FIG. 31 is a sectional view of a high voltage generating circuit used in the flash memory of the sixth embodiment in accordance with another structure. As shown in FIG. 31, a triple well structure is used in the high voltage generating circuit. This prevents the presence of parasitic transistors 1411, 1412, . . . shown in FIG. 29 to allow a stable boosting operation.

Figure 32:
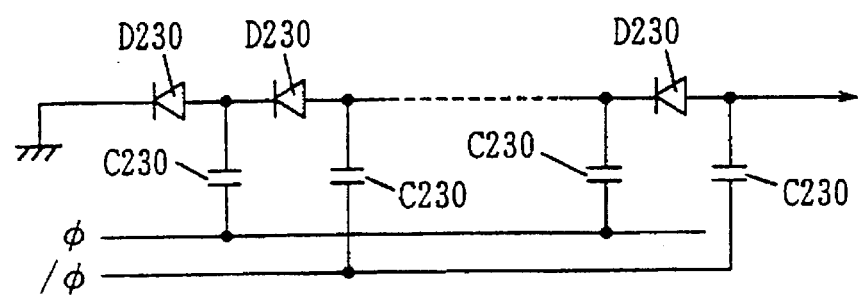
FIG. 32 is a circuit diagram showing an equivalent circuit of a negative voltage generating circuit.
Figure 32:
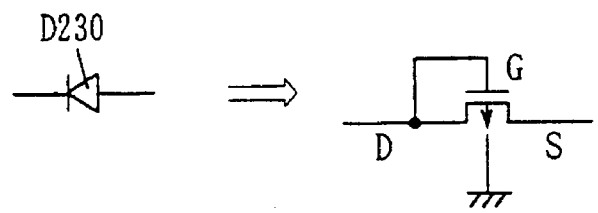
Figure 33:
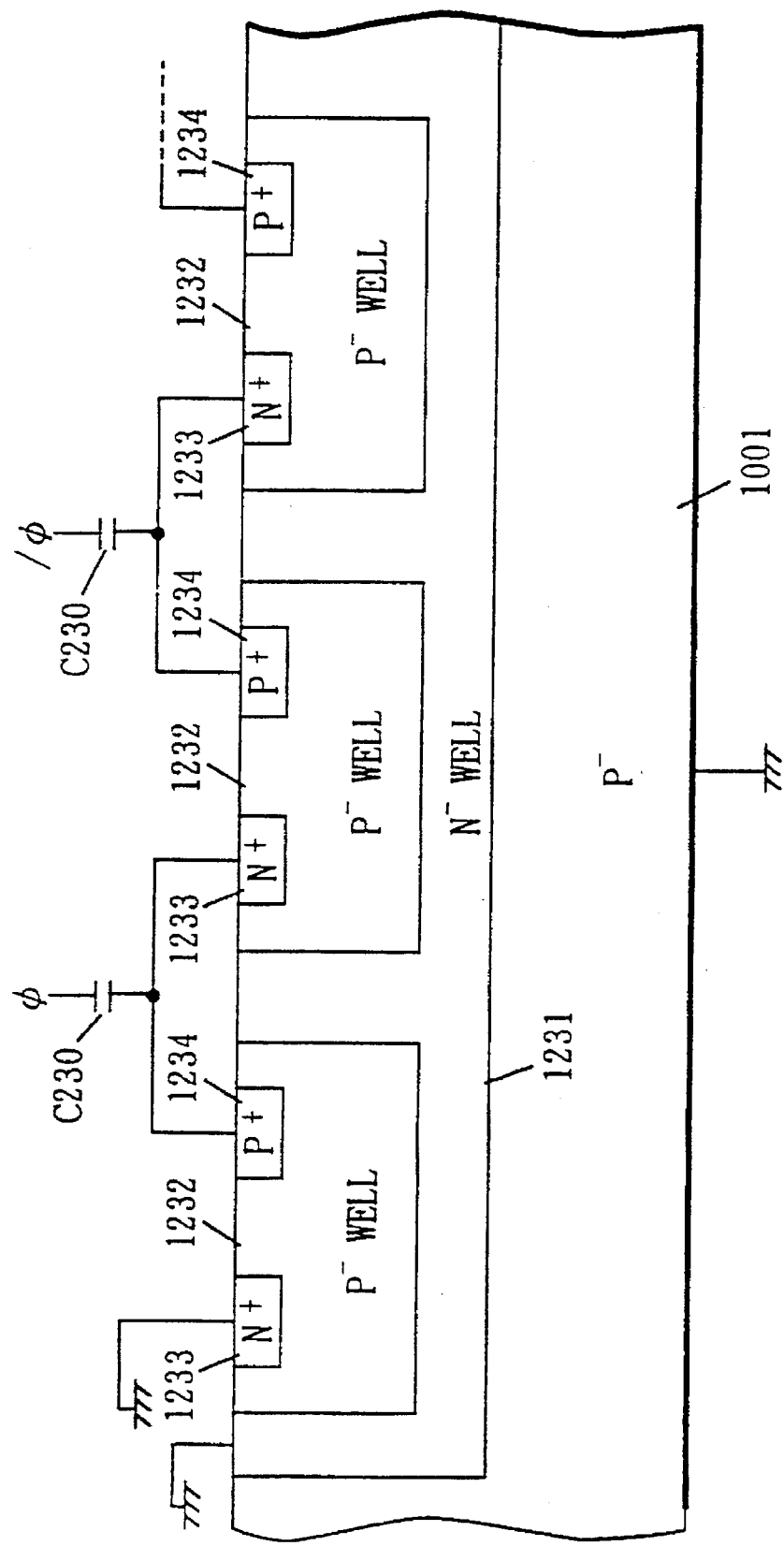
FIG. 33 is a sectional view showing a partial structure of the negative voltage generating circuit employed for the flash memory according to the sixth embodiment.

(g) Negative Voltage Generating Circuit (FIGS. 32 and 33)

FIG. 32 shows an equivalent circuit of a negative voltage generating circuit at (a). The negative voltage generating circuit includes a plurality of diodes D230 and a plurality of capacitances C230. The capacitances C230 are supplied with two-phase clock signal $\phi$ and/$\bar{\phi}$, thereby forming charge pumps.

Each diode D230 is generally formed by a P-channel transistor, as shown at (b) in FIG. 32. The back gate of the P-channel transistor is grounded.

When a power supply voltage Vcc is at a low level (3 V, for example), it is difficult to obtain a low negative voltage due to a back gate effect.

FIG. 33 shows a triple well structure employed in this embodiment. An N⁻ well 1231 is formed in a P⁻-type semiconductor substrate 1 and a plurality of P⁻ wells 1232 are formed in the N⁻ well 1231, while an N⁺-type impurity region 1233 and a P⁺-type impurity region 1234 are formed in each P⁻ well 1232. The N⁺-type impurity region 1233 and the P⁺-type impurity region 1234 form a diode.

According to this structure, no back gate effect is caused since each diode has no back gate. Further, the memory cell is also formed in the N⁻ well as shown in FIG. 23, whereby no fabrication step is increased.

Figure 34:
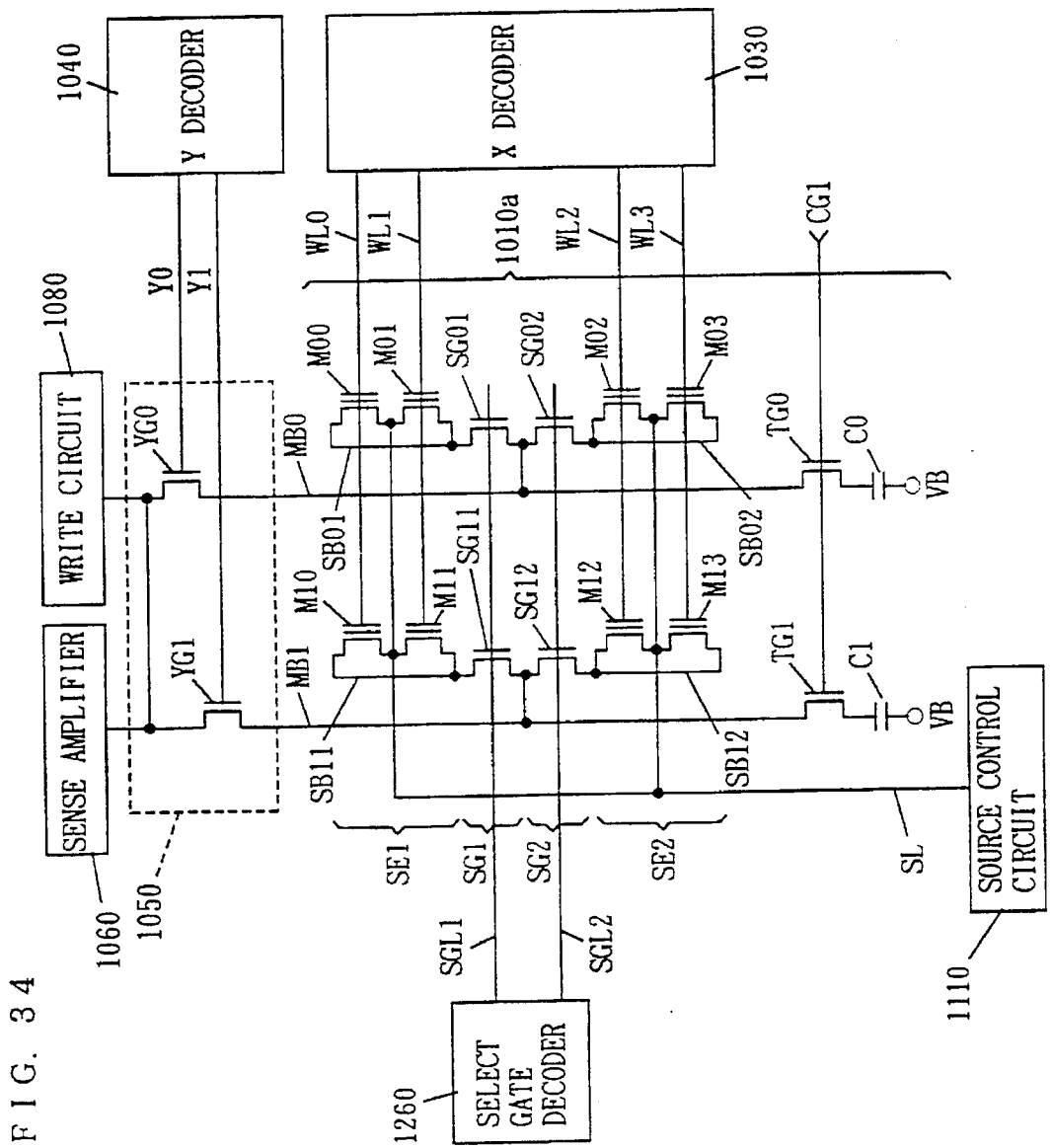
FIG. 34 is a circuit diagram showing the structures of a memory array included in a flash memory according to the seventh embodiment and parts related thereto in detail.
Figure 35:
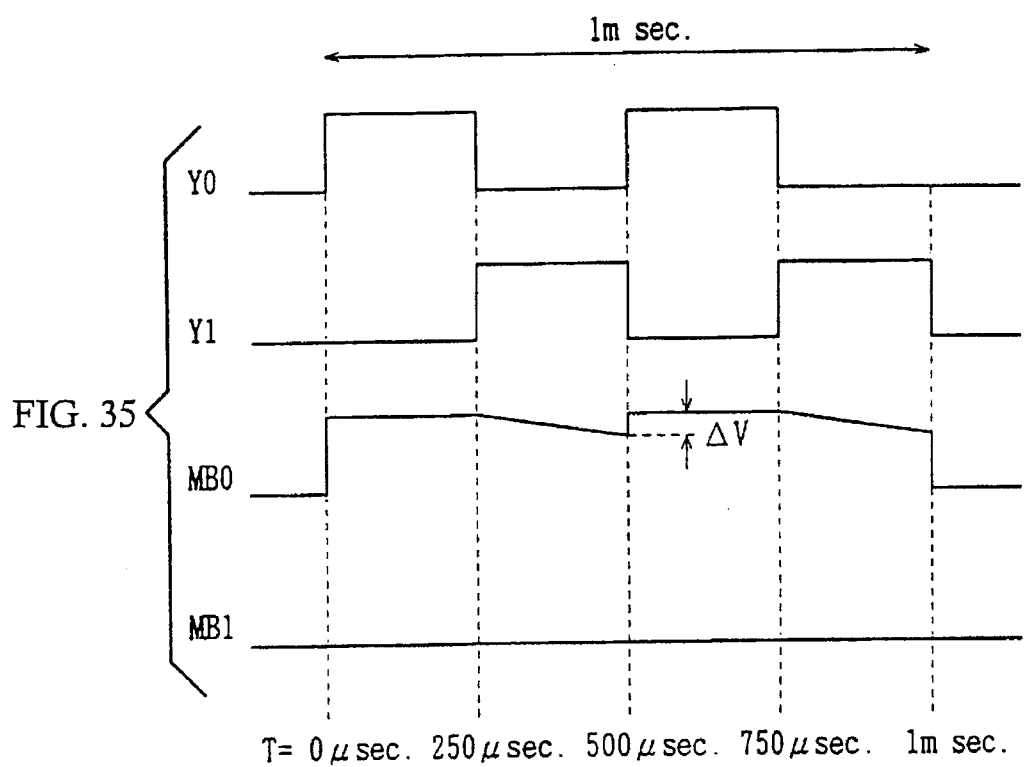
FIG. 35 illustrates changes of voltages in main bit lines in a program operation in the seventh embodiment.

(7) Seventh Embodiment (FIGS. 34 and 35)

FIG. 34 is a circuit diagram showing the structures of a memory array of a flash memory according to the seventh embodiment and parts related thereto in detail. The overall structure of the flash memory according to the seventh embodiment is similar to that shown in FIG. 18.

The seventh embodiment is different from the sixth embodiment in a point that capacitances C0 and C1 are connected to main bit lines MB0 and MB1 through transfer gate transistors TG0 and TG1 respectively. Well potentials VB are supplied to the capacitances C0 and C1. A control signal CG1 is supplied to the transfer gate transistors TG0 and TG1 from a control circuit 1130. The structures of other parts are similar to those shown in FIG. 19.

Assuming that a program time for a single memory is 1 msec., for example, a time of 2 msec. is required for programming in the two-bit structure shown in FIG. 34. In practice, however, hundreds to thousands of memory cells are connected to a single word line, and hence an enormous time is required for rewriting data. A data latch may be provided every main bit line for simultaneously programming memory cells which are connected to a plurality of bit lines. However, it is difficult to implement such a layout.

In the seventh embodiment, therefore, the capacitances C0 and C1 are provided as shown in FIG. 34.

In programming, the transfer gate transistors TG0 and TG1 are turned on in response to the control signal CG1. A Y decoder 1040 switches Y gate transistors YG0 and YG1 at a high speed with a period of several 10 μsec., for example, in response to a Y address signal. At this time, data are sequentially supplied to a write circuit 1080 in accordance with the Y address signal. Thus, the capacitances C0 and C1 are changed in accordance with the data through the main bit lines MB0 and MB1. This operation is repeated for 1 msec.

In general, a current of not more than several nA is required for emission of electrons from a floating gate by a tunnel effect. Thus, it is possible to supply a consumption current required for the tunnel effect by the charges stored in the capacitances C0 and C1.

When the Y gate transistors YG0 and YG1 are switched every 250 μsec. as shown in FIG. 35, for example, no program voltage is applied to the main bit line MB0 for periods of 250 to 500 μsec. and 750 μsec. to 1 msec. During these periods, however, the voltage of the main bit line MB0 is maintained by the charges stored in the main bit line MB0 and the capacitance C0. Thus, a time required for programming memory cells which are connected to the main bit lines MB0 and MB1 is 1 msec.

A voltage decrement Δ V in a period when no program voltage is applied to the main bit line MB0 is determined by the value of the capacitance C0 and the switching frequency for the Y gate transistors YG0 and YG1. As the value of the capacitance C0 or the switching frequency is increased, the decrement of the program voltage is so suppressed that the program operation is stably performed at a high speed.

When the capacitances C0 and C1 are formed by MOS capacitances, the main bit lines MB0 and MB1 are preferably connected to their gates. If the main bit lines MB0 and MB1 are connected to the diffusion layers of the MOS capacitances, the charged program voltage may be discharged in a short period by junction leakage or the like under a high temperature, for example.

Conditions of voltage application in programming and erasing are similar to those of the sixth embodiment. Further, batch sector erase and program operations are also similar to those of the sixth embodiment.

(8) Eighth Embodiment (FIGS. 36 to 51)

Figure 36:
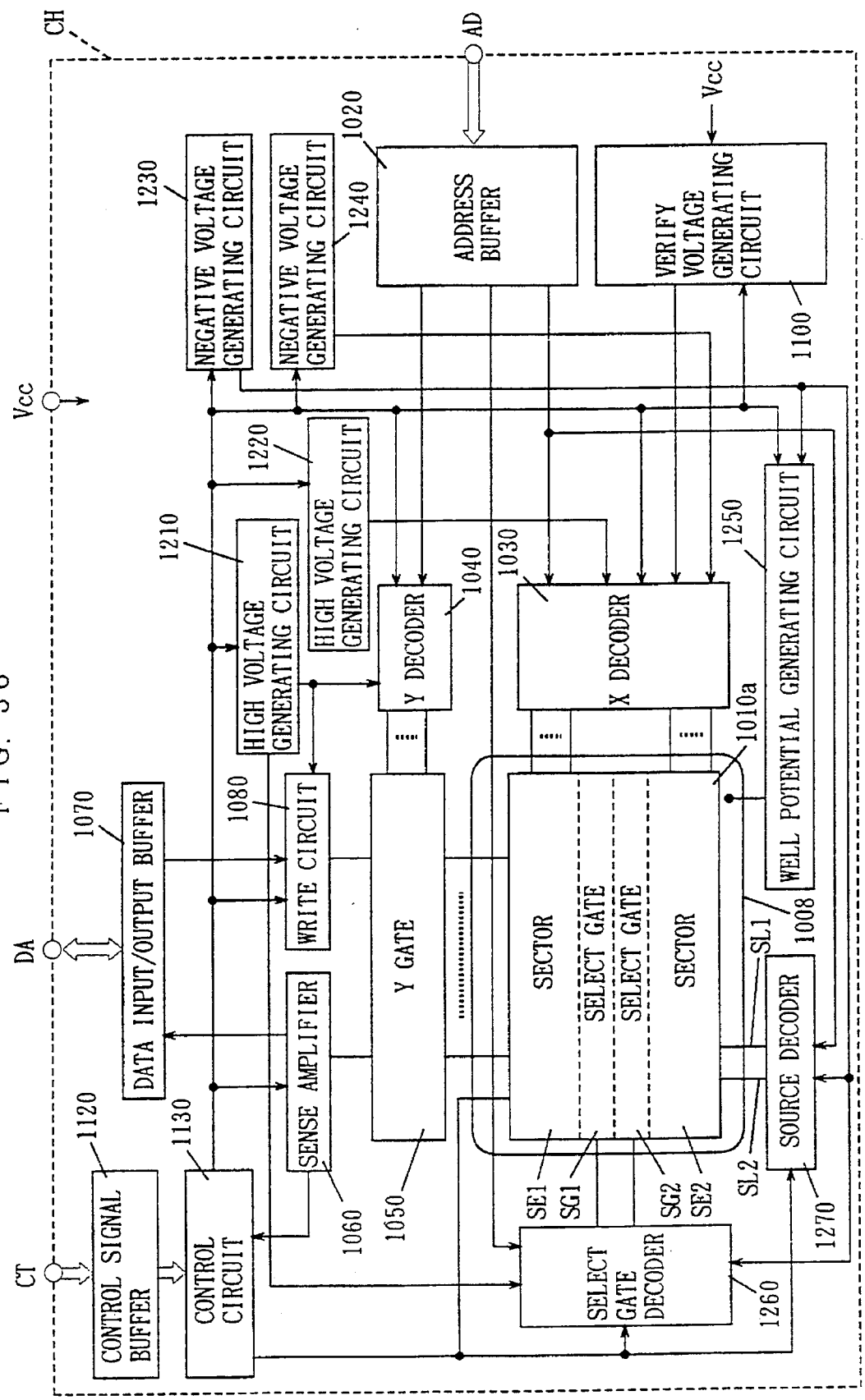
FIG. 36 is a block diagram showing the overall structure of a flash memory according to the eighth embodiment.
Figure 37:
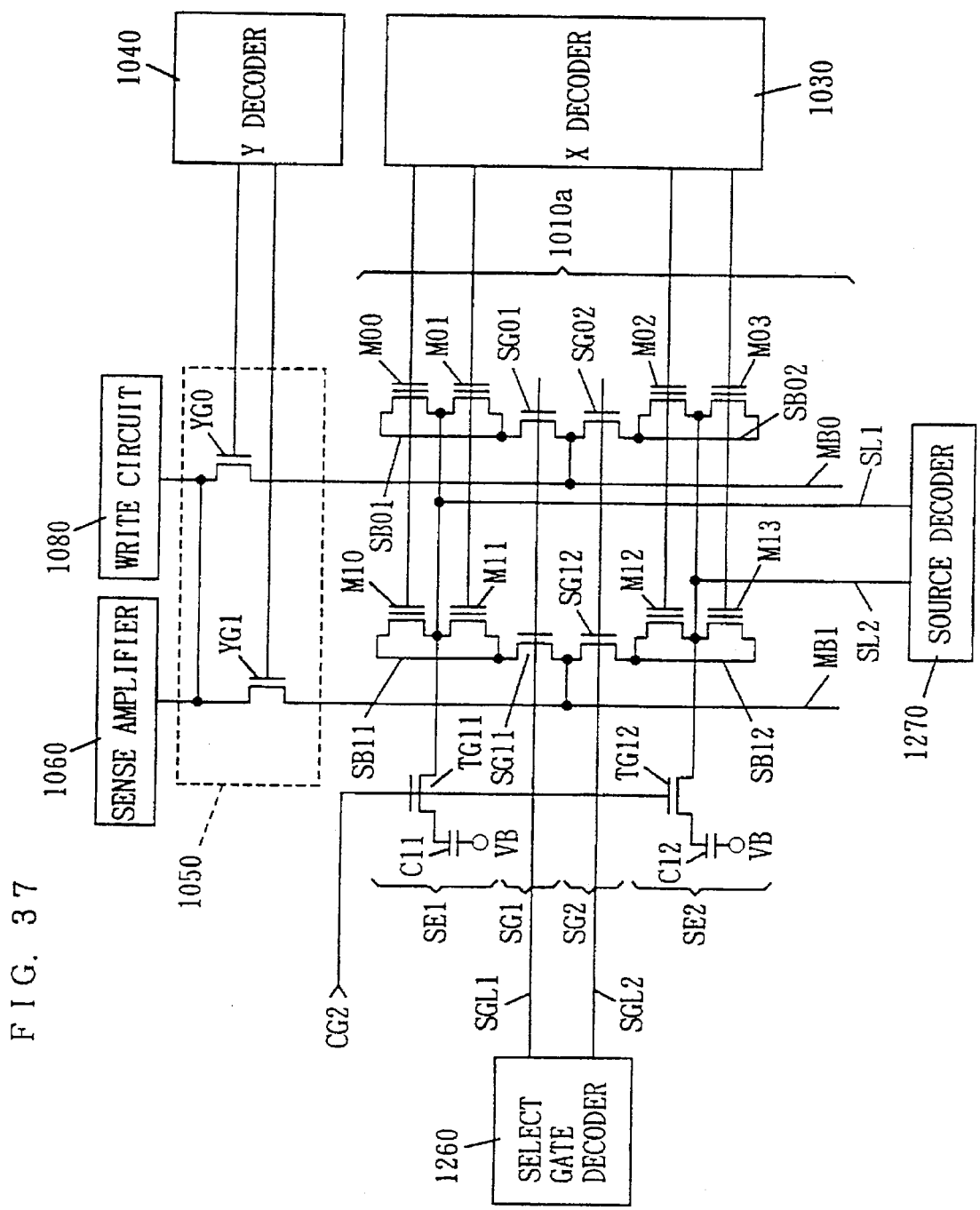
FIG. 37 is a circuit diagram showing the structures of a memory array included in the flash memory shown in FIG. 36 and parts related thereto in detail.

FIG. 36 is a block diagram showing the overall structure of a flash memory according to the eighth embodiment. FIG. 37 is a circuit diagram showing the structures of a memory array and parts related thereto in detail.

The flash memory shown in FIG. 36 is different from that of the sixth embodiment shown in FIG. 18 in the following point: The source control circuit 1110 is replaced by a source decoder 1270. Further, a negative voltage generating circuit 1230 supplies negative voltages to a select gate decoder 1260 and the source decoder 1270 in place of the Y decoder 1040.

As shown in FIG. 37, the sources of memory cells M00, M01, M10 and M11 provided in a sector SE1 are connected to a source line SL1, while those of memory cells M02, M03, M12 and M13 provided in another sector SE2 are connected to another source line SL2. An output terminal of the source decoder 1270 is connected to the source lines SL1 and SL2.

In erasing, the source of each memory cell provided in a selected sector is in a floating state. If the source has a leakage path, the source potential is so increased that an electric field across the source and a floating gate is reduced.

In order to stabilize the source potentials in erasing, therefore, capacitances C11 and C12 may be connected to the source lines SL1 and SL2 through transfer gate transistors TG11 and TG12 respectively.

Well potentials VB are supplied to the capacitances C11 and C12. On the other hand, a control signal CG2 is supplied to the transfer gate transistors TG11 and TG12 from a control circuit 1130.

In erasing, the transfer gate transistors TG11 and TG12 are turned on in response to the control signal CG2. Thus, changes of the source potentials are reduced.

Program and read operations in the eighth embodiment are similar to those in the sixth embodiment. A batch sector erase operation is now described.

In the sixth embodiment, voltages are applied to a memory cell as shown at (b) in FIG. 20 in erasing. When the memory cell is erased in an extremely short period (several msec., for example), however, formation of an inversion layer cannot follow such voltage application and a depletion layer is formed in a lower part of the memory cell.

In this case, conditions of voltage application for memory cells provided in a selected sector are preferably made different from those for memory cells provided in a nonselected sector.

The conditions of voltage application for each memory cell depend on whether or not gate bird's beaks are caused in an insulating film 1004 (tunnel insulating film) provided under a floating gate 1005. The "gate bird's beak" indicates such a state that a lower peripheral edges of the floating gate 1005 is corroded by the tunnel insulating film provided under the floating gate 1005 in fabrication, as denoted by gb in FIG. 43. Thus, the thickness of the tunnel insulating film is increased under the peripheral edges of the floating gate 1005.

Conditions of voltage application for a memory cell having no or small gate bird's beaks are first described, and then those for a memory cell having large gate bird's beaks are described.

Figure 38:
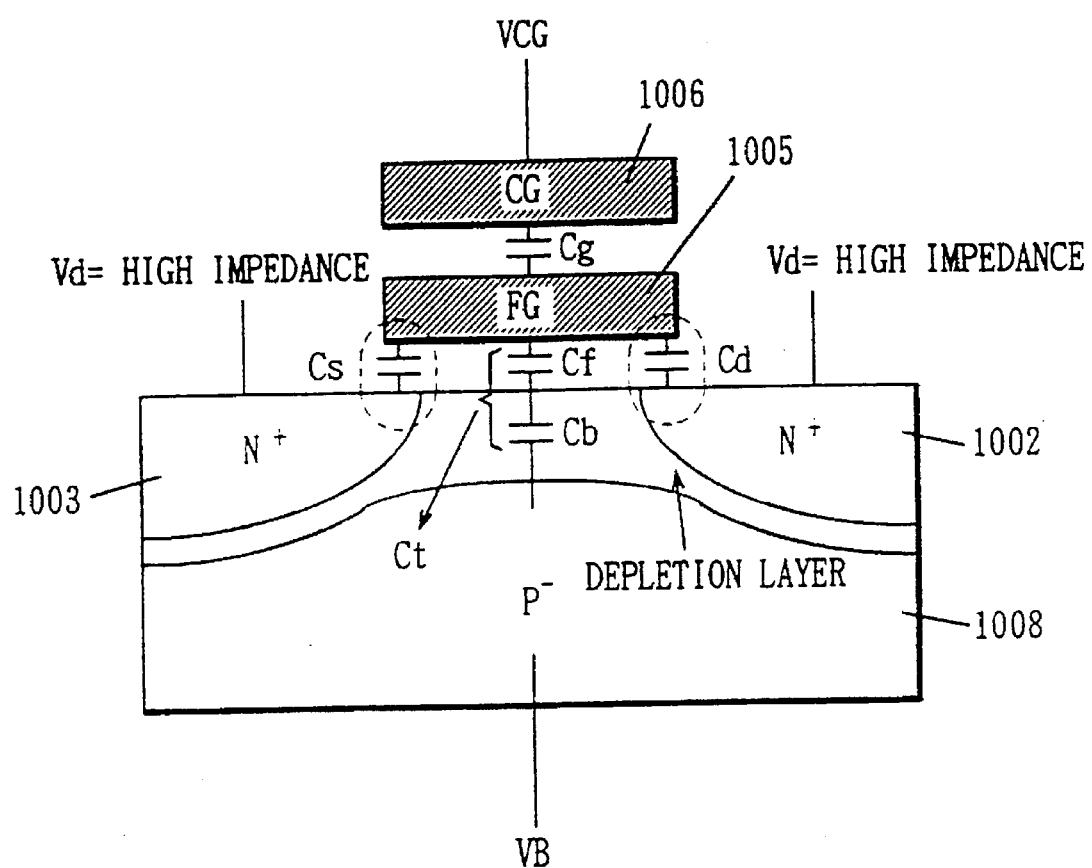
FIG. 38 is a diagram for illustrating an erased state of a memory cell having no gate bird's beaks.
Figure 39:
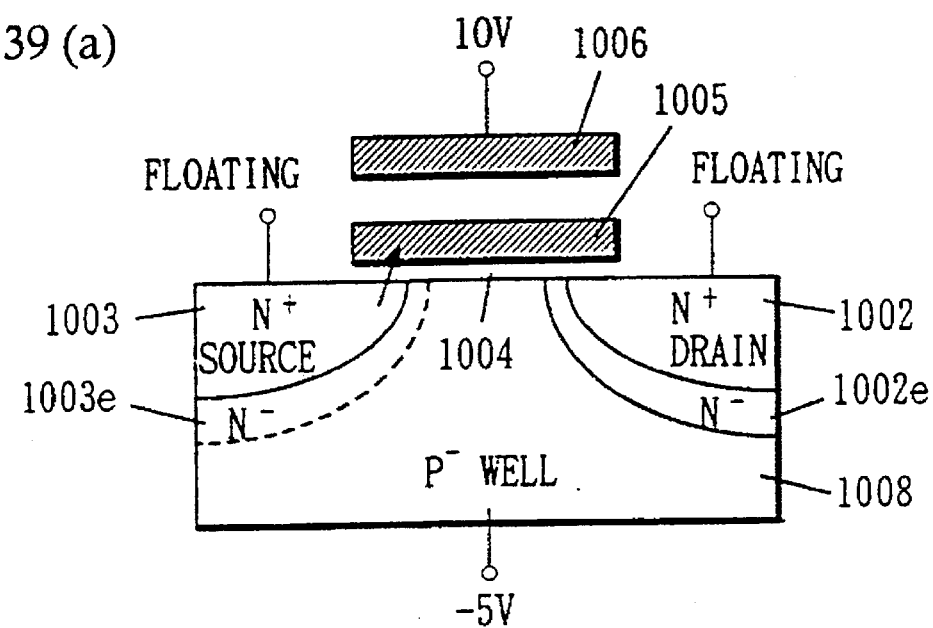
FIG. 39 illustrates conditions of voltage application for memory cells, having no gate bird's beaks, provided in selected and nonselected sectors in erasing.
Figure 39:
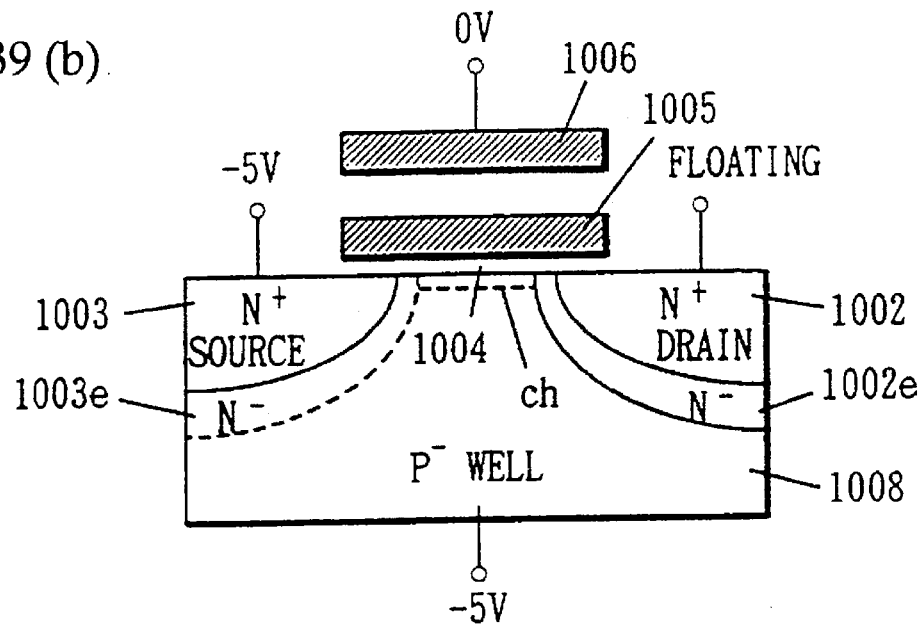

(b) Memory Cell Having No Gate Bird's Beaks (FIGS. 38 to 42):

(i) Erasing of Memory Cell (FIGS. 38 and 39)

FIG. 38 shows a capacitance Cg between a control gate 6 and a floating gate 1005, a capacitance Cf between the floating gate 1005 and a P$^-$ well 1008, a capacitance Cb defined by a depletion layer, a capacitance Cd between a drain 1002 and the floating gate 1005, and a capacitance Cs between a source 1003 and the floating gate 1005. Symbol Ct denotes the total amount of the capacitances Cf and Cb.

A positive voltage VCG is applied to the control gate 1006, while a negative voltage VB is applied to the P$^-$ well 1008. Since the drain 1002 and the source 1003 are in floating states, drain and source voltages Vd and Vs substantially reach the negative voltage VB. Assuming that VFG represents the current potential of the floating gate 1005 and the initial storage charges are zero, the following equation holds for the principle of conservation of charge:

$$(VCG-VFG) \cdot Cg = (VFG - VB) \cdot (Cs+Ct+Cd) \tag{1}$$

The equation (1) is expanded as follows:

$$VFG = \{VCG \cdot Cg + (Cs+Ct+Cd) \cdot VB\}/(Cs+Ct+Cd+Cg) \tag{2}$$

The equation (1) is further expanded as follows:

$$VFG = \{VCG + (Cs+Ct+Cd) \cdot VB/Cg\}/\{(Cs+Ct+Cd)/Cg+1\} \tag{3}$$

The values Cs and Cd can be neglected since the same are small as compared with the value Cg. Thus, the equation (3) can be written as follows:

$$VFG = (VCG + Ct \cdot VB/Cg)/(Ct/Cg+1) \tag{4}$$

When the depletion layer is spread, the capacitances Cb and Ct are reduced. Thus, the potential VFG of the floating gate 1005 approaches the potential VCG of the control gate 1006. However, the potentials of the drain 1002 and the source 1003 which are in floating states are substantially identical to that of the P$^-$ well 1008.

In this case, an electric field E across the floating gate 1005 and the drain 1002 or the source 1003 is expressed as follows:

$$E=(VFG-VB)/TOX \qquad (5)$$

where VFG represents the potential of the floating gate 1005 and VB represents that of the P⁻ well 1008, while TOX represents the thickness of the tunnel insulating film.

Since the potential VFG of the floating gate 1005 is increased, the electric field across the floating gate 1005 and the drain 1002 or the source 1003 is increased. Therefore, a tunnel effect is improved on an end of the drain 1002 or the source 1003. Thus, erasability is improved.

Such an effect is preferable for a selected sector, but unpreferable for a nonselected sector.

Therefore, the source 1003 of each memory cell provided in a selected sector is brought into a floating state as shown at (a) in FIG. 39, while a potential identical to or higher than that of the P⁻ well 1008 is supplied to the source 1003 of each memory cell provided in a nonselected sector as shown at (b) in FIG. 39.

Thus, a channel ch is formed between the source 1003 and the drain 1002 in each memory cell provided in a nonselected sector, and the potential of the channel ch is supplied from the source 1003. Therefore, the potential of the floating gate 1005 is reduced due to capacitive coupling between the floating gate 1005 and the channel ch, to relieve the electric field applied to the tunnel insulating film. As the result, data is stably protected in each memory cell provided in a nonselected sector.

Figure 40:
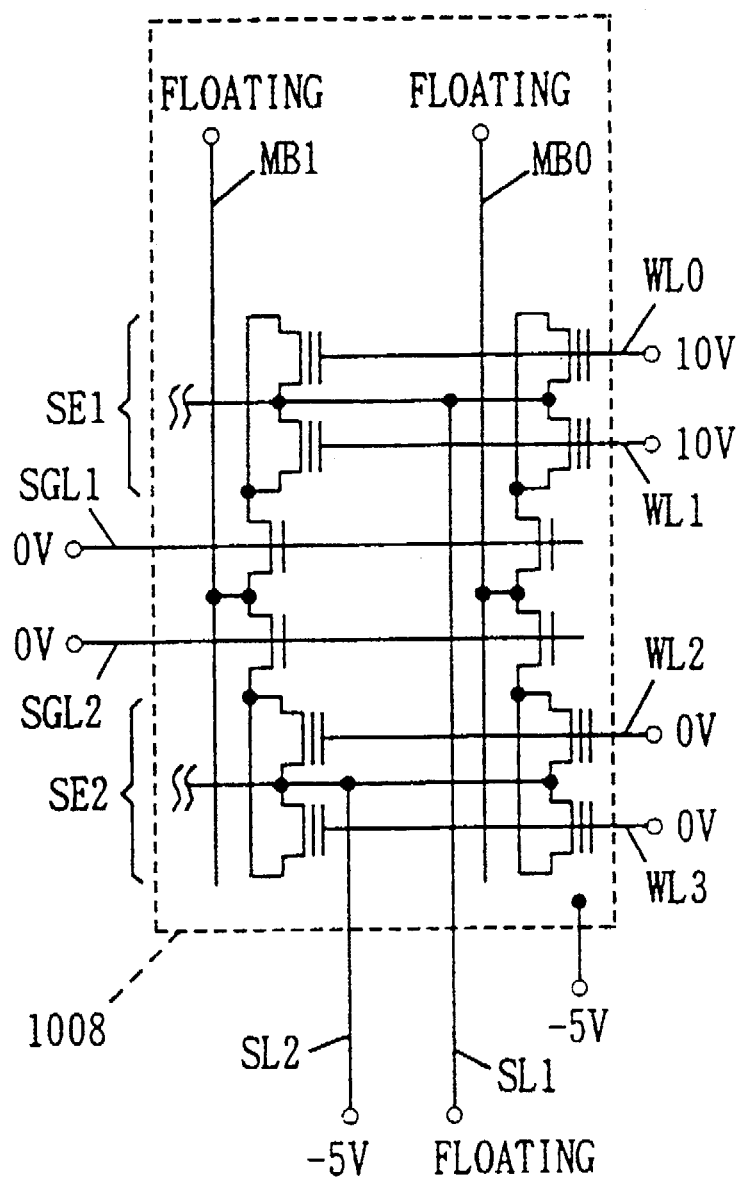
FIG. 40 illustrates conditions of voltage application for memory cells having no gate bird's beaks in a batch sector erase operation.

(ii) Batch Sector Erase Operation in Flash Memory (FIG. 40)

With reference to FIG. 40, a batch sector erase operation in the flash memory having no gate bird's beaks is now described. It is assumed here that memory cells provided in the sector SE1 are batch-erased.

10 V is applied to word lines WL0 and WL1 provided in the sector SE1, while 0 V is applied to word lines WL2 and WL3 provided in the sector SE2. Further, 0 V is applied to select gate lines SGL1 and SGL2. −5 V is applied to the P⁻ well 1008. The source line SL1 is brought into a floating state, while −5 V is applied to the source line SL2.

Thus, it is possible to batch-erase the memory cells provided in the sector SE1 while stably protecting the data in the memory cells provided in the sector SE2.

Figure 41:
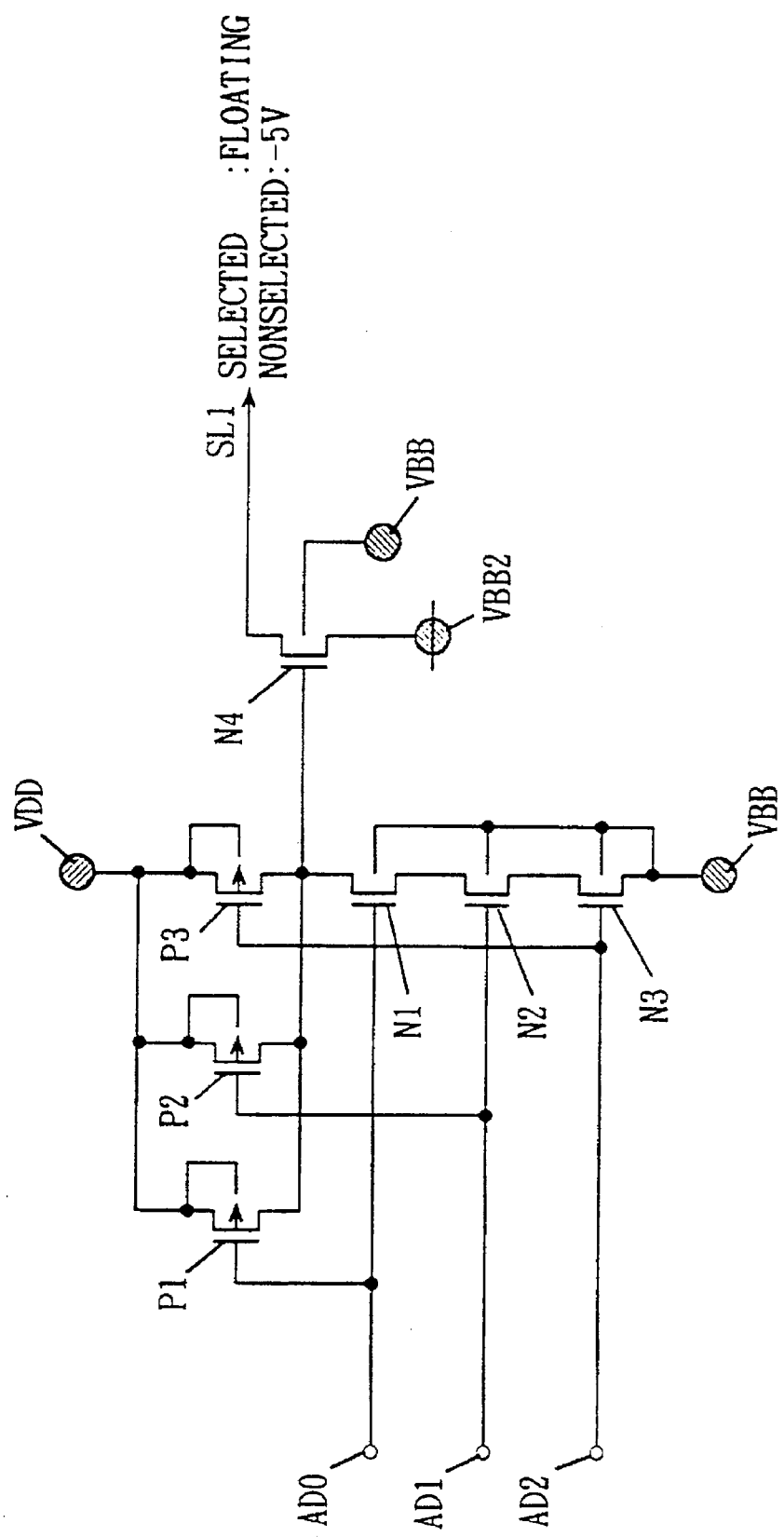
FIG. 41 is a circuit diagram showing the structure of a source decoder employed for memory cells having no gate bird's beaks.
Figure 42:
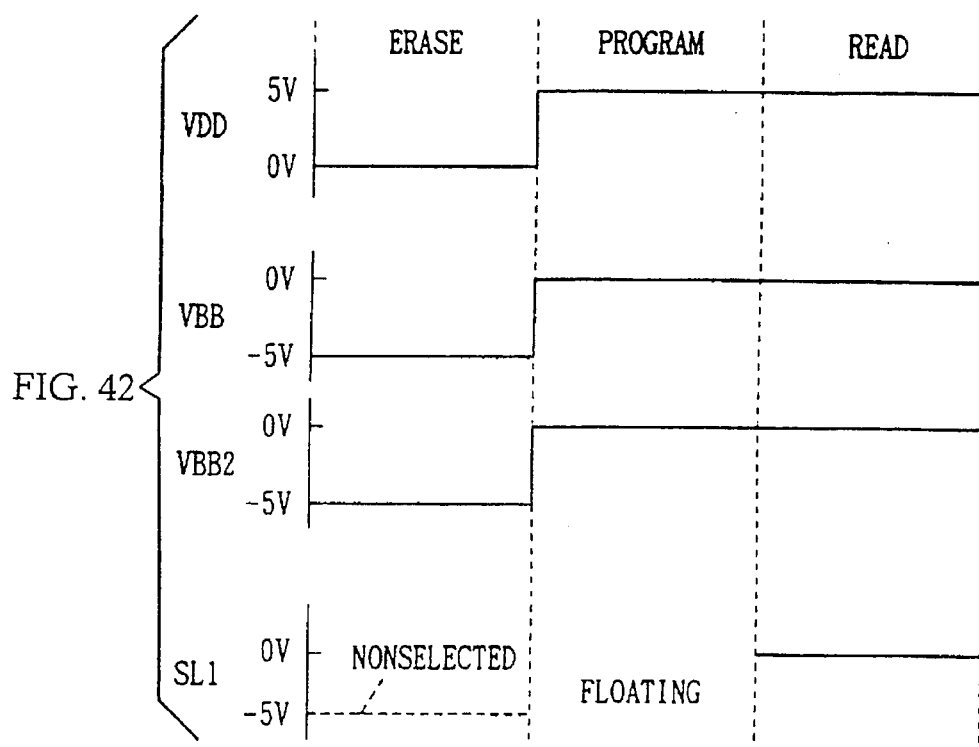
FIG. 42 illustrates voltages of respective parts in the source decoder shown in FIG. 41.

(iii) Source Decoder (FIGS. 41 and 42)

FIG. 41 illustrates the structure of a source decoder 1270 which is employed for a flash memory having no gate bird's beaks. FIG. 42 illustrates voltages of respective parts in the source decoder 1270 shown in FIG. 41, only in relation to the source line SL1. The structures of parts related to the source line SL2 are similar to those shown in FIG. 41, except for input signals supplied to input terminals AD0, AD1 and AD2.

Back gates of P-channel transistors P1, P2 and P3 are connected to a terminal VDD, while those of N-channel transistors N1, N2, N3 and N4 are connected to another terminal VBB.

In erasing, 0 V is applied to the terminal VDD and a negative voltage (−5 V) identical to a well potential is applied to the terminal VBB. Further, a negative voltage identical to or higher than the well potential (−5 V) is applied to still another terminal VBB2.

When the sector SE1 is selected, input signals of 0 V are supplied to all input terminals AD0 to AD2. Thus, the transistor N4 is turned off and the source line SL1 enters a floating state. When the sector SE1 is nonselected, on the other hand, an input signal of −5 V is supplied to any of the input terminals AD0 to AD2. Thus, the transistor N4 is turned on and −5 V is applied to the source line SL1.

In programming and reading, a power supply voltage Vcc (5 V) is applied to the terminal VDD, while 0 V is applied to the terminals VBB and VBB2.

In programming, input signals of 5 V are supplied to all input terminals AD0 to AD2. Thus, the transistor N4 is turned off and the source line SL1 enters a floating state.

In reading, on the other hand, input signals of 0 V are applied to all input terminals AD0 to AD2. Thus, the transistor N4 is turned on and 0 V is applied to the source line SL1.

Figure 43:
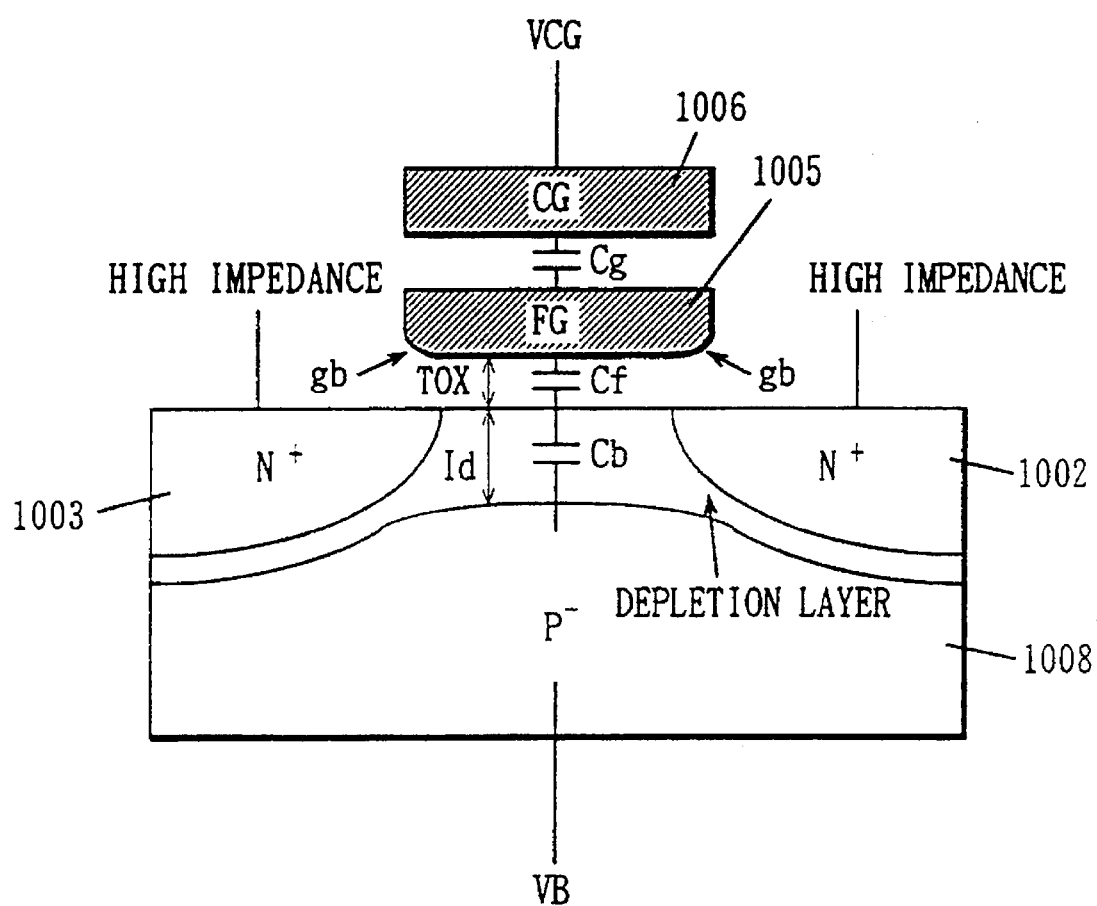
FIG. 43 is a diagram for illustrating an erased state of a memory cell having gate bird's beaks.
Figure 44:
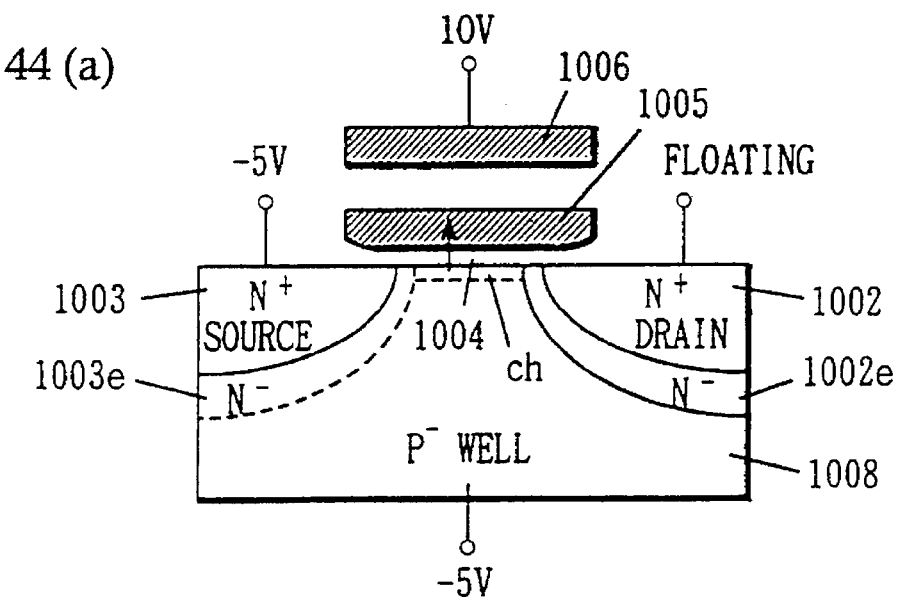
FIG. 44 illustrates conditions of voltage application for memory cells, having gate bird's beaks, provided in selected and nonselected sectors in erasing.
Figure 44:
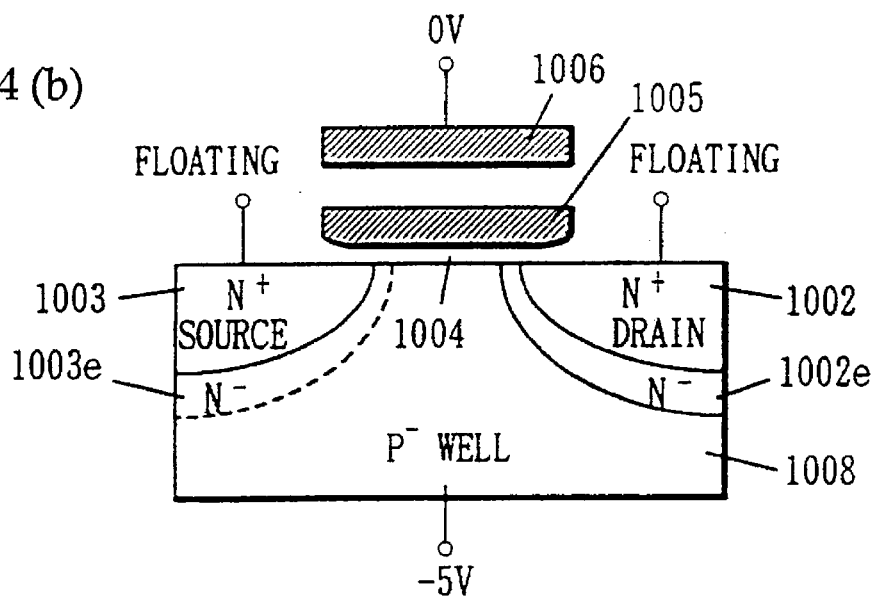

(c) Memory Cell Having Gate Bird's Beaks (FIGS. 43 to 47):

(i) Erasing of Memory Cell (FIGS. 43 and 44)

When a memory cell has large gate bird's beaks gb as shown in FIG. 43, diffusion layers forming a drain 1002 and a source 1003 may not downwardly extend beyond a thin tunnel insulating film. In this case, no tunnel effects are caused between the drain 1002 and a floating gate 1005 and between the source 1003 and the floating gate 1005. Thus, the memory cell is erased by a tunnel effect between a P⁻ well 1008 and the floating gate 1005.

An electric field E across the floating gate 1005 and the P⁻ well 1008 is expressed as follows:

$$E=(VFG-VB)/(TOX+Id) \qquad (6)$$

where VFG represents the potential of the floating gate 1005, VB represents that of the P⁻ well 1008, TOX represents the thickness of the tunnel insulating film, and Id represents the thickness of a depletion layer. When the drain 1002 and the source 1003 are brought into floating states, the electric field is weakened by the depletion layer to reduce erasability.

In this case, a negative voltage (−5 V) identical to the potential of the P⁻ well 1008 is applied to the source 1003 of each memory cell provided in a selected sector as shown at (a) in FIG. 44, while the source 1003 of each memory cell provided in a nonselected sector is brought into a floating state as shown at (b) in FIG. 44.

Thus, a channel ch is formed between the source 1003 and the drain 1002 in each memory cell provided in a selected sector, and the potential of the channel ch is supplied from the source 1003. Thus, a sufficient electric field is applied to the tunnel insulating film between the channel ch and the floating gate 1005, to cause a tunnel effect therebetween. As the result, erasability of the memory cell provided in a selected sector is improved.

On the other hand, the source 1003 of each memory cell provided in a nonselected sector is in a floating state, whereby no channel is formed between the source 1003 and the drain 1002 and a depletion layer is formed in a lower part of the memory cell. Thus, the electric field across the floating gate 1005 and the P⁻ well 1008 is relieved.

Figure 45:
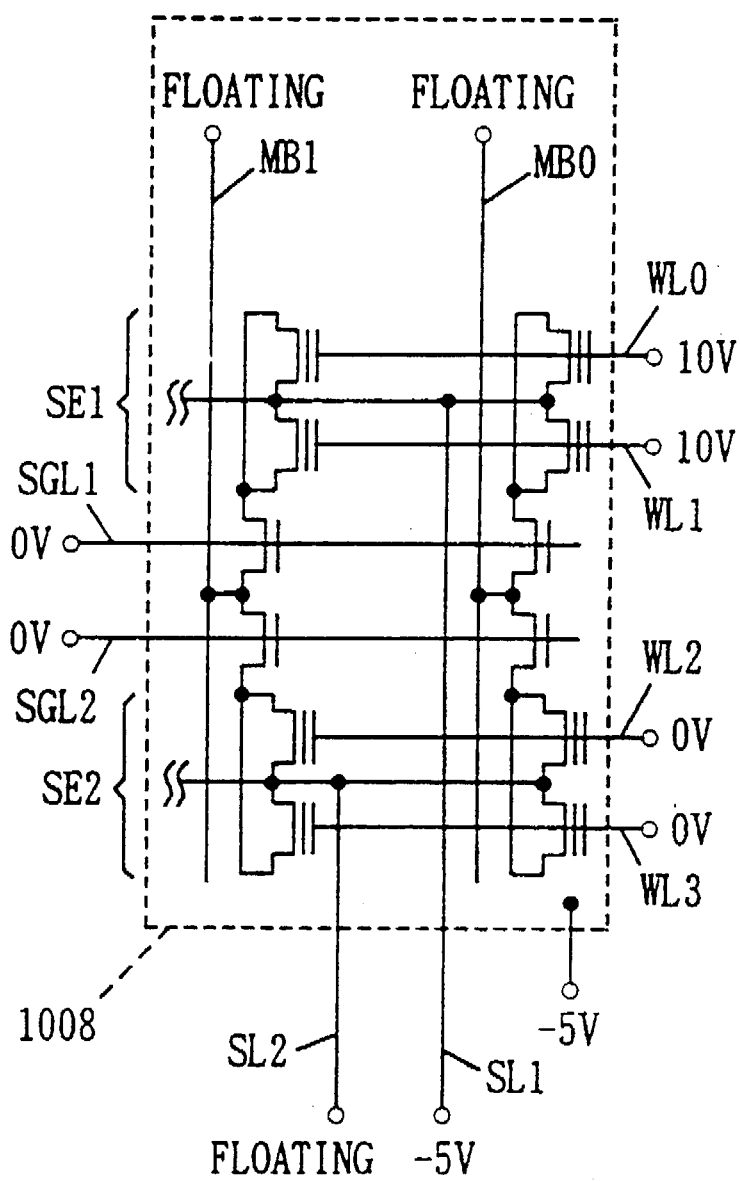
FIG. 45 illustrates conditions of voltage application for memory cells having gate bird's beaks in a batch sector erase operation.

(ii) Batch Sector Erase Operation of Flash Memory (FIG. 45)

With reference to FIG. 45, a batch sector erase operation in a flash memory having gate bird's beaks is now described. It is assumed here that memory cells provided in the sector SE1 are batch-erased.

10 V is applied to the word lines WL0 and WL1 provided in the sector SE1, while 0 V is applied to the word lines WL2 and WL3 provided in the sector SE2. Further, 0 V is applied to the select gate lines SGL1 and SGL2. −5 V is applied to the P⁻ well 1008 and the source line SL1, while the source line SL2 is brought into a floating state.

Thus, it is possible to batch-erase the memory cells provided in the sector SE1 while stably protecting the data in the memory cells provided in the sector SE2.

Figure 46:
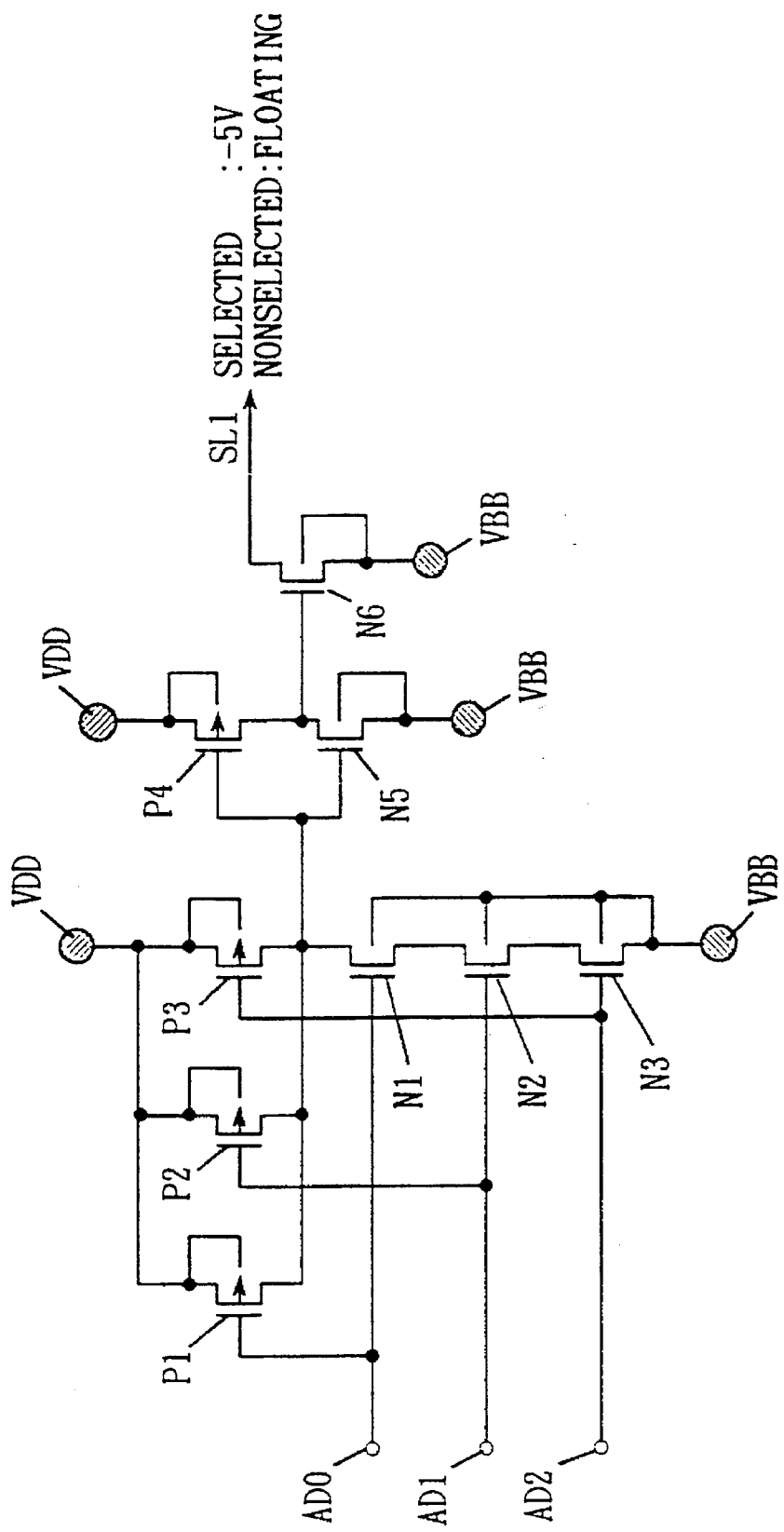
FIG. 46 is a circuit diagram showing the structure of a source decoder employed for memory cells having gate bird's beaks.
Figure 47:
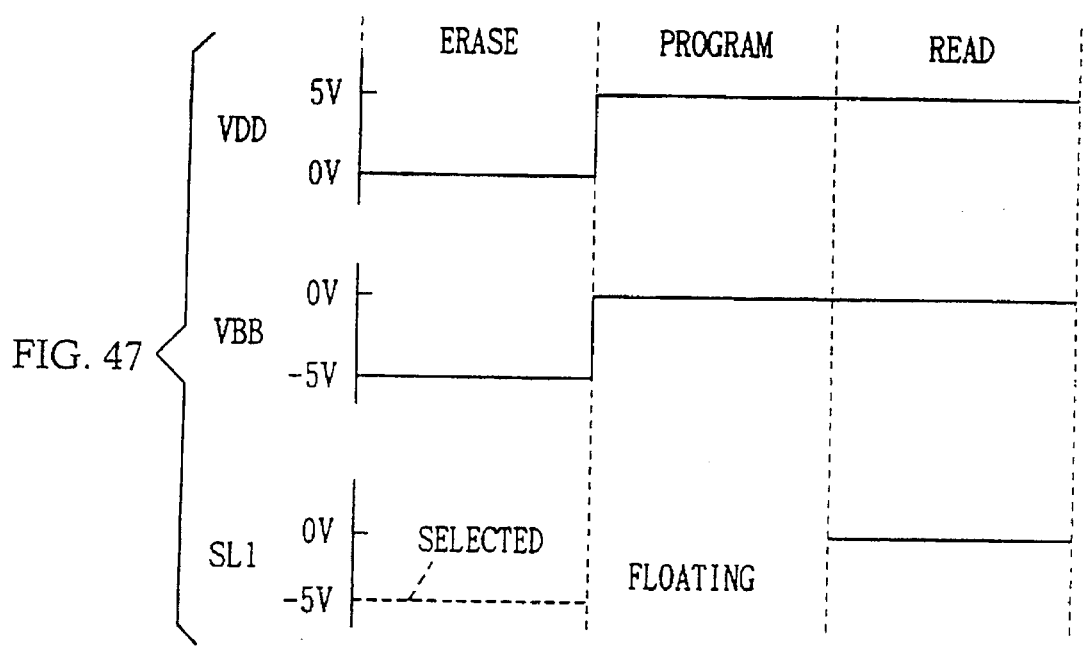
FIG. 47 illustrates voltages of respective parts in the source decoder shown in FIG. 46.

(iii) Source Decoder (FIGS. 46 and 47)

FIG. 46 illustrates the structure of a source decoder 1270 which is employed for a flash memory having gate bird's beaks. FIG. 47 illustrates voltages of respective parts in the source decoder 1270 shown in FIG. 46, only in relation to the source line SL1. The structures of parts related to the source line SL2 are similar to those shown in FIG. 46, except for input signals supplied to input terminals AD0, AD1 and AD2.

Back gates of P-channel transistors P1, P2, P3 and P4 are connected to a terminal VDD, while those of N-channel transistors N1, N2, N3, N5 and N6 are connected to another terminal VBB.

In erasing, 0 V is applied to the terminal VDD, while a negative voltage (−5 V) identical to a well potential is applied to the terminal VBB.

When the sector SE1 is selected, input signals of 0 V are supplied to all input terminals AD0 to AD2. Thus, the transistor N6 is turned on and −5 V is applied to the source line SL1. When the sector SE1 is not selected, on the other hand, an input signal of −5 V is supplied to any of the input terminals AD0 to AD2. Thus, the transistor N6 is turned off and the source line SL1 enters a floating state.

In programming and reading, a power supply voltage Vcc (5 V) is applied to the terminal VDD, while 0 V is applied to the terminal VBB.

In programming, input signals of 0 V are supplied to all input terminals AD0 to AD2. Thus, the transistor N6 is turned off and the source line SL1 enters a floating state.

In reading, on the other hand, input signals of 5 V are supplied to all input terminals AD0 to AD2. Thus, the transistor N6 is turned on and 0 V is applied to the source line SL1.

Figure 48:
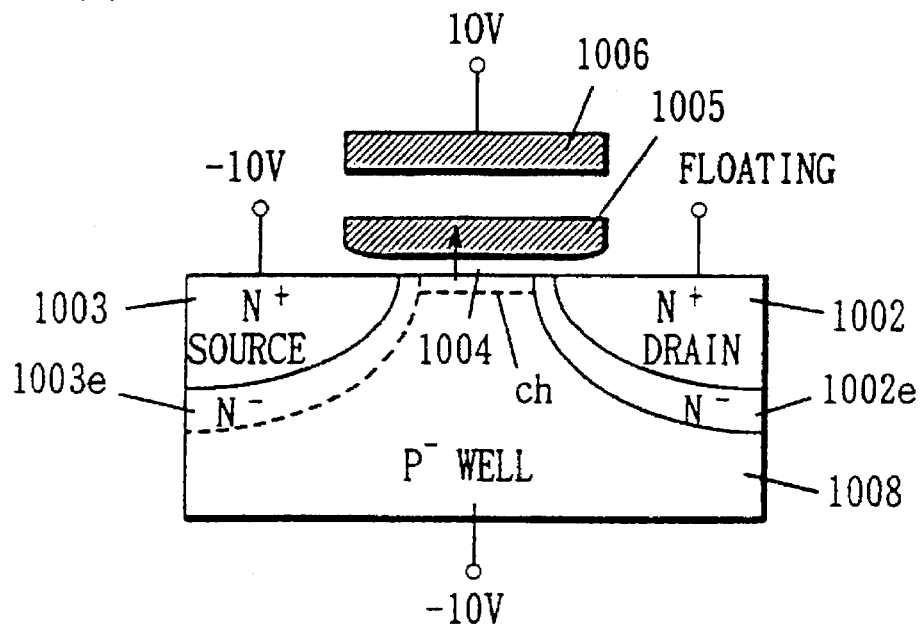
FIG. 48 illustrates conditions of voltage application for memory cells provided in selected and nonselected memory cells in erasing in a storage having a low well potential.
Figure 48:
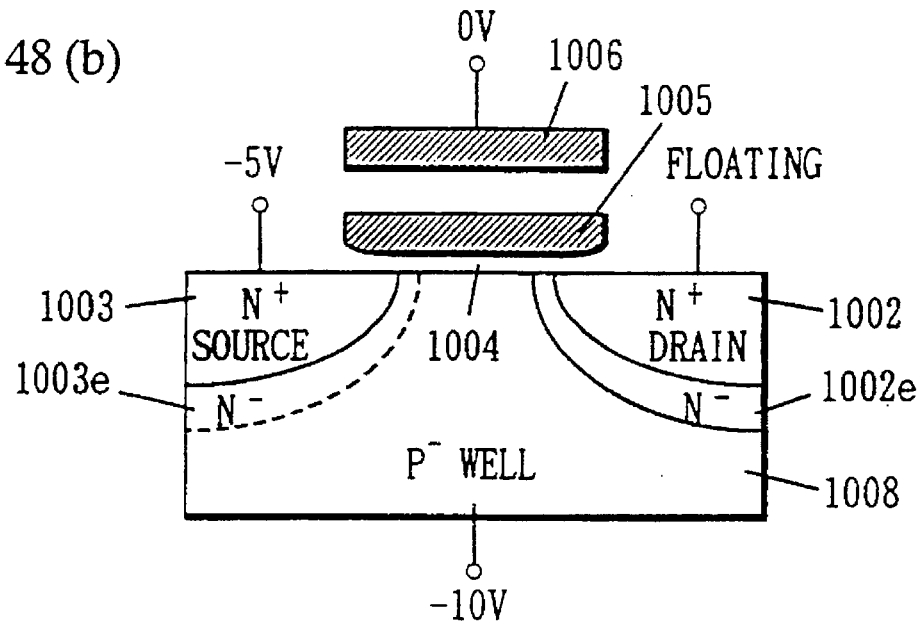

(d) Flash Memory Having Low Well Potential (FIGS. 48 to 51):

(i) Erasing of Memory Cell (FIG. 48)

In the above description, it is assumed that a voltage of −5 V is applied to the P⁻ well in erasing. When the well potential is further reduced in order to improve erasability, a problem of disturbance is caused in a nonselected sector.

When the flash memory has large gate bird's beaks, for example, a negative voltage (−5 V) of the terminal VBB which is identical to the well potential is applied to the source line of a selected sector as shown in FIG. 46, while the source line of a nonselected sector enters a floating state.

If the well potential is further reduced, however, the electric field across a floating gate and the P⁻ well is increased in each memory cell provided in a nonselected sector. Consequently, it is impossible to reliably protect data in the memory cells provided in the nonselected sector.

Therefore, a voltage higher than the well potential is applied to the source line of the nonselected sector. For example, the potential of the P⁻ well 8 is reduced to −10 V, as shown in FIG. 48. In this case, the same potential as the well potential (−10 V) is applied to the source 1003 of each memory cell provided in the selected sector as shown at (a) in FIG. 48, while −5 V is applied to the source 1003 of each memory cell provided in the nonselected sector.

Thus, potential difference between a channel and a control gate 1006 can be made 1005 V in each memory cell provided in the nonselected sector.

Figure 49:
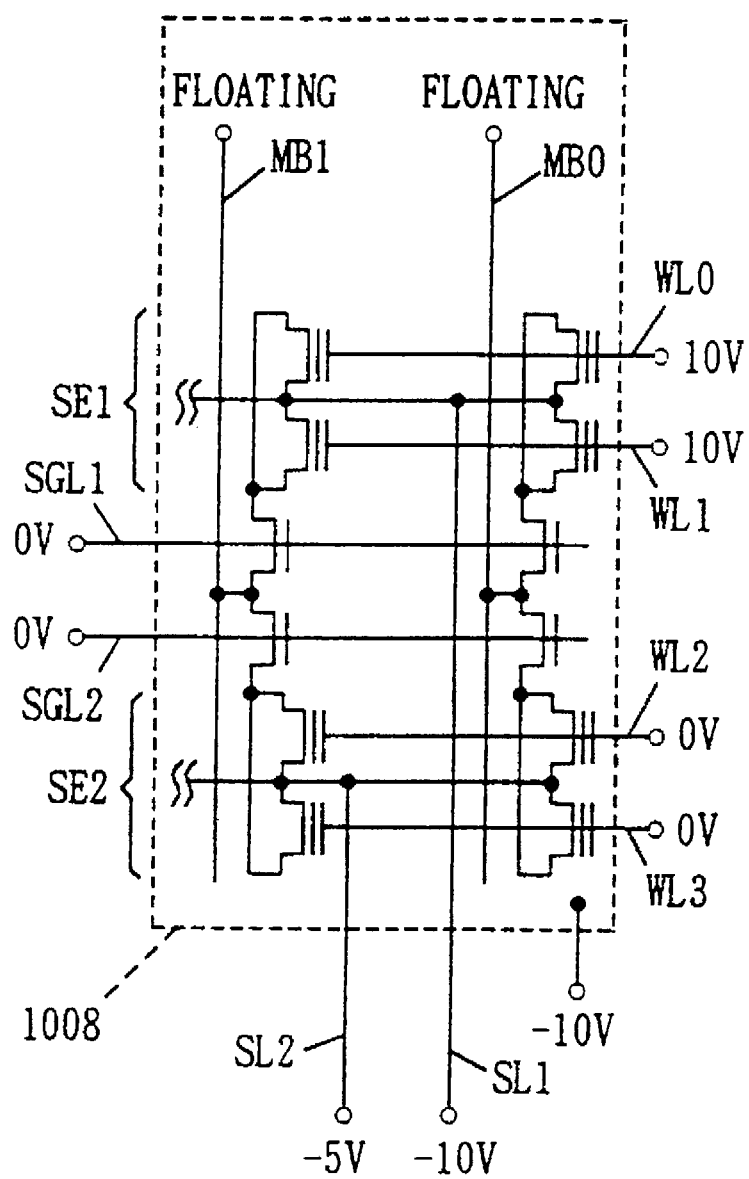
FIG. 49 illustrates conditions of voltage application for memory cells in a batch sector erase operation in a storage having a low well potential.

(ii) Batch Sector Erase Operation in Flash Memory (FIG. 49)

With reference to FIG. 49, a batch sector erase operation in a flash memory having a low well potential is described. It is assumed here that the memory cells provided in the sector SE1 are batch-erased.

10 V is applied to the word lines WL0 and WL1 provided in the sector SE1, while 0 V is applied to the word lines WL2 and WL3 provided in the sector SE2. Further, 0 V is applied to the select gate lines SGL1 and SGL2. −10 V is applied to the P⁻ well 1008 and the source line SL1, while −5 V is applied to the source line SL2.

Thus, it is possible to batch-erase the memory cells provided in the sector SE1 while stably protecting the data in the memory cells provided in the sector SE2.

Figure 50:
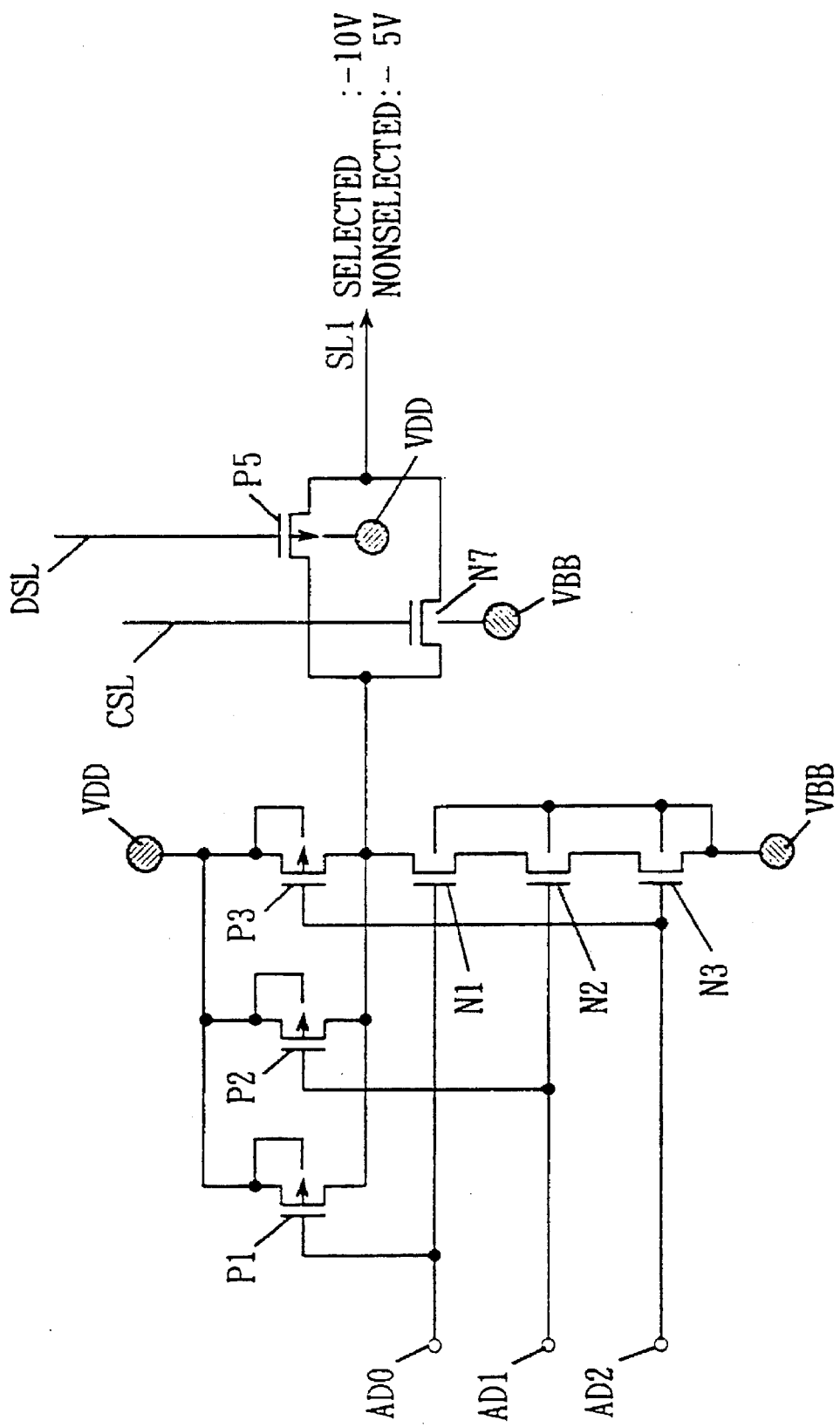
FIG. 50 is a circuit diagram showing the structure of a source decoder employed for a storage having a low well potential.
Figure 51:
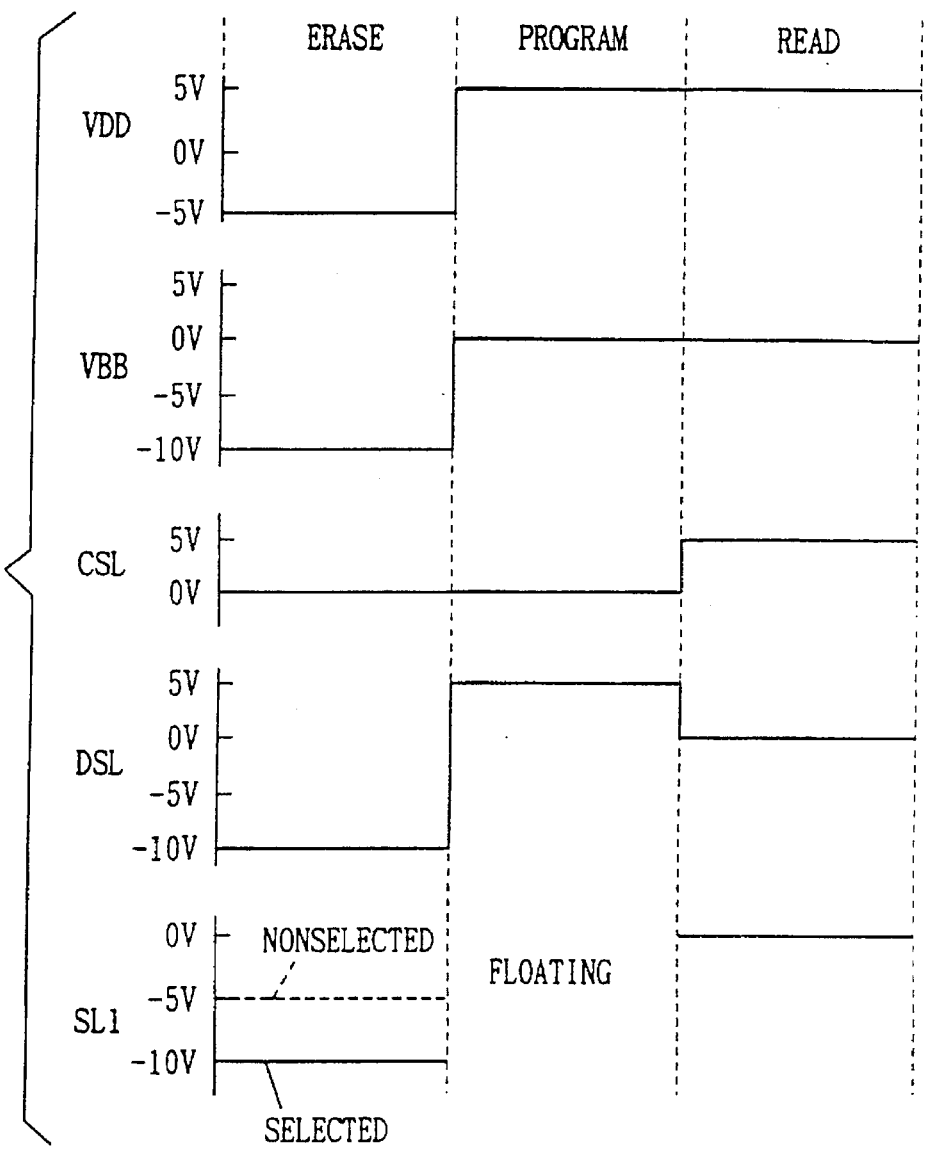
FIG. 51 illustrates voltages of respective parts in the source decoder shown in FIG. 50.

(iii) Source Decoder (FIGS. 50 and 51)

FIG. 50 illustrates the structure of a source decoder 1270 which is employed for a flash memory having a low well potential. FIG. 51 illustrates voltages of the respective parts in the source decoder 1270 shown in FIG. 50, only in relation to the source line SL1. The structures of parts related to the source line SL2 are similar to those shown in FIG. 50, except for input signals supplied to input terminals AD0, AD1 and AD2.

Back gates of P-channel transistors P1, P2, P3 and P5 are connected to a terminal VDD, while those of N-channel transistors N1, N2 and N3 are connected to another terminal VBB.

In erasing, −5 V is applied to the terminal VDD, while a negative voltage (−10 V) identical to the well potential is applied to the terminal VBB. Further, 0 V is applied to a control line CSL, while −10 V is applied to another control line DSL.

When the sector SE1 is selected, input signals of 0 V are supplied to all input terminals AD0 to AD2. Thus, −10 V is applied to the source line SL1. When the sector SE1 is not selected, on the other hand, an input signal of −10 V is supplied to any of the input terminals AD0 to AD2. Thus, −5 V is applied to the source line SL1. The potential of a source line provided in a nonselected sector can be freely selected by changing the potential supplied to the terminal VDD in erasing.

In programming and reading, a power supply voltage Vcc (5 V) is applied to the terminal VDD, while 0 V is applied to the terminal VBB.

In programming, 0 V is applied to the control line CSL, while 5 V is applied to the control line DSL. Thus, the source line SL1 enters a floating state.

In reading, on the other hand, 5 V is applied to the control line CSL, while 0 V is applied to the control line DSL. Further, input signals of 5 V are supplied to all input terminals AD0 to AD2. Thus, 0 V is applied to the source line SL1.

(9) Ninth Embodiment (FIGS. 52 to 56)

Figure 52:
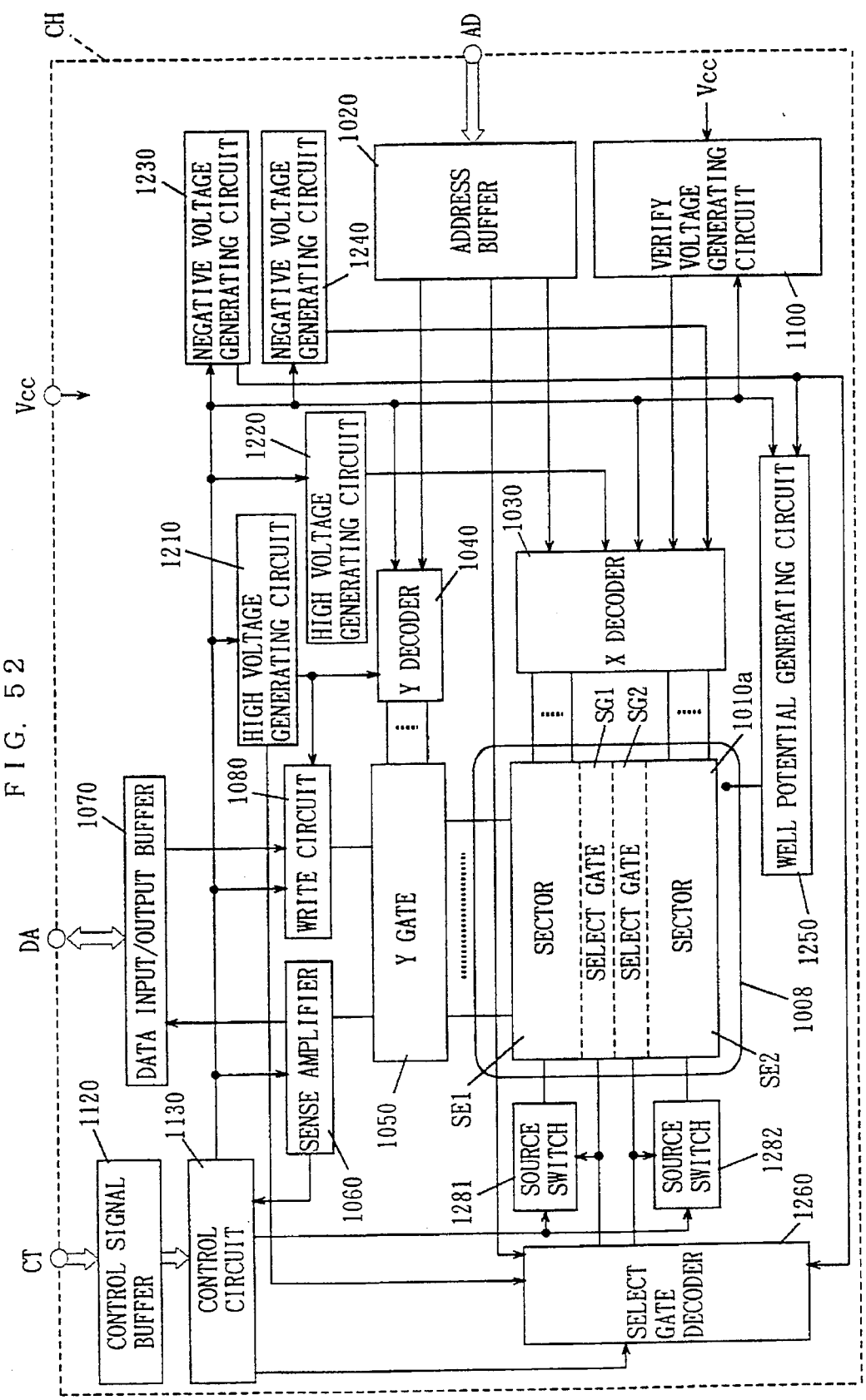
FIG. 52 is a block diagram showing the overall structure of a flash memory according to the ninth embodiment.
Figure 53:
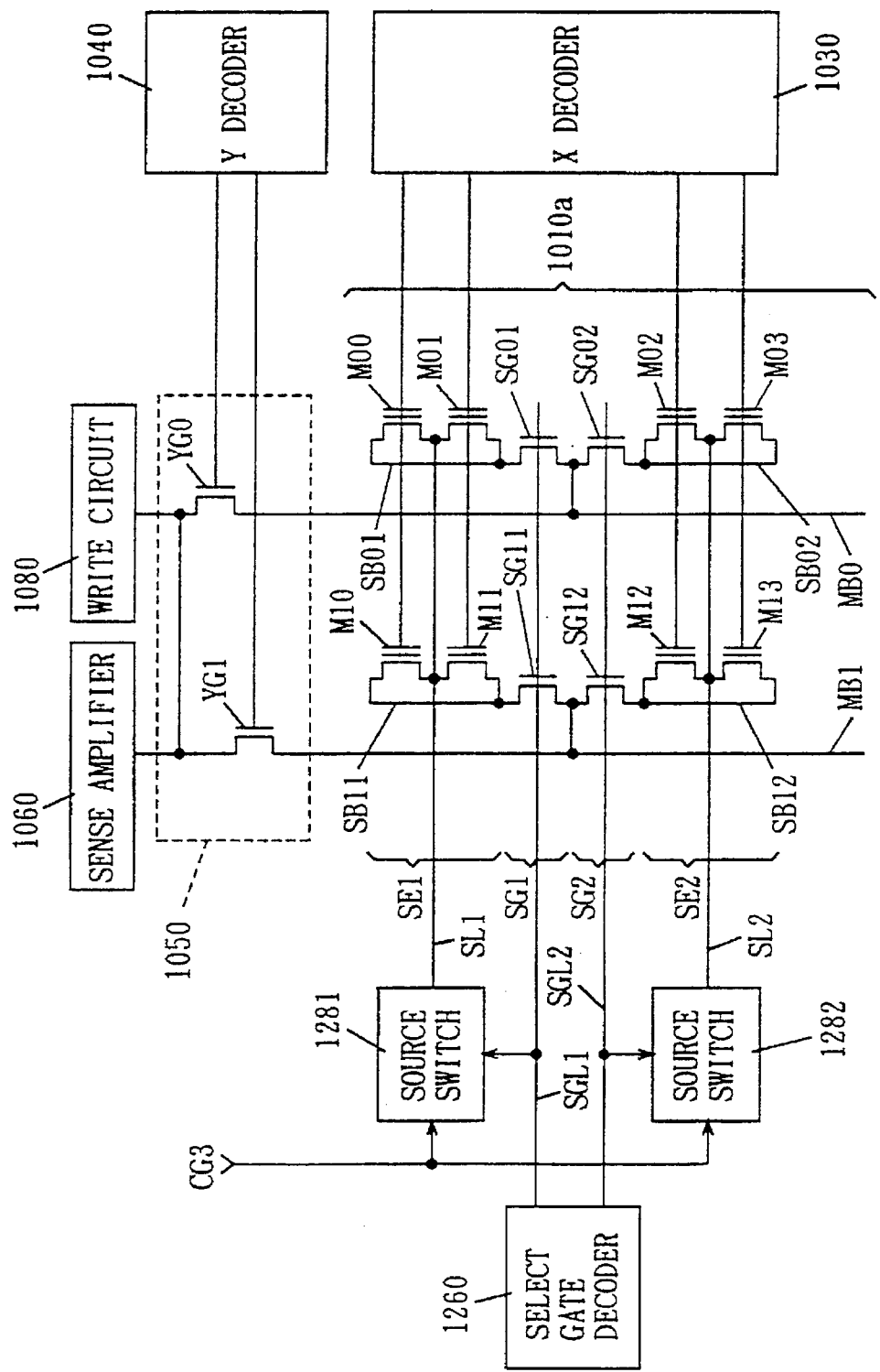
FIG. 53 is a circuit diagram showing the structures of a memory array included in the flash memory shown in FIG. 52 and parts related thereto in detail.

(a) Overall Structure of Flash Memory (FIGS. 52 and 53)

FIG. 52 is a block diagram showing the overall structure of a flash memory according to the ninth embodiment. FIG. 53 is a circuit diagram showing the structures of a memory array and parts related thereto in detail.

The flash memory shown in FIG. 52 is different from that of the eighth embodiment shown in FIG. 36 in the following point: The source decoder 1270 is replaced by source switches 1281 and 1282, while a negative voltage generating circuit 1230 supplies a negative voltage to a select gate decoder 1260.

As shown in FIG. 53, the source switch 1281 receives a potential on a select gate line SGL1, to control the potential of a source line SL1. The source switch 1282 receives a potential on a select gate line SGL2, to control the potential of a source line SL2. These source switches 1281 and 1282 are controlled by a control signal CG3 received from a control circuit 1130.

Program and read operations in the ninth embodiment are similar to those in the sixth embodiment. An erase operation is now described.

Figure 54:
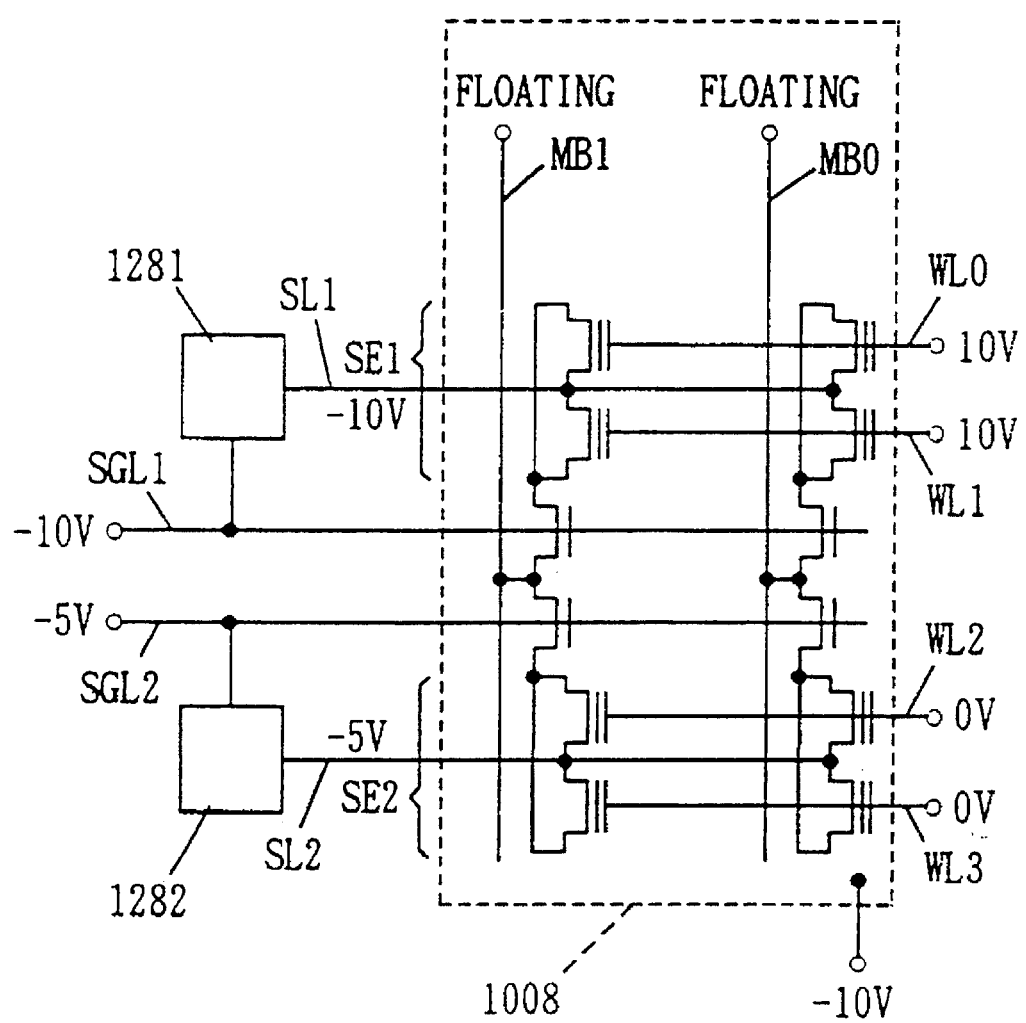
FIG. 54 illustrates conditions of voltage application in a batch sector erase operation in the ninth embodiment.

(b) Batch Sector Erase Operation in Flash Memory (FIG. 54)

With reference to FIG. 54, a batch sector erase operation in the flash memory according to the ninth embodiment is now described. It is assumed here that memory cells provided in a sector SE1 are batch-erased.

As described in relation to the eighth embodiment, −10 V is applied to a P⁻ well 8 for further improvement of erasability. 10 V is applied to word lines WL0 and WL1 provided in the sector SE1, while 0 V is applied to word lines WL2 and WL3 provided in another sector SE2. Further, −10 V is applied to the select gate line SGL1, while −5 V is applied to the select gate line SGL2. −10 V is applied to the source line SL1 by the source switch 1281, while −5 V is applied to the source line SL2 by the source switch 1282.

Thus, it is possible to efficiently batch-erase the memory cells provided in the sector SE1 without disturbing the sector SE2.

Figure 55:
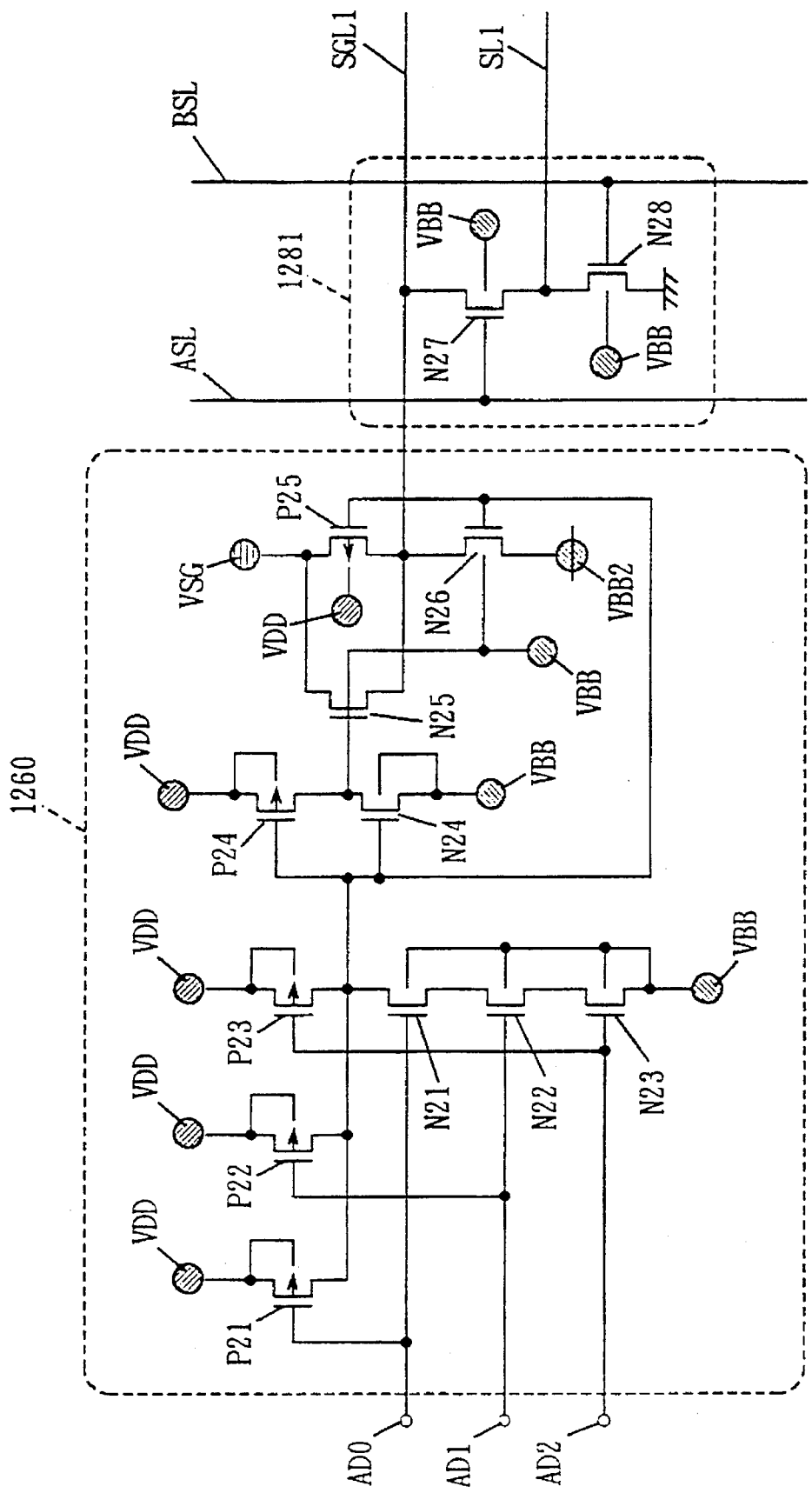
FIG. 55 is a circuit diagram showing the structures of a select gate decoder and a source switch included in the flash memory shown in FIG. 52.

FIG. 55 is a circuit diagram showing the structures of the select gate decoder 1260 and the source switch 1281 employed for the flash memory according to the ninth embodiment. FIG. 56 illustrates voltages of the respective parts in the select gate decoder 1260 and the source switch 1281 shown in FIG. 55. FIG. 55 shows only a part of the select gate decoder 1260 related to the select gate line SGL1 and the source switch 1281 connected to the source line SL1. The structures of a part of the select gate decoder 1260 related to the select gate line SGL2 and the source switch 1282 are similar to those shown in FIG. 55, except for input signals supplied to input terminals AD0, AD1 and AD2.

Back gates of P-channel transistors P21 to P25 are connected to a terminal VDD, while those of N-channel transistors N21 to N28 are connected to another terminal VBB. The control signal CG3 shown in FIG. 53 is supplied by control lines ASL and BSL.

In erasing, 0 V is applied to the terminal VDD, while −10 V is applied to the terminal VBB. −5 V is applied to still another terminal VBB2, and −10 V is applied to a further terminal VSG. 0 V is applied to the control line ASL, while −10 V is applied to the control line BSL.

When the sector SE1 is selected, input signals of 0 V are supplied to all input terminals AD0 to AD2. Thus, the transistors N25 and P25 are turned on so that the potential (−10 V) of the terminal VSG is supplied to the select gate line SGL1. Since the potential of the control line ASL is 0 V, the transistor N27 is turned on so that the potential (−10 V) of the terminal VSG is also supplied to the source line SL1.

When the sector SE1 is not selected, an input signal of −10 V is supplied to any of the input terminals AD0 to AD2. Thus, the transistor N26 is turned on so that the potential (−5 V) of the terminal VBB2 is supplied to the select gate line SGL1. The potential (−5 V) of the terminal VBB2 is also supplied to the source line SL1 through the transistor N27. It is possible to freely change the potential of a source line provided in a nonselected sector by changing the voltage applied to the terminal VBB.

In programming, a power supply voltage Vcc (7 V) is applied to the terminal VDD, while 0 V is applied to the terminals VBB and VBB2. 7 V is applied to the terminal VSG, while 0 V is applied to the control lines ASL and BSL.

When the sector SE1 is selected, the transistors N25 and P25 are turned on so that the potential (7 V) of the terminal VSG is supplied to the select gate line SGL1. At this time, the transistors N27 and N28 are in OFF states, whereby the source line SL1 enters a floating state. When the sector SE1 is not selected, on the other hand, the transistor N26 is turned on so that the potential (0 V) of the terminal VBB2 is supplied to the select gate line SGL1. Also at this time, the transistors N27 and N28 are in OFF states and hence the source line SL1 enters a floating state.

In reading, on the other hand, a power supply voltage Vcc (5 V) is applied to the terminal VDD, while 0 V is applied to the terminals VBB and VBB2. 5 V is applied to the terminal VSG. 0 V is applied to the control line ASL, while 5 V is applied to the control line BSL.

When the sector SE1 is selected, the transistors N25 and P25 are turned on so that the potential (5 V) of the terminal VSG is supplied to the select gate line SGL1. At this time, the transistor N28 is in an ON state and hence the source line SL1 is grounded. When the sector SE1 is not selected, on the other hand, the transistor N26 is turned on so that the potential (0 V) of the terminal VBB2 is supplied to the select gate line SGL1. Also at this time, the transistor N28 is in an ON state and hence the source line SL1 is grounded.

Thus, it is possible to apply a well potential to the source line of a selected sector while applying a potential higher than the well potential to the source line of a nonselected sector in erasing with no requirement for the source decoder 270 shown in FIG. 37.

Figure 57:
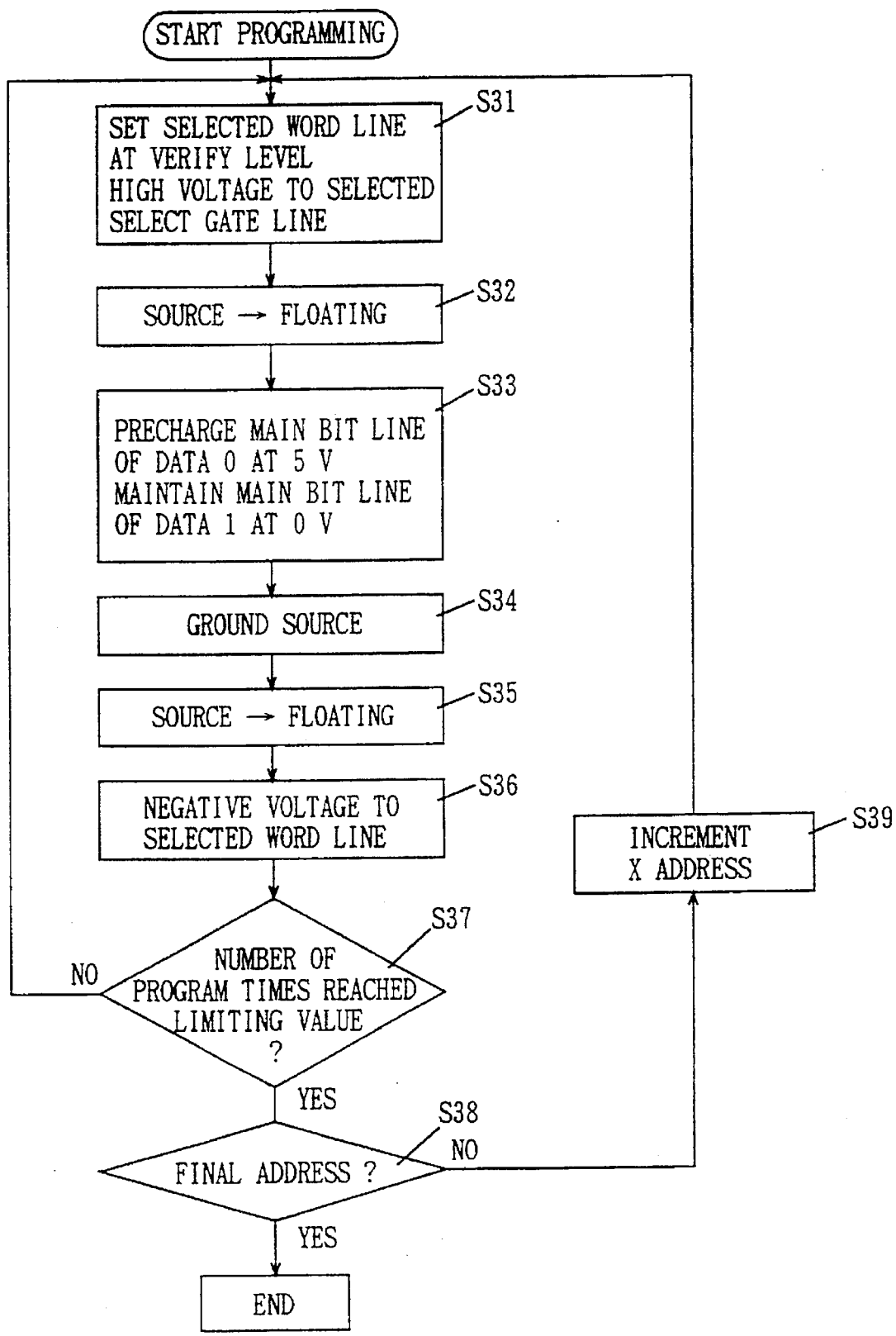
FIG. 57 is a flow chart for illustrating a program operation in a flash memory according to the tenth embodiment.

(10) Tenth Embodiment (FIG. 57)

The feature of a flash memory according to the tenth embodiment resides in that no verify operation is required in programming. The structure of the flash memory according to the tenth embodiment is similar to that in any one of the sixth to ninth embodiments. Further, batch erase and read operations of this embodiment are also similar to those in any one of the sixth to ninth embodiments.

With reference to a flow chart shown in FIG. 57, a program operation of the flash memory according to the tenth embodiment is described.

First, the potential of a selected word line is set at a verify level, and a high voltage is applied to a selected select gate line (step S31). Thus, a selected select gate transistor is turned on. Then, a source line is brought into a floating state (step S32). A main bit line corresponding to data "0" is precharged at 5 V, and that corresponding to data "1" is maintained at 0 V (step S33).

Thereafter the source line is grounded for a certain period of time (step S34). If the threshold voltage of a memory cell provided in the selected sector is higher than the verify level, the potential of the main bit line corresponding to the data "0" is maintained at the aforementioned precharge level. If the threshold voltage of the memory cell provided in the selected sector is lower than the verify level, on the other hand, the main bit line corresponding to the data "0" is discharged through the memory cell.

Thereafter the source line is brought into a floating state (step S35), and a negative voltage is applied to the selected word line (step S36). Thus, only the memory cell which is connected to the main bit line precharged at 5 V is programmed.

The aforementioned program cycle is repeated by a specified number of times (step S37), and thereafter an X address is incremented to repeat the above program cycle in relation to a next word line (steps S38 and S39). When the aforementioned program cycle is repeated in relation to all word lines in the selected sector, the program operation is terminated (step S38).

According to the aforementioned method, it is possible to perform the program operation at a high speed without performing any verify operation after every application of the program voltage to a main bit line.

In order to stably maintain the precharge level, capacitances may be connected to main bit lines through transfer gate transistors so that the transfer gate transistors are turned on in the program operation, as shown in the second embodiment.

The aforementioned method is also applicable to the flash memories according to the remaining embodiments.

Figure 58:
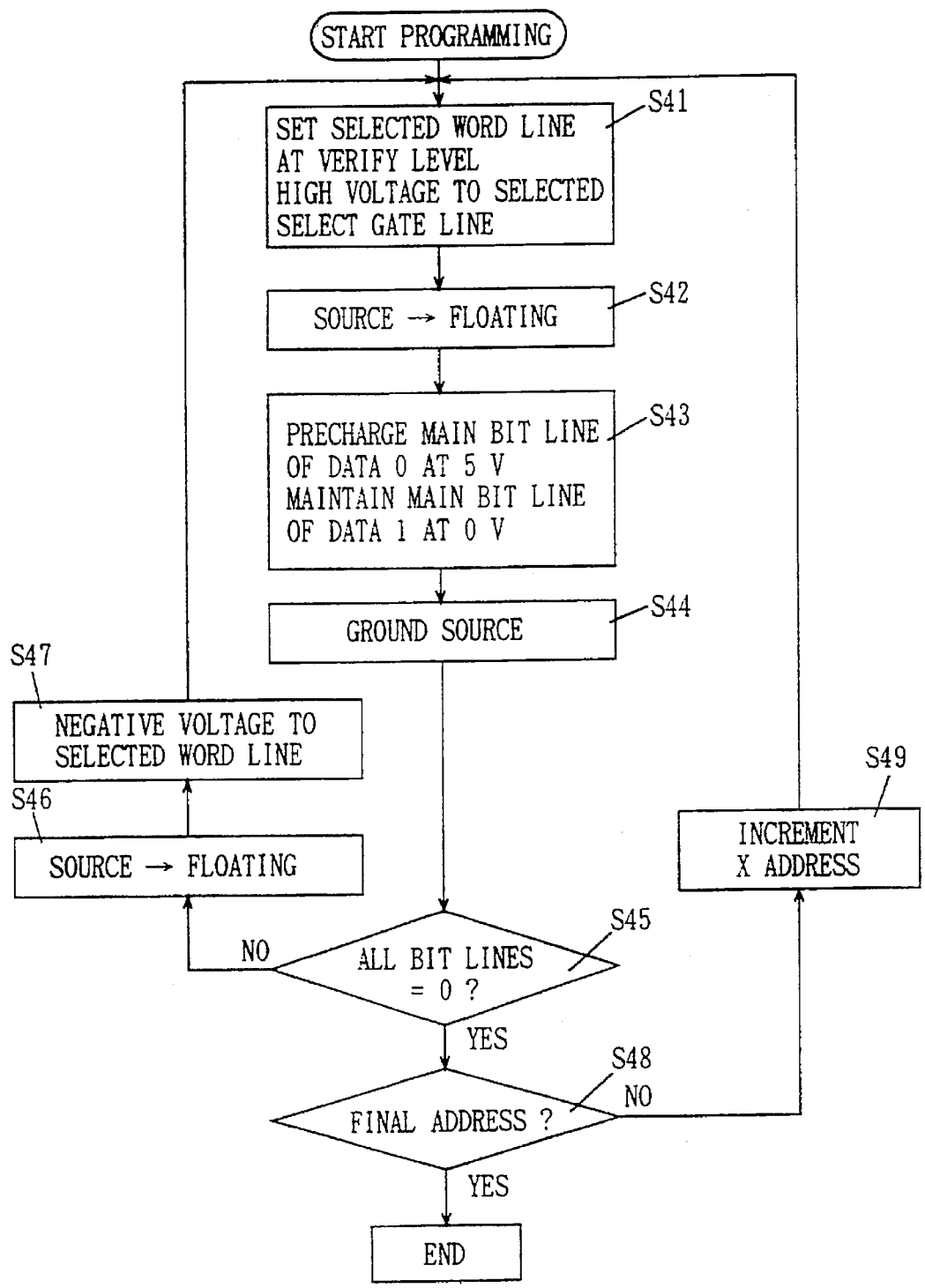
FIG. 58 is a flow chart for illustrating a program operation in a flash memory according to the eleventh embodiment.

(11) Eleventh Embodiment (FIG. 58)

The feature of a flash memory according to the eleventh embodiment also resides in that no verify operation is required in programming. The structure of the flash memory according to the eleventh embodiment is similar to that of any one of the sixth to ninth embodiments. Further, batch erase and read operations are also similar to those in any one of the sixth to ninth embodiments.

With reference to FIG. 58, a program operation of the flash memory according to the eleventh embodiment is now described.

First, the potential of a selected word line is set at a verify level, and a high voltage is applied to a selected select gate line (step S41). Thus, the selected select gate transistor is turned on. Then, a source line is brought into a floating state (step S42). A main bit line corresponding to data "0" is precharged at 5 V, while that corresponding to data "1" is maintained at 0 V (step S43).

Thereafter the source line is grounded for a certain period of time (step S44). If the threshold voltage of a memory cell provided in a selected sector is higher than the verify level, the potential of the main bit line corresponding to the data "0" is maintained at the aforementioned precharge level. If the threshold voltage of the memory cell provided in the selected sector is lower than the verify level, on the other hand, the main bit line corresponding to the data "0" is discharged through the memory cell.

Then, if the potentials of all main bit lines are not 0 V (step S45), the source line is brought into a floating state (step S46), and a negative voltage is applied to the selected word line (step S47). Thus, only a memory cell which is connected to the main bit line precharged at 5 V is programmed.

The aforementioned program cycle is repeated until the potentials of all bit lines reach 0 V (step S45), and thereafter an X address is incremented so that the above program cycle is repeated in relation to a next word line (steps S48 and S49). When the aforementioned program cycle is repeated in relation to all word lines in the selected sector, the program operation is terminated (step S48).

According to the aforementioned method, it is possible to perform a program operation at a high speed without performing any verify operation after every application of the program voltage to a main bit line, while automatically terminating the program operation.

The aforementioned method is also applicable to the flash memories according to the remaining embodiments.

(12) Twelfth Embodiment (FIGS. 59–64)

Figure 59:
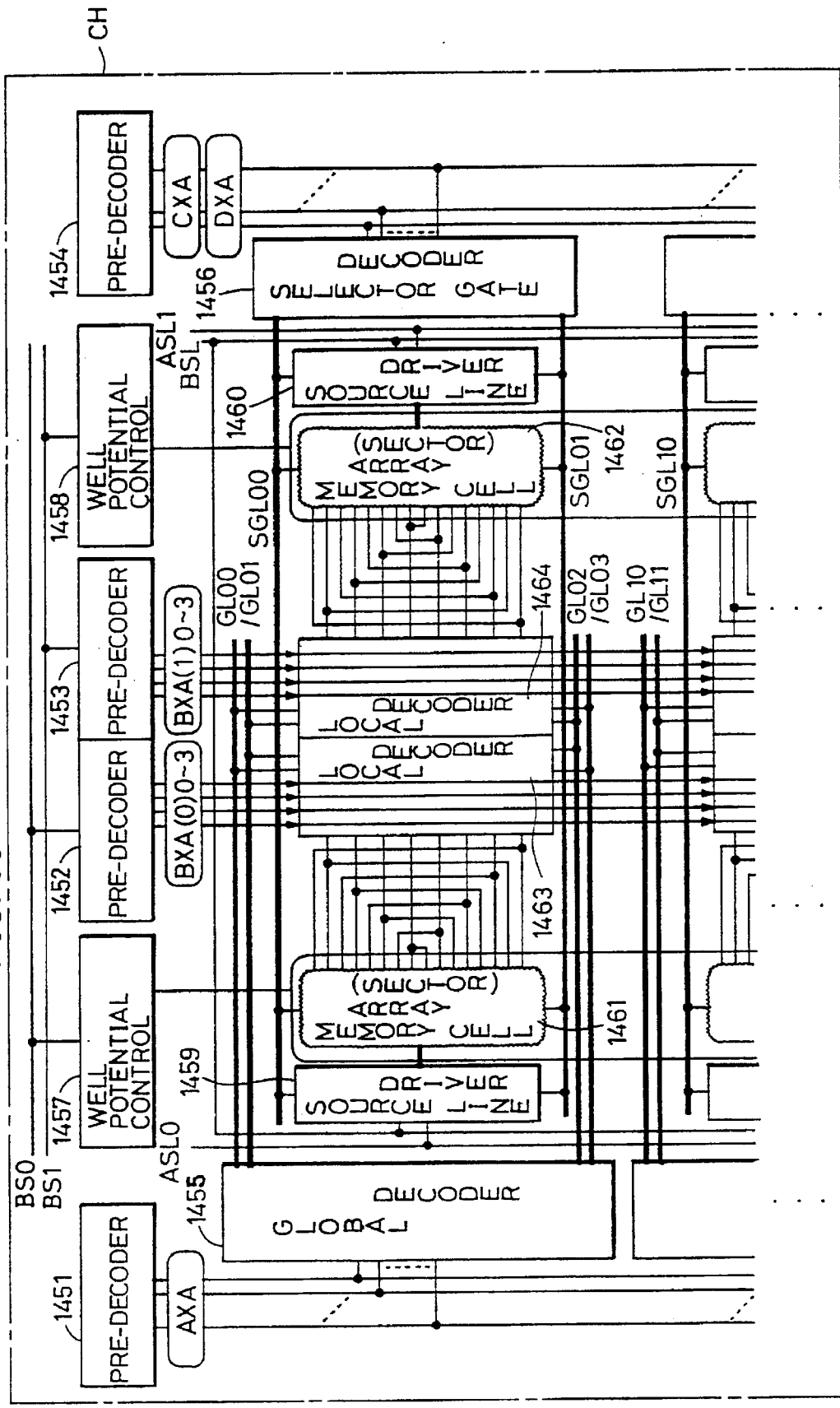
FIG. 59 is a block diagram showing the entire structure of a flash memory in accordance with the twelfth embodiment.

FIG. 59 is a block diagram showing the entire structure of a flash memory in accordance with a twelfth embodiment. A programming operation and an erasure operation similar to those of the flash memory of FIG. 18 are carried out in the flash memory of FIG. 59.

Referring to FIG. 59, this flash memory includes predecoders 1451–1454, a global decoder 1455, a select gate decoder 1456, well potential control circuits 1457 and 1458, source line drivers 1459 and 1460, memory cell arrays 1461 and 1462 divided into sectors, and local decoders 1463 and 1464.

Figure 60:
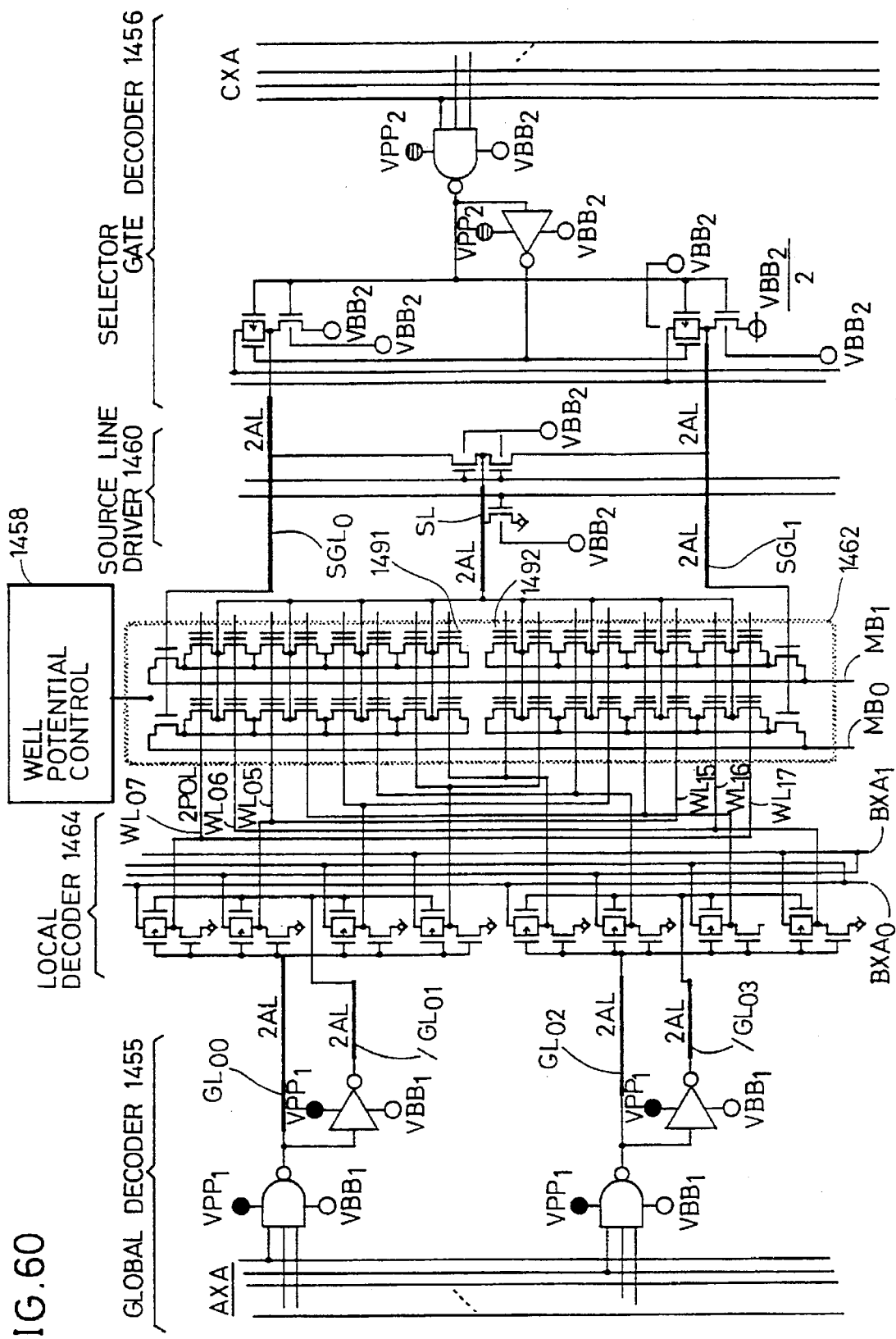
FIG. 60 is a circuit diagram of the memory cell array and its peripheral circuitry shown in FIG. 59.
Figure 135:
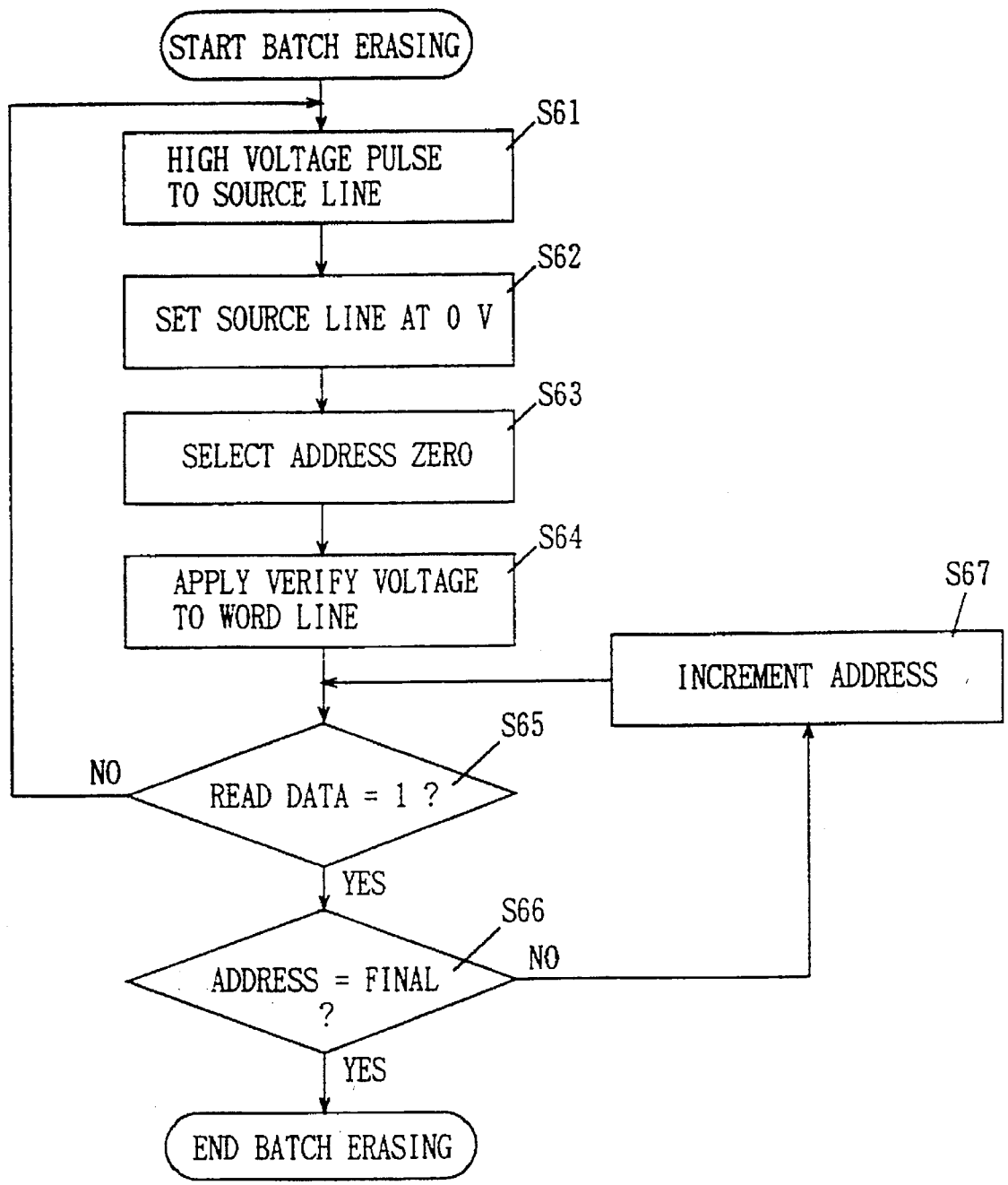
FIG. 135 is a flow chart for illustrating a batch erase operation in the conventional flash memory.
Figure 136:
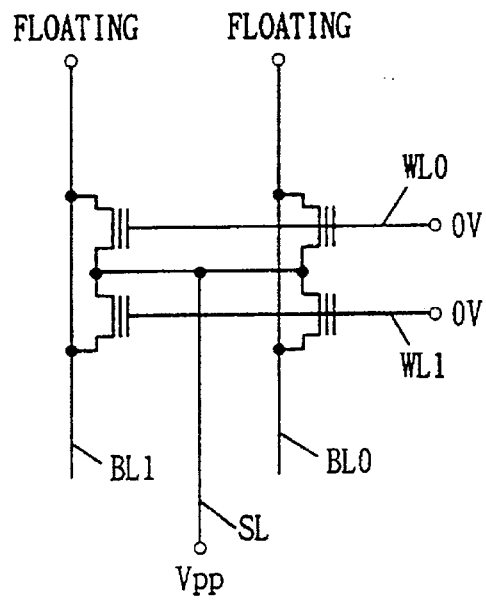
FIG. 136 illustrates conditions of voltage application in a batch erase operation in the conventional flash memory.

FIG. 60 is a circuit diagram of the memory cell array and its peripheral circuitry shown in FIG. 59. FIG. 60 shows in details the circuits of global decoder 1455, local decoder 1464, the memory cell array, source line driver 1460 and select gate decoder 1456. In FIG. 135, "2AL" indicates the interconnection formed by the second aluminum interconnection layer, and "2POL" indicates the interconnection formed by the second polysilicon layer.

The next Table 1 indicates the voltage applied to the circuits shown in FIGS. 59 and 60 in a programming operation and a read operation.

TABLE 1

|  | VPP1 | VPP2 | VBB1 | VBB2 | VBB2/2 | AXA0–2 |
| --- | --- | --- | --- | --- | --- | --- |
| Erase | 10 V | 0 V | 0 V | –8 V | –4 V | 10 V/0 V |
| Program | 0 V | 8 V | –8 V | 0 V | 0 V | 0 V/–10 V |
| Read | 3 V | 3 V | 0 V | 0 V | 0 V | 3 V/0 V |

|  | BXA0–1 | ASL | BSL | DXA0–1 | CXA0–2 | P-WELL |
| --- | --- | --- | --- | --- | --- | --- |
| Erase | 10 V | 0 V/–8 V | –8 V | –8 V | 0 V/–8 V | –8 V |
| Program | 0 V/–10 V | 0 V | 0 V | 8 V/0 V | 8 V/0 V | 0 V |
| Read | 3 V/0 V | 0 V | 3 V | 3 V/0 V | 3 V/0 V | 0 V |

The twelfth embodiment has the following advantage in addition to the various advantages already described.

Figure 61:
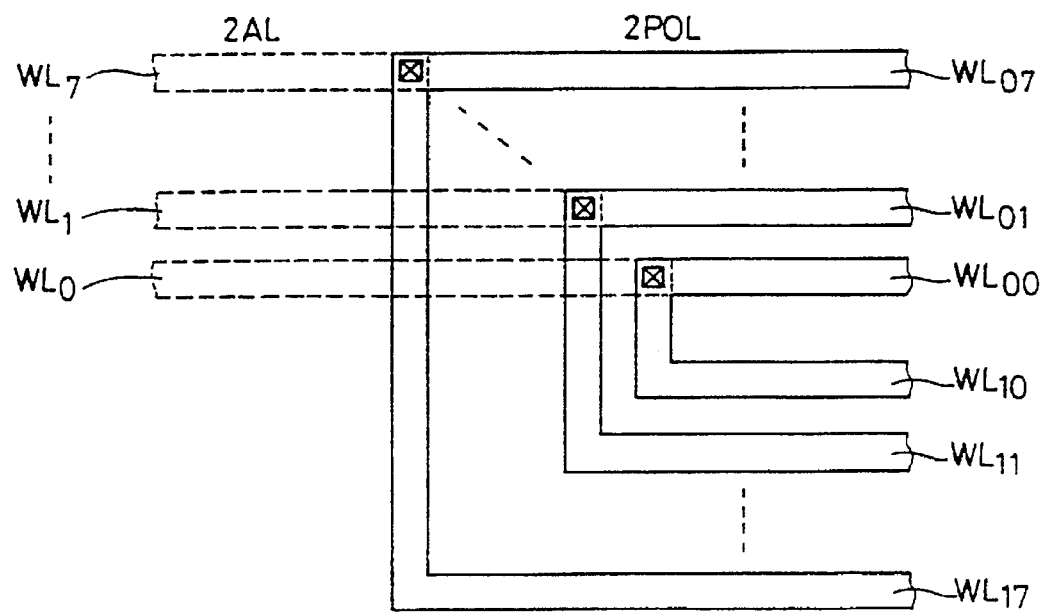
FIG. 61 is a layout diagram of a semiconductor substrate showing the connection between the word line and the output line of the local decoder shown in FIG. 60.

FIG. 61 is a layout showing the connection on a semiconductor substrate between word lines WL00–WL07 and WL10–WL17 and output lines WL0–WL7 of local decoder 1464 shown in FIG. 60. Referring to FIG. 61, each of word lines WL00–WL07 and WL10–WL17 is formed of a second polysilicon layer. Each output line of local decoder 1464 is formed by a second aluminum interconnection layer. The connection between each word line and a corresponding output signal line is carried out via a through hole. It is noted that the connection manner of FIG. 61 is also shown in the circuit diagram of FIG. 60.

By the connection manners shown in FIGS. 60 and 61, the connection between a word line and an output line of the local decoder is simplified to reduce the interconnection density. As a result, high integration density is obtained.

Figure 62:
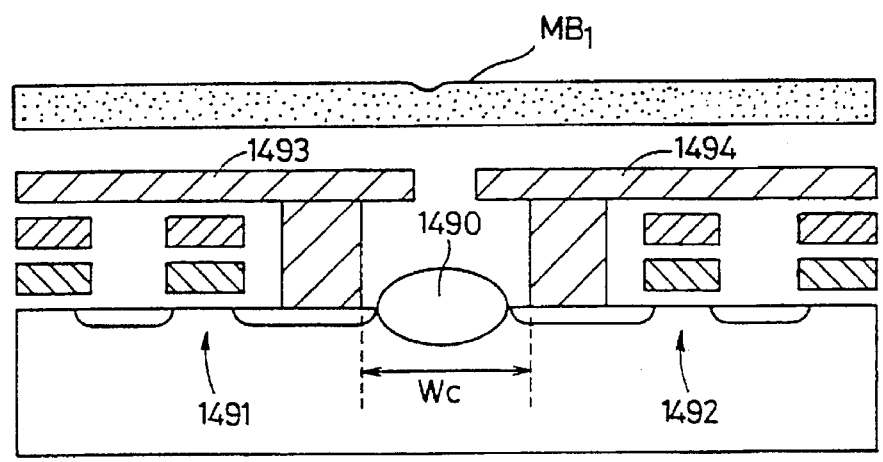
FIG. 62 is a sectional structural view of the two memory cells 1491 and 1492 of FIG. 60 showing the isolation thereof.
Figure 63:
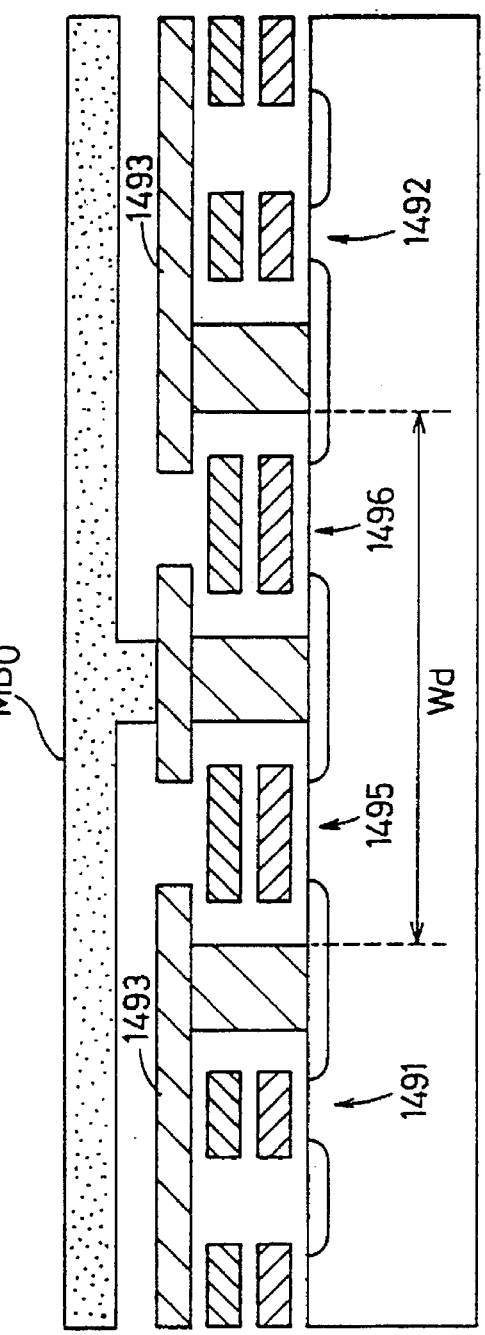
FIG. 63 is a sectional structural view of the two memories 1491 and 1492 of FIG. 60 showing the isolation thereof established out by a field shield transistor.

FIG. 62 is a sectional structural view of two memory cells 1491 and 1492 of FIG. 60 showing the isolation thereof. Memory cells 1491 and 1492 of FIG. 60 are located in respective positions closest to the other sector. In order to isolate transistors 1491 and 1492, an isolation oxide film 1490 is formed in the semiconductor substrate as shown in FIG. 62. The width Wc of isolation oxide film 1490 required for isolating the two adjacent transistors 1491 and 1492 can be made smaller than in the case where transistors 1495 and 1496 are used for field shield as shown in FIG. 63. In other words, although a great width Wd for forming transistors 1495 and 1496 for isolation is required in the embodiment of FIG. 63, the adjacent two transistors 1491 and 1492 can be isolated by the usage of isolation oxide film 1490 with a smaller width Wc. Thus, a higher integration density is obtained.

Figure 64:
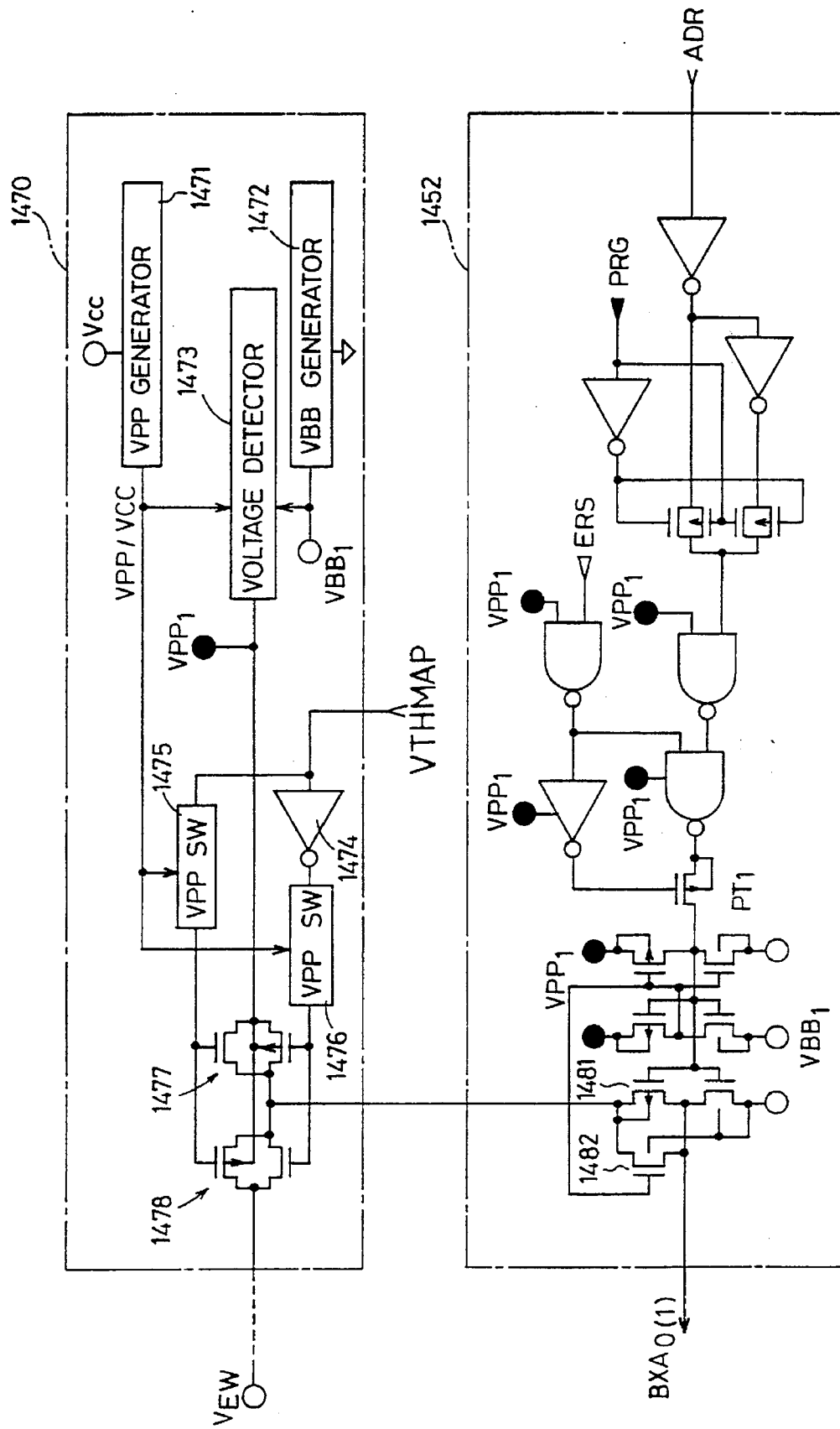
FIG. 64 is a circuit diagram of a word line voltage control circuit and a predecoder used in the twelfth embodiment.

FIG. 64 is a circuit diagram of a word line voltage control circuit and a predecoder used in the twelfth embodiment. The word line voltage control circuit 1470 of FIG. 64 is not shown in FIG. 59 for the sake of simplicity.

Referring to FIG. 64, a word line voltage control circuit 1470 includes a VPP generator 1471, a VBB generator 1472, a voltage detector 1473, an inverter 1474, a VPP switch circuit 1475, a VPP switching circuit 1476, and CMOS transmission gates 1477 and 1478.

Predecoder 1452 includes a PMOS transistor 1481 and an NMOS transistor 1482 implementing a CMOS transmission gate.

In word line voltage control circuit 1470 and predecoder 1452 shown in FIG. 64, the voltage indicated in the aforementioned Table 1, is applied to carry out an erasure operation, a program operation, and a read operation.

In general, an external voltage $V_{EW}$ for testing is supplied to identify the threshold voltage distribution of the memory cells in a flash memory. As shown in FIG. 64, in a test mode operation, an external voltage $V_{EW}$ is applied to word lines WL00–WL17 shown in FIG. 60 via CMOS transmission gate 1478 in word line voltage control circuit 1470 and the CMOS transmission gate (formed by transistors 1481 and 1482) in predecoder 1452. Because the voltage path of external voltage $V_{EW}$ is formed only by the CMOS circuit, there is no loss in voltage by the threshold voltage of the MOS transistor. In other words, an external voltage $V_{EW}$ changing at a wider range can be applied to a word line without change in the voltage level. Therefore, a desired test can be carried out.

Figure 65:
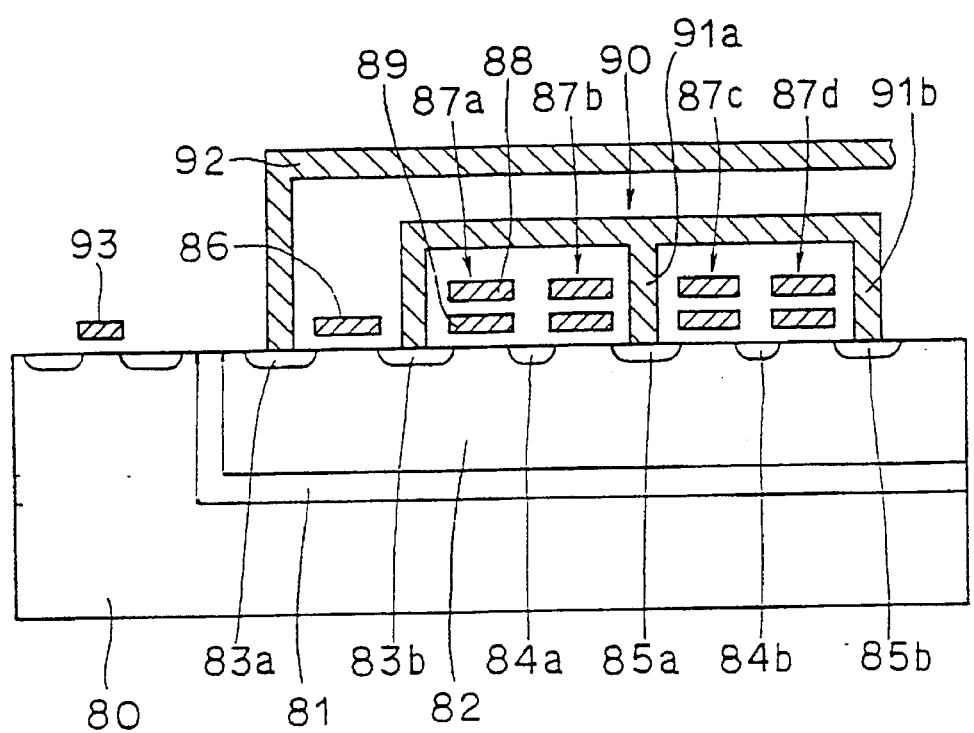
FIG. 65 is a partial sectional view of a memory transistor region of the thirteenth embodiment of a nonvolatile semiconductor memory device in accordance with the present invention.

FIG. 65 is a schematic diagram of a thirteenth embodiment of the nonvolatile semiconductor memory device in accordance with the present invention. A semiconductor substrate 80 is divided into a memory transistor region and a peripheral region. In the memory transistor region, memory transistors 87a, 87b, 87c and 87d are formed spaced apart from each other. On the main surface of semiconductor substrate 80 in the memory transistor region, n type source regions 84a and 84b and n type drain regions 85a and 85b are formed spaced apart from each other. Source region 84a serves as a source region of memory transistors 87a and 87b, while source region 84b serves as a source region of memory transistors 87c and 87d.

Drain region 85a serves as a drain region of memory transistors 87b and 87c, while drain region 85b serves as a drain region of memory transistor 87d. The reference numeral 88 denotes a control gate and 89 denotes a floating gate.

On the main surface of semiconductor substrate 80 in memory transistor region, a select gate transistor 86 having n type source/drain regions 83a and 83b is formed. Source/drain region 83b also serve as a drain region of memory transistor 87a.

On memory transistors 87a, 87b, 87c and 87d, a subbit line 90 of polycrystalline silicon is formed. Subbit line 90 is connected to source/drain region 83b. A branch line 91a branched from subbit line 90 is connected to drain region 85a and branch line 91b is connected to drain region 85b. A main bit line 92 of aluminum is formed on subbit line 90. The main bit line 92 is connected to source/drain region 83a.

In semiconductor substrate 80, a p well region 82 is formed to surround the memory transistor region, and an n well region 81 is formed to surround a p well region 82. A MOS transistor 93 is formed at a peripheral region. More detailed description of the nonvolatile semiconductor memory device in accordance with the present invention will be described, referring to a fourteenth embodiment.

Figure 66:
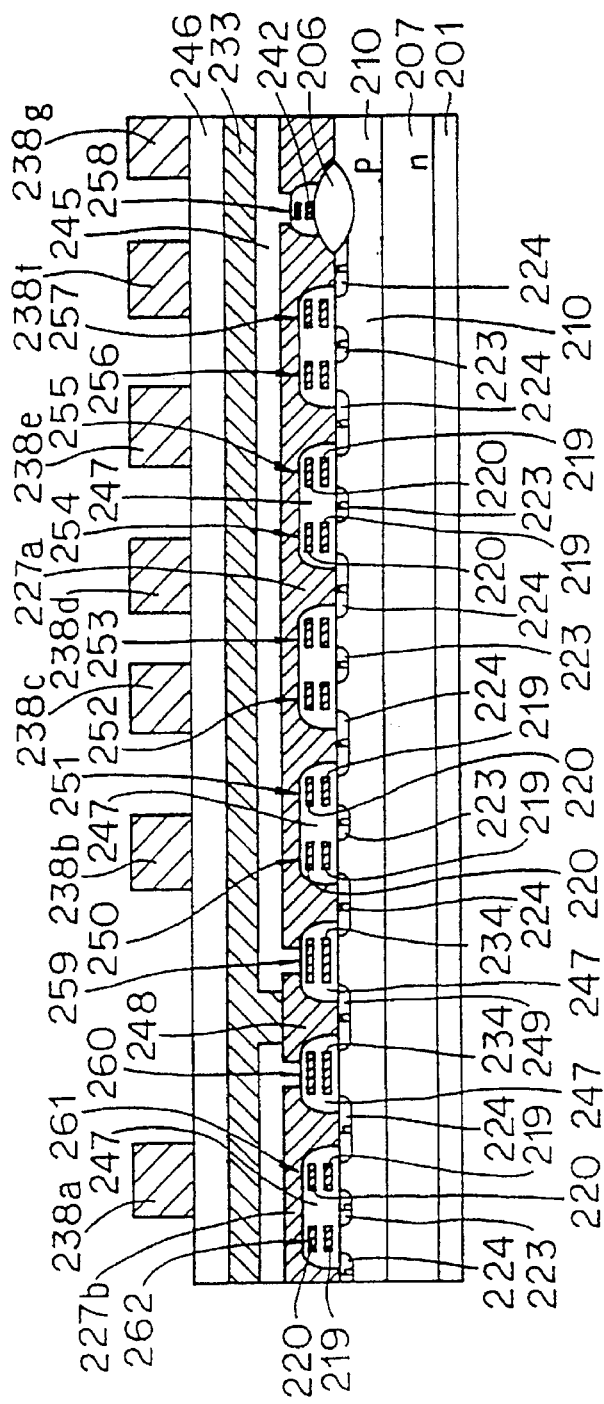
FIG. 66 is a view showing a memory transistor region of the fourteenth embodiment of a nonvolatile semiconductor memory device in accordance with the present invention, in which (a) is a partial sectional view and (b) is an equivalent circuit diagram
Figure 66:
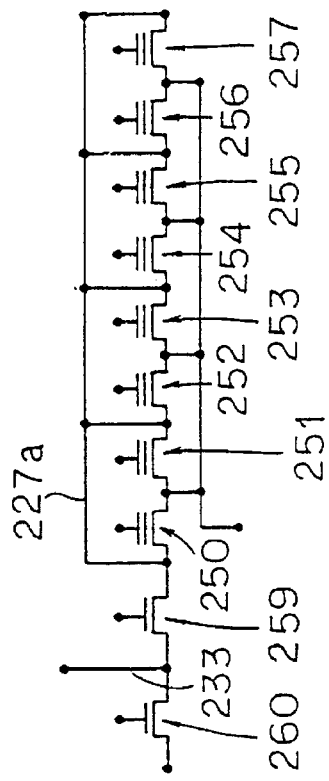

FIG. 66 (a) is a partial cross section of the memory transistor portion of the fourteenth embodiment of the nonvolatile semiconductor memory device in accordance with the present invention p well regions 210 are formed spaced apart on a p type silicon substrate 201. Memory transistors 250 to 257, 261 and 262 as well as select gate transistors 259 and 260 are formed on p well region 210. In p well region 210, an n type source region 223 and an n type drain region 224 of each memory transistor are formed. The reference numeral 249 denotes an n type impurity region. Each of the memory transistors and the select gate transistor are covered by a silicon oxide film 247. The source region 223 is shielded by silicon oxide film 247. By contrast, drain region 224 and impurity region 249 are not shielded by the silicon oxide film. Each memory transistor includes a floating gate 219 and a control gate 220.

Drain regions 224 of respective memory transistors 250 to 257 are electrically connected by one subbit line 227a. Drain regions 224 of memory transistors 261 and 262 are electrically connected by one subbit line 227a. Impurity region 249 is electrically connected to a connection conductive layer 248. A dummy gate transistor 258 having a dummy gate 242 is formed on a field oxide film 206. Details of the dummy gate transistor will be described later. An interlayer insulating film 245 is formed on subbit lines 227a and 227b, and a main bit line 233 is formed on interlayer insulating film 245. Main bit line 233 is electrically connected to connection conductive layer 248. An interlayer insulating film 246 is formed on main bit line 233, and an aluminum interconnection layer 238 is formed spaced apart on interlayer insulating film 246. Meanwhile, in silicon substrate 201, an n well region 207 is formed to cover p well region 210.

FIG. 66 (b) is an equivalent circuit diagram of the memory transistor shown in FIG. 66 (a). Drain regions of 8 memory transistors are connected to the subbit line, and the source regions are connected to a source line. Conduction/disconnection between the main bit line and the subbit line is effected by a selecting gate 1. Word lines 1 to 8 correspond to control gates.

Figure 67:
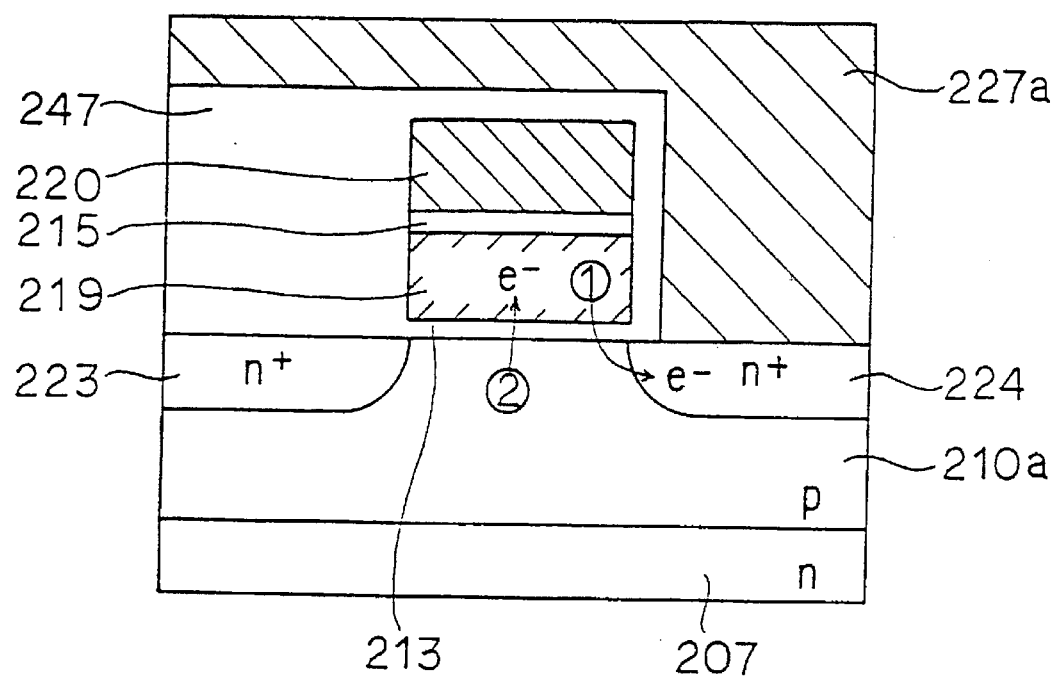
FIG. 67 is a sectional view of a structure of the memory transistor of the fourteenth embodiment of a nonvolatile semiconductor memory device in accordance with the present invention.

FIG. 67 is a cross section of the memory transistor in accordance with the fourteenth embodiment of the nonvolatile semiconductor memory device in accordance with the present invention. A gate oxide film 213 is formed between p well 210 and a floating gate 219, and an ONO film 215 is formed between floating gate 219 and control gate 220.

The operation of the fourteenth embodiment of nonvolatile semiconductor memory device in accordance with the present invention will be described with reference to FIG. 66 (b) and FIG. 67. First, erasing operation will be described. In the NOR type NAND type devices, erasure is effected by drawing electrons out, as described with reference to the prior art. However, in the fourteenth embodiment, erasure is effected by introducing electrons. More specifically, when memory transistors 250 to 257 are to be erased at one time, the main bit line 233 is kept at a floating state, and select gate transistor 259 is turned off. Consequently, subbit line 227a is also set to a floating state. A voltage of about −10 V is applied to the source line and to p well region 210a. Then a voltage of about 10 V is applied to the word lines 1 to 8. Consequently, electrons at the channel region are introduced to floating gate 219 by channel FN phenomenon, which is one of the tunneling effect, as shown in FIG. 67 ②. This corresponds to the erased state 1, and the value of Vth is up to about 6 V.

Writing operation will be described. When the memory transistor 257 is to be set at the written state "0", select gate transistor 259 is turned on, and a voltage of about 5 V is applied to main bit line 233. Thus, subbit line 227a comes to have the voltage of about 5 V. p well region 210a is kept at the ground potential, and the source line is OPENed. Further, a voltage of about −10 V is applied to word line 8, and word lines 1 to 7 are kept at the ground potential. Consequently, electrons stored in floating gate 219 of memory transistor 257 is drawn to the drain region 224 by the drain FN phenomenon, which is one of the tunnelling effect, as shown in FIG. 67 ①. Consequently, the memory transistor 257 is set to the written state "0", and the value of Vth at this time is about 1 V.

The reading operation will be described. When memory transistor 257 is to be read, for example, select gate transistor 259 is turned on and a voltage of about 1 V is applied to main bit line 233. The source line and p well region 210a are kept at the ground potential. A voltage in the range of about 3 to 5 V is applied to word line 8, and word lines 1 to 7 are set to the ground potential. At this time, if the memory transistor 257 is at the erased state "1", there is no channel formed, and therefore no current flows to the bit line. Meanwhile, if it is at the written state "0", a channel is formed and the current flows to the bit line. Determination of the written state/erased state is done in this manner.

In the fourteenth embodiment, a negative voltage is applied to p well region 210. Since there is an n well region 207 around the p well region 210, p well region 210 and n well region 207 are set at a reverse bias state even if a negative voltage is applied, and therefore the voltage is not applied to the peripheral circuitry forming region even when a voltage is applied to p well region 210.

In the erasing operation, the value of the maximum voltage is made small by applying a negative voltage to the p well region and by applying a positive voltage to the word line, while the potential difference between p well region 210 and control gate 220 is made larger relatively, thus enabling occurrence of the channel FN effect. As shown in FIG. 66 (a), subbit line 227a is connected to each drain region 224 of memory transistors 250 to 257. Therefore, much read current can be obtained in the reading operation, and thus the speed of reading operation can be improved as compared with the NAND type device.

In addition, as the drain FN is utilized for writing operation as shown in FIG. 67, writing operation can be effected at higher efficiency as compared with an example employing channel hot electrons which leads to reduction of power consumption.

Figure 68:
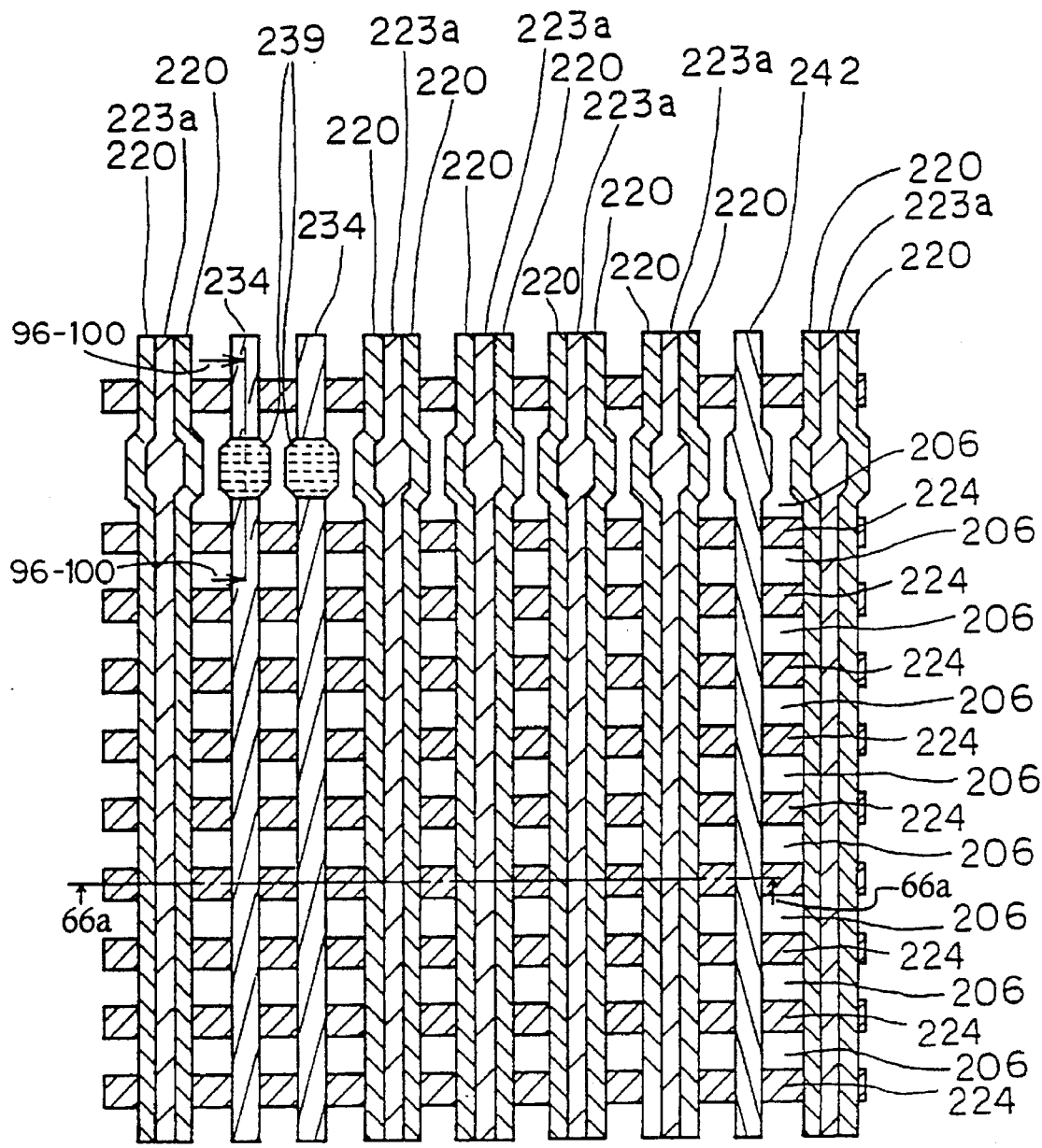
FIG. 68 is a plan view of the structure shown in FIG. 66(a) with a control gate formed.

A planar lay out of the structure shown in FIG. 66 (a) will be described. FIG. 68 is a plan view at a state with the control gate 220 formed. A cross section taken along the line 66a—66a of FIG. 68 corresponds to the state to the control gate 220 of FIG. 66 (a). Control gate 220, selecting gate 234, dummy gate 242 and source line 223a extend in the longitudinal direction. Source line 223a is provided by connecting the source region 223 shown in FIG. 66 (a). Field oxide film 206 and drain region 224 are formed alternately. An interconnection layer (corresponding to the control gate of the memory transistor) on selecting gate 234 is not shown.

Figure 69:
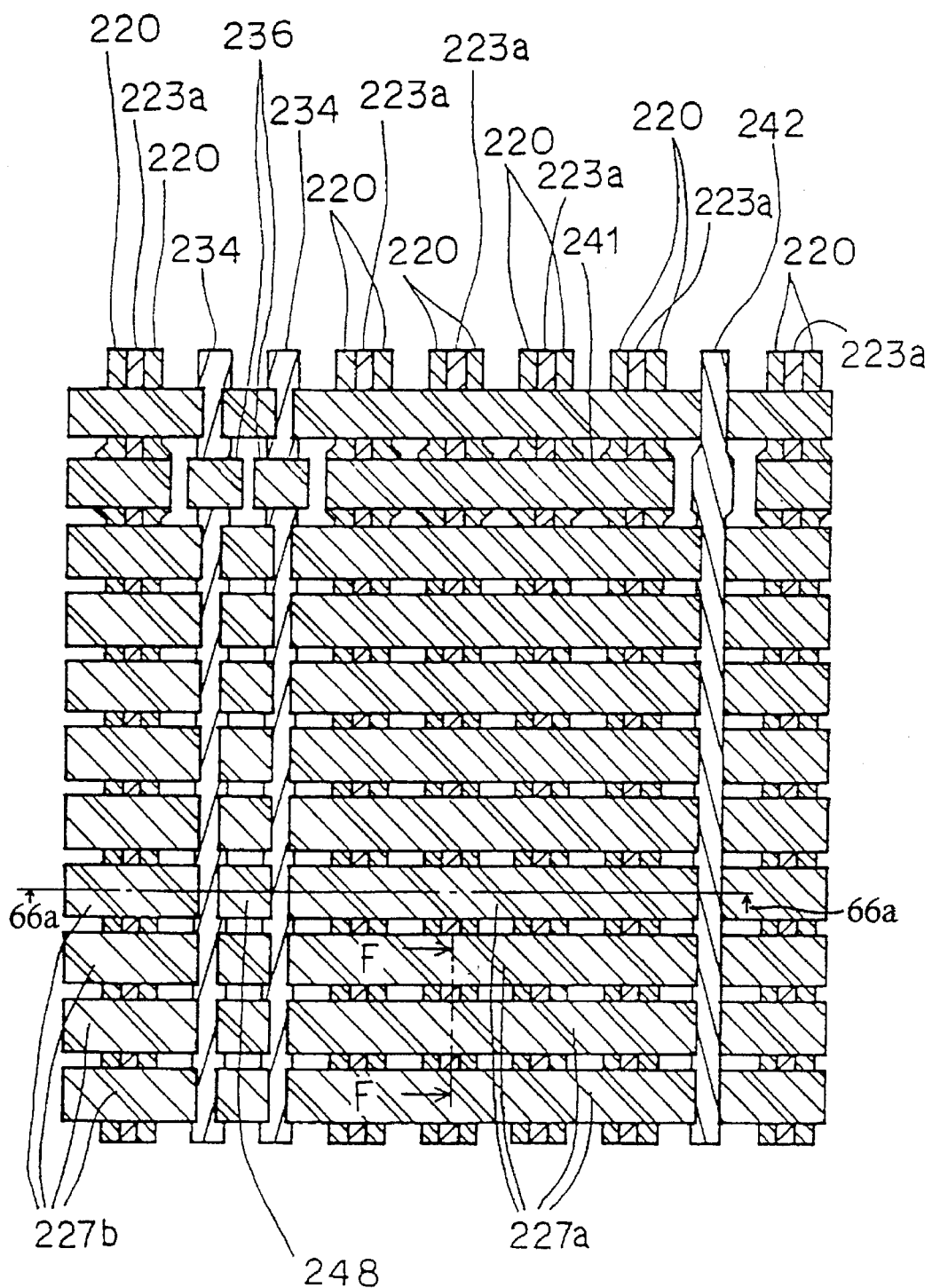
FIG. 69 is a plan view of the structure shown in FIG. 66(a) with a subbit line formed.

FIG. 69 shows a layout of FIG. 68 with subbit lines 227a and 227b formed thereon. Source line 223a is electrically connected to interconnection layer 241. Interconnection layer 241 has been formed simultaneously with subbit lines 227a and 227b.

Selecting gate 234 is electrically connected to a polypad 236. Polypad 236 has also been formed simultaneously with subbit lines 227a and 227b. The contacts between drain region 224 and subbit lines 227a and 227b are not shown. Contact between connection conductive layer 248 and impurity region 249 is not shown, either.

Figure 70:
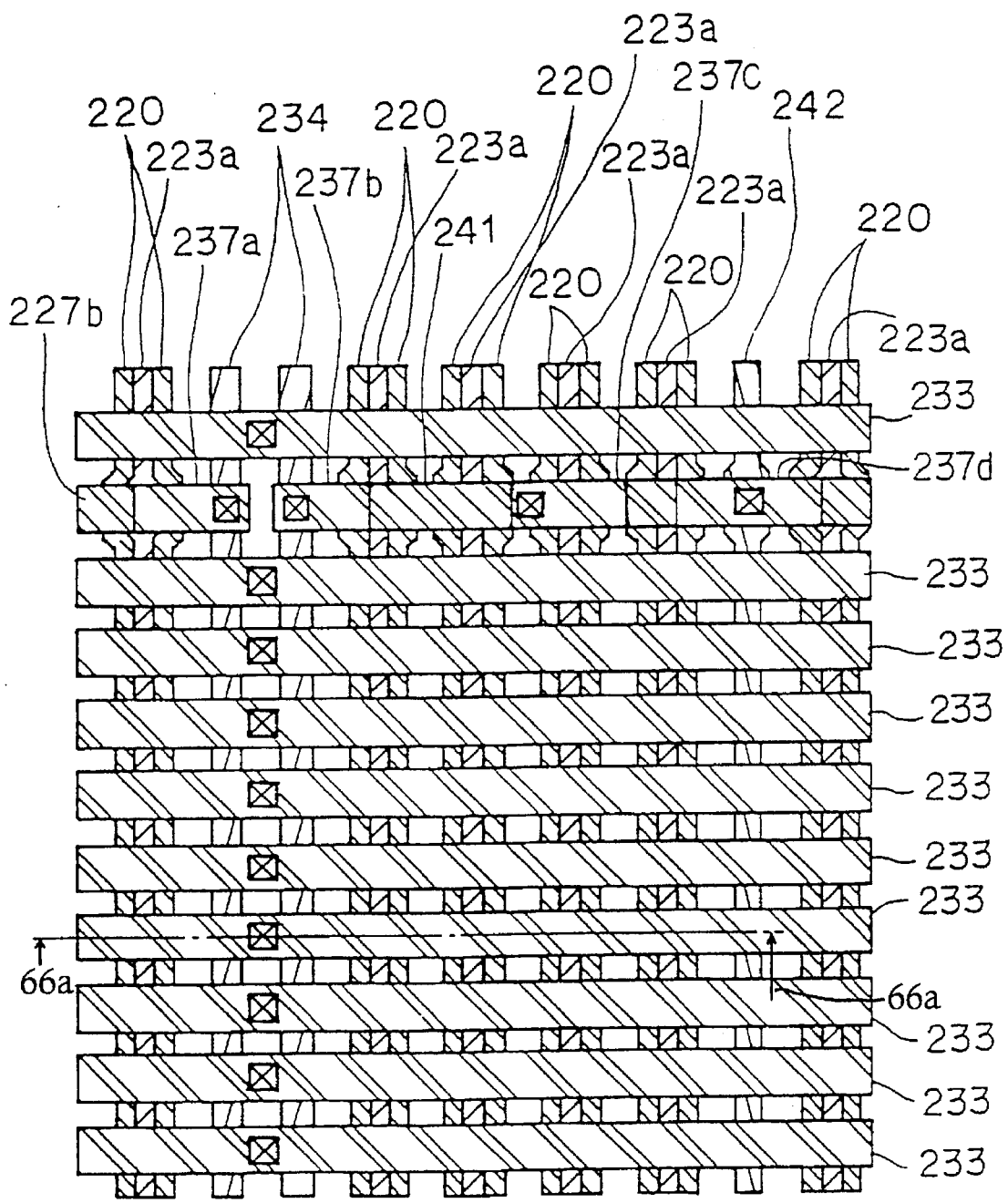
FIG. 70 is a plan view of the structure shown in FIG. 66(a) with a main bit line formed.

FIG. 70 shows a layout of FIG. 69 with a main bit line 233 formed thereon. Main bit line 233 is electrically connected to connecting conductive layer 248. Aluminum electrodes 237a, 237b, 237c and 237d have been formed simultaneously with main bit line 233. Aluminum electrode 237a is electrically connected to one polypad 236 and aluminum electrode 237b is electrically connected to the other polypad 236. Aluminum electrode 237c is electrically connected to interconnection layer 241 and aluminum electrode 237d is electrically connected to dummy gate 242.

Figure 71:
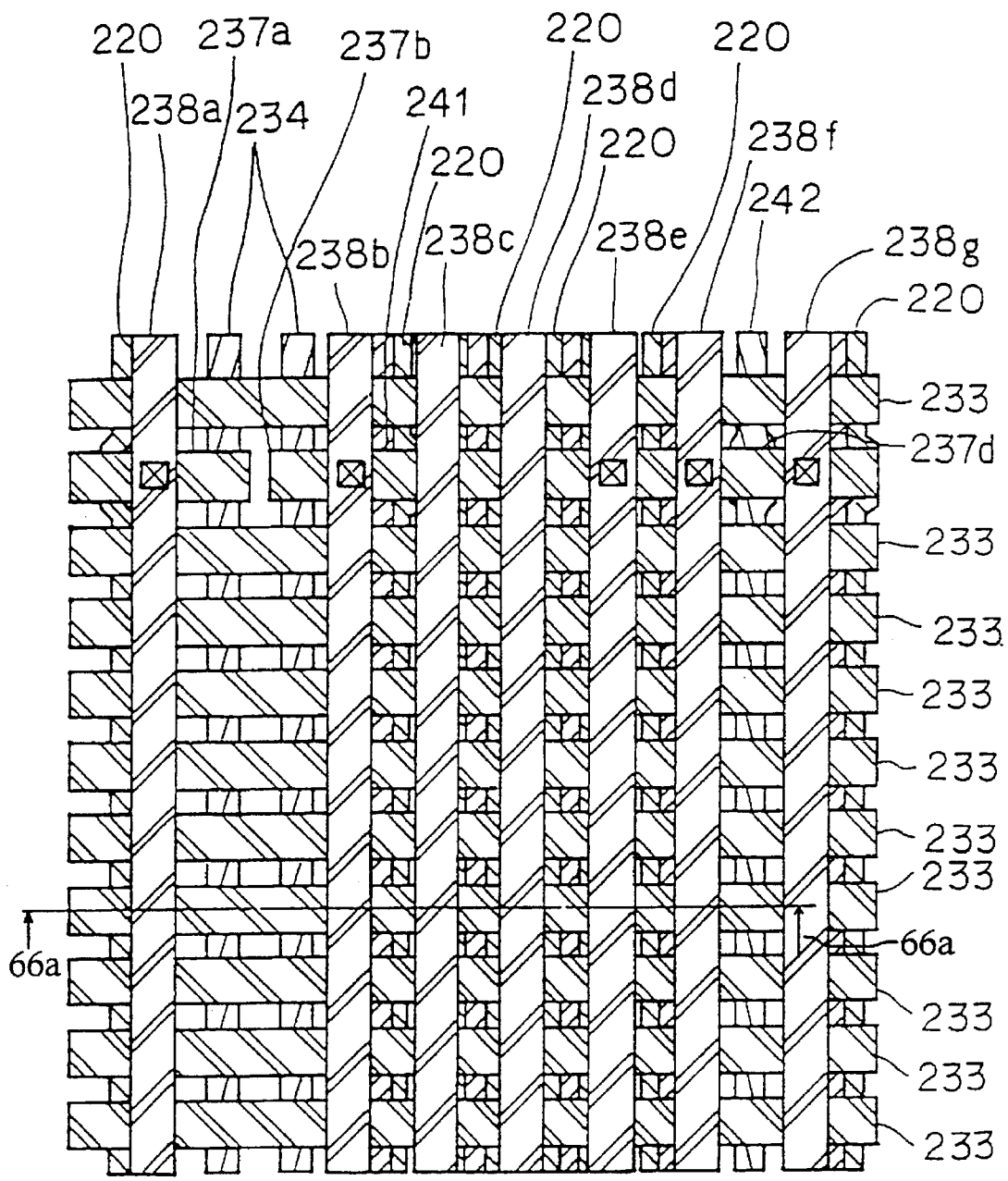
FIG. 71 is a plan view of the structure of FIG. 66(a) with an aluminum interconnection formed.

FIG. 71 shows the layout of FIG. 70 with aluminum interconnections 238a to 238g formed thereon. Aluminum interconnection 238a is electrically connected to aluminum electrode 237a; aluminum interconnection 238b is electrically connected to aluminum electrode 237b; aluminum interconnection 238e is electrically connected to aluminum electrode 237c; and aluminum interconnections 238f and 238g are electrically connected to aluminum electrode 237b.

The whole structure of the fourteenth embodiment of the nonvolatile semiconductor memory device in accordance with the present invention as well as first to seventh examples of operation thereof will be described with reference to Table 1.

A memory cell matrix included in the nonvolatile semiconductor memory device is divided into a plurality of sectors, as will be described below. Table 1 shows conditions for applying voltage to a memory cell (memory transistor) in a selected sector and to a memory cell (memory transistor) in non-selected sectors. In Table 1, the reference character Vd denotes a drain voltage, Vg represents control gate voltage, Vs denotes source voltage and Vbb denotes a well voltage.

|    | Voltages Applied to Selected Sector | | | | Voltages Applied to Non-Selected Sector | | | |
| --- | --- | --- | --- | --- | --- | --- | --- | --- |
|    | VD | Vg | Vs | Vbb | Vd | Vg | Vs | Vbb |
| VOLTAGES APPLIED IN ERASURE | | | | | | | | |
| E1 | open | 10 V | open | −8 V | open | 0 V | open | −8 V |
| E2 | open | 10 V | −8 V | −8 V | open | 0 V | −8 V | −8 V |
| E3 | open | 10 V | open | −8 V | open | 0 V | −8 V | −8 V |
| E4 | open | 10 V | open | −8 V | open | 0 V | 0 V | −8 V |
| E5 | open | 10 V | open | −8 V | open | 0 V | −4 V | −8 V |
| E6 | open | 10 V | −8 V | −8 V | open | 0 V | 0 V | −8 V |
| E7 | open | 10 V | −8 V | −8 V | open | 0 V | −4 V | −8 V |

|    | Voltages Applied to Selected Bit | | | | Voltages Applied to Non-Selected Bit | | | |
| --- | --- | --- | --- | --- | --- | --- | --- | --- |
|    | Vd | Vg | Vs | Vbb | Vd | Vg | Vs | Vbb |
| VOLTAGES APPLIED IN WRITING | | | | | | | | |
| P1 | 5 V | −8 V | open | 0 V | open | 0 V | 0 V | 0 V |

-continued

| VOLTAGES APPLIED IN READING | | | | | | | |
|---|---|---|---|---|---|---|---|
| R1 | 1 V | 3 V | 0 V | 0 V | open | 0 V | 0 V | 0 V |

Figure 72:
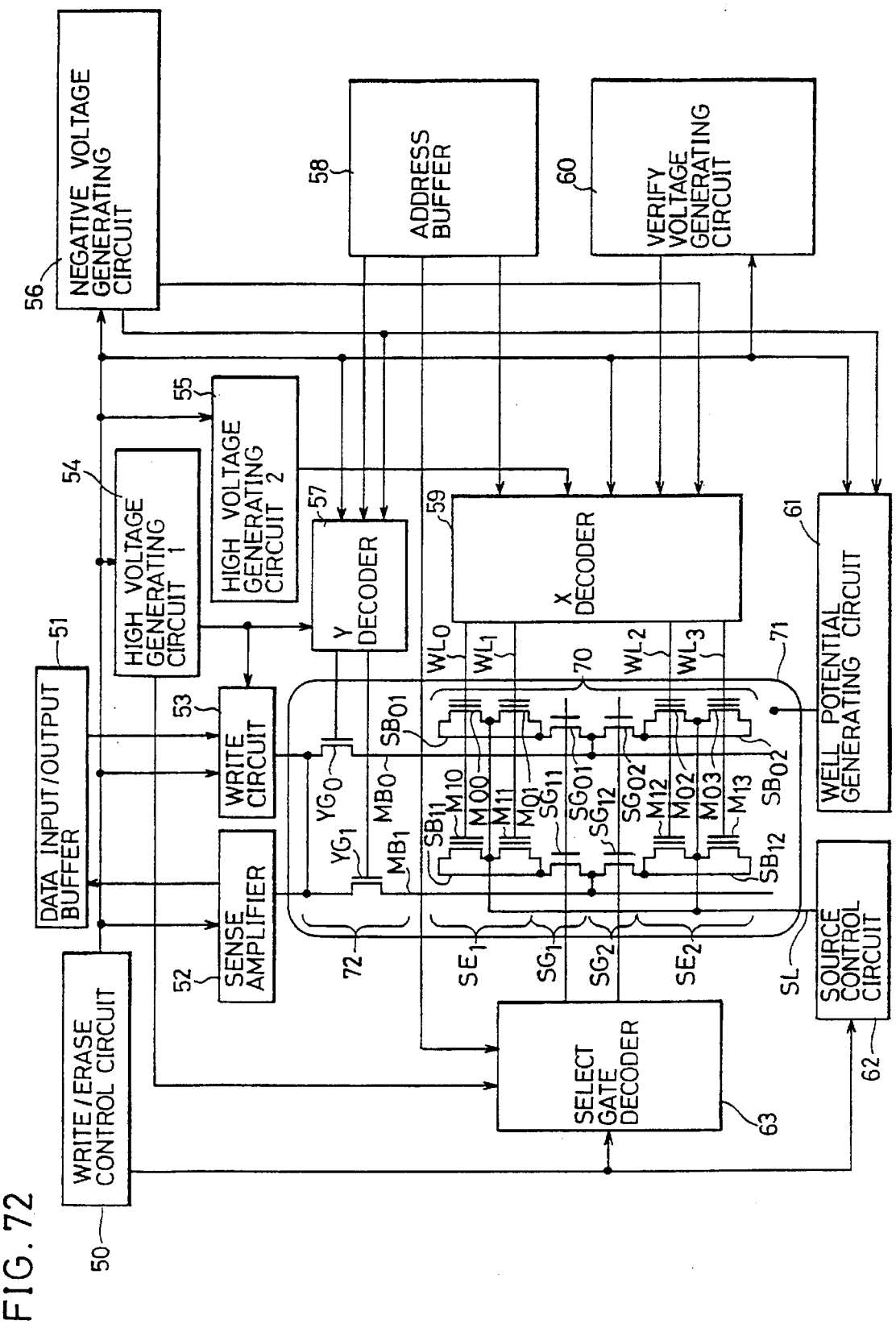
FIGS. 72–76 are block diagrams of first to fifth structures of the fourteenth embodiment of a nonvolatile semiconductor memory device in accordance with the present invention.

<1> First Example (a) Whole structure of the nonvolatile semiconductor memory device FIG. 72 is a block diagram showing the whole structure of the nonvolatile semiconductor memory device of the first example.

A memory cell matrix 70 is divided into sectors SE1 and SE2. Memory cell matrix 70 includes select gates SG1 and SG2 which correspond to sectors SE1 and SE2, respectively. Memory cell matrix 70 is formed in a P well region 71.

Two main bit lines MB0 and MB1 are arranged in memory cell matrix 70. Main bit lines MB0 and MB1 are connected to a sense amplifier 52 and a write circuit 53 through Y gate transistors YG0 and YG1 in a Y gate 72.

Two subbit lines SB01 and SB02 are provided corresponding to main bit line MB0, while two subbit lines SB11 and SB12 are provided corresponding to main bit line MB1.

Word lines WL0 and WL1 are arranged crossing the subbit lines SB01 and SB11, and word lines WL2 and WL3 are arranged crossing subbit lines SB02 and SB12.

At crossing points between subbit lines SB01, SB02, SB11, SB12 and word lines WL0 to WL3, memory cells (memory transistors) M00 to M03 and M10 to M13 are provided, respectively. Memory cells M00, M01, M10 and M11 are included in sector SE1, while memory cells M02, M03, M12 and M13 are included in sector SE2.

The drain of each memory cell is connected to the corresponding subbit line, the control gate is connected to the corresponding word line and the source is connected to the source line SL. Select gate SG1 includes select gate transistors SG01 and SG11, while select gate SG2 includes select gate transistors SG02 and SG12. Subbit lines SB01 and SB02 are connected to main bit line MB0 through select gate transistors SG01 and SG02, respectively, while subbit line SB11 and SB12 are connected to main bit line MB1 through select gate transistors SG11 and SG12, respectively. Address buffer 58 receives an externally applied address signal, applies an X address signal to a X decoder 59 and applies a Y address signal to a Y decoder 57. X decoder 59 selects any of the plurality of word lines WL0 to WL3 in response to the X address signal. Y decoder 57 generates a selecting signal for selecting any of the plurality of main bit lines MB0 and MB1 in response to the Y address signal.

The Y gate transistor in Y gate 72 connects the main bit lines MB0 and MB1 to sense amplifier 52 and write circuit 53, respectively, in response to a selection signal.

In reading, sense amplifier 52 senses data read on the main bit line MB0 or main bit line MB1 and externally outputs the data through a data input/output buffer 51.

In writing, externally applied data is applied to write circuit 53 through data input/output buffer 51 and write circuit 53 applies a program voltage to main bit lines MB0 and MB1 in accordance with the data.

High voltage generating circuits 54 and 55 receive an external supply voltage Vcc (for example 5 V) and generate a high voltage. A negative voltage generating circuit 56 receives externally a supply voltage Vcc and generates a negative voltage. A verify voltage generating circuit 60 receives the externally applied supply voltage Vcc and applies, at the time of verifying, a prescribed verify voltage to a selected word line. A well potential generating circuit 61 applies a negative voltage to p well region 71 at the time of erasure. A source control circuit 62 applies a high voltage to source line SL at the time of erasure. A select gate decoder 63 selectively activates select gates SG1 and SG2 in response to a part of the address signal from address buffer 58.

A write/erase control circuit 50 controls operations of various circuits in response to an externally applied control signal.

(b) Operation of the nonvolatile semiconductor memory device

The sector erasing operation, writing operation and reading operation of the nonvolatile semiconductor memory device will be described with reference to Table 1.

(i) Sector erasing operation

In this description, it is assumed that the sector SE1 is erased at one time. First, a control signal designating a sector collective erasing operation is applied to write/erase control circuit 50. Consequently, high voltage generating circuit 55 and negative voltage generating circuit 56 are activated.

High voltage generating circuit 55 applies a high voltage (10 v) to X decoder 59. X decoder 59 applies the high voltage (10 v) to word lines WL0 and WL1 in sector SE1, and applies 0 V to word lines WL2 and WL3 in sector SE2. Negative voltage generating circuit 56 applies a negative voltage to Y decoder 57 and well potential generating circuit 61. Y decoder 57 applies a negative voltage to Y gate transistors YG0 and YG1 in Y gate 72. Consequently, main bit lines MB0 and MB1 are set to the floating state. Source control circuit 62 sets the source line SL to the floating state. Well potential generating circuit 61 applies a negative voltage (−8 V) to p well region 71. Select gate decoder 63 sets select gates SG1 and SG2 to off state.

In this manner, voltages such as shown in the row E1 of Table 1 are applied to the memory cells of the selected sector SE1 and of the non-selected sector SE2. Consequently, all memory cells in the sector SE1 are erased.

(ii) Writing operation

Assume that a memory cell M00 is to be programmed. More specifically, data "0" is written in memory cell M00 and data "1" is maintained in memory cell M10.

First, a control signal designating programming operation is applied to write/erase control circuit 50. Consequently, high voltage generating circuit 54 and negative voltage generating circuit 56 are activated.

Negative voltage generating circuit 56 applies a negative voltage to X decoder 59. X decoder 59 selects word line WL0 in response to the X address signal applied from address buffer 58, and applies a negative voltage (−8 V) to the selected word line WL0 and 0 V to non-selected word lines WL1 to WL3.

High voltage generating circuit 54 applies a high voltage to Y decoder 57, write circuit 53 and select gate decoder 63. First, data "0" is externally applied to write circuit 53 through the data input/output buffer 51, and latched. Y decoder 57 applies a high voltage to Y gate transistor YG0 in Y gate 72 in response to the Y address signal applied from address buffer 58, and applies 0 V to Y gate transistor YG1. Thus Y gate transistor YG0 turns on.

Write circuit 53 applies a program voltage (5 V) corresponding to data "0" to main bit line MB0 through Y gate transistor YG0. Select gate decoder 63 turns on the select gate SG1 and turns off the select gate SG2. Consequently, subbit lines SB01 and SB11 are connected to main bit lines MB0 and MB1, respectively. Source control circuit 62 sets the source line SL to floating state. Well potential generating circuit 61 applies 0 V to p well region 71.

In this manner, voltages such as shown in the left column of (P1) of Table 1 are applied to memory cell M00. Consequently, the threshold voltage of memory cell M00 lowers.

After the lapse a prescribed time period (for example, 1 msec), data "1" is externally applied to write circuit 53 through data input/output buffer 51, and latched. Y decoder 57 applies a high voltage to Y gate transistor YG1 and 0 V to Y gate transistor YG0 in Y gate 72 in response to the Y address signal applied from address buffer 58. Consequently, Y gate transistor YG1 turns on. Write circuit 53 applies 0 V, which corresponds to data "1", to main bit line MB1, through Y gate transistor YG1.

In this manner, voltages such as shown in the right column of (P1) of Table 1 are applied to memory cell M10. Consequently, the threshold voltage of memory cell M10 is kept high.

(iii) Reading operation

It is assumed that data is read from memory cell M00. First, a control signal designating reading operation is applied to write/erase control circuit 50.

X decoder 59 selects word line WL0 in response to the X address signal applied from address buffer 58, and applies 3 V thereto. At this time, word lines WL1 to WL3 are kept at 0 V. Select gate decoder 63 turns on the select gate SG1 and turns off the select gate SG2. Y decoder 57 turns on the Y gate transistor YG0 in Y gate 72 in response to the Y address signal applied from address buffer 58. Source control circuit 62 grounds the source line SL.

In this manner, voltages shown in the left column of (R1) of Table 1 are applied to selected memory cell M00. Consequently, if the content of M00 is "1", read current flows to the main bit line MB0. This read current is detected by sense amplifier 52 and externally output through data input/output buffer 51. At this time, voltages such as shown in the right column of (R1) of Table 1 are applied to the non-selected memory cells.

<2> Second Example (a) Whole structure of the nonvolatile semiconductor memory device.

Figure 73:
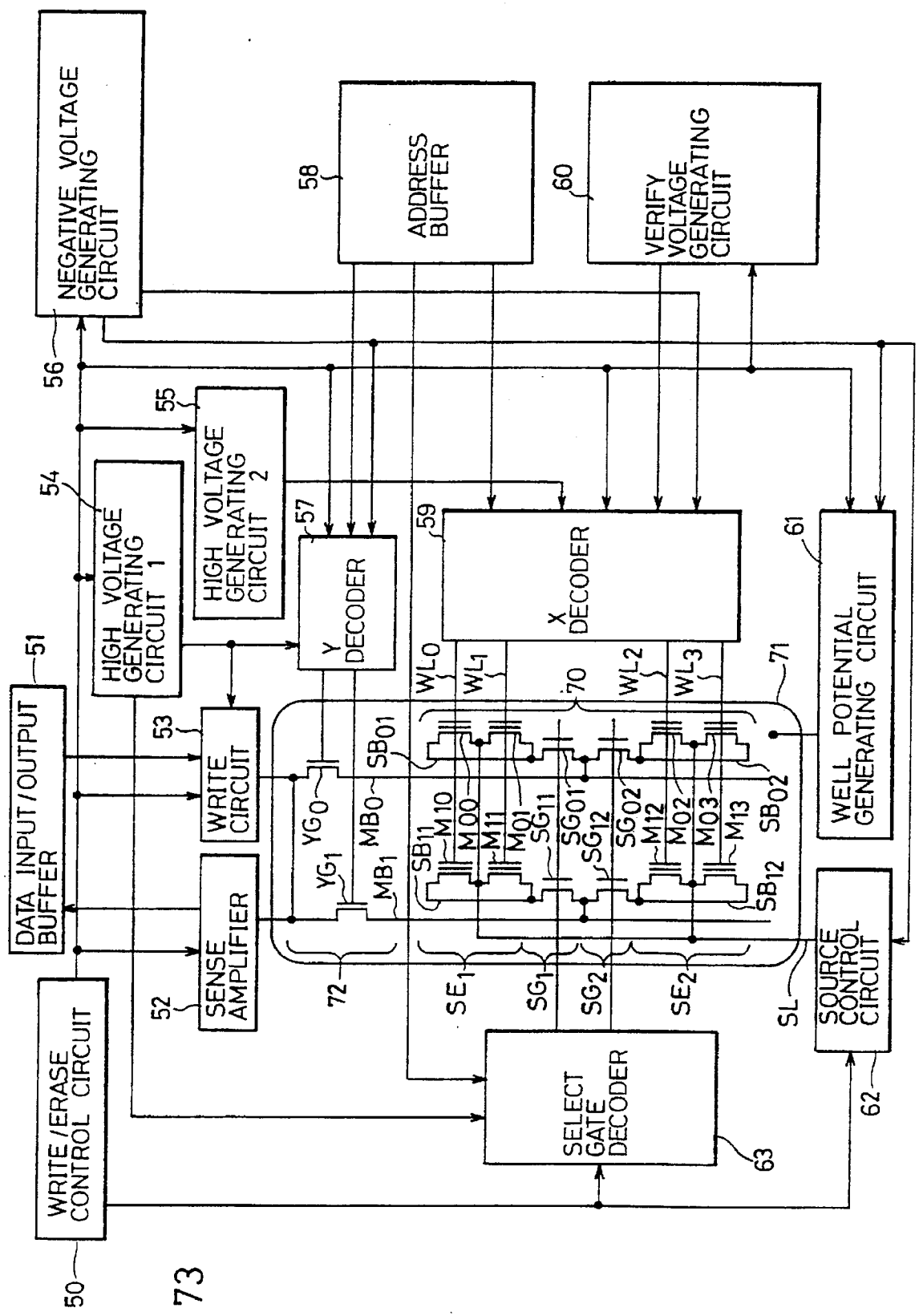

FIG. 73 is a block diagram showing the whole structure of the nonvolatile semiconductor memory device in accordance with the second example.

The nonvolatile semiconductor memory device of FIG. 73 differs from the one of FIG. 72 in that a negative voltage is applied to the source control circuit 62 at the time of erasure by the negative voltage generating circuit 56.

Structures of other portions are the same as those shown in FIG. 72.

(b) Operation of the nonvolatile semiconductor memory device.

The writing operation and reading operation of the nonvolatile semiconductor memory device of the second example are the same as those in the first example. As for the sector collective erasure operation, it differs from the first example in that a negative voltage (−8 V) is applied to the source line SL by source control circuit 62.

At the time of collective erasure, voltages are applied to the memory cells of the selected sector as shown in the left column of (E2) of Table 1, while voltages are applied to the memory cells in the nonselected sector as shown in the right column of (E2) of Table 1.

Figure 74:
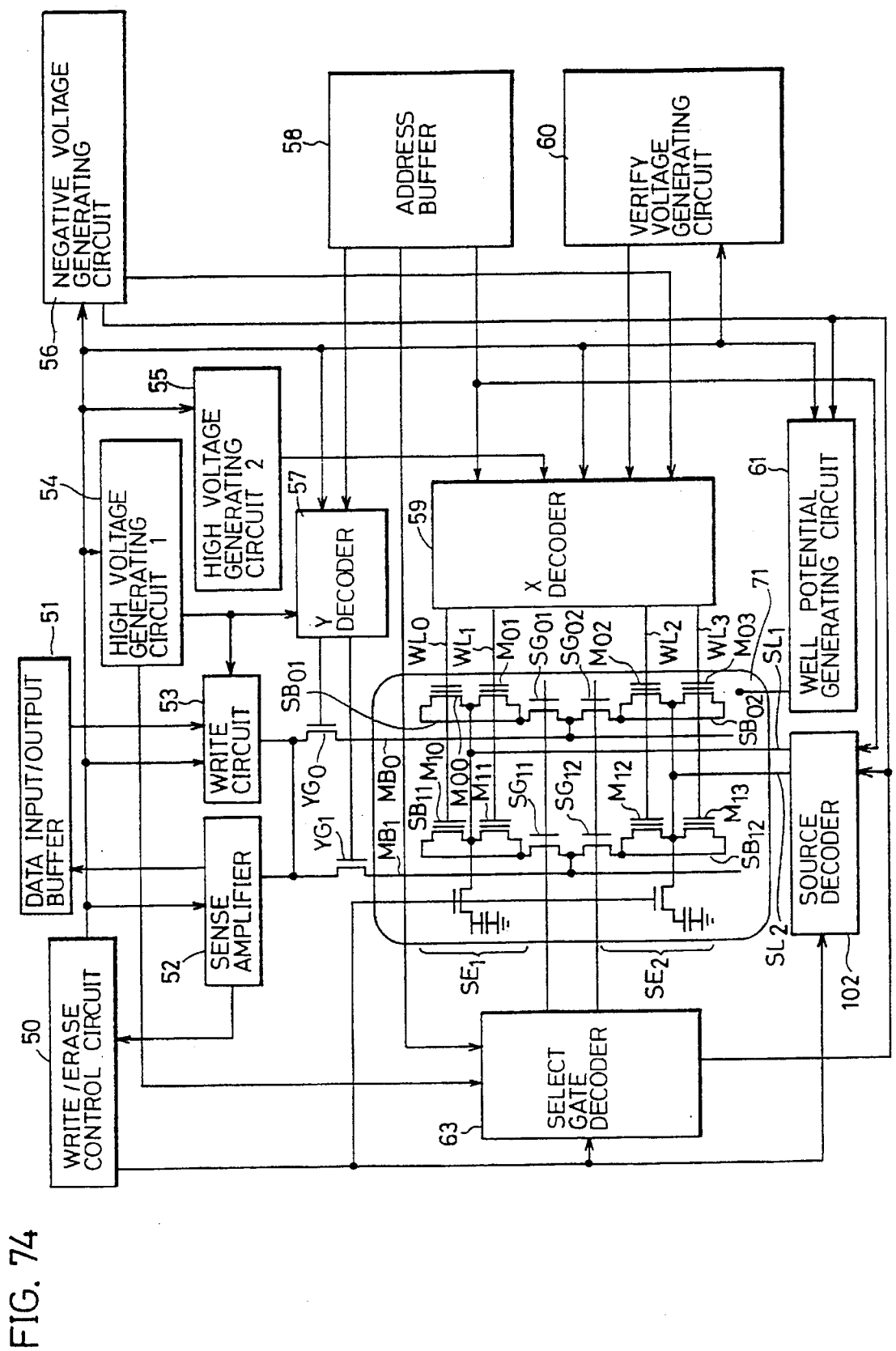

<3> Third Example (a) Whole structure of the nonvolatile semiconductor memory device FIG. 74 is a block diagram showing the whole structure of the nonvolatile semiconductor memory device in accordance with the third example.

The nonvolatile semiconductor memory device of the third example differs from the one of the first example in the following points. A source decoder 102 is provided in place of the source control circuit 62. The negative voltage generating circuit 56 applies a negative voltage not to Y decoder 57 but to select gate decoder 63 and source decoder 102.

Sources of memory cells M00, M01, M10 and M11 in sector SE1 are connected to source line SL1, while sources of memory cells M02, M03, M12, M13 in sector SE2 are connected to source line SL2. An output terminal of source decoder 102 is connected to source lines SL1 and SL2.

(b) Operation of the nonvolatile semiconductor memory device.

The writing operation and reading operation of the nonvolatile semiconductor memory device of the third example are the same as those of the first example. In the sector collective erasing operation, source decoder 102 sets the source line corresponding to the selected sector to the floating state, and applies a negative voltage (−8 V) to the source line corresponding to the nonselected sector. For example, when the sector SE1 should be collectively erased, the source line SL1 is set to the floating state and −8 V is applied to source line SL2.

In this manner, voltages are applied to the memory cells of the selected sector as shown in the left column of (E3) of Table 1, and voltages are applied to memory cells in the non-selected sector as shown in the right column of (E3) of Table 1.

Consequently, memory cells in the selected sector can be erased at one time while the data in the memory cells of the non-selected sector are protected stably.

Figure 75:
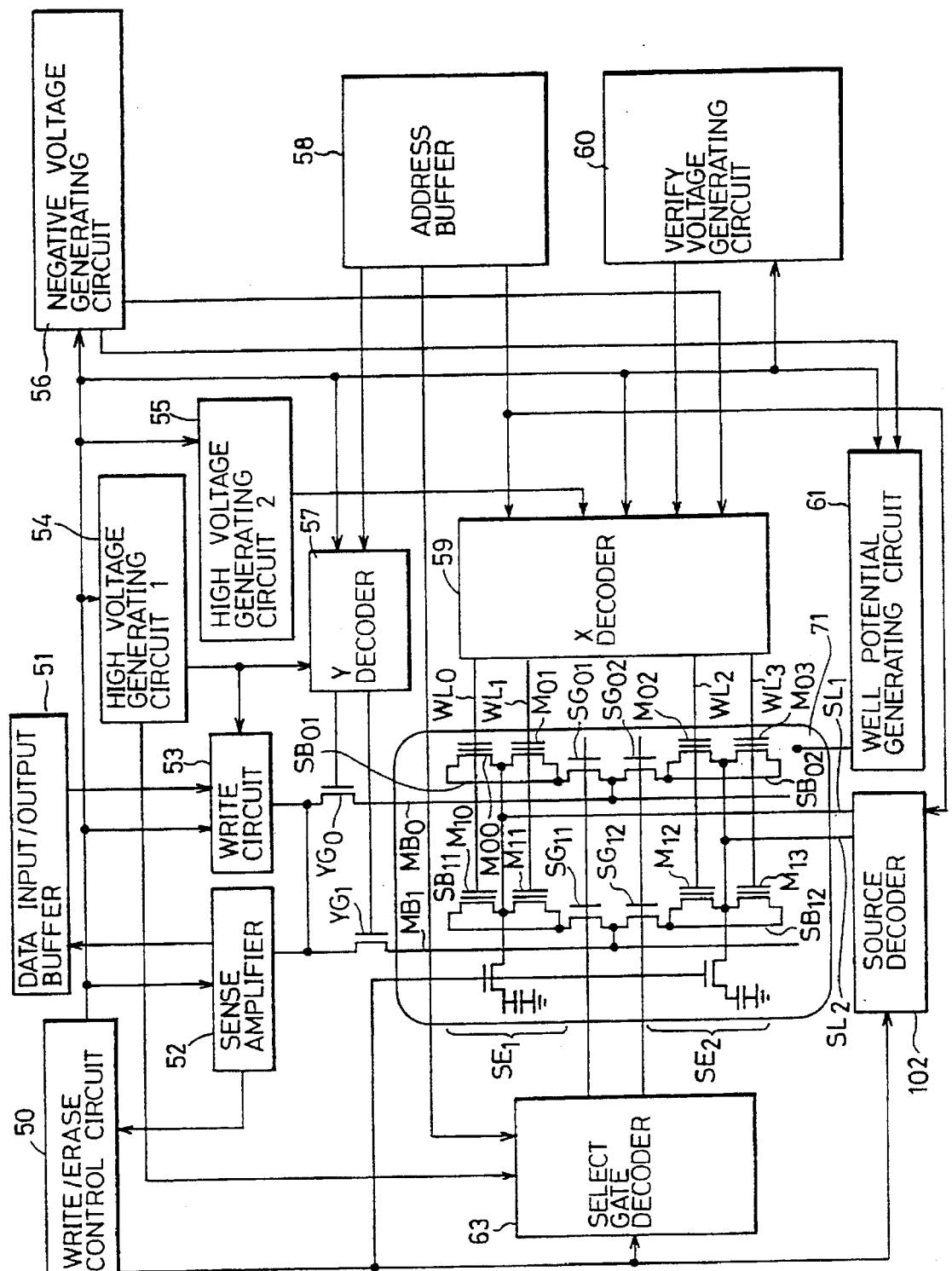

<4> Fourth Example (a) Whole structure of the nonvolatile semiconductor memory device FIG. 75 is a block diagram showing the whole structure of the nonvolatile semiconductor memory device in accordance with the fourth example.

The nonvolatile semiconductor memory device of the fourth example differs from the nonvolatile semiconductor memory device of the third example shown in FIG. 74 in the following point. Namely, negative voltage generating circuit 56 applies a negative voltage only to the well potential generating circuit 61 and does not apply the negative voltage to select gate decoder 63 and source decoder 102 at the time of erasure.

(b) Operation of the nonvolatile semiconductor memory device

The writing operation and the reading operation of the nonvolatile semiconductor memory device of the fourth example are the same as those of the first example.

At the time of collective erasure, source decoder 102 sets the source line corresponding to the selected sector to the floating state, and applies 0 V to the source line corresponding to the non-selected sector. When the sector SE1 is to be collectively erased, for example, the source line SL1 is set to the floating state and 0 V is applied to source line SL2.

In this manner, voltages are applied to the memory cells of the selected sector as shown in the left column of (E4) of Table 1, and voltages are applied to the memory cells in the non-selected sector as shown in the right column of (E4) of Table 1.

Consequently memory cells in the selected sector can be erased at one time, while the data in the memory cells of the non-selected sector can be protected stably.

Figure 76:
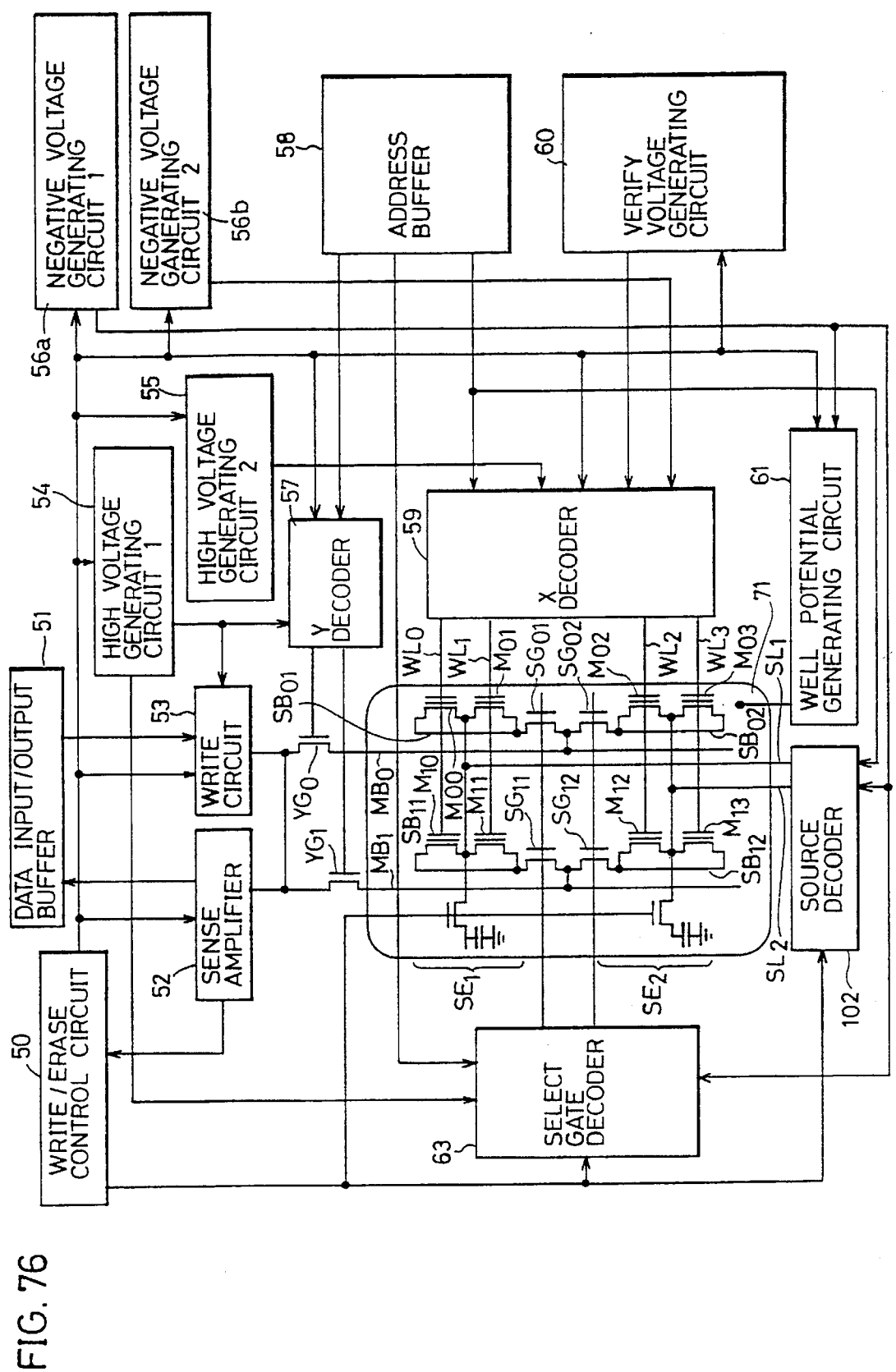

<5> Fifth Example (a) Whole structure of the nonvolatile semiconductor memory device FIG. 76 is a block diagram showing the whole structure of the nonvolatile semiconductor memory device in accordance with the fifth example.

The nonvolatile semiconductor memory device of the fifth example differs from the nonvolatile semiconductor memory device of the fourth example shown in FIG. 75 in the following points. Namely, two negative voltage generating circuits 56a and 56b are provided. The negative voltage generating circuit 56a applies a negative voltage to well potential generating circuit 61, select gate decoder 63 and source decoder 102. Negative voltage generating circuit 56b applies a negative voltage to X decoder 59. Structures of other portions are the same as those shown in FIG. 75.

(b) Operation of the nonvolatile semiconductor memory device

The writing operation and the reading operation of the nonvolatile semiconductor memory device of the fifth example are the same as those of the first example.

At the time of sector collective erasing operation, source decoder 102 sets the source line corresponding to the selected sector to the floating state, and applies −4 V to the source line corresponding to the non-selected sector. When sector SE1 is to be collectively erased, for example, the source line SL1 is set to the floating state and −4 V is applied to source line SL2.

In this manner, voltages are applied to the memory cells in the selected sector as shown in the left column of (E5) of Table 1, while voltages are applied to the memory cells in the non-selected sector as shown in (E5) of Table 1.

Consequently, the memory cells in the selected sector can be erased at one time while the data in the memory cells of the non-selected sector are protected stably.

<6> Sixth Example

The whole structure of the nonvolatile semiconductor memory device in accordance with the sixth example is the same as the structure shown in FIG. 74. The reading and writing operations of the nonvolatile semiconductor memory device of the sixth example are the same as those of the first example.

At the time of collective erasing operation, source decoder 102 applies −8 V to the source line corresponding to the selected sector, and applies 0 V to the source line corresponding to the non-selected sector. When the sector SE1 is to be collectively erased, for example −8 V is applied to source line SL1 and 0 V is applied to source line SL2.

In this manner, voltages are applied to the memory cells in the selected sector as shown in the left column of (E6) of Table 1, and voltages are applied to the memory cells in the non-selected sector as shown in the right column of (E6) of Table 1.

Consequently, memory cells in the selected sector can be erased at one time while the data in the memory cells of the non-selected sector can be protected stably.

<7> Seventh Example

The whole structure of the nonvolatile semiconductor memory device in accordance with the seventh example is the same as the structure shown in FIG. 76. The writing and reading operations of the nonvolatile semiconductor memory device of the seventh example are the same as the first example.

At the time of sector collective erasing operation, source decoder 102 applies −8 V to the source line corresponding to the selected sector and applies −4 V to the source line corresponding to the non-selected sector. When the sector SE1 is selected, for example, −8 V is applied to source line SL1, and −4 V is applied to source line SL2.

In this manner, voltages are applied to the memory cells of the selected sector as shown in the left column of (E7) of Table 1, while voltages are applied to the memory cells of the non-selected sector as shown in the right column of (E7) of Table 1.

Consequently, memory cells in the selected sector can be collectively erased while the data in the memory cells in the non-selected sector can be protected stably.

<8> Advantages of Respective Examples

In the first and second examples, the non-selected sector is disturbed to some extent from the substrate. However, the source decoder is not necessary and only one negative voltage generating circuit is required.

In the third example, the disturb from the substrate to the non-selected sector is small. Only one negative voltage generating circuit is required. Further, junction breakdown voltage of the source at the time of erasure may be low. However, a source decoder is necessary.

In the fourth and sixth examples, the disturb from the substrate to the non-selected sector is the smallest. Only one negative voltage generating circuit is required. However, a source decoder is necessary and source junction breakdown voltage as high as 8 V is necessary.

In the fifth and seventh examples, the disturb from the substrate to the non-selected sector is relatively small and the source junction breakdown voltage may be as small as up to 4 V. However, a source decoder and two negative voltage generating circuits are necessary.

The method of manufacturing the nonvolatile semiconductor memory device of the fourteenth embodiment of the present invention shown in FIG. 66 (a) will be described with reference to FIGS. 77 to 95. FIGS. 77 to 95 are cross sections showing the first to nineteenth steps of manufacturing the nonvolatile semiconductor memory device having the above described structure.

Figure 77:
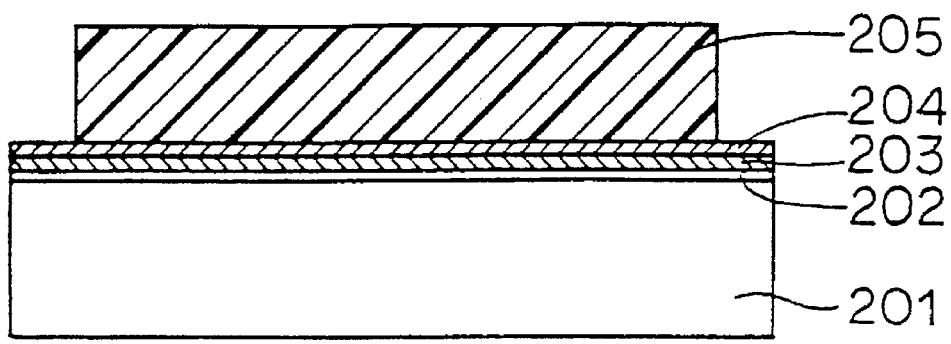

Referring to FIG. 77, on a main surface of a p type silicon substrate 201, an underlayer oxide film 202 having the thickness of about 300 Å is formed. On this underlying oxide film 202, a polycrystalline silicon film 203 having the thickness of about 500 Å is formed by CVD (Chemical Vapor Deposition) method. On the polycrystalline silicon film 203, a silicon nitride film 204 of about 1000 Å is formed by CVD method or the like. A resist 205 is formed to expose an element isolating region on silicon nitride film 204. By carrying out anisotropic etching using the resist 205 as a mask, silicon nitride film 204 and polycrystalline silicon film 203 on the element isolating region are etched.

Figure 78:
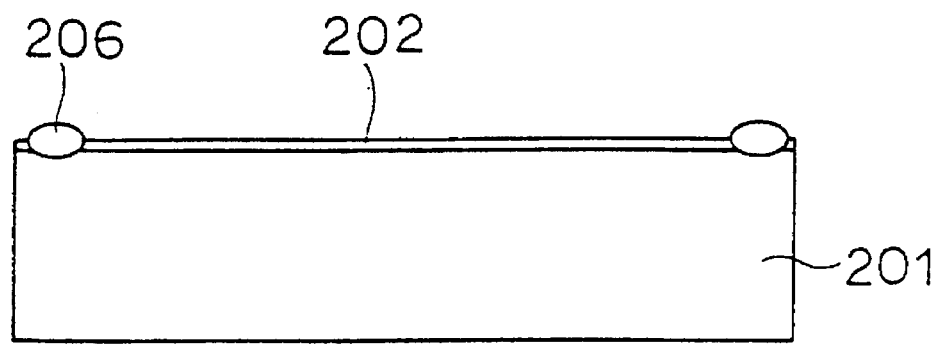

Then, resist 205 is removed, and by carrying out selective oxidation by using silicon nitride film 204 as a mask, a field oxide film 206 is formed as shown in FIG. 78. Then the polycrystalline silicon film 203 and silicon nitride film 204 are removed.

Figure 79:
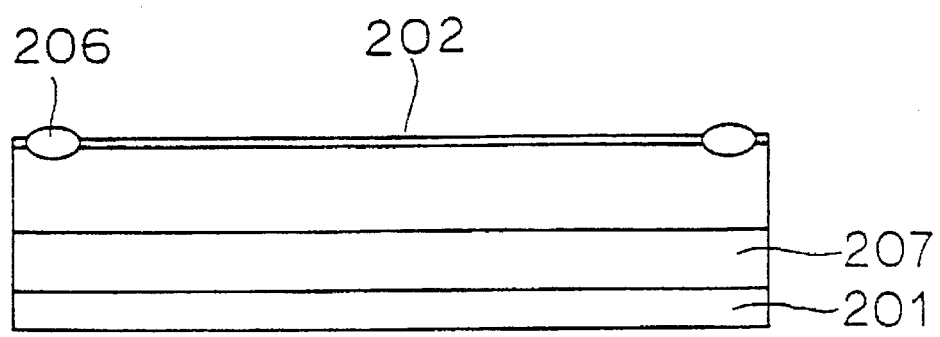
Figure 80:
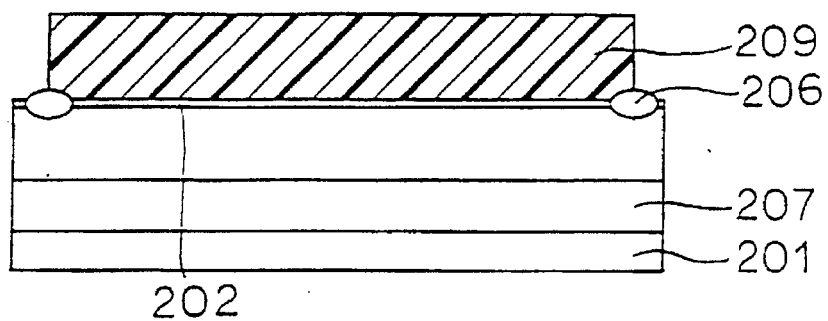

Then, as shown in FIG. 79, phosphorus (P) is ion-implanted under the condition of 3.0 MeV, $2.0 \times 10^{13}$ cm$^{-3}$ at a portion of the peripheral circuit region and the memory transistor region as shown in FIG. 79. Then, impurity driving is carried out for one hour at the temperature of 1000° C. Thus, an n well 207 is formed. Thereafter, as shown in FIG. 80, a resist 209 is formed to cover the memory cell forming region, by using the resist 209 as a mask, phosphorus (P) is ion-implanted under the condition of 1.2 MeV and $1.0 \times 10^{13}$ cm$^{-3}$, and further phosphorus (P) is ion-implanted under the condition of 180 keV and $3.5 \times 10^{12}$ cm$^{-3}$. Consequently, an n well (not shown) is formed at a portion of the peripheral circuit region.

Figure 81:
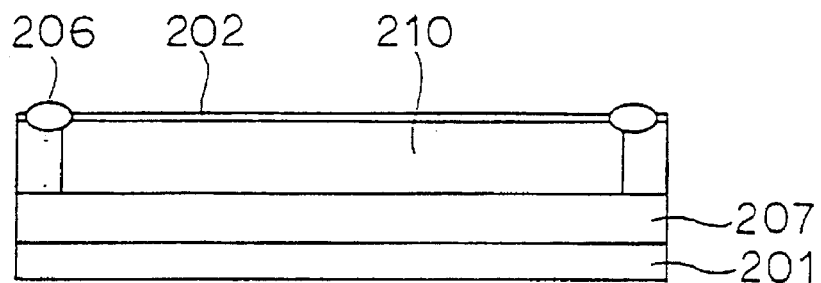

Then, referring to FIG. 81, boron (B) is ion-implanted under the condition of 700 keV and $1.0 \times 10^{13}$ cm$^{-3}$ in the memory transistor region, and boron (B) is further ion-implanted under the condition of 180 keV and $3.5 \times 10^{12}$ cm$^{-3}$. Thus p well 210 is formed.

Figure 82:
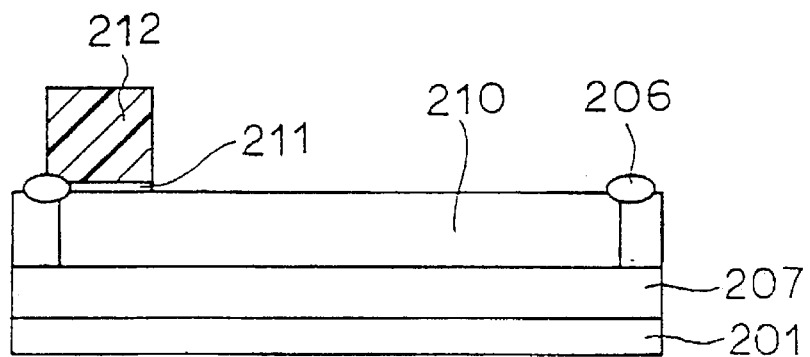
Figure 83:
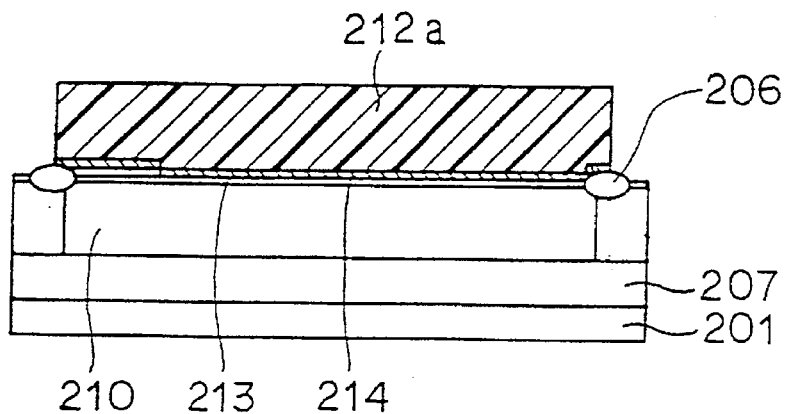

Thereafter, impurities are introduced for controlling the threshold voltage of each memory transistor, and thereafter, referring to FIG. 82, a gate insulating film 211 having the thickness of about 150 Å is formed by thermal oxidation entirely over the main surface of the p type silicon substrate 201. A resist 212 is formed to cover a selective gate transistor (described later) forming region on the gate insulating film 211. By using resist 212 as a mask, etching is carried out and, thereby, portions other than the selective gate transistor forming region on the gate insulating film 211 are removed.

By removing the aforementioned resist 212 and by carrying out thermal oxidation again, a gate insulating film 213 having the thickness of about 100 Å is formed on the entire surface of p type silicon substrate 201. Consequently, gate insulating films 211 and 213 having the thickness of about 250 Å come to be formed at the selective gate transistor forming region. On the gate insulating films 211 and 213, a first polycrystalline silicon film 214 is formed to have the thickness of about 1200 Å by the CVD method or the like. Then, on the first polycrystalline silicon film 214, a resist 212a of a prescribed shape (in this example, a plurality of resist patterns are formed intermittently in the vertical direction vertical to the sheet) is deposited, and the first polycrystalline silicon film 214 is etched by using the resist 212a as a mask.

Figure 84:
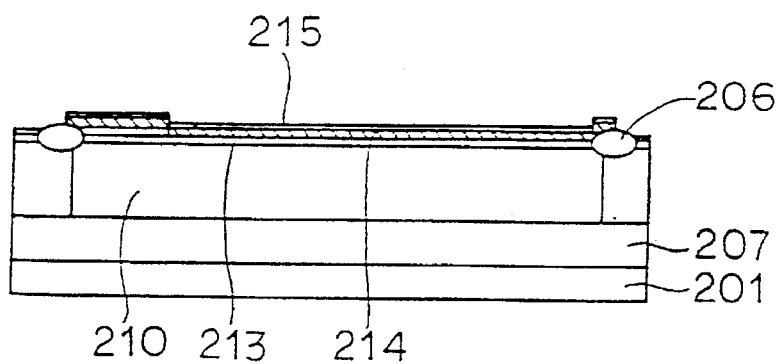

Then, as shown in FIG. 84, a high temperature oxide film having the thickness of about 100 Å is formed by the CVD method or the like on the aforementioned first polycrystalline silicon film 214, a silicon nitride film is formed to the thickness of about 100 Å on the high temperature oxide film by the CVD method or the like, and then a high temperature oxide film having the thickness of about 150 Å is formed on the silicon nitride film by the CVD method. Consequently, an ONO film 215 is formed.

Figure 85:
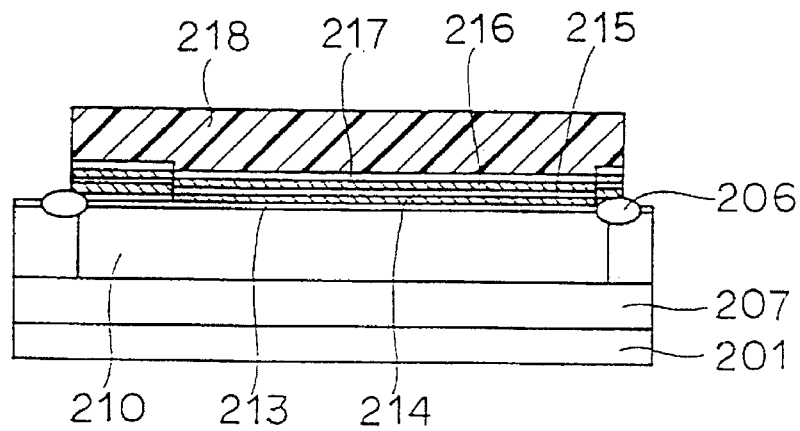

Then, referring to FIG. 85, a polycrystalline silicon layer doped with impurity is formed to the thickness of about 1200 Å by the CVD method on the aforementioned ONO film 215. Then, on the polycrystalline silicon layer, a tungsten silicide (WSi) layer is formed to the thickness of about 1200 Å by sputtering. Consequently, a conductive layer 216 which will serve as a control gate electrode is formed. On the conductive layer 216, a high temperature oxide film 217 having the thickness of about 2000 Å is formed by the CVD method. Then, on the high temperature oxide film 217 positioned above the transistor forming regions in the memory transistor region and in the peripheral portion, a resist 218 is formed, etching is carried out by using the resist 218 as a mask, and thus electrodes of the transistors used in the peripheral circuitry are formed.

Then, referring to FIG. 86, a resist 218a is formed intermittently in lateral direction in FIG. 86, on the aforementioned high temperature oxide film 217. By using the resist 218a as a mask, high temperature oxide film 217, conductive film 216, ONO film 215 and the first polycrystalline silicon film 214 are etched. Consequently, a floating gate electrode 219 and a control gate electrode 220 are formed.

Referring to FIG. 87 (a), resist 221 is further applied on the flash memory in the state shown in FIG. 86, and resist 221 is patterned to expose a portion which will be the source region of the memory transistor. FIG. 87 (b) is a plan view showing a part of the plan of the flash memory in the state shown in FIG. 87 (a). A cross section along the line 87a—87a of FIG. 87 (b) corresponds to FIG. 87 (a). By using the patterned resist 221 as a mask, dry etching is carried out to remove a field oxide film 206 formed on the source region.

Figure 88:
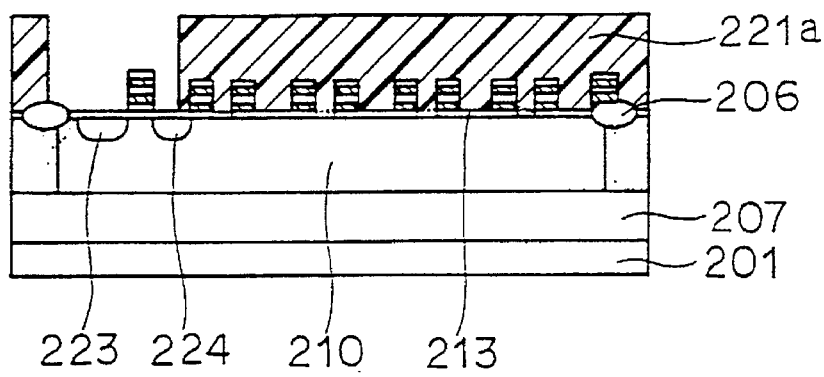

After resists 218a and 211 are removed, a resist pattern 221a is formed to expose only the selective gate transistor as shown in FIG. 88. By using the resist pattern 221a as a mask, phosphorus (P) is ion-implanted under the condition of 60 KeV and $3.0 \times 10^{13}$ cm$^{-3}$. Consequently, source/drain regions 223 and 224 of the selective gate transistor are formed. Then resist 221a is removed.

Figure 89:
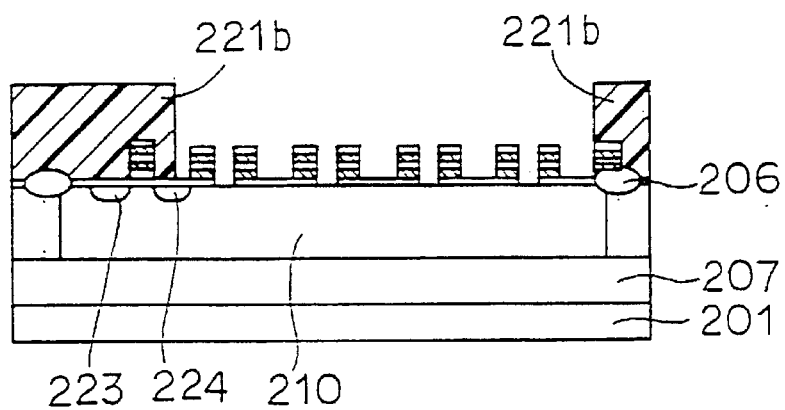

Thereafter, referring to FIG. 89, a resist pattern 221b is formed to cover the transistor which will be the selective gate transistor and to expose other memory cells. By using resist 221b as a mask, arsenic (As) is ion-implanted under the condition of 35 keV and $5.5 \times 10^{15}$ cm$^{-3}$. Consequently, source/drain regions and the source line of the memory transistor are formed. Then resist 221b is removed.

Figure 90:
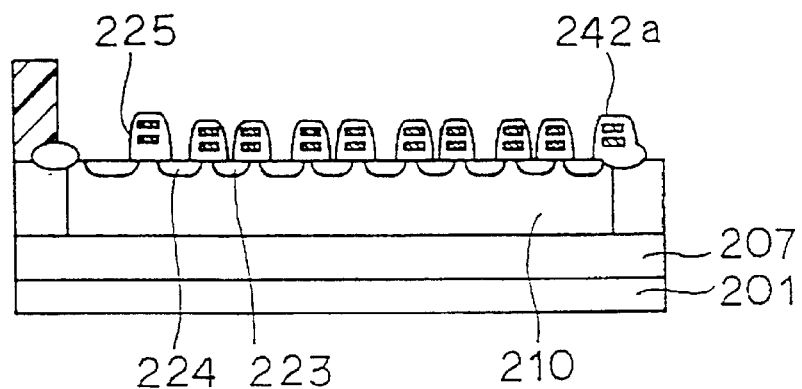

Then, referring to FIG. 90, a high temperature oxide film having the thickness of about 2000 Å is formed on the memory transistor region by the CVD method. By anisotropic etching of the high temperature oxide film, sidewalls 225 are formed on the sidewalls of the selective gate transistor or on the sidewalls of the memory transistor. By using the sidewalls 225 as a mask, arsenic (As) is ion-implanted under the condition of 35 keV and $4.0 \times 10^{15}$ cm$^{-3}$. Consequently, source/drain regions of the transistors in the peripheral region are formed.

Figure 91:
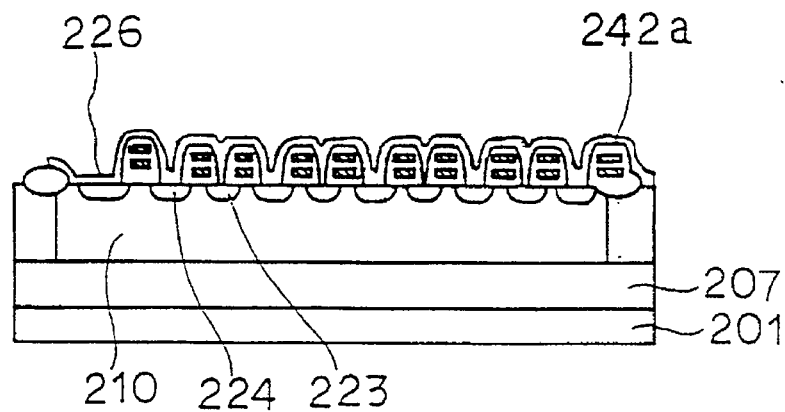
Figure 92:
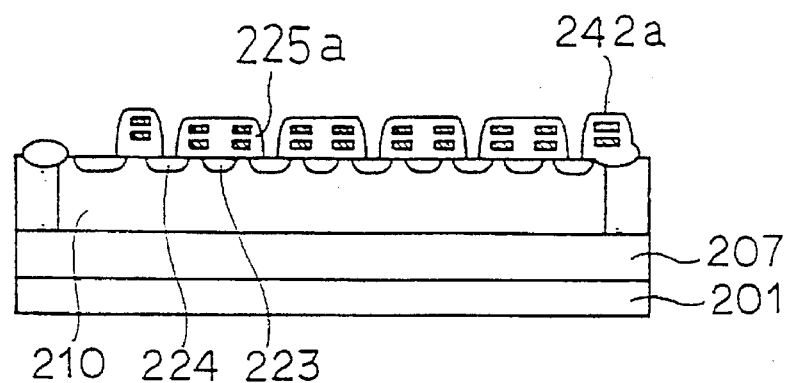

Thereafter, referring to FIG. 91, a silicon oxide film 226 formed of a TEOS (Tetra Ethyl Ortho Silicate) film, for example, is deposited on the memory transistor region. Sintering of the oxide film is carried out for about 30 minutes. Then, as shown in FIG. 92, by anisotropic etching of the silicon oxide film 226, a sidewall 225a is formed. By the formation of the sidewall 225a, the source region in the memory cell is covered by a silicon oxide film.

Figure 93:
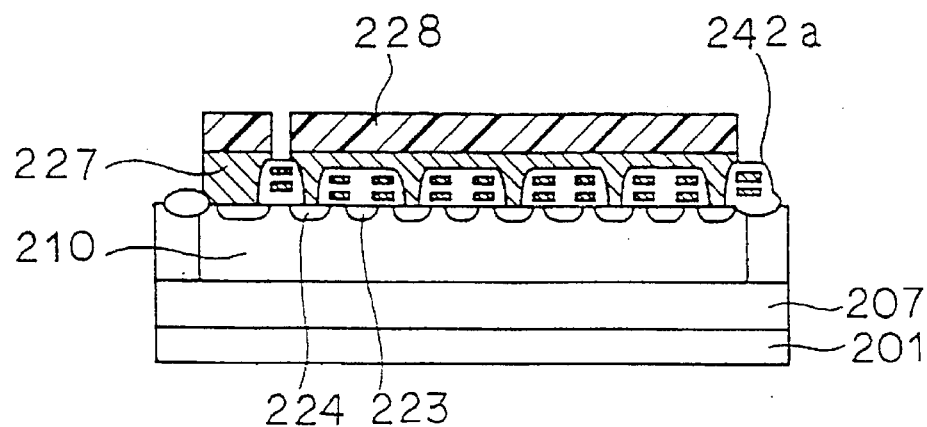

Referring to FIG. 93, a polycrystalline silicon layer having the thickness of about 2000 Å is formed by the CVD method or the like, and by introducing impurities to the polycrystalline silicon layer, it is rendered conductive. A resist 228 having a prescribed shape is applied to the polycrystalline silicon layer, and by patterning the same using resist 228 as a mask, a subbit line 227 is formed.

Figure 94:
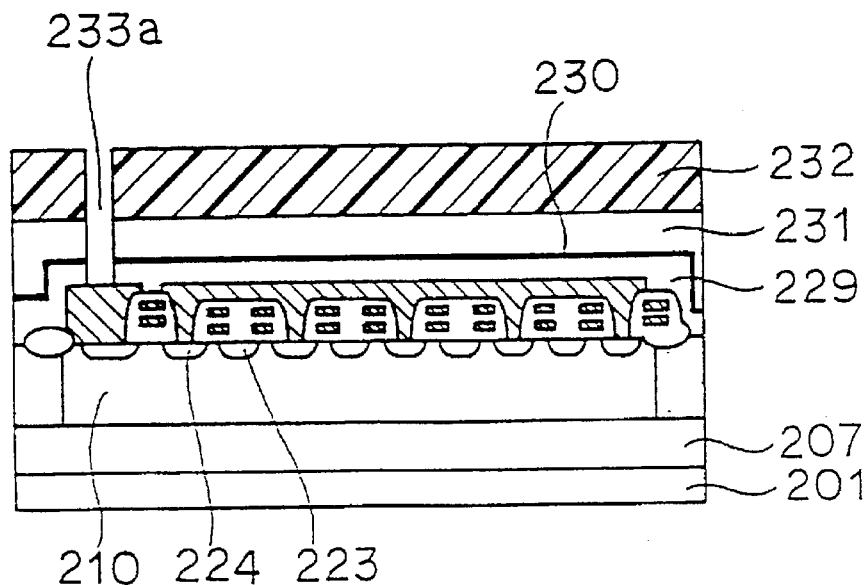

Then, referring to FIG. 94, after the resist 228 is removed, a silicon oxide film 229 of, for example TEOS film is formed by the CVD method on the subbit line 227. The thickness of silicon oxide film 229 is about 1500 Å. Then, a silicon nitride film 230 having the thickness of about 500 Å is formed by the CVD method or the like on the silicon oxide film 229. Then, a silicon oxide film 231 of, for example, BPTEOS film having the thickness of about 10000 Å is formed by the CVD method or the like on silicon nitride film 230. Thereafter, reflow processing is carried out by thermal processing at about 850° C., and BPTEOS film is etched back to about 5000 Å by HF or the like. Thereafter, a resist 232 of a prescribed shape is deposited on the silicon oxide film 231, and by using the resist 232 as a mask, silicon oxide films 229 and 231 and silicon nitride film 230 are etched. Consequently, a contact hole 233a for connection between subbit line 227 and a main bit line 233 which will be formed in the subsequent step is provided.

Figure 95:
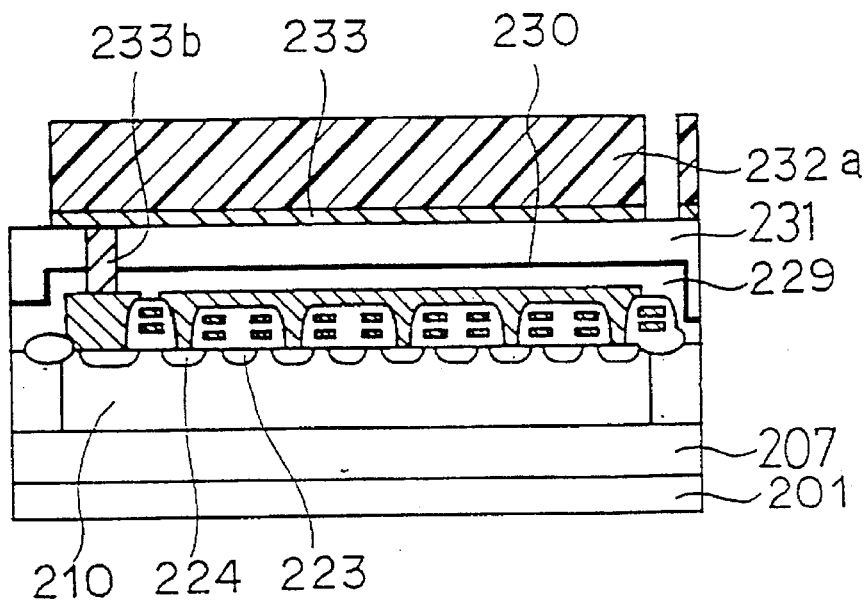

Then, referring to FIG. 95, a tungsten plug 233b is formed by the CVD method and etch back method in the contact hole 233a. Then, an aluminum alloy layer having the thickness of about 5000 Å is formed on the tungsten plug 233b and on silicon oxide film 231 by, for example, sputtering. Then, a resist 232a of a prescribed shape is deposited on the aluminum alloy layer, and by patterning the aluminum alloy layer by using the resist 232a as a mask, the main bit line 233 is formed. Thereafter, resist 232a is removed and an interlayer insulating layer is formed on the main bit line. Then, after the step of forming through holes, an aluminum interconnection layer is further provided on the interlayer insulating layer. Thus the nonvolatile semiconductor memory device shown in FIG. 66 (a) is completed.

A method of manufacturing a select gate contact portion of the fourteenth embodiment of the nonvolatile semiconductor memory device in accordance with the present invention will be described with reference to FIGS. 96 to 100. FIGS. 96 to 100 are cross sections taken along the line C—C of FIG. 68.

Figure 96:
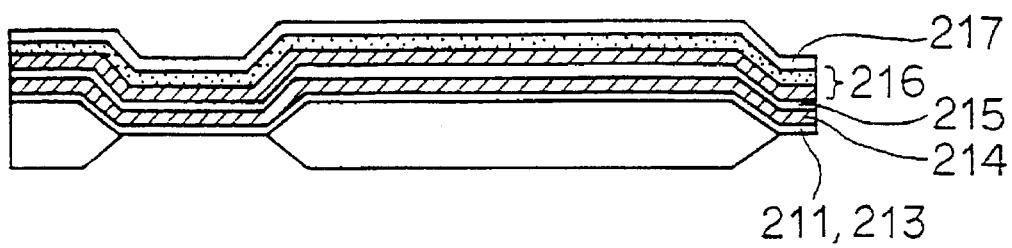
FIGS. 96–100 are sectional views of a select gate contact region of the fourteenth embodiment of a nonvolatile semiconductor memory device in accordance with the present invention, respectively showing the first to fifth steps of the manufacturing method thereof.
Figure 97:
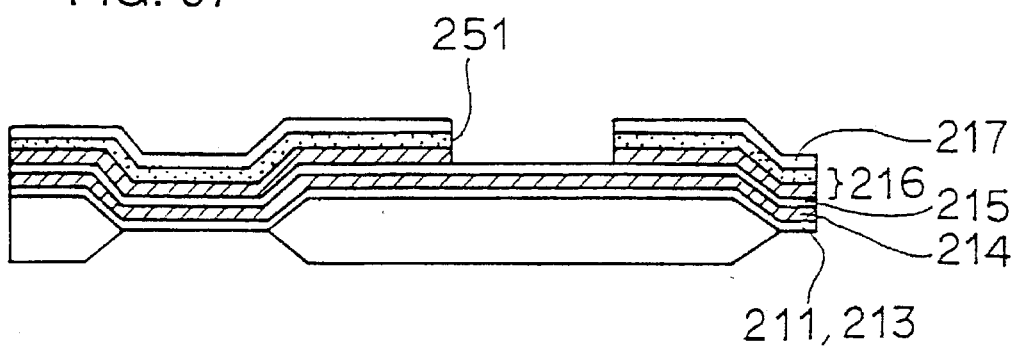

First, referring to FIG. 96, through the similar steps as in the above described embodiment, components up to the high temperature oxide film 217 are formed. As for the selective gate transistor, it is connected through the contact hole with the aluminum interconnection layer 238 formed thereabove. Therefore, there is formed a contact hole at the connection portion. The contact portion is shown in FIG. 97. Referring to FIG. 97, after high temperature oxide film 217 is deposited in the above described manner, the high temperature oxide film 217 and conductive film 216 at the contact portion are removed by etching. Thus a contact hole 251 is formed.

Figure 98:
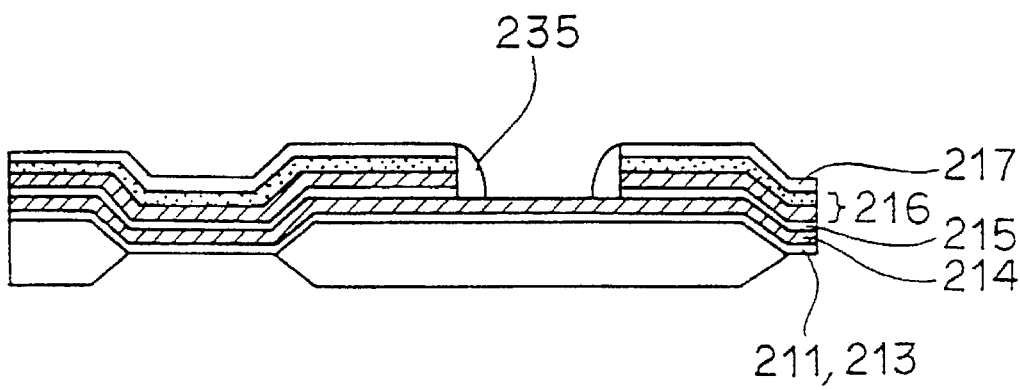

Then, referring to FIG. 98, an oxide film such as a TEOS film is formed on the entire surface by the CVD method, for example, and by effecting anisotropic etching, a silicon oxide film 235 is left on the sidewalls of the contact hole 251. At this time, during forming the silicon oxide film 235 which will serve as the sidewall, the ONO film 215 on the first polycrystalline silicon film 214 is also etched, and therefore the first polycrystalline silicon film 214 is being exposed.

Figure 99:
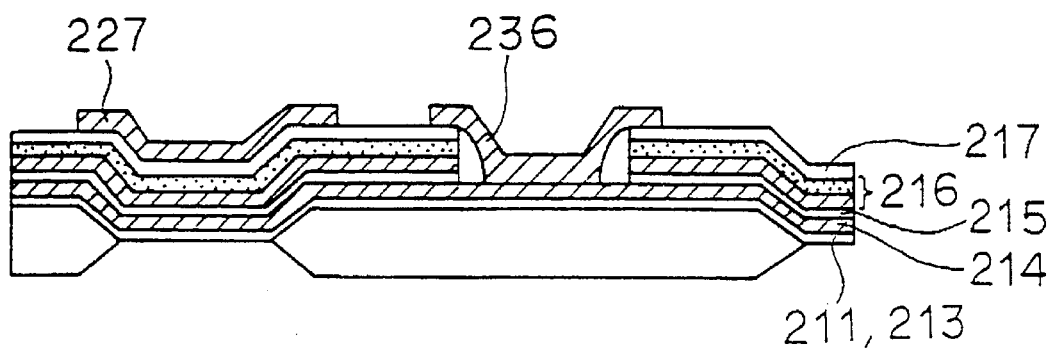
Figure 100:
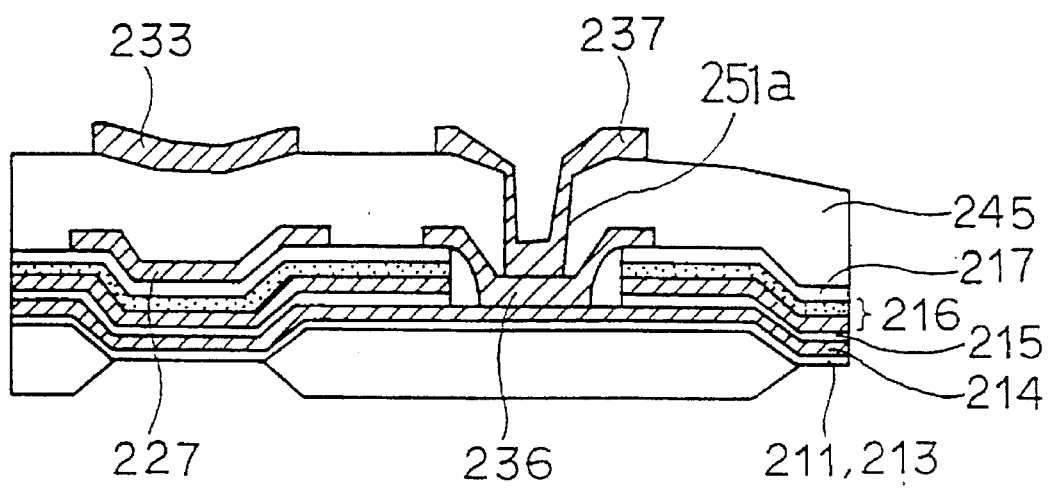

Then, referring to FIG. 99, a polypad 236 of polycrystalline silicon is formed at the contact hole 251, and at the same time, a subbit line 227 is formed. Thereafter, as shown in FIG. 100, an interlayer insulating film 245 is formed on polypad 236 and on subbit line 227. At a portion positioned above polypad 236 of the interlayer insulating film 245, a contact hole 251a is formed, and an aluminum electrode 237 is formed in the contact hole 251a. At this time, the main bit line 233 is formed simultaneously with the formation of aluminum electrode 237. In this manner, since polypad 236 is formed at the contact portion of the selective gate transistor, aspect ratio at the contact portion can be reduced, and the margin for registering patterns can be improved.

After main bit line 233 and aluminum electrode 237 are formed in the above described manner, the nonvolatile semiconductor memory device is formed through the same steps as in the above embodiment.

Figure 101:
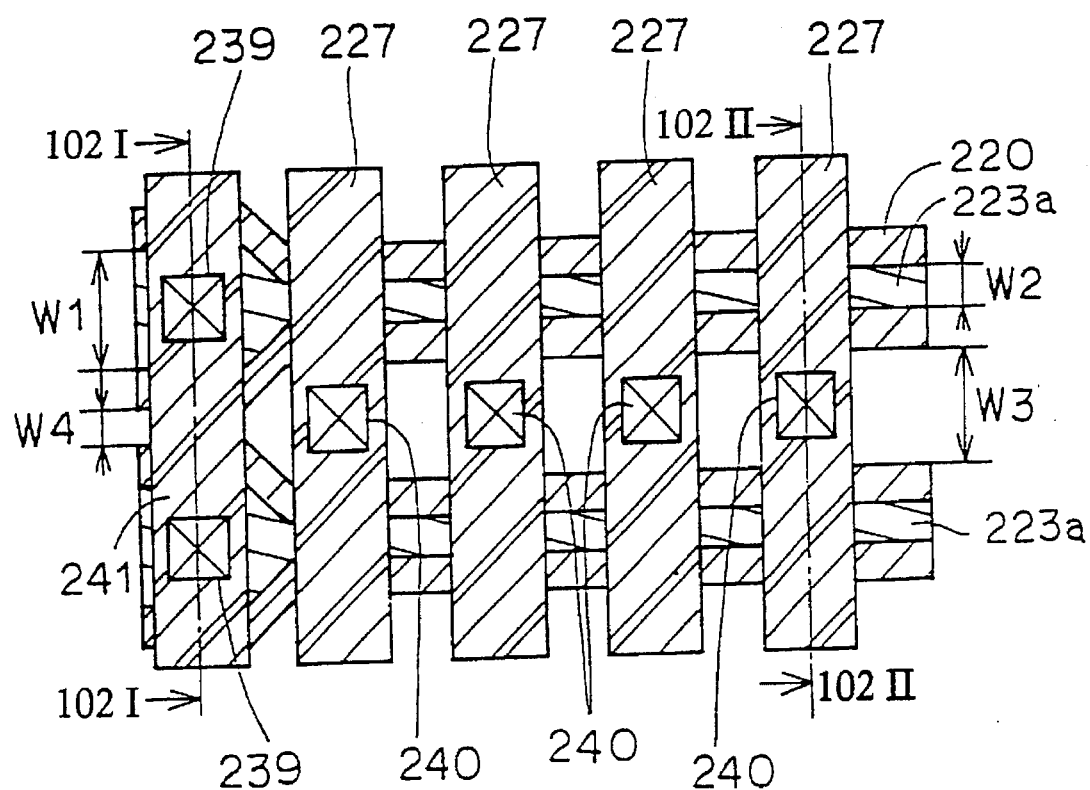
FIG. 101 is a plan view of a source line contact region and a drain contact region of the fourteenth embodiment of a nonvolatile semiconductor memory device in accordance with the present invention.

A method of manufacturing the source line contact portion of the fourteenth embodiment of the nonvolatile semiconductor memory device in accordance with the present invention will be described with reference to FIGS. 101 to 106. FIG. 101 is a plan view showing a portion of the nonvolatile semiconductor memory device shown in FIG. 70. Referring to FIG. 101, at the source line contact portion 239 source line 223a is formed to have a width W1 larger than the width W2 of source line 223a at portions other than the contact portion. Reflecting this shape, the width of the drain region at portions sandwiched by the source line contact portions 239 is small as denoted by W4, and it has wider width W3 at other portions. In this embodiment, formation of the contact hole at the source line contact portion 239 and formation of the contact hole at the drain contact portion 240 are to be done simultaneously, utilizing the difference in width mentioned above.

Detailed description will be given with reference to FIGS. 102 to 106. FIG. 102 (I) is a cross section taken along the line D—D of FIG. 101. FIG. 102 (II) is a cross section taken along the line E—E of FIG. 101. FIGS. 103 to 106 are also the cross sections taken in the similar manner.

Referring to FIG. 102, floating gate electrode 219, ONO film 215, control gate electrode 220 and high temperature oxide film 217 in the memory transistor are formed through the same steps as in the above embodiment. At this time, in FIG. 102 (I), the space at the source portion is wider than the space at the drain portion, while in FIG. 102 (II), the space at the drain portion is wider than that of the source portion.

In the memory transistor at this state, the sidewalls 225 are formed in the similar manner as in the above embodiment, as shown in FIG. 103. Then, as shown in FIG. 104, an oxide film 226 is deposited on the sidewalls 225.

Thereafter, as shown in FIG. 105 (I), a contact hole 239a is formed at the source line contact portion 239 by anisotropic etching of the oxide film 226. At this time, since the width at the source portion is wider than that at the drain portion, the source portion is more liable to etching, and therefore a contact hole 239a is formed at the source portion but the contact hole is not formed at the drain portion.

Referring to FIG. 105 (II), in this example, since the width at the drain portion is wider than that at the source portion, the contact hole 240a is formed only at the drain portion, because of the same reason mentioned above. Thus the contact holes 239a and 240a are formed simultaneously in this manner, and thereafter an interconnection layer 241 and a subbit line 227 of polycrystalline silicon or the like are formed on the memory transistor as shown in FIG. 106.

As described above, in this embodiment, formation of the source line contact portion 239 and of the drain contact portion 240 can be simultaneously carried out utilizing the different width of the source line 223a and of the different width of the drain. In addition, since is not necessary to provide masked for forming respective contact holes, the manufacturing steps can be simplified and the cost can be reduced.

Figure 107:
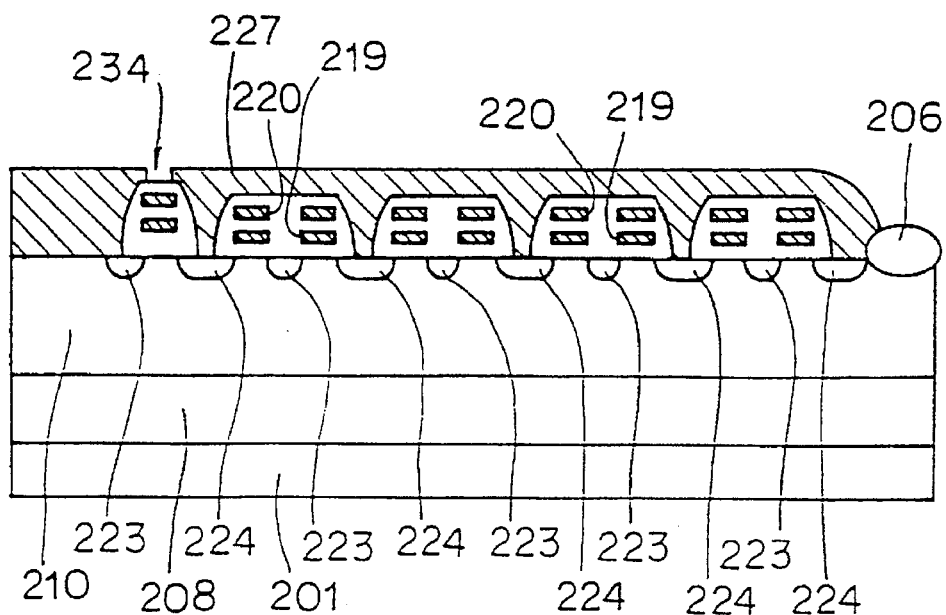
FIG. 107 is a sectional view of a memory transistor region of the fifteenth embodiment of a nonvolatile semiconductor memory device in accordance with the present invention.
Figure 107:
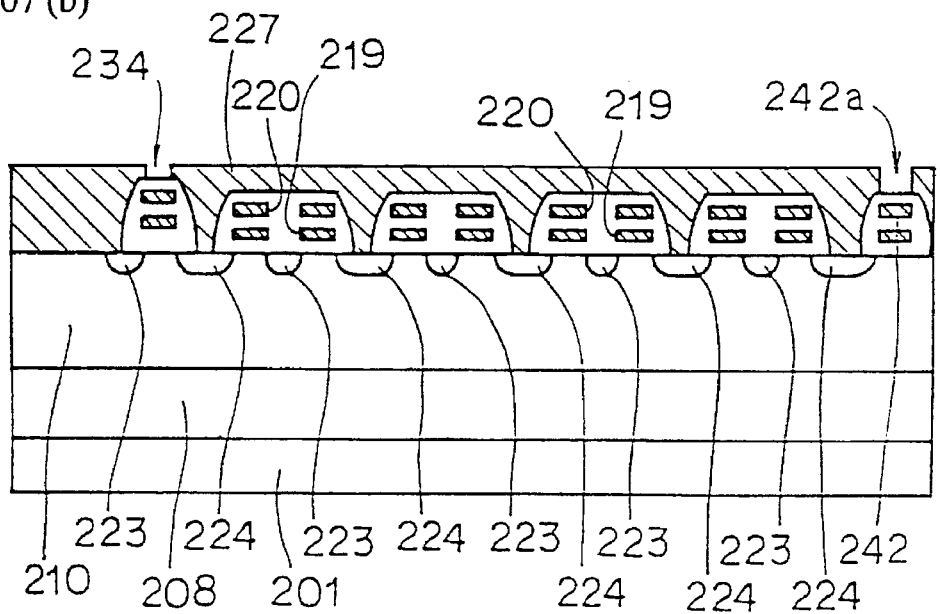

A fifteenth embodiment of the nonvolatile semiconductor memory device in accordance with the present invention will be described with reference to FIG. 107. FIG. 107 (a)

is a cross section of the nonvolatile semiconductor memory device after the subbit line 227 is formed, in case the dummy memory transistor is not formed, and FIG. 107 (b) is a cross section of the fifteenth embodiment of the nonvolatile semiconductor memory device with the dummy memory transistor formed. Referring to FIG. 107 (a), one end of the subbit line 227 is cut on the selective gate transistor 234, while the other end is cut on field oxide film 206. In such a case, it is possible that field oxide film 206 has its film thickness reduced during contact etching or the like, resulting in degraded isolation characteristic.

Therefore, in the thirteenth embodiment, a dummy memory transistor 242 is formed on field oxide film 206. This prevents degradation of isolation breakdown voltage between elements and enables reduction of steps at the subbit line 227. In the thirteenth embodiment, the dummy memory transistor 242 is formed on field oxide film 206. However, as shown in FIG. 107 (b), dummy memory transistor 242a may be directly formed on p type silicon substrate 201. By doing so, introduction of electrons by using FN tunneling is enabled between dummy gate 242 and p type silicon substrate 201, which in turn enables field shield effect. In addition, by using the subbit line 227 sandwiching the dummy memory transistor 242a, electrons can be introduced to the dummy gate 242 by channel hot electrons. The potential of p well 210 is applied to the dummy gate 242. This also leads to the field shield effect as mentioned above.

Figure 108:
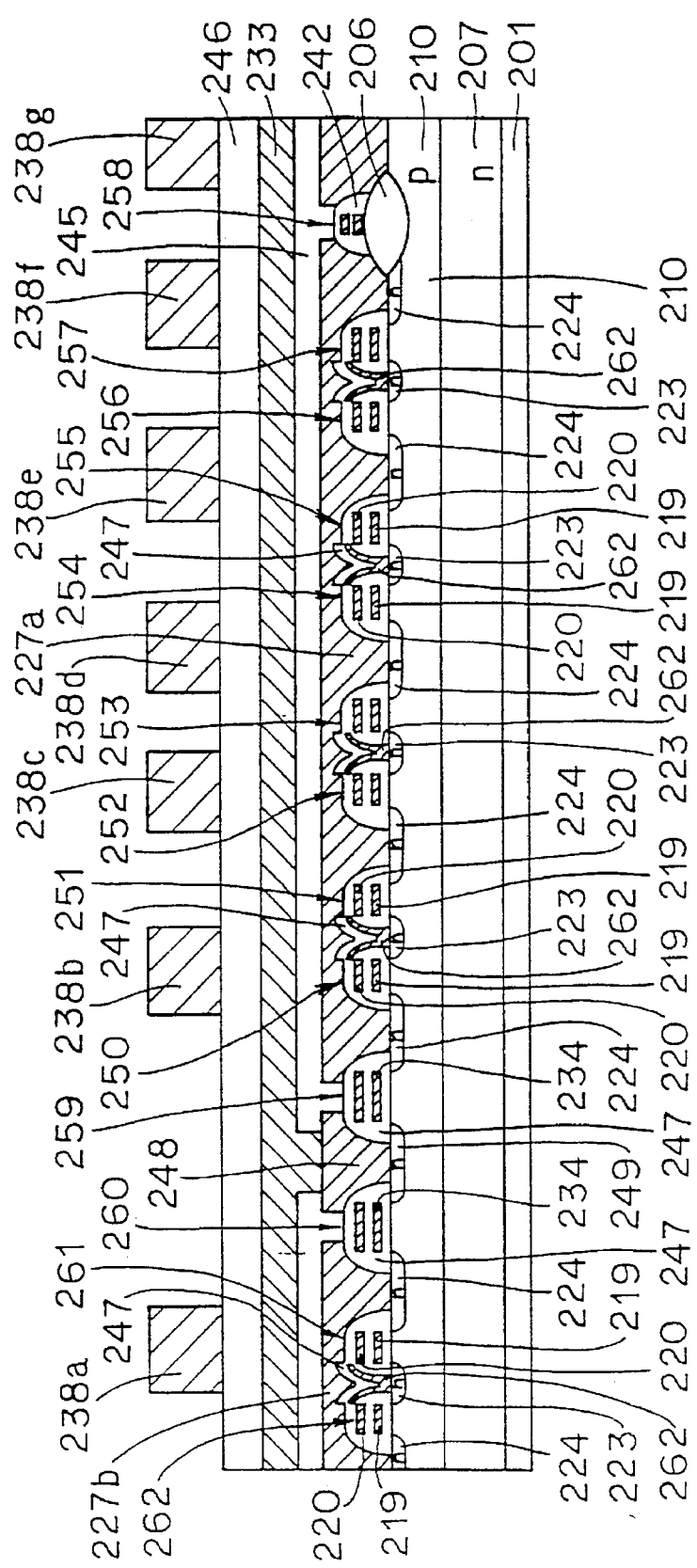
FIG. 108 is a sectional view of a portion of a memory transistor region of the sixteenth embodiment of a nonvolatile semiconductor memory device in accordance with the present invention.
Figure 109:
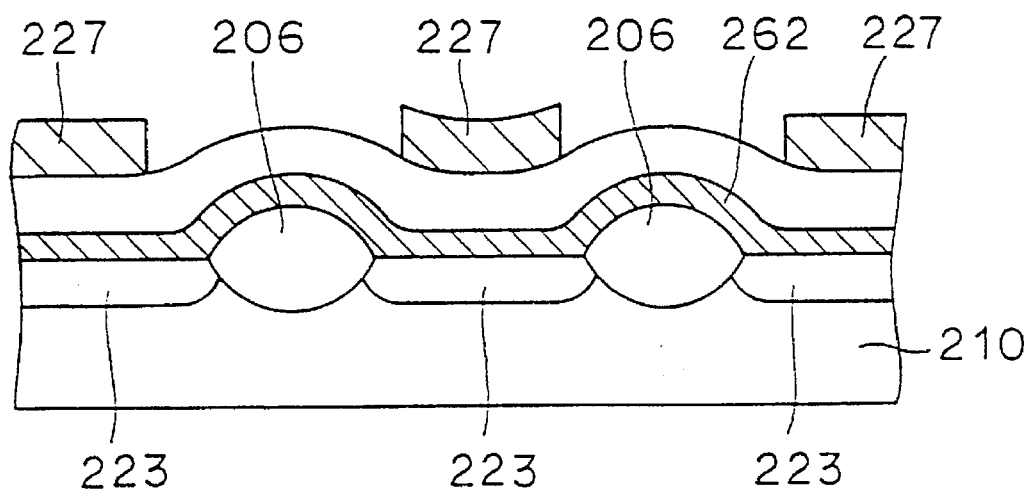
FIG. 109 is a partial sectional view of a memory transistor portion taken along line F—F of FIG. 69 in the sixteenth embodiment of a nonvolatile semiconductor memory device in accordance with the present invention.

A sixteenth embodiment of the nonvolatile semiconductor memory device in accordance with the present invention will be described with reference to FIGS. 108 to 119. FIG. 108 is a partial cross section of the memory transistor of the nonvolatile semiconductor memory device in accordance with the sixteenth embodiment of the present invention. FIG. 109 is a partial cross section correspondence to the cross section along the F—F line of FIG. 69. FIGS. 110 to 119 are cross sections showing the tenth to nineteenth steps of manufacturing the nonvolatile semiconductor memory device of this embodiment.

In each of the above described embodiments, field oxide film 206 positioned on the source region is removed by etching, and the source line is formed by introducing arsenic (As) at the source region in this state. However, this provides the following problem. More specifically, at immediately below the field oxide film 206, boron (B) or the like has been introduced in advance through the field oxide film 206 in order to improve isolation characteristic between elements. Therefore, when arsenic (As) for forming the source line is introduced after the etching of field oxide film 206, boron (B) which has been introduced in advance across the field oxide film 206 may be overlapped at some portions with arsenic (As) introduced to form the source line. At the overlapped portions, it is possible that the carrier concentration is offset, resulting in lower source breakdown voltage.

Therefore, in the present embodiment, in order to form the source line, an interconnection layer formed of polycrystalline silicon or the like doped with impurities which electrically connects respective source regions is formed. Since the interconnection layer can be formed on the field oxide film 206, it becomes unnecessary to remove field oxide film 206 positioned on the source line forming region. Consequently, overlap of the impurity regions mentioned above can be prevented, and thus lowering of the source breakdown voltage can be prevented.

The present invention will be described more specifically with reference to the figures. First, referring to FIG. 108, the feature of this embodiment is that an interconnection layer 262 for electrically connecting source region 223 dispersed in the word line direction is formed. Other structures are the same as those of each of the above described embodiments. In this example, the interconnection layer 362 is formed of polycrystalline silicon.

The interconnection layer 262 connects source regions 223 with each other which are isolated by field oxide film 206. Therefore, as shown in FIG. 109, interconnection layer 262 extends over the field oxide film 206 sandwiched by source region 223. By the provision of interconnection layer 262, source regions 223 can be electrically connected to each other, and therefore it becomes unnecessary to remove partially the field oxide film 206 by etching. Therefore, lowering of the source line breakdown voltage can be prevented, as described above.

A method of manufacturing the nonvolatile semiconductor memory device having hue above described structure will be described with reference to FIGS. 110 to 119.

Figure 110:
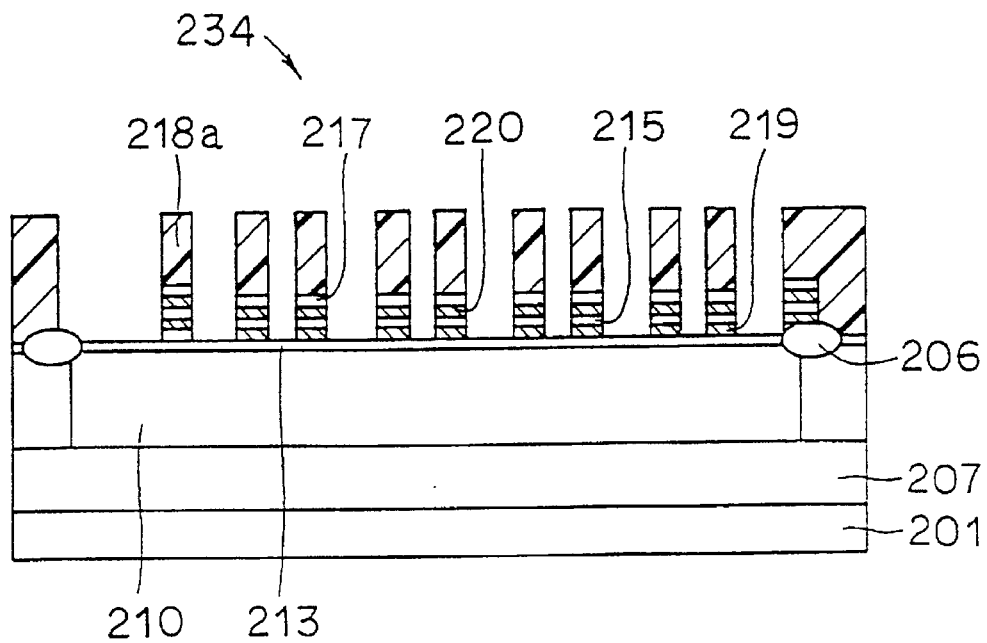
FIGS. 110—119 are sectional views of a memory transistor region of the sixteenth embodiment of a nonvolatile semiconductor memory device in accordance with the present invention, respectively showing the tenth-nineteenth steps of the manufacturing method thereof.

Referring to FIG. 110, high temperature oxide film 227, conductive film 216, ONO film 215 and the first polycrystalline silicon film 214 are etched through the same steps as in the fourteenth embodiment described above. Consequently, floating gate electrode 219 and control gate electrode 220 are formed. Then resist 218 is removed.

Figure 111:
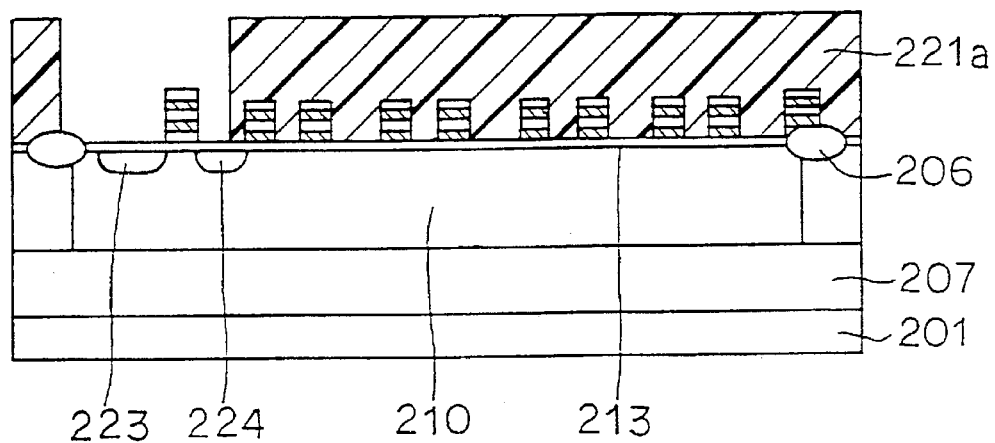

Thereafter, as shown in FIG. 111, a resist pattern 221a is formed to expose only the selective gate transistor. By using resist pattern 221a as a mask, phosphorus (P) is ion-implanted under the condition of 60 KeV and $3.0 \times 10^{13}$ $cm^{-2}$. Thus source/drain regions 223 and 224 of the selective gate transistor are formed. Then, the resist 221a is removed.

Figure 112:
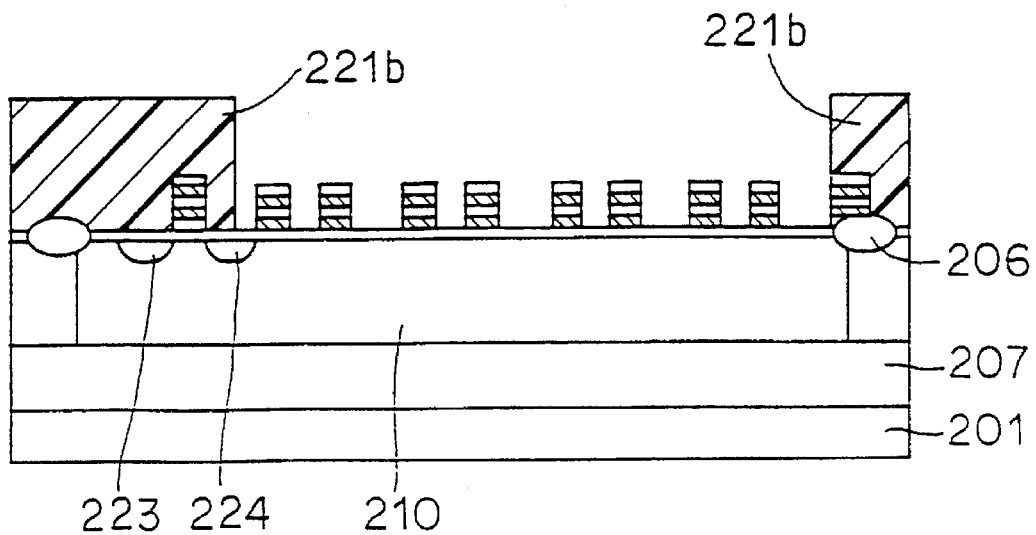

Then, referring to FIG. 112, a resist pattern 221b is formed to cover the transistor which will be the selected gate transistor and to expose other memory transistors. By using resist pattern 221b as a mask, arsenic (As) is ion-implanted under the condition of 35 keV, $5.5 \times 10^{15}$ $cm^{-2}$. The source/drain regions of memory transistors are formed. Then resist 221b is removed.

Figure 113:
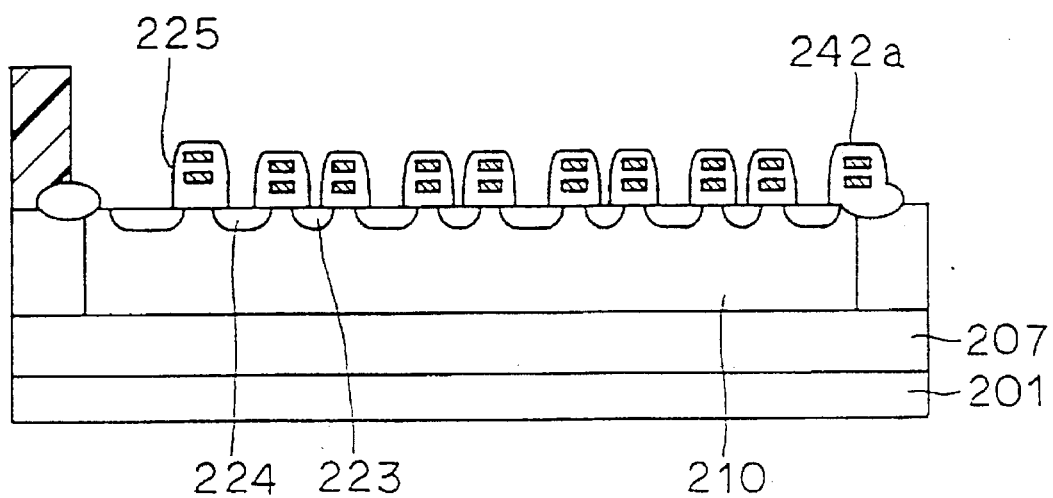

Thereafter, referring to FIG. 113, a high temperature oxide film having the thickness of about 2000 Å is formed by the CVD method at the memory transistor region. By anisotropic etching of the high temperature oxide film, sidewalls 225 are formed on the sidewalls of the selective gate transistor or on the sidewalls of the memory transistor. By using the sidewalls 225 as a mask, arsenic (As) is ion-implanted under the condition of 35 KeV, $4.0 \times 10^{15}$ $cm^{-2}$. Thus source/drain regions, the source region 223 and the drain region 224 of the transistors in the peripheral portion are formed.

Figure 114:
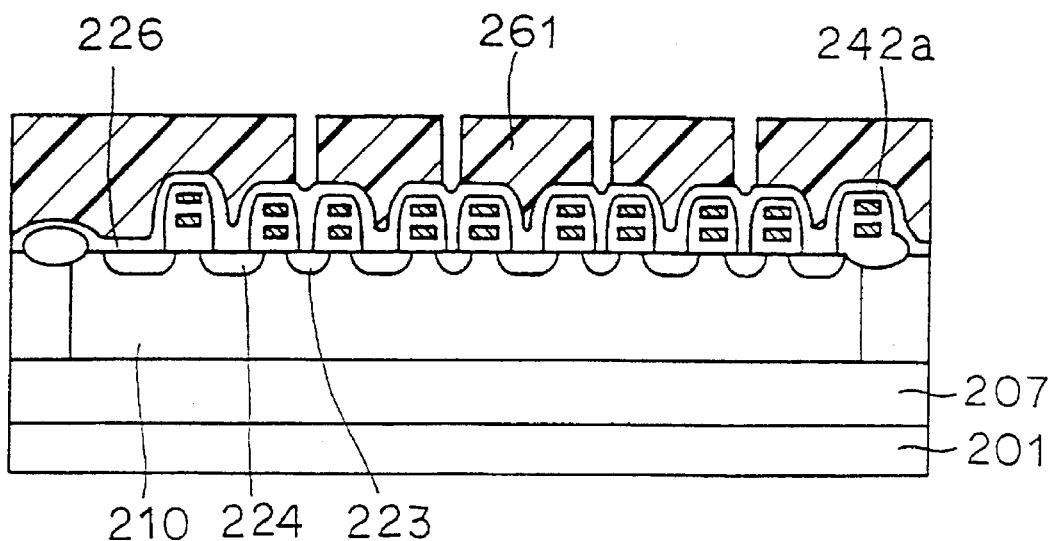
Figure 115:
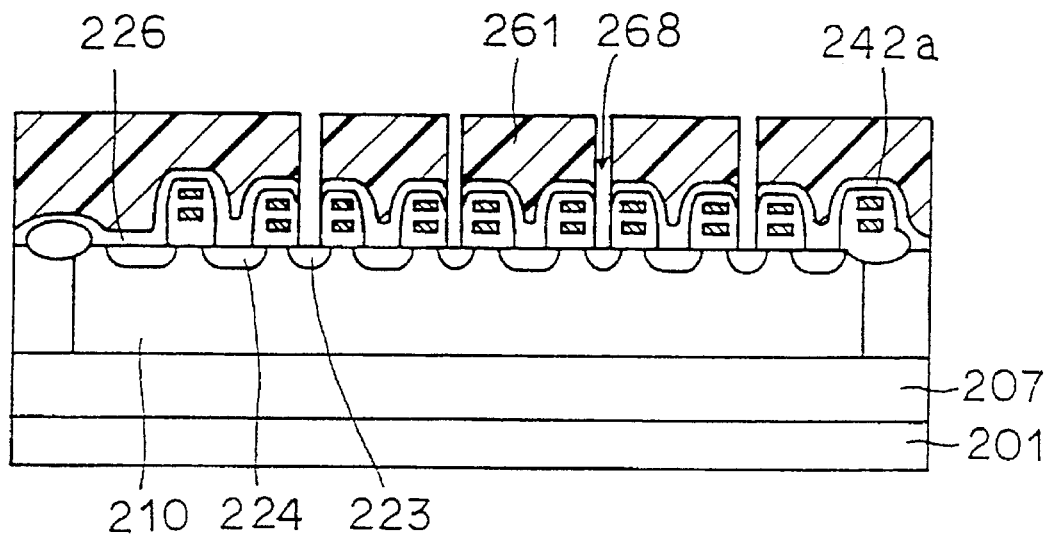

Referring to FIG. 114, a silicon oxide film 226 formed of, for example, TEOS (tetra Ethyl Ortho Silicate) is deposited on the memory transistor region. Then, sintering of the oxide film is carried out for about 30 minutes. Thereafter, a resist pattern 261 is formed to expose the silicon oxide film 226 positioned on the source region 223. By using the resist pattern 261 as a mask, the silicon oxide film 226 and a portion of the sidewall 225 positioned on the source region 223 are etched. Consequently, a contact hole 268 is formed at a region positioned on the source region 223, as shown in FIG. 115. Thereafter, the resist 261 is removed.

Figure 116:
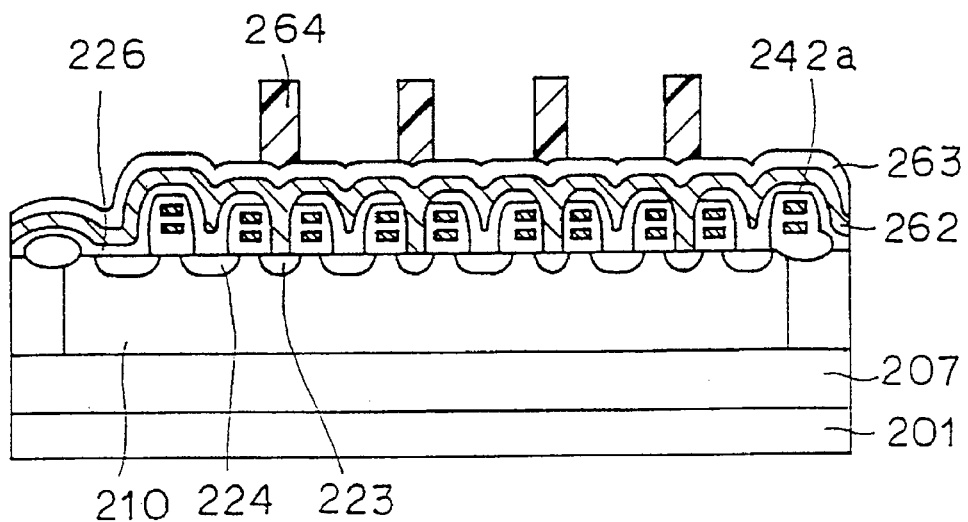

Referring to FIG. 116, a polycrystalline silicon layer 262 is formed on the silicon oxide film 226 and on the inner surface of the contact hole 268 by the CVD method or the like. An oxide film 263 is formed by the CVD method or the like on the polycrystalline silicon layer 262. Then, a resist pattern 264 is formed on the oxide film 263 positioned on the source region 223. At this time, an end portion of the resist pattern 264 is made to be positioned on the end portion of the control gate electrode 220 and the floating gate electrode 219 positioned on the side of the source. Consequently, the polycrystalline silicon layer 260 and the subbit line 227 can be spaced apart by a greater distance, and thus a desired breakdown voltage of the polycrystalline silicon layer 262 and the subbit line 227 can be ensured. In addition, the breakdown voltage between the control gate electrode 220 and the polycrystalline silicon layer 262 can also be set at a desired value.

Figure 117:
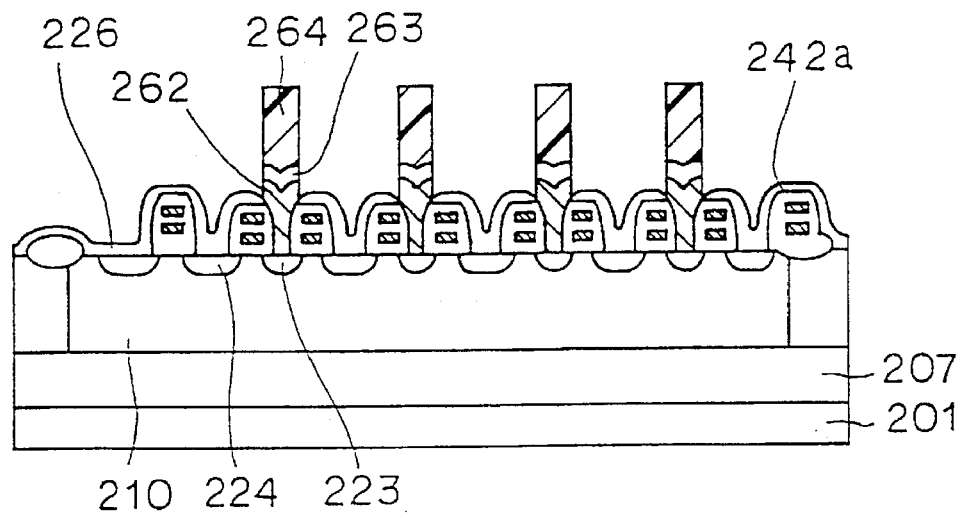

Then, as shown in FIG. 117, the oxide film 263 and the polycrystalline silicon layer 362 are etched by using the resist pattern 264 as a mask. Consequently, an interconnection layer 262 electrically connecting the source regions 223 which are dispersed in the word line direction can be formed.

Figure 118:
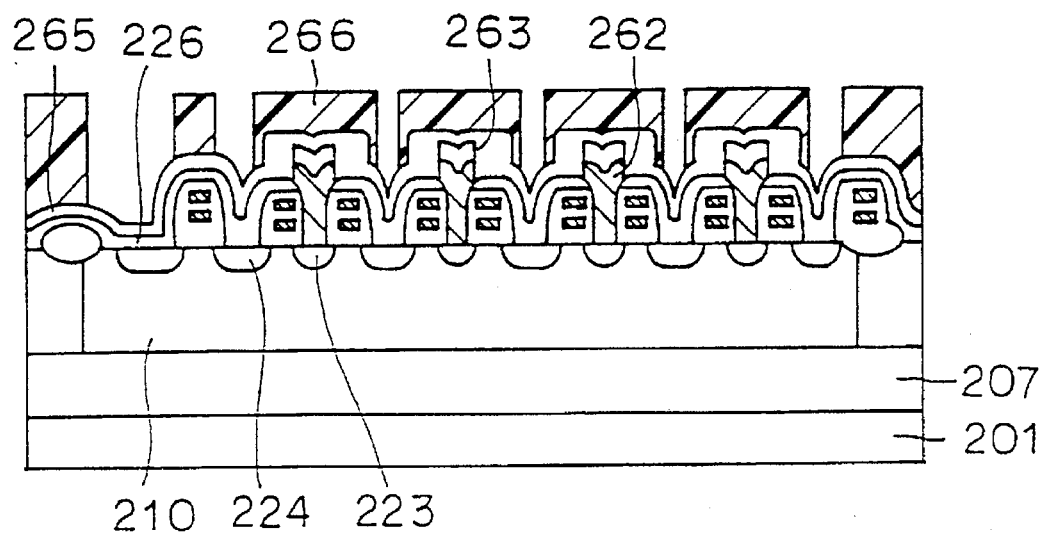

Then, referring to FIG. 118, resist 264 is removed, and an oxide film 265 is formed by CVD method or the like on oxide films 226 and 263. A resist pattern 266 is formed to expose the oxide film 265 positioned on drain diffusion region 224. By using resist pattern 266 as a mask, oxide films 265 and 226 positioned on the drain region 224 are removed by etching. Consequently, a portion of the drain region 224 comes to be exposed.

Figure 119:
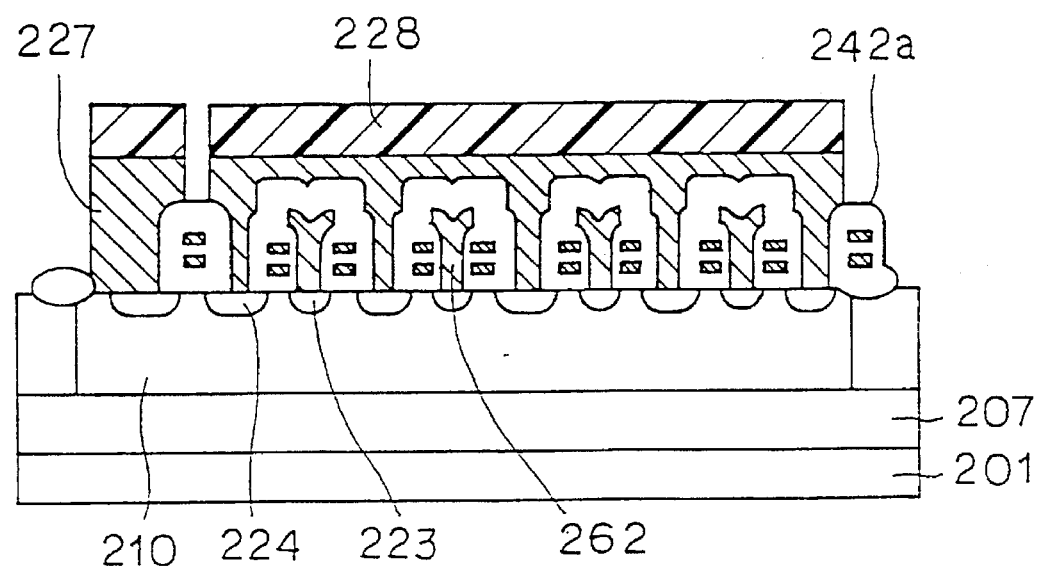

Then, referring to FIG. 119, after the resist 266 is removed, a polycrystalline silicon layer having the thickness of about 2000 Å is formed by the CVD method or the like, and impurities are introduced to the polycrystalline silicon layer to render this layer conductive. Then, a resist 228 of a prescribed shape is applied on the polycrystalline silicon layer, the polycrystalline silicon layer is patterned by using the resist 228 as a mask, and thus the subbit line 227 is formed. Thereafter, the same steps as in the fourteenth embodiment described above are carried out and the nonvolatile semiconductor memory device is completed.

Figure 120:
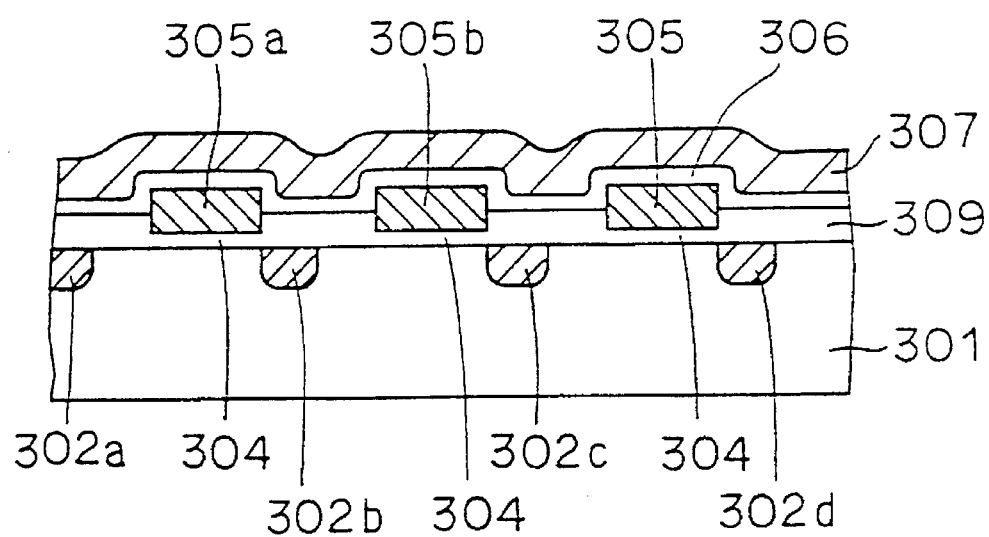
FIG. 120 is a partial sectional view of the seventeenth embodiment of a nonvolatile semiconductor memory device in accordance with the present invention.
Figure 121:
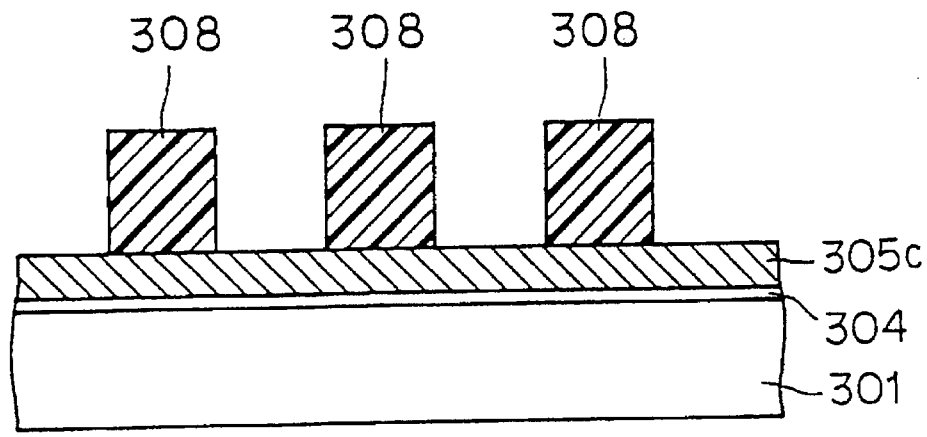
FIGS. 121 and 122 are views showing a memory transistor region of the seventeenth embodiment of a nonvolatile semiconductor memory device in accordance with the present invention, respectively showing the first and second steps of the manufacturing method thereof, in which each of (a) is a sectional view and each of (b) is a plan view.
Figure 121:
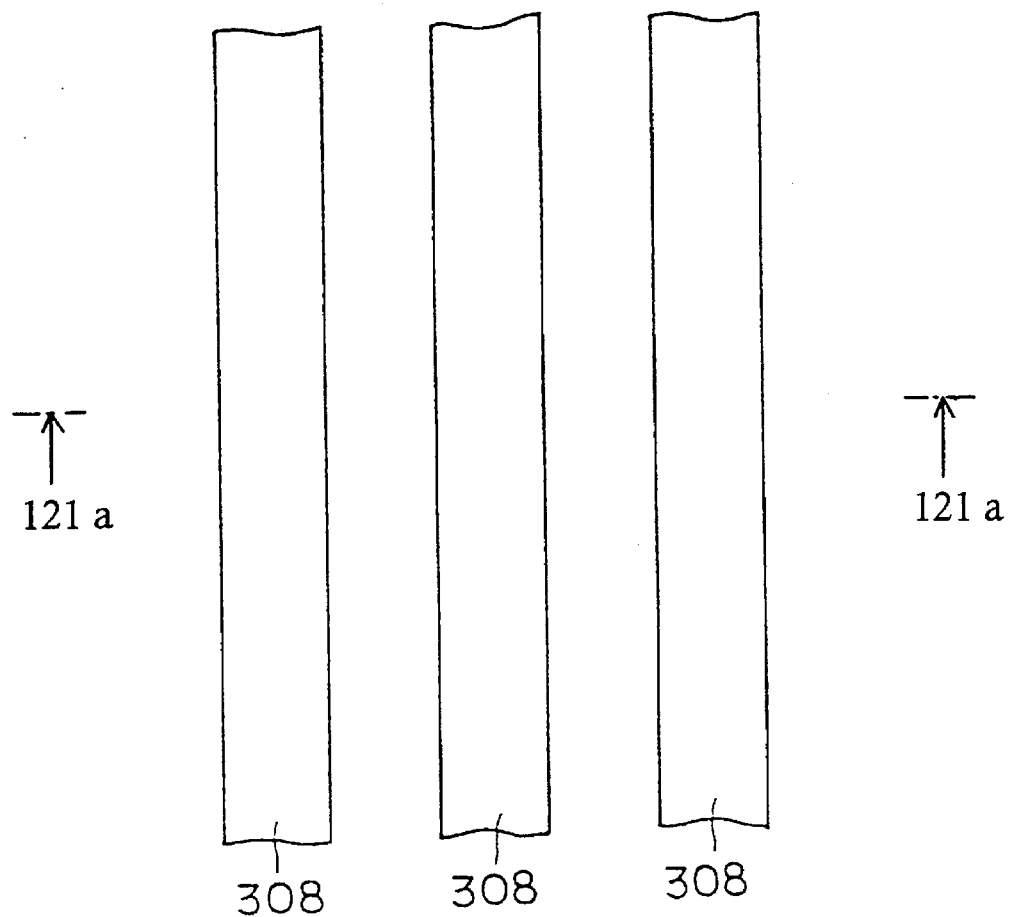
Figure 157:
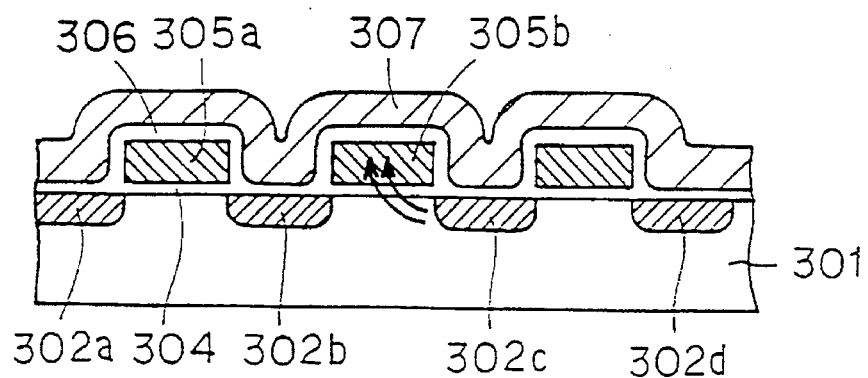
FIG. 157 is a diagram for describing a conventional write operation of the nonvolatile semiconductor memory device shown in FIG. 156.
Figure 158:
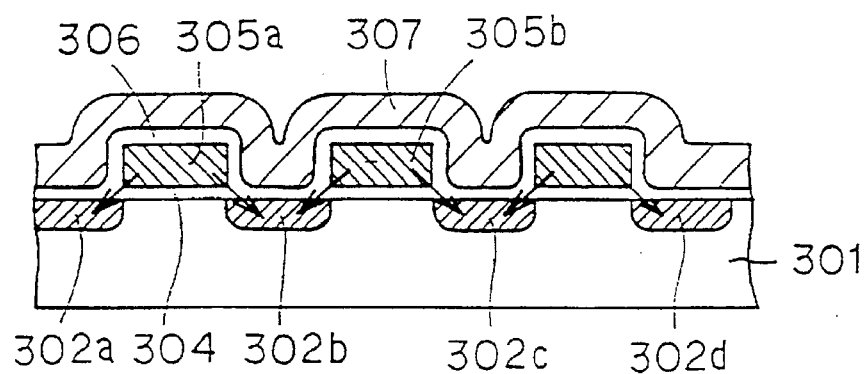
FIG. 158 is a diagram for describing a conventional erase operation of the nonvolatile semiconductor memory device shown in FIG. 156.
Figure 159:
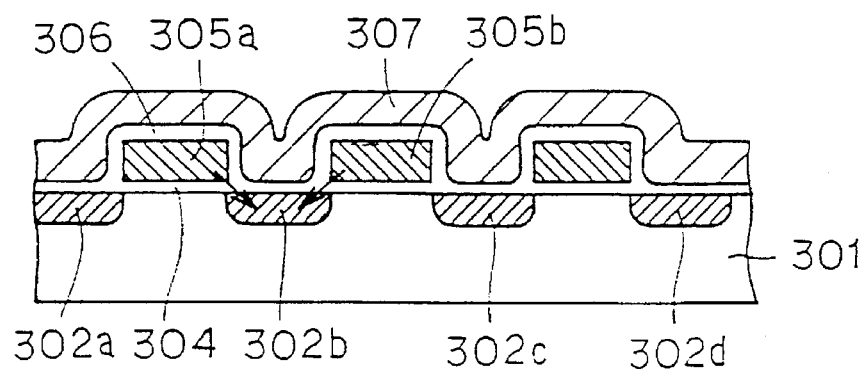
FIG. 159 is a diagram for describing problems in the conventional nonvolatile semiconductor memory device of FIG. 156 carrying out an operation in accordance with the present invention.

A eighteenth embodiment of the present invention will be described with reference to FIGS. 120 to 125 and 156 to 159. FIG. 120 is a partial cross section of the nonvolatile semiconductor memory device in accordance with the eighteenth embodiment of the present invention. FIGS. 121 to 125 show first to fifth steps of manufacturing the nonvolatile semiconductor memory device shown in FIG. 156. FIG. 156 (a) is a plan view and a cross section (b) taken along the line B—B of (a), showing the conventional structure of the nonvolatile semiconductor memory device related to the eighteenth embodiment. FIG. 157 is a partial cross section for explaining the writing operation of the conventional nonvolatile semiconductor memory device shown in FIG. 156. FIG. 158 is a partial cross section for explaining the erasing operation of the nonvolatile semiconductor memory device shown in FIG. 156. FIG. 159 is a partial cross section showing problems of the conventional nonvolatile semiconductor memory device shown in FIG. 156.

The conventional structure of the nonvolatile semiconductor memory device related to the eighteenth embodiment of the present invention will be described with reference to FIGS. 156 to 159. Referring to FIGS. 156 (a) and (b), the nonvolatile semiconductor memory device of this type is generally called a nonvolatile semiconductor memory device having a memory cell array of a virtual ground array.

Referring to FIG. 156 (b), n type impurity regions 302a, 302b, 302c and 302d of high concentration serving as bit lines are formed approximately parallel to and spaced apart from each other on a main surface of a p type semiconductor substrate 301. On regions sandwiched by high concentration impurity regions 302a to 302d, floating gates 305a, 305b and 305 are formed with an insulating film 304 posed therebetween. An insulating film 306 is formed to cover these floating gates 305a, 305b and 305. A control gate 307 if formed on the surface of the insulating film 306. Control gates 307 extends over a plurality of floating gates 305 and crosses approximately perpendicularly the high concentration impurity regions 302a to 302d, as shown in FIG. 156(a).

The conventional operation of the conventional nonvolatile semiconductor memory device having the above described structure will be described with reference FIGS. 157 and 158. First, writing operation will be described. Referring to FIGS. 156(a) and 157, writing to the floating gate 305b will be described. When writing is to be done in the floating gate 305b, a voltage of about 12 V is applied to the control gate 307 existing over the floating gate 305b, and a voltage of about 5 V is applied to high concentration impurity region 302b serving as a bit line.

At this time, high concentration impurity region 302a is kept at a floating state. Impurity region 302c is held at the ground potential. Thus a current flows from high concentration impurity region 302b to high concentration impurity region 302c. At this time, electrons come to be introduced to floating gate 305b, and thus writing is effected in the floating gate 305b.

The erasing operation will be described. When information which has been written in floating gates 305, 305a and 305b is to be erased, control gates 307 are held at the ground potential and a voltage of about 10 V is applied to each of the high concentration impurity regions 302a to 302d. Consequently, electrons are simultaneously drawn out from the floating gates 305, 305a and 305b and the information written therein is erased. This is shown in FIG. 158.

When the operation in accordance with the present invention is to be effected by the nonvolatile semiconductor memory device having the memory cell array of the conventional virtual ground array having the above described structure and operating in the above described manner, there arises the following problem, which will be described with reference to FIG. 159.

When the operation in accordance with the present invention is to be carried out by the nonvolatile semiconductor memory device having the memory cell array of the conventional virtual ground array, there arises a program in the writing operation. Referring to FIG. 159, when information is to be written to floating gate 305a by the writing operation in accordance with the present invention, a voltage of about −8 V is applied to the selected control gate 307. At this time, a voltage of about 5 V is applied to the selected bit line, which is, in this example, the high concentration impurity region 302b serving as the bit line. The non-selected bit lines, in this example the high concentration impurity regions 302a, 302c and 302d are kept at the ground potential.

Consequently, as shown by the arrows in FIG. 159, electrons are drawn out from the floating gate 305a as well as from the floating gate 305b adjacent to floating gate 305a. The reason for this is that one end of the high concentration impurity region 302b is formed to be partially overlapped with floating gate 305a, and the other end is formed to be partially overlapped with floating gate 305b.

Since floating gates 305a and 305b are formed at positions partially overlapping with the high concentration impurity region 302b, electrons are drawn out from respective floating gates 305a and 305b by the FN phenomenon, at the overlapped portions. This state corresponds to writing of information to both floating gates 305a and 305b. Consequently, the nonvolatile semiconductor memory device may possibly operate erroneously.

The nonvolatile semiconductor memory device of this embodiment has been proposed to eliminate the above described the problem. The structure and operation of the nonvolatile semiconductor memory device of the present embodiment will be described with reference to FIGS. 120 to 125.

Referring to FIG. 120, the nonvolatile semiconductor memory device having the memory cell array of the virtual ground array according to the present embodiment has one end of each of the high concentration impurity regions 302a, 302b, 302c and 302d serving as the bit lines positioned below the floating gate 305 and not below the adjacent floating gate 305. Preferably, the concentration of the high concentration impurity regions 302a, 302b, 302c and 302d is not lower than $10^{20}/cm^3$.

More specifically, referring to FIG. 120, one end of the high concentration impurity region 302b is positioned below floating gate 305a. However, the impurity region 302b is offset so as not to be overlapped with the floating gate 305b adjacent to the floating gate 305a. Except for this point, the structure is almost the same as the conventional one shown in FIG. 156 (b).

In this manner, by forming the high concentration impurity region 302b with its end portion not overlapped with the adjacent floating gate 305b, the problem of electrons being drawn out from the adjacent floating gate 305b when writing operation in accordance with the present invention is to be carried out on the floating gate 305a can be avoided. Therefore, writing of information can be done more stably.

A method of manufacturing the nonvolatile semiconductor memory device in accordance with the present embodiment having the structure shown in FIG. 120 will be described with reference to FIGS. 121 to 125. First, referring to FIGS. 121 (a) and (b), an insulating film 304 having the thickness of about 100 Å is formed on the main surface of p type semiconductor substrate 301. A first polycrystalline silicon layer 305c having the thickness of about 1000 Å is deposited on the insulating film 304 by the CVD method or the like.

A resist 308 having a desired thickness is applied on the first polycrystalline silicon layer 305c. Resist 308 is patterned to have a prescribed shape. By using the patterned resist 308 as a mask, the first polycrystalline silicon layer 305c is patterned by etching.

Figure 122:
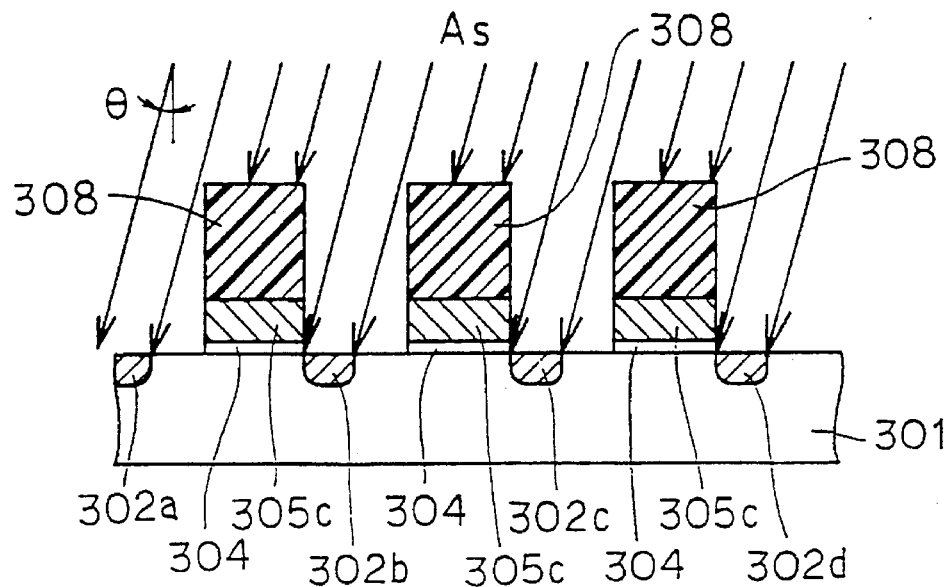
Figure 122:
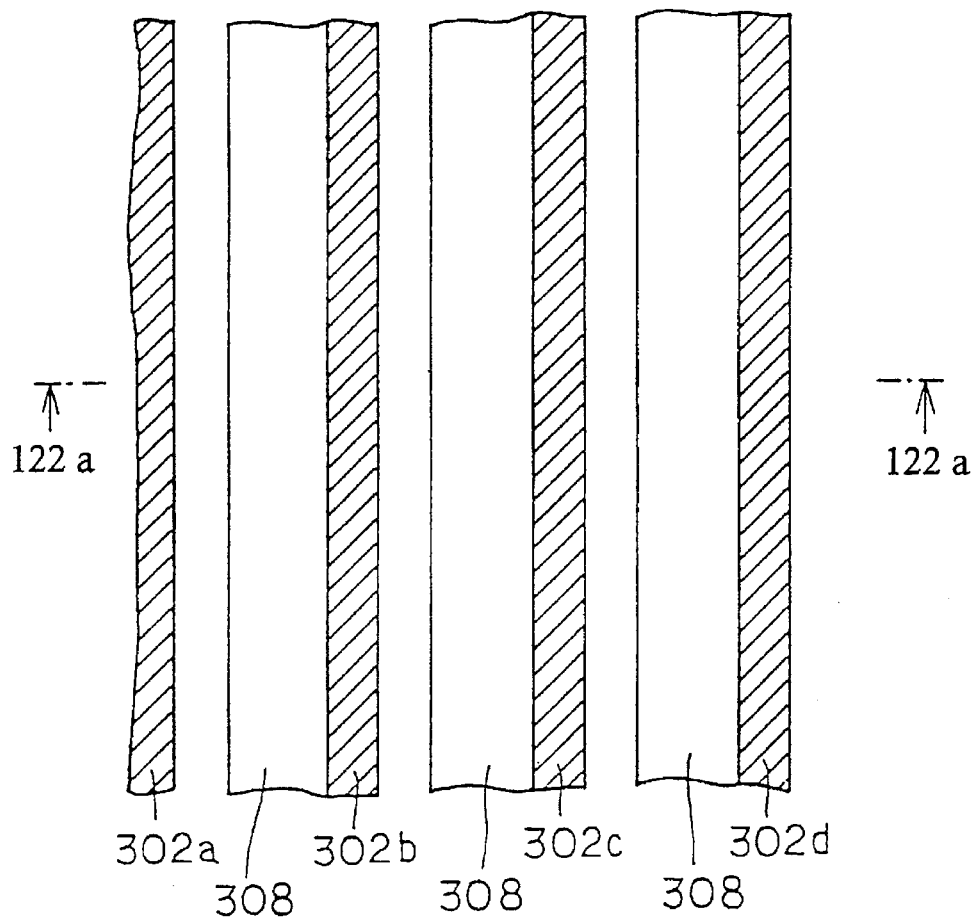

Referring to FIG. 122 (a), after the first polycrystalline silicon layer 305 is patterned, n type impurities such as arsenic (As) is ion-implanted to the main surface of p type semiconductor substrate 301, using resist 308 as a mask. At this time, the angle of implantation of impurity is inclined by a prescribed angle θ. Consequently, by the shadowing effect by the resist 308, high concentration impurity regions 302a to 302d can be formed with their end portions partially overlapped with only one of the adjacent floating gates.

The value of the angle θ is preferably about 7° C. By ion-implanting arsenic (As) with an inclination from the vertical direction by the angle θ, high concentration impurity regions 302a to 302d can be formed which are overlapped with one first polycrystalline silicon layer 305c but offset from the other first polycrystalline silicon layer 305c of the adjacent to first polycrystalline silicon layer 305c patterned in accordance with the resist 308 can be formed. This state viewed from the top is shown in FIG. 122 (b).

Figure 123:
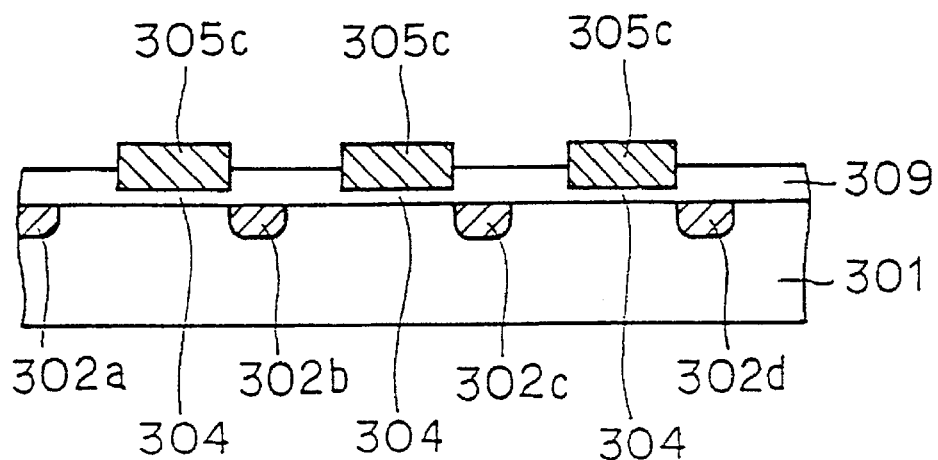
FIGS. 123 and 124 are partial sectional views of the memory transistor region of the seventeenth embodiment of a nonvolatile semiconductor memory device, showing the third and fourth steps of the manufacturing method thereof, respectively.

Referring to FIG. 123, after the resist 308 is removed, an oxide film 309 is formed to cover the first polycrystalline silicon layer 305c by the CVD method or the like. By etching back the oxide film 309, oxide film 309 is buried between first polycrystalline silicon layer 305c.

Figure 124:
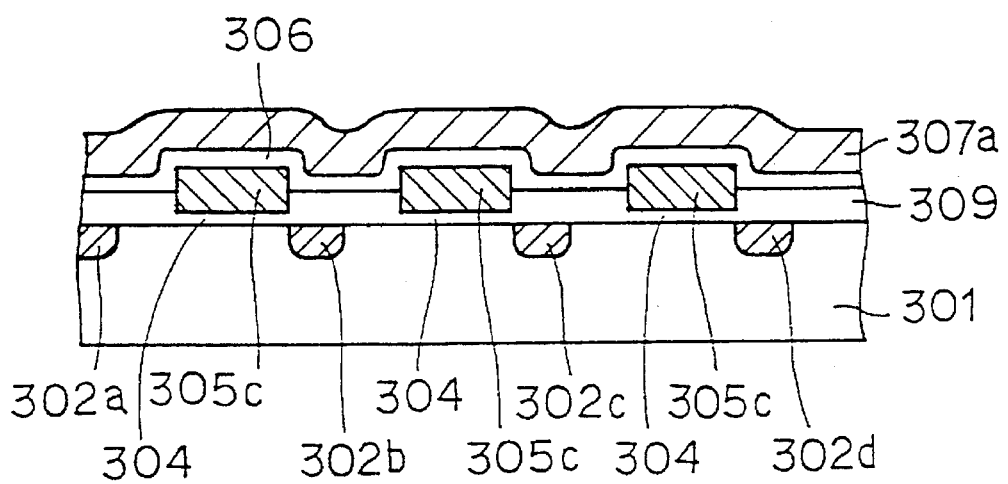
Figure 125:
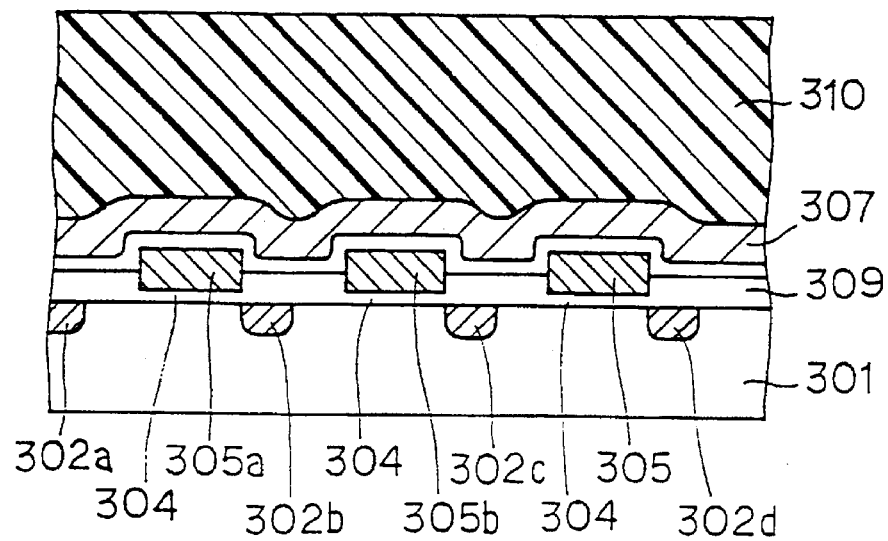
FIG. 125 is a view showing a memory transistor region of the seventeenth embodiment of a nonvolatile semiconductor memory device in accordance with the present invention, in which (a) is a partial sectional view and (b) is a plan view.
Figure 125:
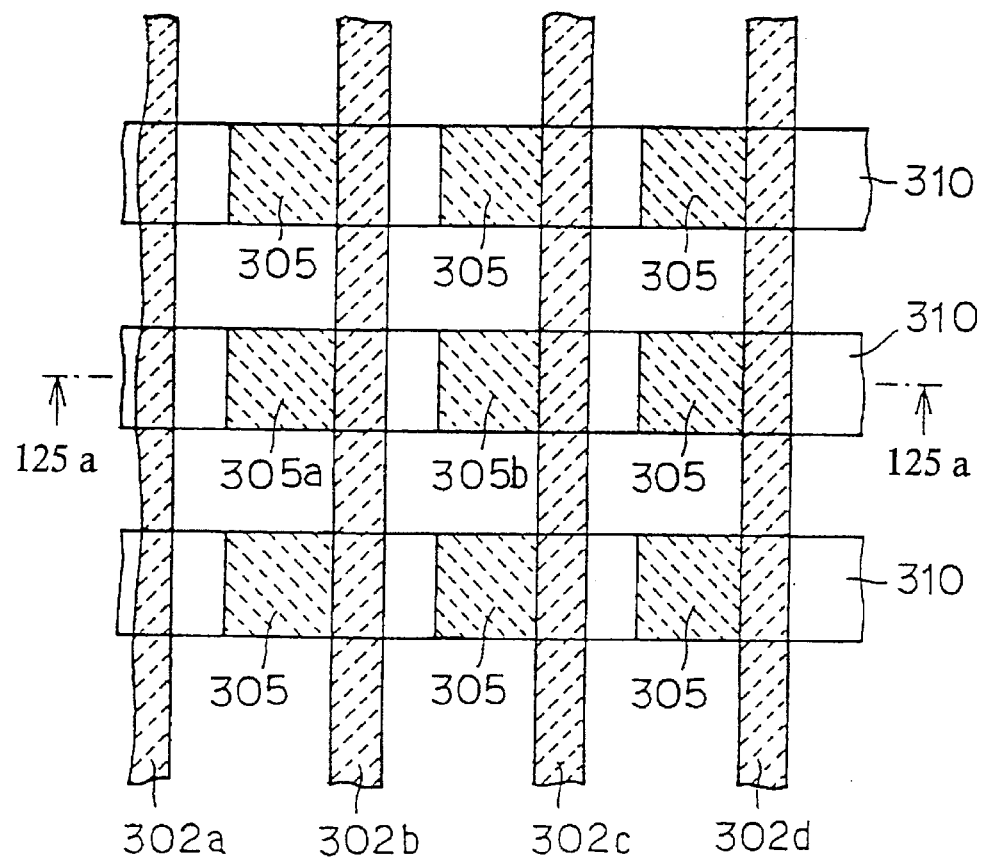

Referring to FIG. 124, an insulating film 306 is formed on the oxide film 309 and on the first polycrystalline silicon layer 305c by the CVD method or the like. A second polycrystalline silicon layer 307a of a prescribed thickness is deposited on insulating film 306 by the CVD method or the like. Then, referring to FIG. 125 (a), a resist 310 is applied on the second polycrystalline silicon layer 307a, and the resist 310 is patterned to a prescribed shape. In this case, referring to FIG. 125 (b), resist 310 is patterned in the direction approximately perpendicular to high concentration impurity regions 302a to 302d. By etching using the resist 310 thus patterned as a mask, control gate 307, floating gates 305a, 305b and 305 and insulating film 306 are formed as shown in FIG. 125 (a). Thereafter, resist 310 is removed. Through the above described steps, the nonvolatile semiconductor memory device shown in FIG. 120 is completed.

Figure 126:
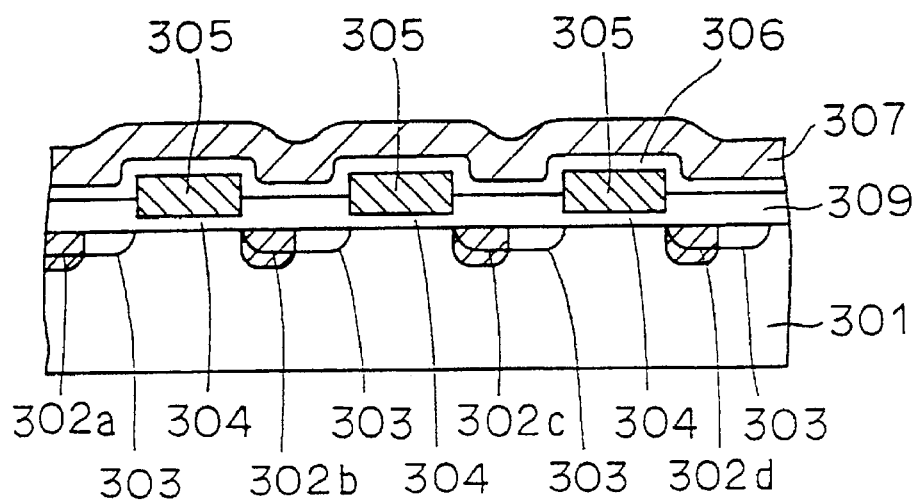
FIG. 126 is a partial sectional view of the seventeenth embodiment of a nonvolatile semiconductor memory device in accordance with the present invention in which another manner is shown.

A modification of the eighteenth embodiment shown in FIG. 120 will be described with reference to FIG. 126. In the nonvolatile semiconductor memory device shown in FIG. 120, high concentration impurity regions 302a to 302d only are formed. However, in this modification, n type high concentration impurity regions 302a to 302d related to the writing operation are formed in the same manner as described with reference to the eighteenth embodiment above, and further n type low concentration impurity region 303 is formed. By providing the low concentration impurity region 303, operating characteristics of the nonvolatile semiconductor memory device can be improved. The low concentration impurity region 303 can be formed by ion-implanting n type impurities such as arsenic (As) to the main surface of the semiconductor substrate 301 at the injection angle which is the same as the conventional example.

As for the exemplary condition for implantation, arsenic (As) of more than $10^{11}/cm^2$ is introduced to form the low concentration impurity region 303. Consequently, the concentration of the low concentration impurity region 303 will be $10^{16}/cm^3$ or higher. At this time, the dosage of arsenic (As) for forming the high concentration impurity regions 302a to 302d should be preferably be $10^{15}/cm^2$ or higher. Thus, the concentration of the resulting high concentration impurity regions 302a to 302d will be $10^{20}/cm^3$.

Figure 127:
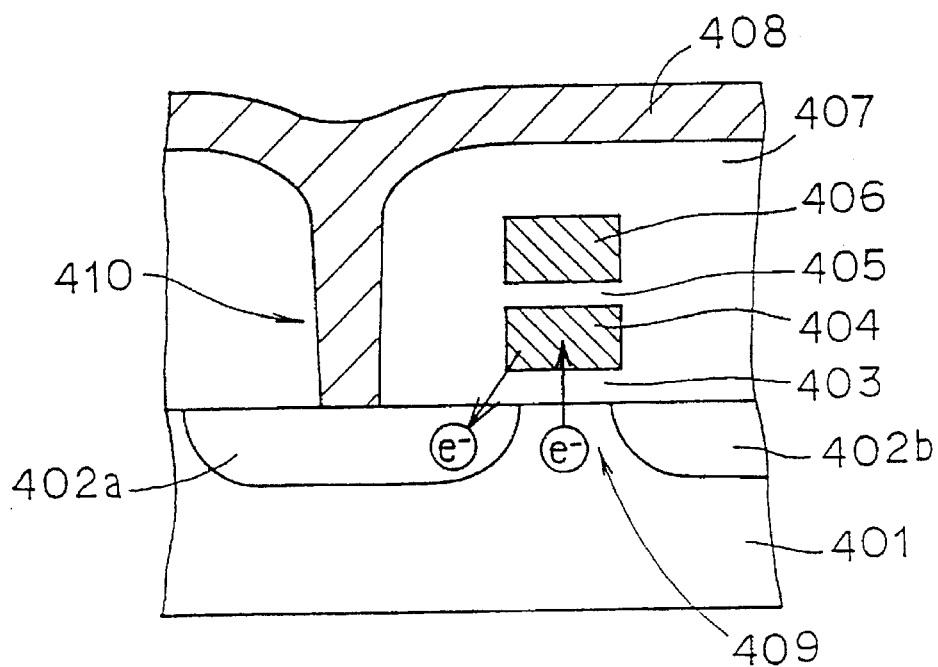
FIG. 127 is a schematic diagram of a nonvolatile semiconductor memory device in accordance with the present invention for describing the characteristic operation thereof.
Figure 128:
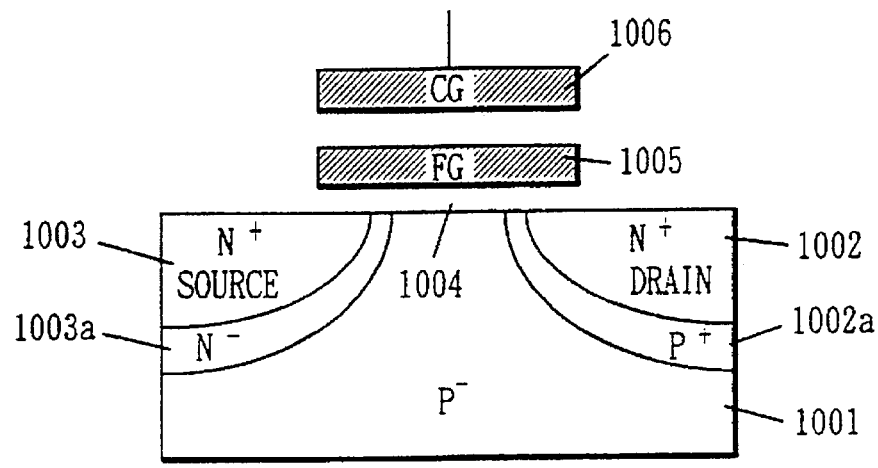
FIG. 128 is a sectional view showing the structure of a stack gate memory cell employed in a conventional flash memory.
Figure 129:
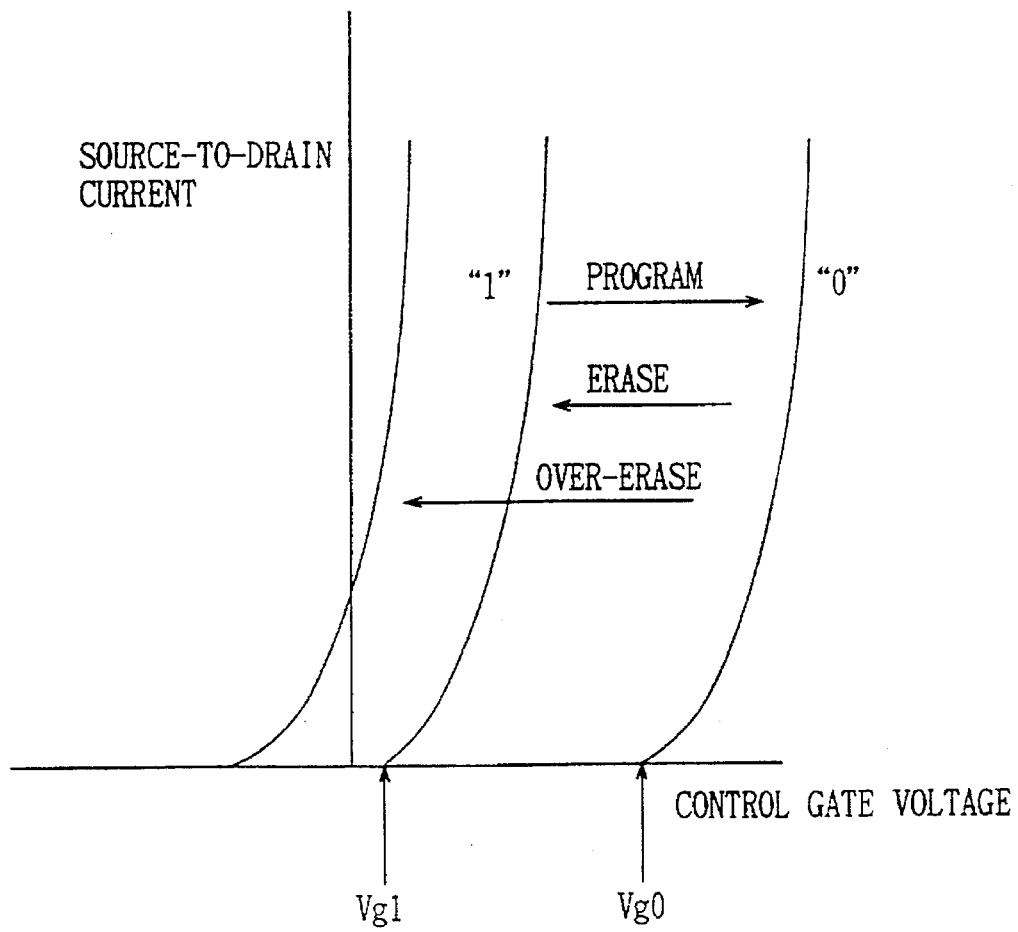
FIG. 129 illustrates relations between program and erase operations and threshold voltages in the conventional flash memory.

The present invention will be summarized with reference to FIG. 127. FIG. 127 is a schematic diagram showing essential components of the nonvolatile semiconductor memory device in accordance with the present invention. Referring to FIG. 127, impurity regions 402a and 402b are formed spaced apart on a main surface of a semiconductor substrate 401. An insulating film 403 is formed on a channel region 409 between impurity regions 402a and 402b. On insulating film 403, a floating gate 404 is formed. This floating gate 404 serves as electron storage means. A word line 406 is formed on the floating gate 404 with an insulating film 405 posed therebetween. An interlayer insulating film 407 is formed on word line 406, and a bit line 408 is formed on interlayer insulating film 407. Bit line 408 is electrically connected to impurity region 402a through a contact hole 410 provided at interlayer insulating film 407.

The characteristic operation of the present invention is carried out in the nonvolatile semiconductor memory device having the above described structure. First, in the typical operation of the nonvolatile semiconductor memory device of the present invention, the initial state corresponds to the erased state. More specifically, a state in which electrons are stored in the floating gate 404 corresponds to the erased state (initial state). As for the method of storing electrons at the floating gate 404, at first, bit line 408 is held at the floating state, and a voltage of about −10 V, for example, is applied to semiconductor substrate 401. At this time, a voltage of about 10 V is applied to word line 406. Consequently, by the FN phenomenon (channel FN) at the entire surface of channel region 409, electrons can be introduced to the floating gate 404. The threshold voltage Vth (E) of the memory transistor of the erased state is higher than the voltage $V_{Read}$ applied to the word line 406 at the time of reading.

The device is at first erased as described above, and by drawing out electrons from a prescribed memory transistor, writing of information is effected. At the time of writing, a voltage of about 5 V is applied to bit line 408. At this time, the semiconductor substrate 401 is kept at the ground potential. A voltage of about −10 V is applied to word line 406. Consequently, electrons are drawn out from floating gate 404. At this time, drawing of electrons is effected by the FN phenomenon at an overlapping portion between the floating gate 404 and impurity region 402a. Consequently, threshold voltage Vth (P) of the memory transistor after writing becomes smaller than the voltage $V_{Read}$ applied to word line 406 at the time of reading.

As described above, in the operation of the nonvolatile semiconductor memory device in accordance with the present invention, the state in which electrons are introduced to the memory transistor correspond to the erased state, and information is written by drawing out electrons from a prescribed memory transistor among all the memory transistors. In each of the above described embodiments, the present invention has been applied to a nonvolatile semiconductor memory device. However, the present invention can be applied to other semiconductor memory devices than the nonvolatile semiconductor memory devices.

According to the nonvolatile semiconductor memory device in accordance with the present invention, when a voltage is applied to the first well region, the junction between the first and second well regions are set to the reverse bias state. Therefore, even when a voltage is applied to the first well region, current does not flow to the second element forming region. Therefore, by applying a voltage to the first well region and by applying a voltage having the different sign from the voltage applied to the first well region to the control gate, the potential difference between first well region and the control gate can be enlarged relatively while the maximum voltage in the semiconductor substrate can be lowered, and thus channel FN can be generated which enables writing/erasing operations. As described above, in the nonvolatile semiconductor memory device, since maximum voltage in the semiconductor device can be lowered, load to the peripheral circuitry can be reduced and therefore it is advantageous for higher degree of integration.

In addition, in the nonvolatile semiconductor memory device in accordance with the present invention, subbit lines are connected to respective drain regions of a plurality of memory transistors. Therefore, at the time of reading, a large read current can be obtained, which enables higher reading operation as compared with a NAND type device.

Further, in the nonvolatile semiconductor memory device in accordance with the present invention, the bit line is divided into a main bit line and a subbit line. The main bit line and the subbit line are made conductive through a select gate transistor. Therefore, one subbit line can be electrically separated from the other subbit line, while they share the main bit line. Accordingly, when writing operation is being carried out by using one subbit line, the other subbit line can be electrically separated from said one subbit line, and therefore in this writing operation, drain disturb is not caused in the memory transistors connected to the said the other bit line. Thus, by the nonvolatile semiconductor memory device, drain disturb can be reduced.

Further, in the nonvolatile semiconductor memory device in accordance with the present invention, data writing operation can be carried out by drain FN. Therefore, writing operation can be carried out with high efficiency with smaller current flowing through the bit lines. Since the current flowing through the bit line can be reduced, a material having larger resistance value can be used as the bit line, and therefore bit lines can be formed by using materials other than aluminum. Therefore two-layered structure of the main bit line and the subbit line and miniaturization of the bit lines can be simultaneously enabled.

In the nonvolatile semiconductor memory device in accordance with the present invention, memory transistors can be set to the written state by drain FN. Therefore, compared with the NOR type device in which writing operation is carried out by using channel hot electrons, efficiency in writing can be improved, and thus power consumption can be reduced.

By the nonvolatile semiconductor memory device in accordance with the present invention, the operation in accordance with the present invention can be carried out more stably.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:

a plurality of memory cells being arranged in a plurality of rows and a plurality of columns;

a plurality of word lines being provided in correspondence to said plurality of rows;

a plurality of main bit lines being provided in correspondence to said plurality of columns; and a source line being provided in common for said plurality of memory cells;

said plurality of memory cells being divided into a plurality of sectors each including a plurality of memory cells being arranged in a plurality of rows and a plurality of columns, a plurality of subbit line groups being provided in correspondence to said plurality of said sectors, each of said subbit line groups including a plurality of subbit lines corresponding to said plurality of columns in a corresponding one of said sectors; and first connection means for selectively connecting one of said plurality of subbit line groups to said plurality of main bit lines;

each of said plurality of memory cells including a control gate being connected to a corresponding one of said word lines, a drain being connected to a corresponding one of said subbit lines, a source being connected to said source line, and a floating gate, electron injecting means for simultaneously injecting electrons into the floating gates of a plurality of memory cells in a selected one of said sectors in erasing to force said plurality of memory cells to a first enhancement type defined by a first threshold voltage; and electron extracting means for extracting electrons from said floating gate of at least a selected one of said plurality of memory cells in programming to force the at least selected one of said plurality of memory cells to a second enhancement type defined by a second threshold voltage.

2. A nonvolatile semiconductor memory device in accordance with claim 1, wherein each of said plurality of memory cells includes a stack gate type memory cell.

3. A nonvolatile semiconductor memory device in accordance with claim 1, wherein said plurality of memory cells are formed in a well, said electron injecting means including:

first voltage applying means for applying a prescribed positive voltage to word lines corresponding to said selected sector while applying a prescribed negative voltage to said well thereby injecting electrons into said floating gates of said plurality of memory cells in said selected sector by a tunnel effect in erasing, said electron extracting means including:

second voltage applying means for applying a prescribed negative voltage to a selected one of said word lines while applying a prescribed positive voltage to a selected one of said main bit lines thereby extracting electrons from said floating gate of said selected memory cell by a tunnel effect in programming.

4. A nonvolatile semiconductor memory device in accordance with claim 3, further including:

Positive voltage generating means receiving a power supply voltage from the exterior for generating said prescribed positive voltage, and negative voltage generating means receiving said power supply voltage form the exterior for generating said prescribed negative voltage.

5. A nonvolatile semiconductor memory device in accordance with claim 3, wherein said electron injecting means further includes:

means for bringing said source line into a floating state, and means for bringing said sub bit lines in said selected sector into floating states.

6. A nonvolatile semiconductor memory device in accordance with claim 3, further including:

means for applying a ground potential to word lines corresponding to nonselected sector.

7. A nonvolatile semiconductor memory device in accordance with claim 3, wherein said electron extracting means further includes:

means for applying a ground potential to said well.

8. A nonvolatile semiconductor memory device in accordance with claim 7, further including:

means for applying a ground potential to nonselected word lines in programming, and means for applying a ground potential to nonselected bit lines in said selected sector in programming.

9. A nonvolatile semiconductor memory device in accordance with claim 1, further including:

a first conductivity type semiconductor substrate, a second conductivity type well being formed in said first conductivity type semiconductor substrate, and a plurality of first conductivity type wells being formed in said second conductivity type well, said plurality of memory cells being formed in at least one of said plurality of first conductivity type wells.

10. A nonvolatile semiconductor memory device in accordance with claim 9, further including:

negative voltage generating means receiving a power supply voltage from the exterior for generating a prescribed negative voltage, said negative voltage generating means including a plurality of transistor means .each being formed in one of said plurality of first conductivity type wells.

11. A nonvolatile semiconductor memory device in accordance with claim 1, further including:

a plurality of capacitance means being provided in correspondence to said plurality of main bit lines, and second connection means for connecting said plurality of capacitance means to said plurality of main bit lines respectively in programming.

12. A nonvolatile semiconductor memory device in accordance with claim 11, further including:

selection means for periodically repeatedly selecting said plurality of main bit lines thereby periodically repeatedly selecting said plurality of subbit lines in said selected sector in programming.

13. A nonvolatile semiconductor memory device in accordance with claim 1, wherein said source line is separated into a plurality of source line parts in correspondence to said plurality of sectors, said nonvolatile semiconductor memory device further including:

potential setting means for setting one source line part corresponding to said selected sector and another source line part corresponding to nonselected sector at potentials being different from each other in erasing.

14. A nonvolatile semiconductor memory device in accordance with claim 13, wherein said plurality of memory cells are formed in a well, said electron injecting means including:

voltage applying means for applying a prescribed positive voltage to word lines corresponding to said selected sector while applying a prescribed negative voltage to said well thereby injecting electrons into said floating gates of said plurality of memory cells in said selected sector by a tunnel effect, said potential setting means including:

source potential setting means for setting a source line part corresponding to said selected sector in a floating state and applying a prescribed negative voltage to a source line part corresponding to said nonselected sector.

15. A nonvolatile semiconductor memory device in accordance with claim 14, wherein said source potential setting means includes:

decoder means for selecting any of said plurality of source line parts for setting a selected source line part in a floating state and applying said prescribed negative voltage to a nonselected source line part.

16. A nonvolatile semiconductor memory device in accordance with claim 13, wherein said plurality of memory cells are formed in a well, said floating gate of each memory cell having gate bird's beaks in the vicinity of said source and said drain, said electron injecting means including:

voltage applying means for applying a prescribed positive voltage to word lines corresponding to said selected sector while applying a prescribed negative voltage to said well thereby injecting electrons into said floating gates of said plurality of memory cells in said selected sector by a tunnel effect, said potential setting means including:

source potential setting means for applying a prescribed negative voltage to a source line part corresponding to said selected sector and bringing a source line part corresponding to said nonselected sector into a floating state.

17. A nonvolatile semiconductor memory device in accordance with claim 16, further including:

decoder means for selecting any of said plurality of source line parts and applying said prescribed negative voltage to a selected source line part while setting a nonselected source line part in a floating state.

18. A nonvolatile semiconductor memory device in accordance with claim 13, wherein said plurality of memory cells are formed in a well, said electron injecting means including:

voltage applying means for applying a prescribed positive voltage to word lines corresponding to said selected sector while applying a prescribed negative voltage to said well thereby injecting electrons into said floating gates of said plurality of memory cells in said selected sector by a tunnel effect, said potential setting means including:

source potential setting means for applying a first negative voltage to a source line part corresponding to said selected sector while applying a second negative voltage higher than said first negative voltage to a source line part corresponding to said nonselected sector.

19. A nonvolatile semiconductor memory device in accordance with claim 18, wherein said source potential setting means includes:

decoder means for selecting any of said plurality of source line parts and applying said first negative voltage to a selected source line part while applying said second negative voltage to a nonselected source line part.

20. A nonvolatile semiconductor memory device in accordance with claim 18, wherein said first connection means includes:

a plurality of field effect transistors being connected between respective ones of said plurality of subbit lines and corresponding ones of said main bit lines, and a plurality of select gate lines being provided in correspondence to said plurality of sectors to be connected to gates of corresponding ones of said plurality of field effect transistors respectively, and decoder means for selecting any of said plurality of select gate lines and applying said first negative voltage to a selected select gate line while applying said second negative voltage to a nonselected select gate line, said source potential setting means including:

a plurality of switch means being provided in correspondence to said plurality of sectors and each for supplying a potential of a corresponding select gate line to a corresponding source line part.

21. A nonvolatile semiconductor memory device in accordance with claim 13, wherein, said well is divided into a plurality of well regions, each of said plurality of well regions is provided with at least one of said plurality of sectors, said plurality of select gate lines are coupled to said plurality of well regions, a negative voltage is applied to selected one of said plurality of well regions in erasing, and sources of the memory cells provided in said selected well region are connected to said plurality of select gate lines in erasing.

22. A nonvolatile semiconductor memory device in accordance with claim 1, further including:

capacitance means, and third connection means for connecting said capacitance means to said source line in erasing.

23. A nonvolatile semiconductor memory device in accordance with claim 1, wherein said electron extracting means includes:

voltage applying means for precharging a selected one of said main bit lines at a prescribed potential in accordance with data and applying a prescribed voltage to a selected one of said word lines, then temporarily grounding said source line and thereafter applying a negative voltage to said selected word line.

24. A nonvolatile semiconductor memory device in accordance with claim 23, further including:

control means for controlling said voltage applying means to repeat said series of voltage applying operations a predetermined number of times.

25. A nonvolatile semiconductor memory device in accordance with claim 23, further including:

detecting means for detecting whether or not the potential of said selected main bit line is at a ground level after said source line is temporarily grounded by said voltage applying means, and control means for controlling said voltage applying means to repeat said series of voltage applying operations until said detecting means detects that the potential of said selected main bit line is at a ground level.

26. An operating method of a nonvolatile semiconductor memory device comprising a plurality of memory cells being arranged in a plurality of rows and a plurality of columns, a plurality of word lines being provided in correspondence to said plurality of rows, a plurality of main bit lines being provided in correspondence to said plurality of columns, and a source line being provided in common for said plurality of memory cells, said plurality of memory cells being divided into a plurality of sectors each including a plurality of memory cells being arranged in a plurality of rows and a plurality of columns, said nonvolatile semiconductor memory device further including a plurality of subbit line groups being provided in correspondence to said plurality of said sectors, each of said subbit lines including a plurality of subbit lines corresponding to said plurality of columns in a corresponding one of said sectors, and first connection means for selectively connecting one of said plurality of subbit line groups to said plurality of main bit lines, each of said plurality of memory cells including a control gate being connected to a corresponding one of said word lines, a drain being connected to a corresponding one of said subbit lines, a source being connected to said source line, and a floating gate, said method comprising the steps of:

simultaneously injecting electrons into the floating gates of a plurality of memory cells in a selected one of said sectors in erasing to force said plurality of memory cells to a first enhancement type defined by a first threshold voltage, and extracting electrons from said floating gate of at least a selected one of said plurality of memory cells in programming to force the at least selected one of said plurality of memory cells to a second enhancement type defined by a second threshold voltage.

27. A method in accordance with claim 26, wherein said plurality of memory cells are formed in a well, said step of injecting electrons including a step of:

applying a prescribed positive voltage to word lines corresponding to said selected sector while applying a negative voltage to said well thereby injecting electrons into said floating gates of said plurality of memory cells in said selected sector by a tunnel effect in erasing, said step of extracting electrons including a step of:

applying a prescribed negative voltage to a selected one of said word lines while applying a prescribed positive voltage to a selected one of said subbit lines thereby extracting electrons from said floating gate of said selected memory cell by a tunnel effect in programming.

28. A method in accordance with claim 26, further including a step of:

connecting a plurality of capacitance means to said plurality of main bit lines respectively.

29. A method in accordance with claim 26, wherein said source line is separated into a plurality of source line parts in correspondence to said plurality of sectors, said method further including a step of:

setting one source line part corresponding to said selected sector and another source line part corresponding to nonselected sector at potentials being different from each other in erasing.

30. A method in accordance with claim 26, further including a step of:

connecting capacitance means to said source line in erasing.

31. A method in accordance with claim 26, wherein said step of extracting electrons includes steps of:

precharging a selected one of said main bit lines at a prescribed potential in accordance with data and applying a prescribed voltage to a selected one of said word lines, temporarily grounding said source line after said precharging step, and applying a negative voltage to said selected word line after said grounding step.

32. A method in accordance with claim 31, wherein said step of extracting electrons further includes a step of:

repeating said precharging step, said grounding step and said applying step a predetermined number of times.

33. A method in accordance with claim 31, wherein said step of extracting electrons further includes steps of:

detecting whether or not the potential of said selected bit line is at a ground level after said grounding step, and repeating said precharging step, said grounding step and said applying step until it is detected that the potential of said selected bit line is at a ground level.

34. A nonvolatile semiconductor memory device according to claim 1, further comprising:

a memory cell array including a plurality of memory cells arranged in rows and columns, each of said memory cells including a control gate, a floating gate, a drain, and a source;

a plurality of main bit lines, each provided in one corresponding column in said memory cell array;

a plurality of sub bit lines, each connected to the drain of memory cells in said one corresponding column in said memory cell array;

a plurality of switching transistors, each responsive to an externally applied address signal for connecting a corresponding one of said plurality of main bit lines to a corresponding one of said plurality of sub bit lines;

a plurality of word liens, each connected to the control gate of memory cells in one corresponding row in said memory cell array;

a source line connected to the source electrode on said plurality of memory cells;

row decoder means responsive to an externally applied address signal for selectively supplying a negative voltage to said plurality of word lines.

\* \* \* \* \*

UNITED STATES PATENT AND TRADEMARK OFFICE
CERTIFICATE OF CORRECTION

PATENT NO. : 5,659,505
DATED : Aug. 19, 1997
INVENTOR(S) : Kobayashi, et al.

It is certified that error appears in the above-identified patent and that said Letters Patent is hereby corrected as shown below:

On the title page item [75] after " Onoda; " insert the following inventors -- Atsushi Fukumoto; Makoto Ohi, both of Hyoto-ken, Japan Signed and Sealed this Fourteenth Day of October, 1997

*Attest:*

*Attesting Officer*

BRUCE LEHMAN

*Commissioner of Patents and Trademarks*

United States Patent [19]
Kobayashi et al.

[11] Patent Number: 5,659,505
[45] Date of Patent: Aug. 19, 1997

[54] ELECTRICALLY PROGRAMMABLE AND ERASABLE NONVOLATILE SEMICONDUCTOR MEMORY DEVICE AND OPERATING METHOD THEREFOR

[75] Inventors: Shinichi Kobayashi; Yasushi Terada; Yoshikazu Miyawaki; Takeshi Nakayama; Tomoshi Futatsuya; Natsuo Ajika; Yuichi Kunori; Hiroshi Onoda; Atsushi Fukumoto; Makoto Ohi, all of hyogo-ken, Japan

[73] Assignee: Mitsubishi Denki Kabushiki Kaisha, Tokyo, Japan

[21] Appl. No.: 509,250

[22] Filed: Jul. 31, 1995

Related U.S. Application Data

[62] Division of Ser. No. 43,889, Apr. 7, 1993, abandoned.

[30] Foreign Application Priority Data

| Apr. 7, 1992 | [JP] | Japan | 4-85281 |
| Jun. 30, 1992 | [JP] | Japan | 4-172812 |
| Jul. 6, 1992 | [JP] | Japan | 4-178116 |
| Sep. 7, 1992 | [JP] | Japan | 4-238546 |
| Dec. 24, 1992 | [JP] | Japan | 4-344807 |

[51] Int. Cl.$^6$ .................................. G11C 11/40
[52] U.S. Cl. .................. 365/185.29; 365/185.13; 365/185.33
[58] Field of Search ............... 365/185.13, 185.18, 365/185.28, 185.33, 230.03, 185.29, 218, 189

[56] References Cited

U.S. PATENT DOCUMENTS

| 4,377,857 | 3/1983 | Tickle . | |
| 4,460,982 | 7/1984 | Gee et al. | 365/189 |
| 4,868,619 | 9/1989 | Mukherjee et al. . | |
| 4,878,199 | 10/1989 | Mizutani et al. | 365/185 |
| 4,887,238 | 12/1989 | Terasawa et al. | 365/185 |
| 4,959,812 | 9/1990 | Monodomi et al. | 365/185 |
| 5,022,000 | 6/1991 | Terasawa et al. | 365/189.09 |
| 5,077,691 | 12/1991 | Haddad et al. | 365/218 |
| 5,088,060 | 2/1992 | Endoh et al. . | |
| 5,126,808 | 6/1992 | Montalvo et al. . | |
| 5,245,570 | 9/1993 | Pazio et al. | 365/185.13 |
| 5,278,439 | 1/1994 | Ma et al. . | |
| 5,341,342 | 8/1994 | Brahmbhatt | 365/900 |
| 5,365,484 | 11/1994 | Cleveland et al. | 365/218 |

FOREIGN PATENT DOCUMENTS

| 3831538A1 | 3/1989 | Germany . |
| 1-282873 | 11/1989 | Japan . |
| 2-3182 | 1/1990 | Japan . |
| 3-295097 | 12/1991 | Japan . |
| 4-14871 | 1/1992 | Japan . |
| 5-6680 | 1/1993 | Japan . |

OTHER PUBLICATIONS

"A 4–Mbit NAND–EEPROM with Tight Programmed Vt Distribution", Tomoharu Tanaka et al., 1990 Symposium on VLSI Circuits Digest of Technical Papers, pp. 105–106.

"An Experimental 4–Mbit CMOS EEPROM with a NAND–Structured Cell", Masaki Momodomi, et al., IEEE Journal of Solid–State Circuits, vol. 24, No. 5, Oct. 1989, pp. 1238–1241.

"A New Erasing and Row Decoding Scheme for Low Supply Voltage Operation 16–Mb/64–Mb Flash Memories", Yoshikazu Miyawaki et al., IEEE Journal of Solid–State Circuits, vol. 27, No. 4, Apr. 1992, pp. 583–587.

"An Experimental 4–Mb Flash EEPROM with Sector Erase", Mike McConnell et al., IEEE Journal of Solid–State Circuits, vol. 26, No. 4, Apr. 1991, pp. 484–489.

(List continued on next page.)

Primary Examiner—David C. Nelms
Assistant Examiner—Vu A. Le
Attorney, Agent, or Firm—Lowe, Price, LeBlanc & Becker

[57] ABSTRACT

In erasing, electrons are simultaneously injected into floating gates from sources of a plurality of memory cells. Thus, the threshold voltages of the plurality of memory cells are increased. In programming, electrons are emitted from a floating gate of a selected memory cell to a drain. Thus, the threshold voltage of the selected memory cell is reduced.

34 Claims, 124 Drawing Sheets

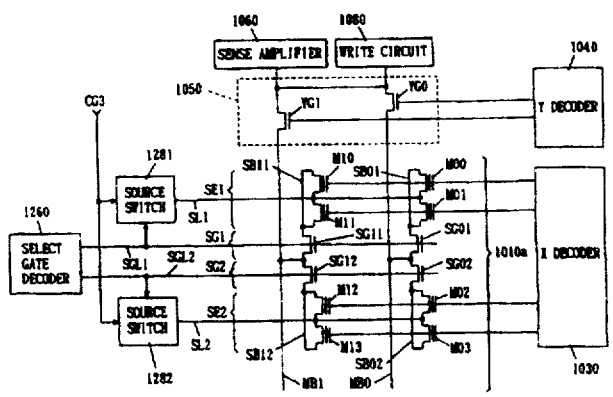

UNITED STATES PATENT AND TRADEMARK OFFICE
CERTIFICATE OF CORRECTION

PATENT NO. : 5,659,505
DATED : Aug. 19, 1997
INVENTOR(S) : Kobayashi, et al.

It is certified that error appears in the above-identified patent and that said Letters Patent is hereby corrected as shown below:

On the title page item [75] after " Onoda; insert the following inventors -- Atsushi Fukumoto; Makoto Ohi, both of Hyogo-ken, Japan This certificate supersedes Certificate of Corrections issued Oct. 14, 1997

Signed and Sealed this

Sixteenth Day of December, 1997

Attest:

BRUCE LEHMAN

Attesting Officer

Commissioner of Patents and Trademarks

United States Patent [19]
Kobayashi et al.

[11] Patent Number: 5,659,505
[45] Date of Patent: Aug. 19, 1997

[54] ELECTRICALLY PROGRAMMABLE AND ERASABLE NONVOLATILE SEMICONDUCTOR MEMORY DEVICE AND OPERATING METHOD THEREFOR

[75] Inventors: Shinichi Kobayashi; Yasushi Terada; Yoshikazu Miyawaki; Takeshi Nakayama; Tomoshi Futatsuya; Natsuo Ajika; Yuichi Kunori; Hiroshi Onoda; Atsushi Fukumoto; Makoto Ohi, all of Hyogo-ken, Japan

[73] Assignee: Mitsubishi Denki Kabushiki Kaisha, Tokyo, Japan

[21] Appl. No.: 509,250

[22] Filed: Jul. 31, 1995

Related U.S. Application Data

[62] Division of Ser. No. 43,889, Apr. 7, 1993, abandoned.

[30] Foreign Application Priority Data

| Apr. 7, 1992 | [JP] | Japan | 4-85281 |
| Jun. 30, 1992 | [JP] | Japan | 4-172812 |
| Jul. 6, 1992 | [JP] | Japan | 4-178116 |
| Sep. 7, 1992 | [JP] | Japan | 4-238546 |
| Dec. 24, 1992 | [JP] | Japan | 4-344807 |

[51] Int. Cl.$^6$ ............................................. G11C 11/40
[52] U.S. Cl. ....................... 365/185.29; 365/185.13; 365/185.33
[58] Field of Search ................ 365/185.13, 185.18, 365/185.28, 185.33, 230.03, 185.29, 218, 189

[56] References Cited

U.S. PATENT DOCUMENTS

| 4,377,857 | 3/1983 | Tickle. | |
| 4,460,982 | 7/1984 | Gee et al. | 365/189 |
| 4,868,619 | 9/1989 | Mukherjee et al. | |
| 4,878,199 | 10/1989 | Mizutani et al. | 365/185 |
| 4,887,238 | 12/1989 | Terasawa et al. | 365/185 |
| 4,959,812 | 9/1990 | Momodomi et al. | 365/185 |
| 5,022,000 | 6/1991 | Terasawa et al. | 365/189.09 |
| 5,077,691 | 12/1991 | Haddad et al. | 365/218 |
| 5,088,060 | 2/1992 | Endoh et al. | |
| 5,126,808 | 6/1992 | Montalvo et al. | |
| 5,245,570 | 9/1993 | Fazio et al. | 365/185.13 |
| 5,278,439 | 1/1994 | Ma et al. | |
| 5,341,342 | 8/1994 | Brahmbhatt | 365/900 |
| 5,365,484 | 11/1994 | Cleveland et al. | 365/218 |

FOREIGN PATENT DOCUMENTS

| 3831538A1 | 3/1989 | Germany. |
| 1-282873 | 11/1989 | Japan. |
| 2-3182 | 1/1990 | Japan. |
| 3-295097 | 12/1991 | Japan. |
| 4-14871 | 1/1992 | Japan. |
| 5-6680 | 1/1993 | Japan. |

OTHER PUBLICATIONS

"A 4-Mbit NAND-EEPROM with Tight Programmed Vt Distribution", Tomoharu Tanaka et al., 1990 Symposium on VLSI Circuits Digest of Technical Papers, pp. 105–106.

"An Experimental 4-Mbit CMOS EEPROM with a NAND-Structured Cell", Masaki Momodomi, et al., IEEE Journal of Solid-State Circuits, vol. 24, No. 5, Oct. 1989, pp. 1238–1241.

"A New Erasing and Row Decoding Scheme for Low Supply Voltage Operation 16-Mb/64-Mb Flash Memories", Yoshikazu Miyawaki et al., IEEE Journal of Solid-State Circuits, vol. 27, No. 4, Apr. 1992, pp. 583–587.

"An Experimental 4-Mb Flash EEPROM with Sector Erase", Mike McConnell et al., IEEE Journal of Solid-State Circuits, vol. 26, No. 4, Apr. 1991, pp. 484–489.

(List continued on next page.)

*Primary Examiner*—David C. Nelms
*Assistant Examiner*—Vu A. Le
*Attorney, Agent, or Firm*—Lowe, Price, LeBlanc & Becker

[57] ABSTRACT

In erasing, electrons are simultaneously injected into floating gates from sources of a plurality of memory cells. Thus, the threshold voltages of the plurality of memory cells are increased. In programming, electrons are emitted from a floating gate of a selected memory cell to a drain. Thus, the threshold voltage of the selected memory cell is reduced.

34 Claims, 124 Drawing Sheets